US005426613A

United States Patent [19]

Takahashi et al.

[11] Patent Number: 5,426,613

[45] Date of Patent: Jun. 20, 1995

[54] SEMICONDUCTOR MEMORY DEVICE WITH IMPROVED SUBSTRATE ARRANGEMENT TO PERMIT FORMING A PLURALITY OF DIFFERENT TYPES OF RANDOM ACCESS MEMORY, AND A TESTING METHOD THEREFOR

[75] Inventors: Yasushi Takahashi, Tachikawa; Hidetoshi Iwai, Ohme; Satoshi Oguchi, Ohme; Hisashi Nakamura, Ohme; Hiroyuki Uchiyama, Fuchuu; Toshitugu Takekuma; Shigetoshi Sakomura, both of Ohme; Kazuyuki Miyazawa, Iruma; Masamichi Ishihara, Hamura; Ryoichi Hori, Tokyo; Takeshi Kizaki, Higashimurayama; Yoshihisa Koyama, Akishima; Haruo Ii, Akishima; Masaya Muranaka, Akishima; Hidetomo Aoyagi, Akishima; Hiromi Matsuura, Tokorozawa, all of Japan

[73] Assignees: Hitachi, Ltd.; Hitachi VLSI Engineering Corp., both of Tokyo, Japan

[21] Appl. No.: 972,907

[22] Filed: Nov. 6, 1992

Related U.S. Application Data

[63] Continuation of Ser. No. 496,280, Mar. 20, 1990, Pat. No. 5,217,917.

[30] Foreign Application Priority Data

Mar. 20, 1989 [JP] Japan .................................... 1-65838
Mar. 20, 1989 [JP] Japan .................................... 1-69932

[51] Int. Cl.[6] .......................... G11C 7/00; G11C 8/00

[52] U.S. Cl. ............................... 365/222; 365/230.08; 365/230.06

[58] Field of Search ............. 365/222, 230.08, 230.06, 365/233, 189.04

[56] References Cited

U.S. PATENT DOCUMENTS 4,354,259 10/1982 Ishimoto ............................ 365/230
4,581,718 4/1986 Oishi .................................. 365/222
4,680,737 7/1987 Oishi .................................. 365/222
4,747,082 5/1988 Minato ............................... 365/222
4,766,570 8/1988 Yamaguchi ......................... 365/222
4,802,135 1/1989 Shinoda .............................. 365/233
4,870,620 9/1989 Yamagata ........................... 365/222
4,905,198 2/1990 Oishi .................................. 365/222
4,914,630 4/1990 Fujishima ....................... 365/189.04

FOREIGN PATENT DOCUMENTS 48603 3/1986 European Pat. Off. ............ 365/222
48812 12/1988 Japan .................................. 365/222
49002 2/1990 Japan .................................. 365/222

*Primary Examiner*—William L. Sikes
*Assistant Examiner*—Tiep H. Nguyen
*Attorney, Agent, or Firm*—Antonelli, Terry, Stout & Kraus

[57] ABSTRACT

A semiconductor memory device is provided which includes a substrate arrangement which is suitable for forming a large number of types of DRAMs having different package specifications, different bit structure and different operating modes. In conjunction with this, the bonding pads are arranged at optimum locations for accommodating the different package types. Various layout arrangements are also provided to minimize space and to improve access time. Additional features are provided, including improved output buffer circuitry, protection circuitry and testing methods to facilitate operation of the semiconductor memory device.

7 Claims, 130 Drawing Sheets

XAB

XABC

DIP

SOJ

ZIP

FIG. 5(a) DIP
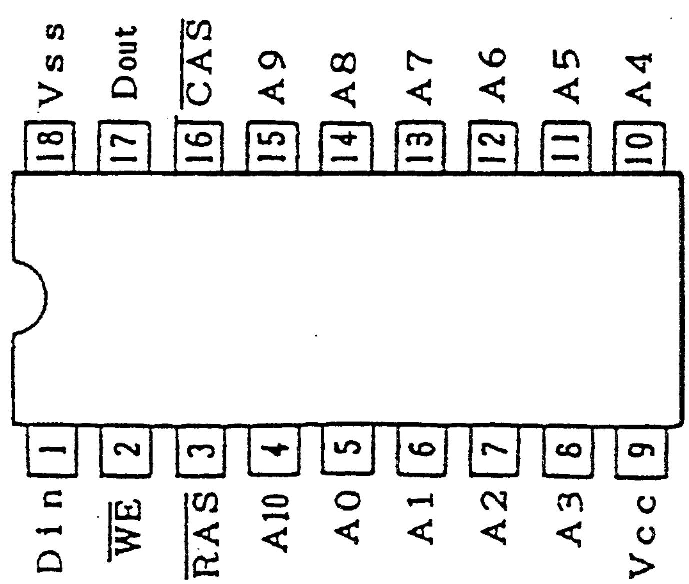
FIG. 5(b) SOJ
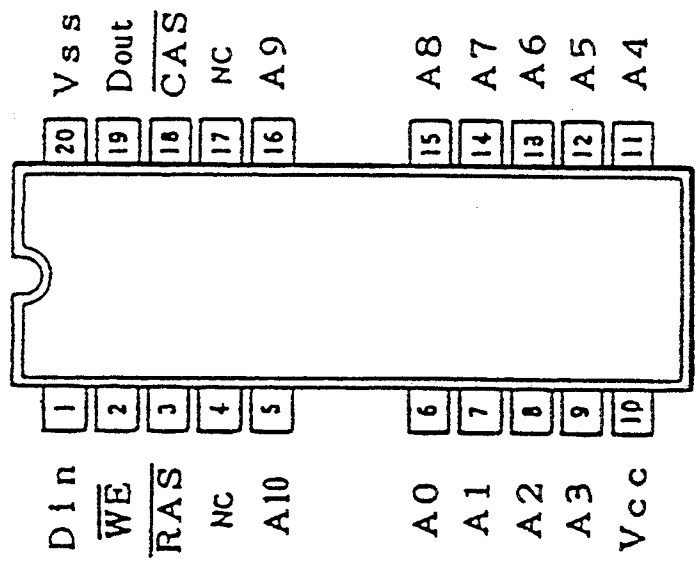
FIG. 5(c) ZIP
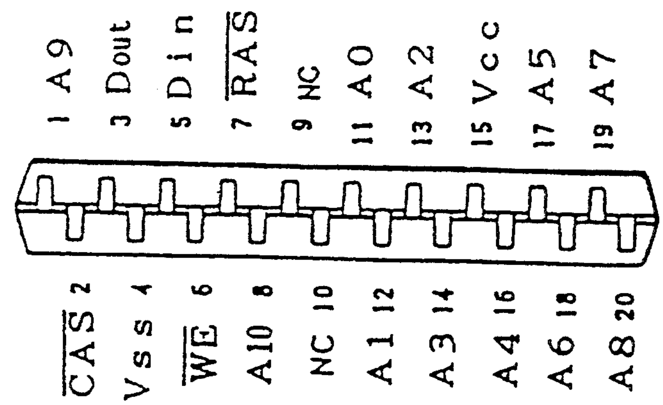

DIP

SOJ

ZIP

DIP (×1)

DIP (×4)

SOJ (X1, X4)

ZIP (×1)

ZIP (×4)

EARLY WRITE CYCLE

DELAYED WRITE CYCLE

FP READ CYCLE

OPEN TEST MODE SET CYCLE

VENDOR TEST MODE SETTING CYCLE

FIG. 44(a)
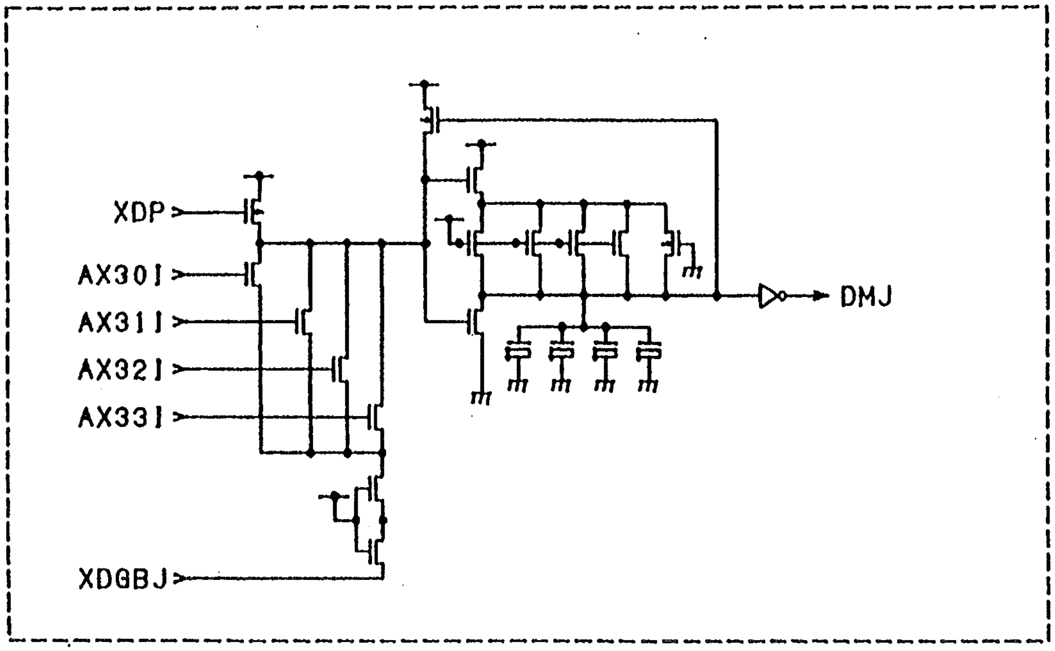
DECM
( C4 )
| | | | | | |
|---|---|---|---|---|---|
| AX30I | AX31I | AX32I | AX33I | XDGBJ | DMJ |
| AX30U | AX31U | AX32U | AX33U | XDG3B | DM3 |
| AX30U | AX31U | AX32U | AX33U | XDG1B | DM1 |
| AX30D | AX31D | AX32D | AX33D | XDG2B | DM2 |
| AX30D | AX31D | AX32D | AX33D | XDG0B | DM0 |
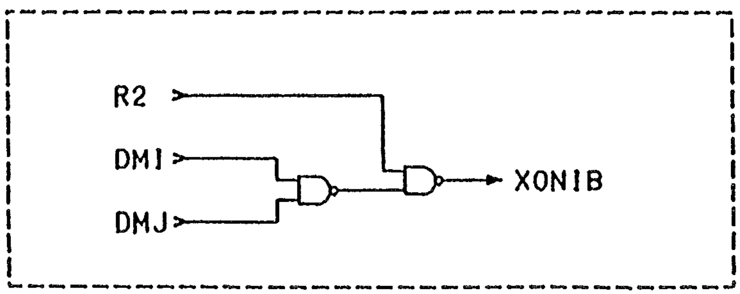
XONB
( C2 )
| | | |
|---|---|---|
| DMI | DMI | XONIB |
| DM1 | DM3 | XONUB |
| DM0 | DM2 | XONDB |

| | | |
|---|---|---|
| BX1I | BX2I | WC1D |
| BX1 | BX2 | WC0D |
| BX1B | BX2 | WC1D |
| BX1 | BX2B | WC2D |
| BX1B | BX2B | WC3D |

| | MSI | WC0I | WC1I | WC2I | WC3I | WC10B | WC11B | WC12B | WC13B |
|---|---|---|---|---|---|---|---|---|---|
| A | MS0 | WC0D | WC1D | WC2D | WC3D | WC00B | WC01B | WC02B | WC03B |
| B | MS2 | WC0D | WC1D | WC2D | WC3D | WC20B | WC21B | WC22B | WC23B |
| C | MS0 | WC0D | WC1D | WC2D | WC3D | WC40B | WC41B | WC42B | WC43B |
| D | MS2 | WC0D | WC1D | WC2D | WC3D | WC60B | WC61B | WC62B | WC63B |
| E | MS1 | WC0U | WC1U | WC2U | WC3U | WC10B | WC11B | WC12B | WC13B |
| F | MS3 | WC0U | WC1U | WC2U | WC3U | WC30B | WC31B | WC32B | WC33B |
| G | MS1 | WC0U | WC1U | WC2U | WC3U | WC50B | WC51B | WC52B | WC53B |
| H | MS3 | WC0U | WC1U | WC2U | WC3U | WC70B | WC71B | WC72B | WC73B |

XDGB
( C8 )

XRA
( C4 )

XRIJ
(A8)

| | |
|---|---|
| BXI | BXIB |
| BX1 | BX1B |
| BX2 | BX2B |
| BX3 | BX3B |
| BX4 | BX4B |
| BX5 | BX5B |
| BX6 | BX6B |
| BX7 | BX7B |
| BX8 | BX8B |

BXL1
( C8 )

XAB

AXNL
( C6 )

| BXK | BXI | BXJ | AXN0K~AXN3K |
|---|---|---|---|
| BX0B | BX3 | BX4 | AX30U~AX33U |
| BX0B | BX5 | BX6 | AX50U~AX53U |
| BX0B | BX7 | BX8 | AX70U~AX73U |
| BX0 | BX3 | BX4 | AX30D~AX33D |
| BX0 | BX5 | BX6 | AX50D~AX53D |
| BX0 | BX7 | BX8 | AX70D~AX73D |

PXAD

RFC

RC
( C10 )

| | | | |
|---|---|---|---|
| BXI | BXIB | CAI | CAJ |
| BX0 | BX0B | VCC | CA0 |
| BX1 | BX1B | CA0 | CA1 |
| BX2 | BX2B | CA1 | CA2 |
| BX3 | BX3B | CA2 | CA3 |
| BX4 | BX4B | CA3 | CA4 |
| BX5 | BX5B | CA4 | CA5 |
| BX6 | BX6B | CA5 | CA6 |
| BX7 | BX7B | CA6 | CA7 |
| BX8 | BX8B | CA7 | CA8 |
| BX9 | BX9B | CA8 | OPEN |

XCMP
( C8x4 )

| CYI | CYJ | ATI |
| --- | --- | --- |
| CY9CL | CYφ | AT2 |
| CY9CL | CY8C | AT3 |

<NIBBLE COUNTER>

TG(WTG)

FIG. 67(B)

| IOSL2 | | | | | IOS | | | | | |
|---|---|---|---|---|---|---|---|---|---|---|
| MSI | MSJ | DHI | DHIB | ZWPI | IOIJ | IOIJB | IOKL | IOKLB | HI | HIB |
| MSφU | MS1U | DHφ | DHφB | ZWPφ | I00L0 | I00L0B | I00L1 | I00L1B | Hφ | HφB |
| | | | | 1 | I00L2 | I00L2B | I00L3 | I00L3B | H1 | H1B |
| ↑ | ↑ | DH1 | DH1B | 2 | I00H0 | I00H0B | I00H1 | I00H1B | H2 | H2B |
| | | | | 3 | I00H2 | I00H2B | I00H3 | I00H3B | H3 | H3B |
| MS2U | MS3U | DHφ | DHφB | ZWPφ | I02L0 | I02L0B | I02L1 | I02L1B | Hφ | HφB |
| | | | | 1 | I02L2 | I02L2B | I02L3 | I02L3B | H1 | H1B |
| ↑ | ↑ | DH1 | DH1B | 2 | I02H0 | I02H0B | I02H1 | I02H1B | H2 | H2B |
| | | | | 3 | I02H2 | I02H2B | I02H3 | I02H3B | H3 | H3B |
| MSφU | MS1U | DH2 | DH2B | ZWP4 | I04L0 | I04L0B | I04L1 | I04L1B | H4 | H4B |
| | | | | 5 | I04L2 | I04L2B | I04L3 | I04L3B | H5 | H5B |
| ↑ | ↑ | DH3 | DH3B | 6 | I04H0 | I04H0B | I04H1 | I04H1B | H6 | H6B |
| | | | | 7 | I04H2 | I04H2B | I04H3 | I04H3B | H7 | H7B |
| MS2U | MS3U | DH2 | DH2B | ZWP4 | I06L0 | I06L0B | I06L1 | I06L1B | H4 | H4B |
| | | | | 5 | I06L2 | I06L2B | I06L3 | I06L3B | H5 | H5B |
| ↑ | ↑ | DH3 | DH3B | 6 | I06H0 | I06H0B | I06H1 | I06H1B | H6 | H6B |
| | | | | 7 | I06H2 | I06H2B | I06H3 | I06H3B | H7 | H7B |

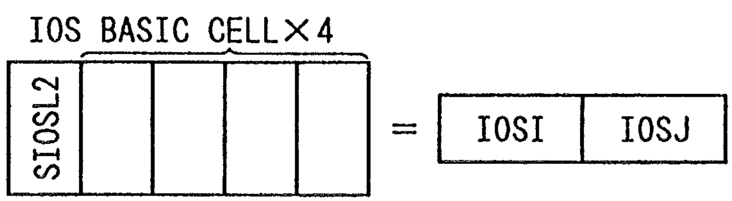

MAD (U)

| | AXYI | AYΦI | MKBI | ZMAI | ZWPI | HI | HIB | MOI | MOIB |
|---|---|---|---|---|---|---|---|---|---|
| MAΦ | AXYΦ | AYΦB | MKBΦ | ZMAΦ | ZWPΦ | HΦ | HΦB | MOΦ | MOΦB |
| 1 | ↑ | AYΦ | 1 | 1 | 1 | 1 | 1B | 1 | 1B |
| 2 | AXY1 | AYΦB | Φ | 2 | 2 | 2 | 2B | 2 | 2B |
| 3 | ↑ | AYΦ | 1 | 3 | 3 | 3 | 3B | 3 | 3B |
| 4 | AXY2 | AYΦB | 2 | 4 | 4 | 4 | 4B | 4 | 4B |
| 5 | ↑ | AYΦ | 3 | 5 | 5 | 5 | 5B | 5 | 5B |
| 6 | AXY3 | AYΦB | 2 | 6 | 6 | 6 | 6B | 6 | 6B |
| 7 | ↑ | AYΦ | 3 | 7 | 7 | 7 | 7B | 7 | 7B |

| | | | |
|---|---|---|---|
| AXYi | AYφ | MOi | CBi |
| AXYφ | AYφB | MOφ | CBφ |
| AXYφ | AYφ | MO1 | CBφ |
| AXY1 | AYφB | MO2 | CB1 |
| AXY1 | AYφ | MO3 | CB1 |
| AXY2 | AYφB | MO4 | CB2 |
| AXY2 | AYφ | MO5 | CB2 |
| AXY3 | AYφB | MO6 | CB3 |
| AXY3 | AYφ | MO7 | CB3 |

DHI

CBS (U8)

| CBI | CBIB | PDOI | PDOIB | DOI |
|---|---|---|---|---|
| CBφ | CBφB | PDOφ | PDOφB | IO1 |
| CB1 | CB1B | PDO1 | PDO1B | IO2 |
| CB2 | CB2B | PDO2 | PDO2B | DO/IO3 |
| CB3 | CB3B | PDO3 | PDO3B | IO4 |

DOB
(U4)

DOB

| CBi | A | | B | |
|---|---|---|---|---|
| | X1 | X4 | X1 | X4 |
| CBφ | VCC | OLB | VCC | DSB |
| CB1 | VCC | OLB | VCC | DSB |
| CB2 | OLB | OLB | DSB | DSB |
| CB3 | VCC | OLB | VCC | DSB |

| CBi | C | | D | |
|---|---|---|---|---|
| | X1 | X4 | X1 | X4 |
| CBφ | VCC | DOE | VSS | VCC |
| CB1 | VCC | DOE | VSS | VCC |
| CB2 | DOE | DOE | VCC | VCC |
| CB3 | VCC | DOE | VSS | VCC |

| DO/IOi | E | | F | |
|---|---|---|---|---|
| | X1 | X4 | X1 | X4 |
| IO1 | VSS | PDO0 | VSS | PDO0B |
| IO2 | VSS | PDO1 | VSS | PDO1B |
| DO/IO3 | PDO2 | PDO2 | PDO2B | PDO2B |
| IO4 | VSS | PDO3 | VSS | PDO3B |

FIG. 72
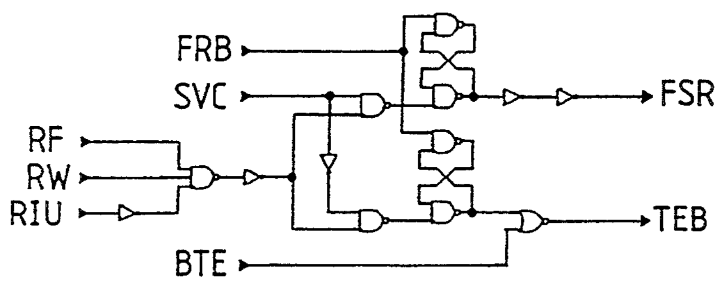
FSR (U)
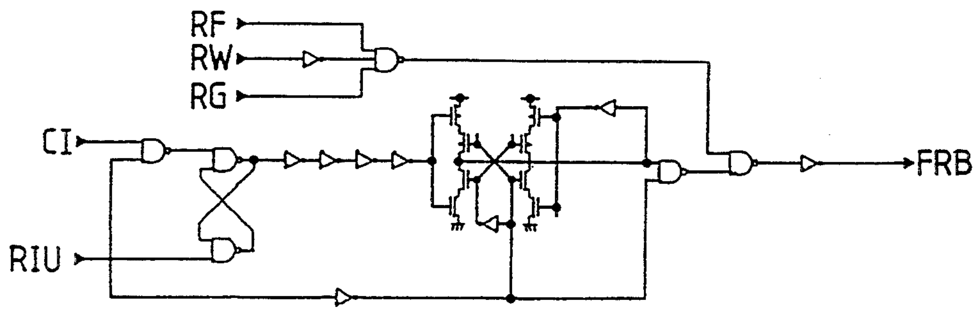
FR (U)
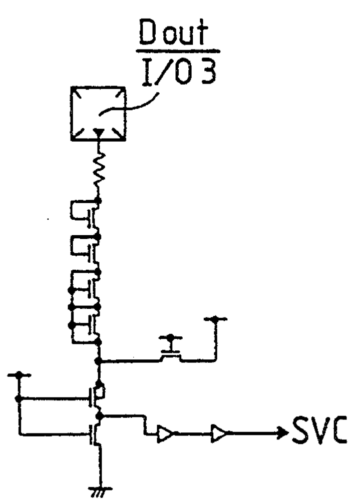
TST
SVC (U)

| MOi | MOj | TXi | MXi | TYi | TYiB |
|---|---|---|---|---|---|
| MOϕ | MO1 | TXϕ | MXϕ | TYϕ | TYϕB |
| MO2 | MO3 | TX1 | MX1 | TY1 | TY1B |
| MO4 | MO5 | TX2 | MX2 | TY2 | TY2B |
| MO6 | MO7 | TX3 | MX3 | TY3 | TY3B |

| MXI | TXI | TZI | CBI |
|---|---|---|---|
| MXϕ | TXϕ | TZϕ | CBϕ |
| MX1 | TX1 | TZ1 | CB1 |
| MX2 | TX2 | TZ2 | CB2 |
| MX3 | TX3 | TZ3 | CB3 |

FIG. 74
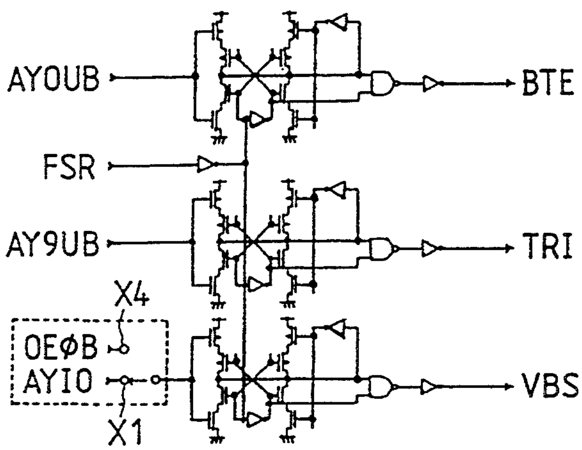
BTE
(U)
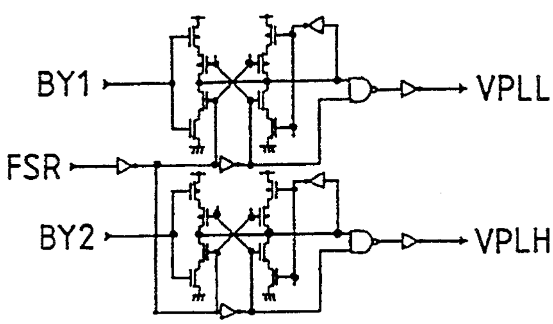
TST
RDNK
(D)
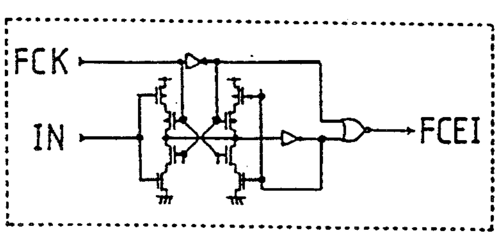
| IN | FCEI |
|---|---|
| BX5 | FCEφX |
| BX6 | FCE1X |
| BX7 | FCE2X |
| BX8 | FCE3X |
( C4 )
| IN | FCEI |
|---|---|
| BY2 | FCEφY |
| BY3 | FCE1Y |
| CY4 | FCE2Y |
| CY5 | FCE3Y |
( D4 )
FCE
(C4)
(D4)

FIG. 79
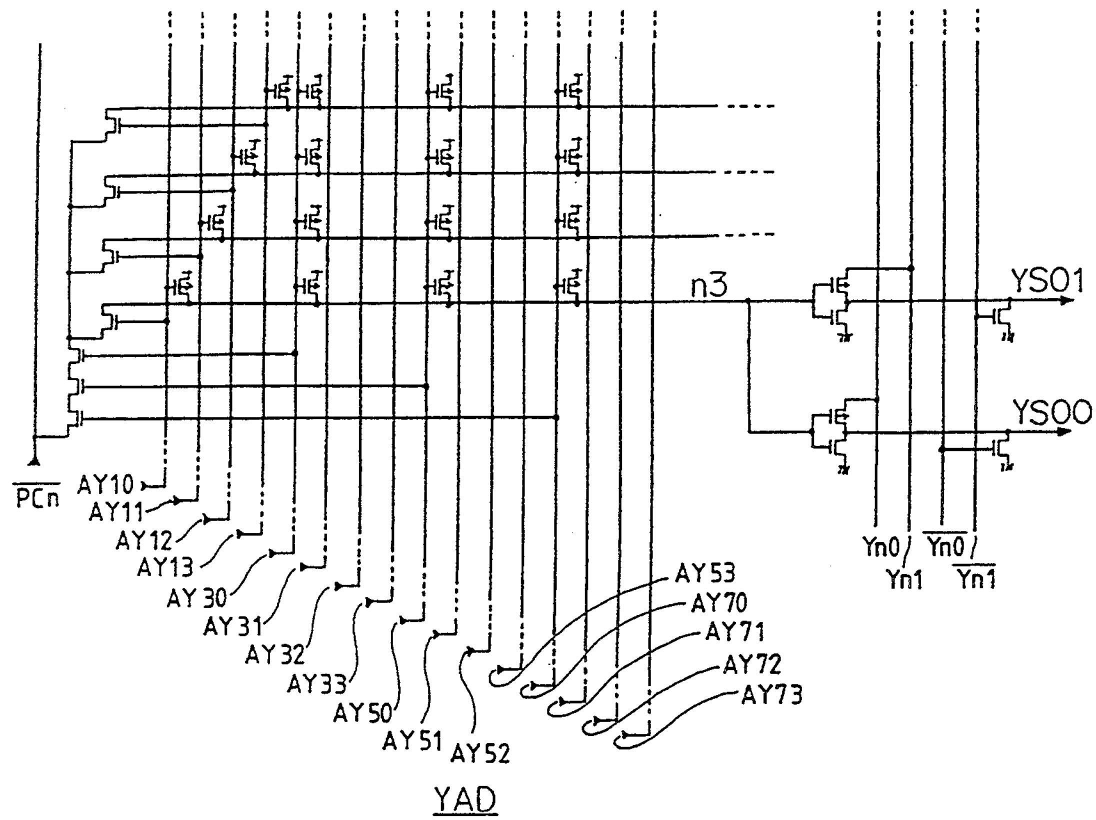
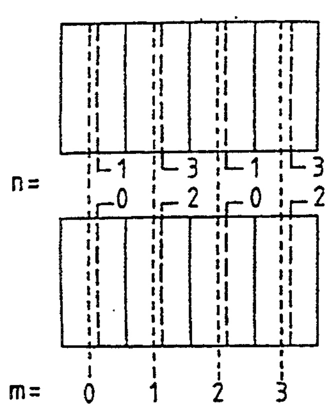
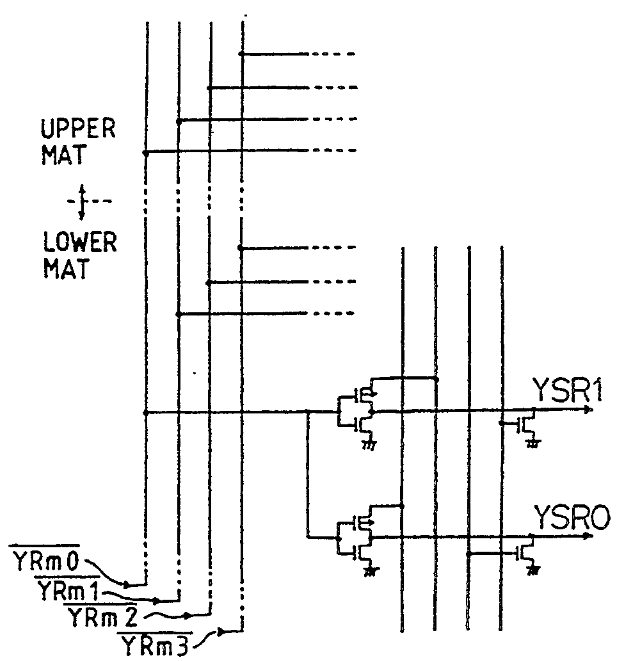

φXG : ( X1, X2 )
XAD : ( X3, X4, X5, X6, X7, X8 )
YAD : ( Y1, Y2, Y3, Y4, Y5, Y6, Y7, Y8 )

A-A' SECTION

B-B' SECTION

SEMICONDUCTOR MEMORY DEVICE WITH IMPROVED SUBSTRATE ARRANGEMENT TO PERMIT FORMING A PLURALITY OF DIFFERENT TYPES OF RANDOM ACCESS MEMORY, AND A TESTING METHOD THEREFOR

This is a continuation of application Ser. No. 496,280, filed Mar. 20, 1990, U.S. Pat. No. 5,217,917.

BACKGROUND OF THE INVENTION

The present invention relates generally to dynamic random access memories (DRAMs), and, more specifically, to improved arrangements for output buffers, protection circuits, semiconductor memory devices, type developing methods for such memory devices, layout methods and test methods which are particularly effective if applied to a dynamic RAM, although not limited thereto.

One example of a dynamic RAM (Random Access Memory) and its package mode are disclosed on pp. 55 to 57 and 15 to 24 of "Hitachi IC Memory Data Book" issued in June 1987 by Hitachi, Ltd.

In this previous dynamic RAM, which has plural package specifications, the lead frame for packaging a semiconductor substrate will have different optimum shapes for the individual shapes of the package. Thus, the bonding pads for coupling the lead frames and the semiconductor substrate accordingly have optimum layout positions different for the individual package shapes. As a result, in addition to the bit structures and the operation modes, a number of semiconductor substrates have previously had to be prepared corresponding to the different package shapes. This restricts the reduction in the cost for the dynamic RAM thereby blocking the efficient development of various types of DRAMs.

OBJECTS AND SUMMARY OF THE INVENTION

A major object of the present invention is to provide a semiconductor memory device such as a dynamic RAM intended for efficient development of various kinds or types of DRAMs.

Another major object of the present invention is to provide an output buffer and a protection circuit, which are intended to have their operations speeded up and stabilized, and several layout methods and test methods which are suited for the semiconductor memory device or the dynamic RAM.

A further object of the present invention is to promote the reduction in the cost for the semiconductor memory device such as the dynamic RAM while enhancing its performance and reliability.

A further object of the present invention is to provide a semiconductor device which can speed up its address access.

A summary of representative features of the invention to be disclosed herein will be described in the following.

In a dynamic RAM having a plurality of package specifications, there is prepared and shared among the plural package specifications a common semiconductor substrate comprising: a plurality of bonding pads arranged in optimum positions for the individual package shapes; a plurality of buffers provided for those bonding pads; and a control bonding pad for validating the plural buffers, i.e., the plural bonding pads, selectively by executing the corresponding predetermined bonding treatments selectively. Moreover, the memory array such as the dynamic RAM is divided into at least four portions and arranged by two center lines in parallel with the shorter and longer sides of the semiconductor substrate surface, and a peripheral circuit including an X-system selection circuit is arranged along the center line in parallel with the shorter sides of the semiconductor substrate surface whereas another portion of the peripheral circuit is arranged outside of the memory array and in parallel with the individual shorter sides of the semiconductor substrate surface. At this time, a power supply trunk line is constructed of: a first power supply line arranged along the center line in parallel with the longer sides with the semiconductor substrate surface; and a plurality of power supply lines arranged along each peripheral circuit and coupled by the first power supply line.

As a result, different kinds of the semiconductor memory device such as the dynamic RAM having plural package specifications can be efficiently developed, and the signal transmission delay time can be shortened while suppressing the power supply noises and reducing the area necessary for the layout, so that the operations of the dynamic RAM can be speeded up and stabilized. Thus, the performance and reliability of the dynamic RAM can be enhanced while promoting the cost reduction of the same.

In a semiconductor device comprising: dynamic memory cell regions formed at the two longitudinal ends over a rectangular chip; a peripheral circuit formed at a a central portion of the rectangular chip; and I/O lines joining I/O and address pads formed at the longitudinal two ends of the chip and arranged in the dynamic memory cell regions and in parallel with word lines formed in the dynamic memory cells, the dynamic memory cell regions are formed such that the word lines are in parallel with the longer sides of the chip.

Since the dynamic memory cell regions are so formed that the word lines are in parallel with the longer sides of the chip, the I/O lines arranged in parallel with the word lines in the dynamic memory cell regions are also in parallel with the longer sides of the chip in said regions. By connecting the I/O lines straight in the memory cell regions divided and arranged at the two ends, the length of the I/O lines taken in the shorter sides of the chip can be made no more than the length between the two ends of the memory cell regions taken in the shorter sides of the chip without elongating the I/O lines in the longer sides of the chip. As a result, the I/O lines can be shortened to speed up the address access.

BRIEF DESCRIPTION OF THE DRAWINGS

FIGS. 5 and 6 are terminal arrangement diagrams for the packages shown in FIG. 4;

FIGS. 42 to 79 are circuit diagrams showing one embodiment of the specific circuit structure of each of the portions of the invention shown in FIGS. 1 to 3.

DETAILED DESCRIPTION

1.1. Fundamental Structure or Method and Its Features

1.1.1. Block Structures

Figure 1:
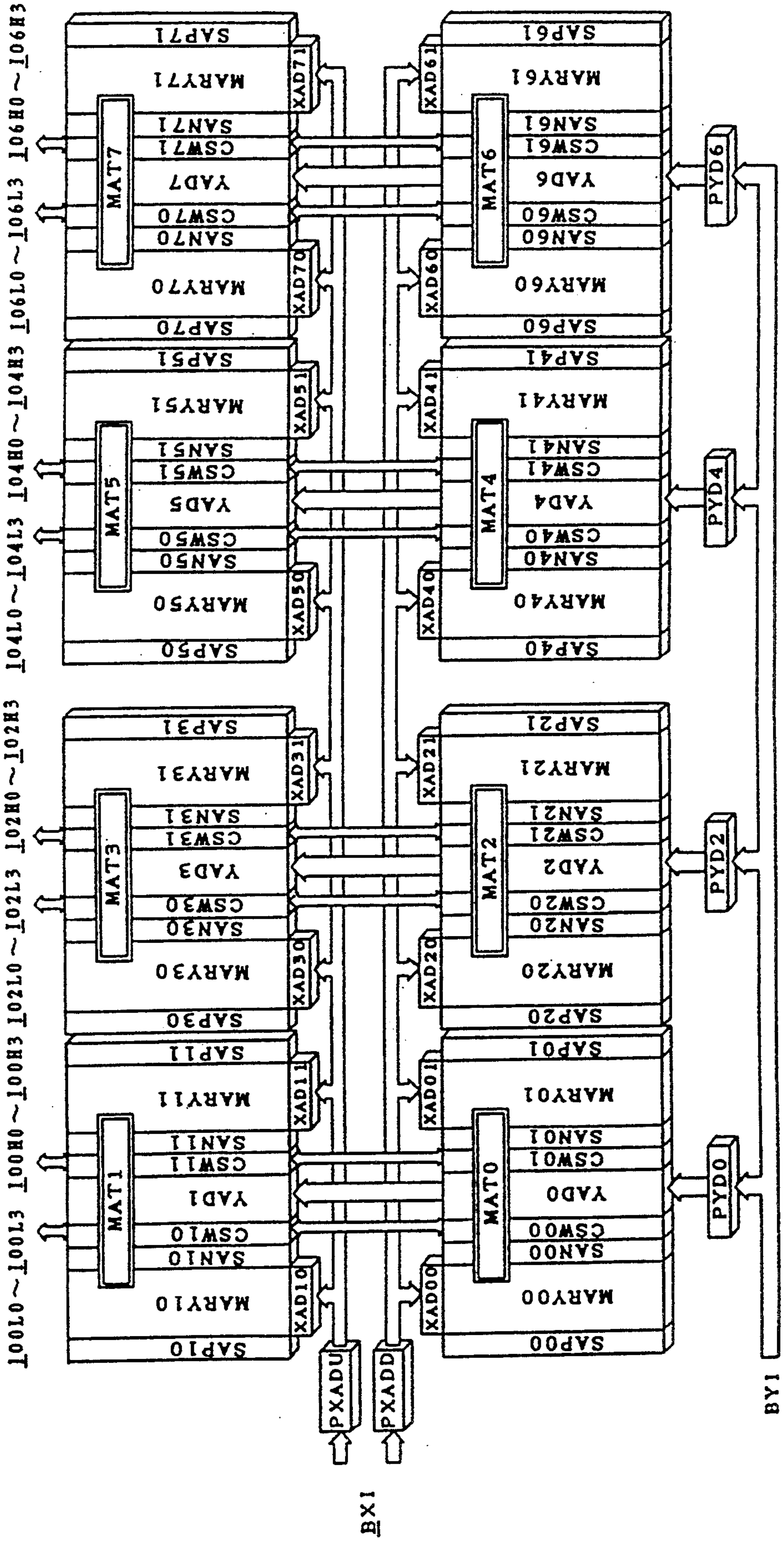
FIGS. 1 to 3 are block diagrams showing an overall structure of one embodiment of the dynamic RAM according to the present invention.
Figure 2:
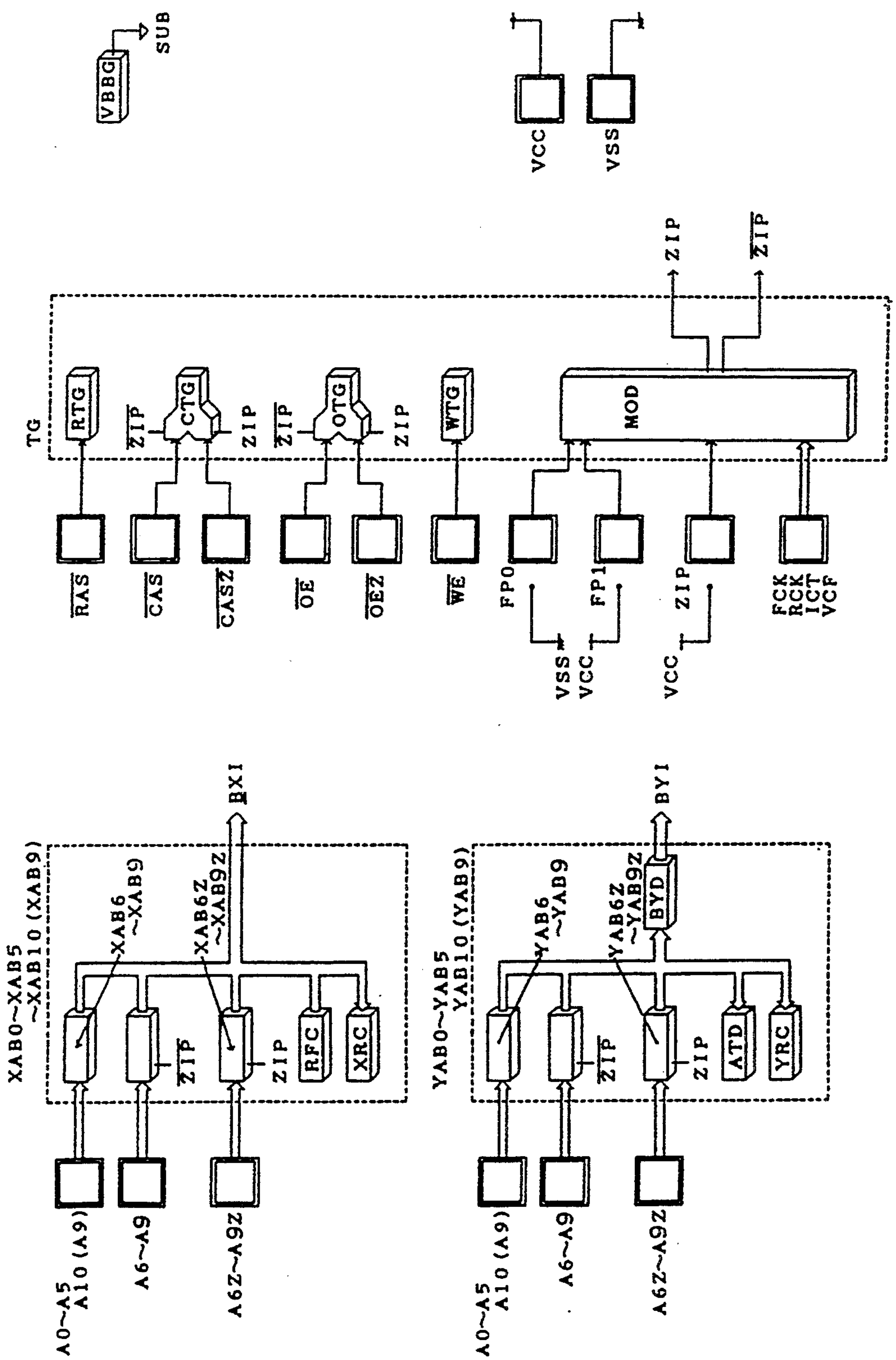
Figure 3:
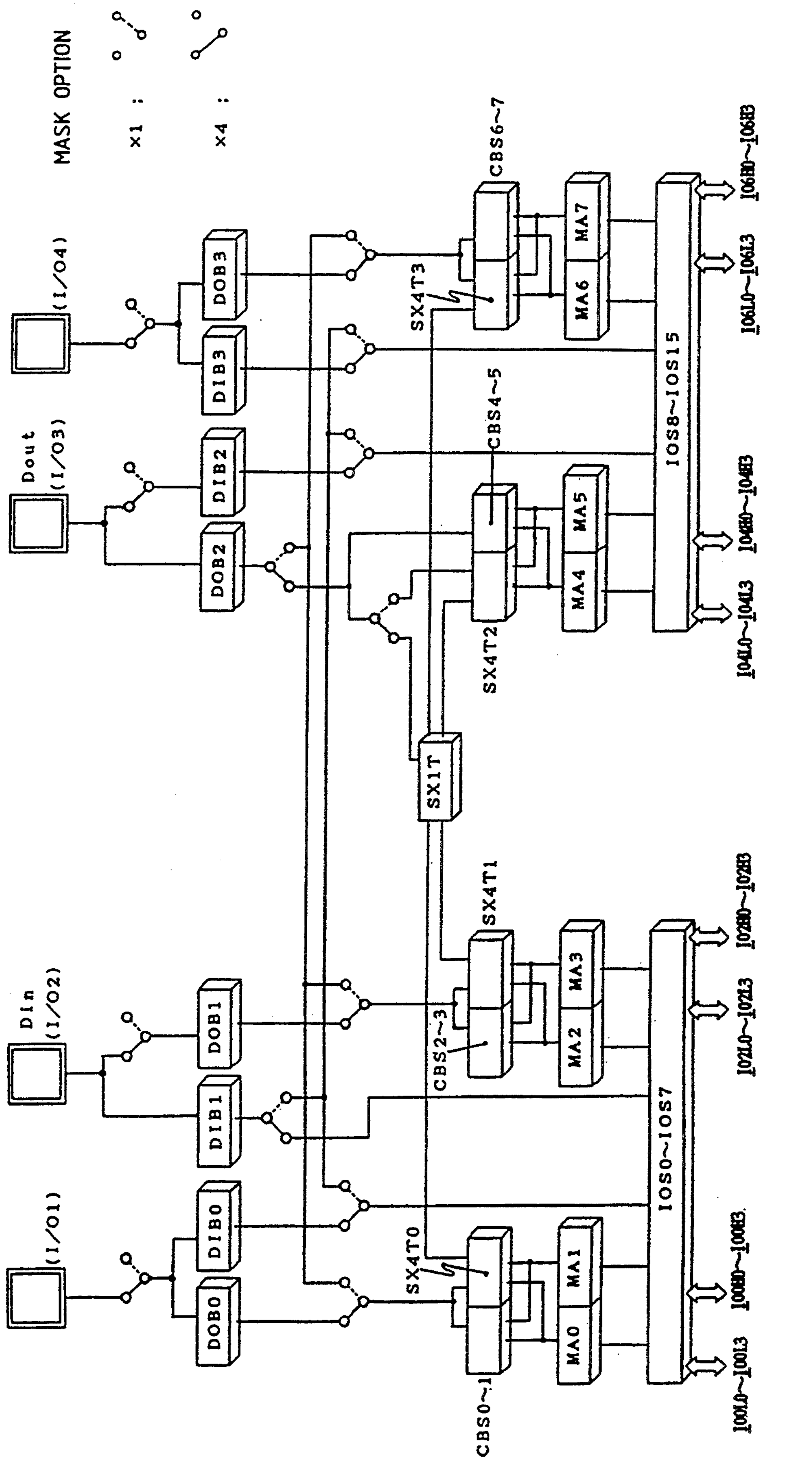

FIG. 1 is a block diagram showing one embodiment of the input portion of a dynamic RAM according to the present invention. Moreover, FIGS. 2 and 3 are block diagrams showing embodiments of the memory array of the dynamic RAM and the direct peripheral circuit and output portion of the same, respectively. The circuit elements constituting the individual blocks of FIGS. 1 to 3 are formed over one semiconductor substrate made of a P-type single-crystal silicon, although not especially limitative thereto. In FIGS. 1 to 3 and other Figures, signals lines for input or output signals are indicated to start from bonding pads formed over the semiconductor substrate surface. In these Figures, moreover, the dynamic RAM is basically shown in the so-called "x 1 bit structure" in which the memory data are inputted or outputted at the unit of 1 bit, and the so-called "x 4 bit structure" for inputting or outputting the memory data at the unit of 4 bits is shown in the parenthesized shape.

In FIG. 2, the dynamic RAM is fed from outside memory control units with a row address strobe signal $\overline{RAS}$ acting as a start control signal, a column address strobe signal $\overline{CAS}$ and a write enable signal $\overline{WE}$ (and an output enable signal $\overline{OE}$ in the case of the x 4 bit structure), although not especially limitative thereto. These start control signals are fed to a $\overline{RAS}$-system control circuit RTG, a $\overline{CAS}$-system control circuit CTG, a $\overline{WE}$ control circuit WTG and a data output control circuit OTG of a timing generator TG, respectively. On the other hand, eleven (or ten in the case of the x 4 bit structure) address input terminals A0 to A10 (or A0 to A9) are fed in a time sharing manner with X address signals X0 to X10 (or X0 to X9) and Y address signals Y0 to Y10 (or Y0 to Y9). These address signals are fed to the corresponding unit circuits of X-address buffers XAB and Y-address buffers YAB.

As will be described hereinafter, the dynamic RAM of this embodiment is classified into twenty one kinds of products (although not limited thereto) in accordance with their bit structures, operation modes and package shapes, and a common semiconductor substrate is prepared for all the product types. Of the bonding pads to be formed over the semiconductor substrate surface, therefore, some of the pads shown in Table 1 are used for different applications depending upon the bit structure of the dynamic RAM, and some of the pads shown in Table 2 are arranged in different positions depending upon the package shapes of the dynamic RAM. In this embodiment, for the pads enumerated in Table 2, there are prepared a plurality of different input buffers or unit circuits, which are arranged in the vicinity of the corresponding ones of the pads. The semiconductor substrate is formed additionally with a pad ZIP for designating the package shape of the dynamic RAM and pads FP0 and FP1 for designating the operation modes, although not especially limitative thereto. By executing the bonding treatments of those pads selectively, the package shape or operation mode of the dynamic RAM is selectively designated, as will be described hereinafter. At this time, the aforementioned plural input buffers and unit circuits are selectively activated in accordance with the internal signal ZIP, which is formed by the bonding treatment to the pad ZIP, or its inverted internal signal $\overline{ZIP}$ so that the corresponding pad is selectively useful.

TABLE 1

| Bit Structures | |
|---|---|
| × 1 | × 4 |
| — | I/O 1 |
| Din | I/O 2 |
| Dout | I/O 3 |
| — | I/O 4 |

TABLE 1-continued

| Bit Structures | |
|---|---|
| × 1 | × 4 |
| A9 | $\overline{OE}$ |
| A10 | A9 |

TABLE 2

| Package Shapes | |
|---|---|
| DIP · SOJ | ZIP |
| $\overline{CAS}$ | $\overline{CASZ}$ |
| A6 | A6Z |
| A7 | A7Z |
| A8 | A8Z |
| A9 ($\overline{OE}$) | A9Z ($\overline{OEZ}$) |

In FIG. 1, the dynamic RAM is equipped with eight memory mats MAT0 to MAT7, although not especially limitative thereto. These memory mats individually include corresponding Y-address decoders YAD0 to YAD7, and two memory arrays MARY00 and MARY01 to MARY70 and MARY71 arranged across the Y-address decoders YAD0 to YAD7, and their direct peripheral circuits. In this embodiment, the memory mats MAT0 and MAT1 to MAT6 and MAT7 are paired and symmetrically arranged across the corresponding X-system selection circuits, as can be analogized, although not especially limitative thereto. Each memory mat is equipped with four common I/O lines for each memory array, namely, totally eight common I/O lines, each of which is arranged to extend through the paired two memory mats. Moreover, two of these memory mats are simultaneously rendered operative in another predetermined combination so that four memory arrays are simultaneously brought into the selected states. Two memory cells are then simultaneously selected from the four memory arrays in the selected states so that a total of eight memory cells are actually simultaneously selected, and these are connected with the corresponding eight pairs of common I/O lines.

In FIG. 3, the common I/O lines IO0L0 to IO0L3 and IO0H0 to IO0H3 through IO6L0 to IO6L3 and IO6H0 to IO6H3 (wherein an uninverted common I/O line IO0L0 and an inverted common I/O line $\overline{IO0L0}$ are expressed together as the common I/O line IO0L0 like the following complementary signal lines), which are to be coupled to the memory mats MAT0 and MAT1 to MAT6 to MAT7, are coupled to common I/O line selection circuits IOS0 to IOS15. The eight memory cells connected with the corresponding common I/O lines by the aforementioned selecting operations are selectively connected through the corresponding common I/O line selection circuits IOS0 to IOS15 to data input buffers DIB0 to DIB3 or main amplifiers MA0 to MA7. Moreover, these main amplifiers MA0 to MA7 are selectively connected with data output buffers DOB0 to DOB3. As a result, the write or read operations of the designated one or four memory cells are selectively executed.

The summary and features of the specific structures and operations of each block of the dynamic RAM will be described in detail hereinafter.

1.1.2. Product Types

Table 3 enumerates product types of one embodiment of the dynamic RAM according to the present invention. The dynamic RAM of this embodiment is classified into totally twenty-one product types according to the bit structures, operation modes and package shapes. Specifically, the dynamic RAM is first classified into two kinds of x 1 and x 4 bits, as tabulated in Table 3, according to its bit structures. Of these kinds, the type of x 1 bit structure is classified into three kinds of fast page mode, static column mode and nibble mode according to the operation modes, and the type of x 4 bit structure is classified into four kinds of fast page mode and static column mode having no masked write mode function and first page mode and static column mode having the masked write mode. Three kinds of package shapes of DIP, SOJ and ZIP are prepared for the individual ones of the above-specified seven product types to thereby arrive at the total of twenty-one product types.

TABLE 3

| Type | Bit Structure | Operation Mode FP | SC | NB | MW | Package |
|---|---|---|---|---|---|---|
| 1 | × 1 | ○ | | | | DIP, SOJ, ZIP |
| 2 | | | ○ | | | |
| 3 | | | | ○ | | |
| 4 | × 4 | ○ | | | | |
| 5 | | ○ | | | ○ | |
| 6 | | | ○ | | | |
| 7 | | | ○ | | ○ | |

Figure 4A:
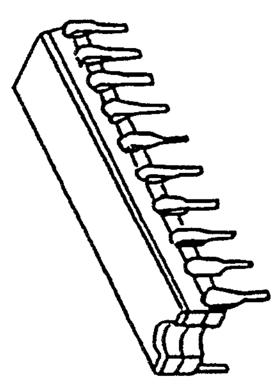
FIG. 4 is an external view showing packages which can be used for the dynamic RAM according to the present invention.
Figure 4B:
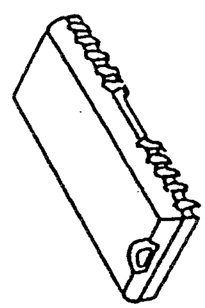
Figure 4C:
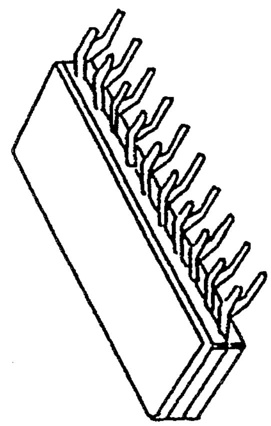

FP: Fast Page Mode
SC: Static Column Mode
NB: Nibble Mode
MW: Masked Write Mode 1.1.3. Package Shapes FIG. 4 is an external view showing one embodiment of the dynamic RAM according to the present invention. The dynamic RAM of this embodiment is prepared with three kinds of aforementioned package specifications DIP, SOJ and ZIP, as shown at (a), (b) and (c) in FIG. 4.

Figure 6A:
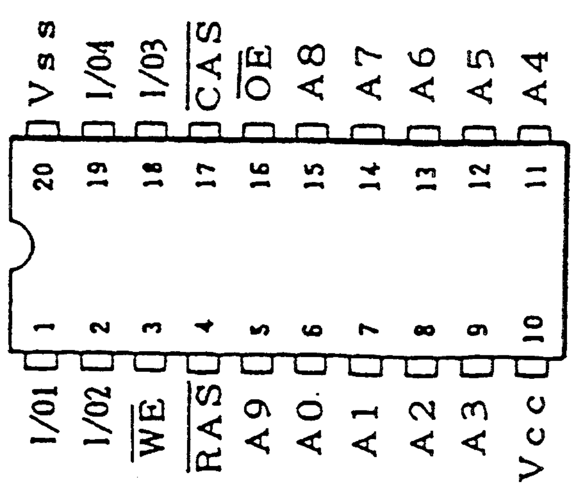
Figure 6B:
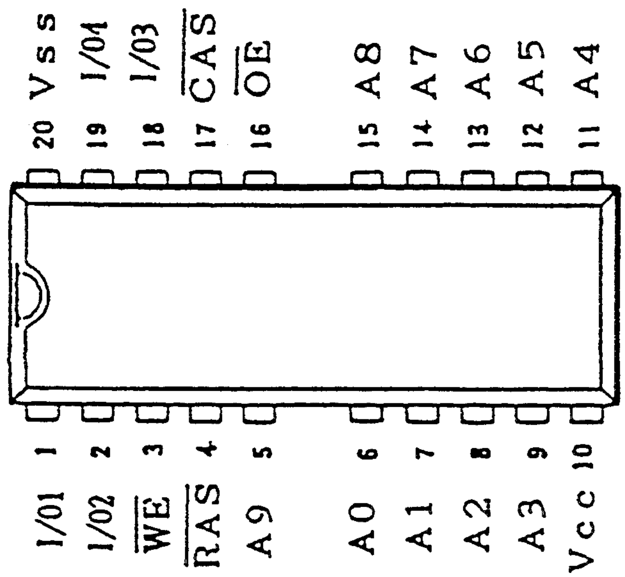
Figure 6C:
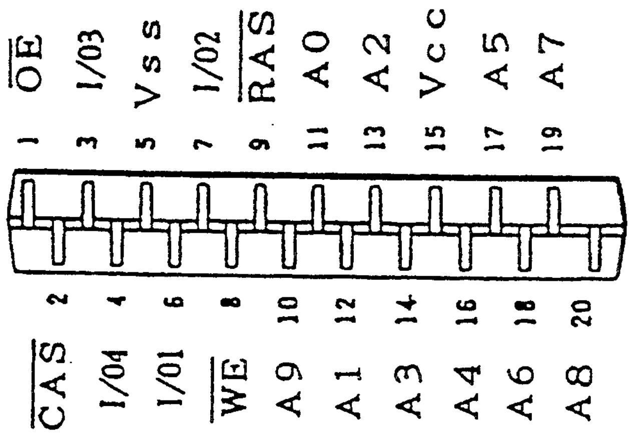

FIG. 5 presents terminal arrangements of one embodiment of the dynamic RAM of the x 1 bit structure according to the present invention. FIG. 6 presents terminal arrangements of the dynamic RAM of the x 4 bit structure according to the present invention. Moreover, Table 4 enumerates the names and functions of the external terminals shown in the terminal arrangements of FIGS. 5 and 6. Incidentally, in FIGS. 5 and 6, the DIP and SOJ packages at (a) and (b) are taken downward, and the ZIP package at (c) are taken upward.

TABLE 4

| Terminal Name | Function |
|---|---|
| A0–A10 | Address Input (× 1) |
| A0–A9 | Address Input (× 4) |
| Din | Data Input (× 1) |
| Dout | Data Output (× 1) |
| I/O1–I/O4 | Data Input/Output (× 4) |
| $\overline{RAS}$ | Row Address Strobe |
| $\overline{CAS}$ | Column Address Strobe |
| $\overline{WE}$ | Write Enable |
| $\overline{OE}$ | Output Enable (× 4) |
| VCC | Power Supply Voltage (+5 V) |

TABLE 4-continued

| Terminal Name | Function |
|---|---|
| VSS | Ground Potential |

Figure 7:
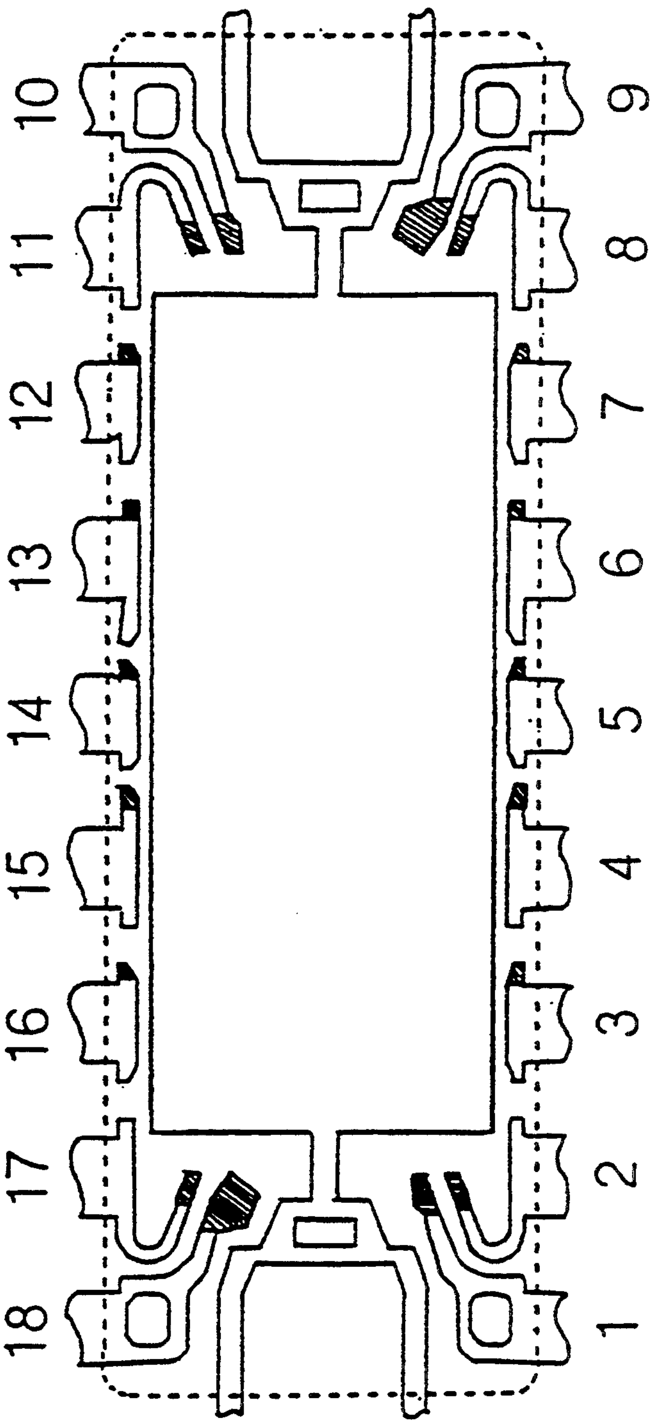
FIGS. 7 to 11 are external views showing a lead frame for the terminal arrangements shown in FIGS. 5 and 6.
Figure 8:
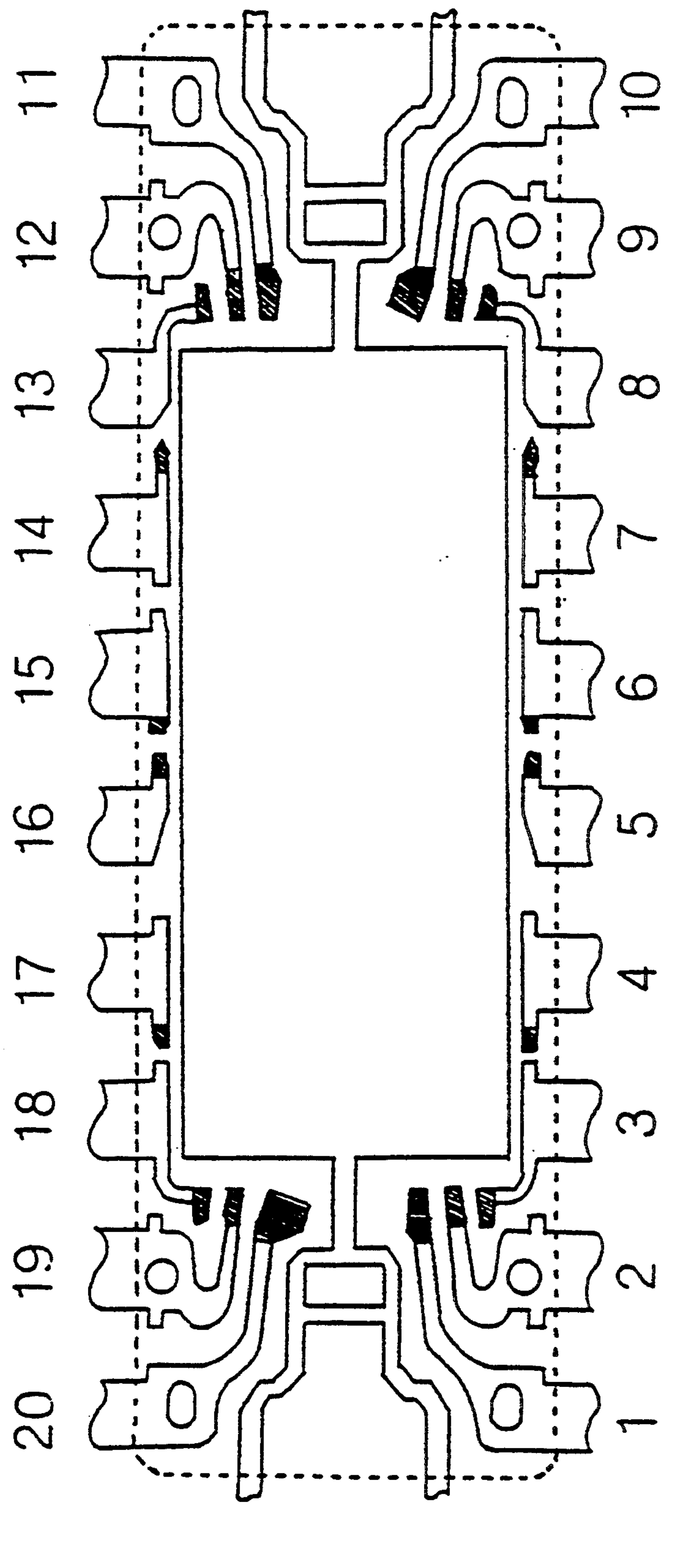
Figure 9:
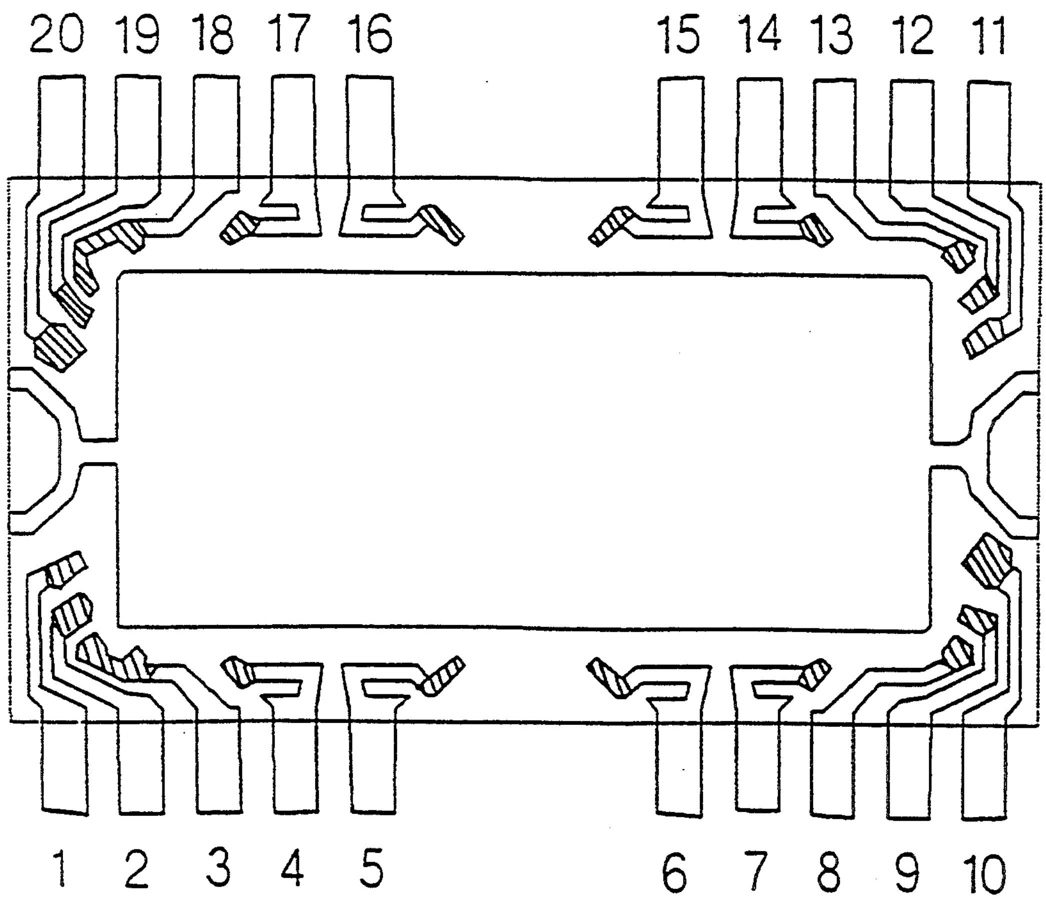
Figure 10:
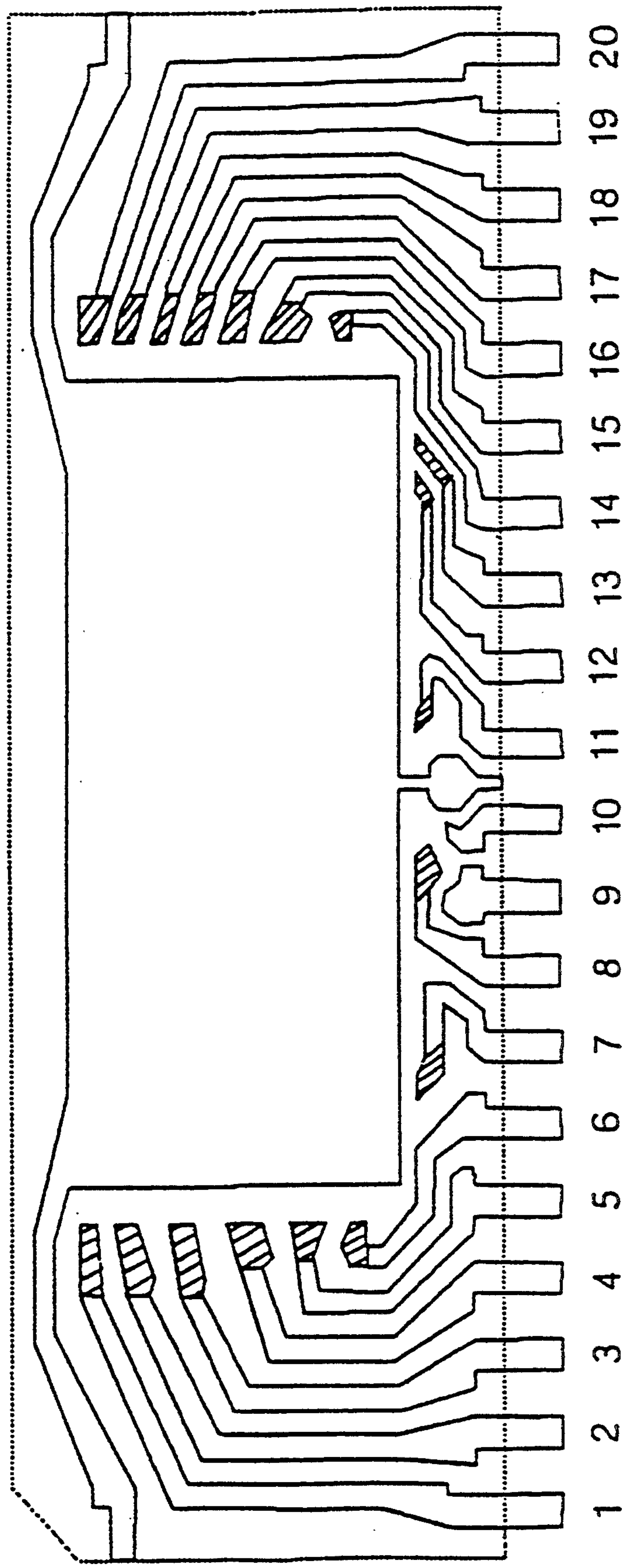
Figure 11:
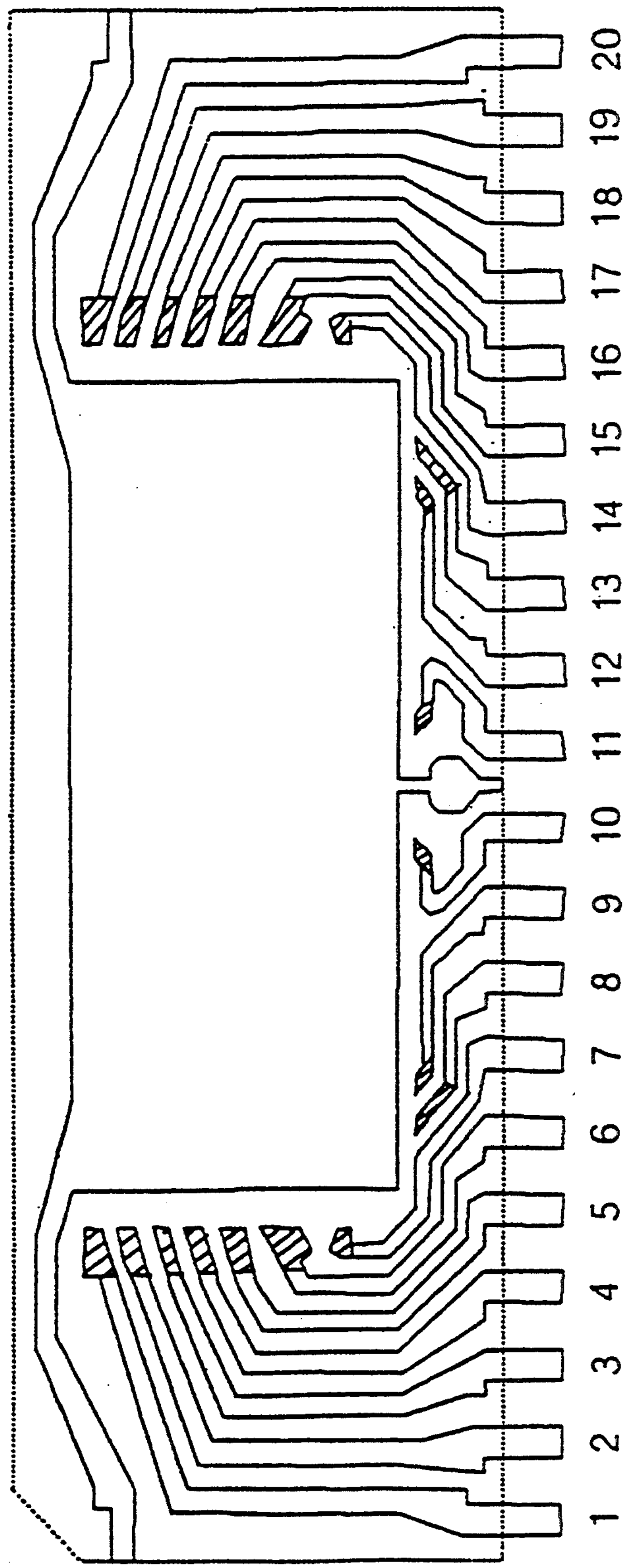

FIGS. 7 to 11 are top plan views showing the portions of lead frames to be used in the individual package specifications of the dynamic RAM according to the present invention. Of these, the lead frame of FIG. 7 is used in the dynamic RAM of the DIP package and the x 1 bit structure, and the lead frame of FIG. 8 is used in the dynamic RAM of the DIP package and the x 4 bit structure. Likewise, the lead frame of FIG. 9 is shared between the dynamic RAMs of the SOJ package and the x 1 bit and x 4 bit structures, and the lead frames of FIGS. 10 and 11 are used for the dynamic RAMs of the ZIP package and the x 1 and x 4 bit structures. In FIGS. 7 to 11, the leading end portions of the hatched lead frames indicate the bonding posts for bonding the wires.

In the cases of the DIP and SOJ packages, as shown in FIGS. 7 to 9, the individual lead frames are radially extended toward the corresponding external terminals. In the case of the ZIP package, however, the lead frames are extended from the three sides excepting the upper one toward the external terminals, which are arranged at one side of the package, and the upper side has none of the bonding posts as shown in FIGS. 10 and 11.

Figure 12:
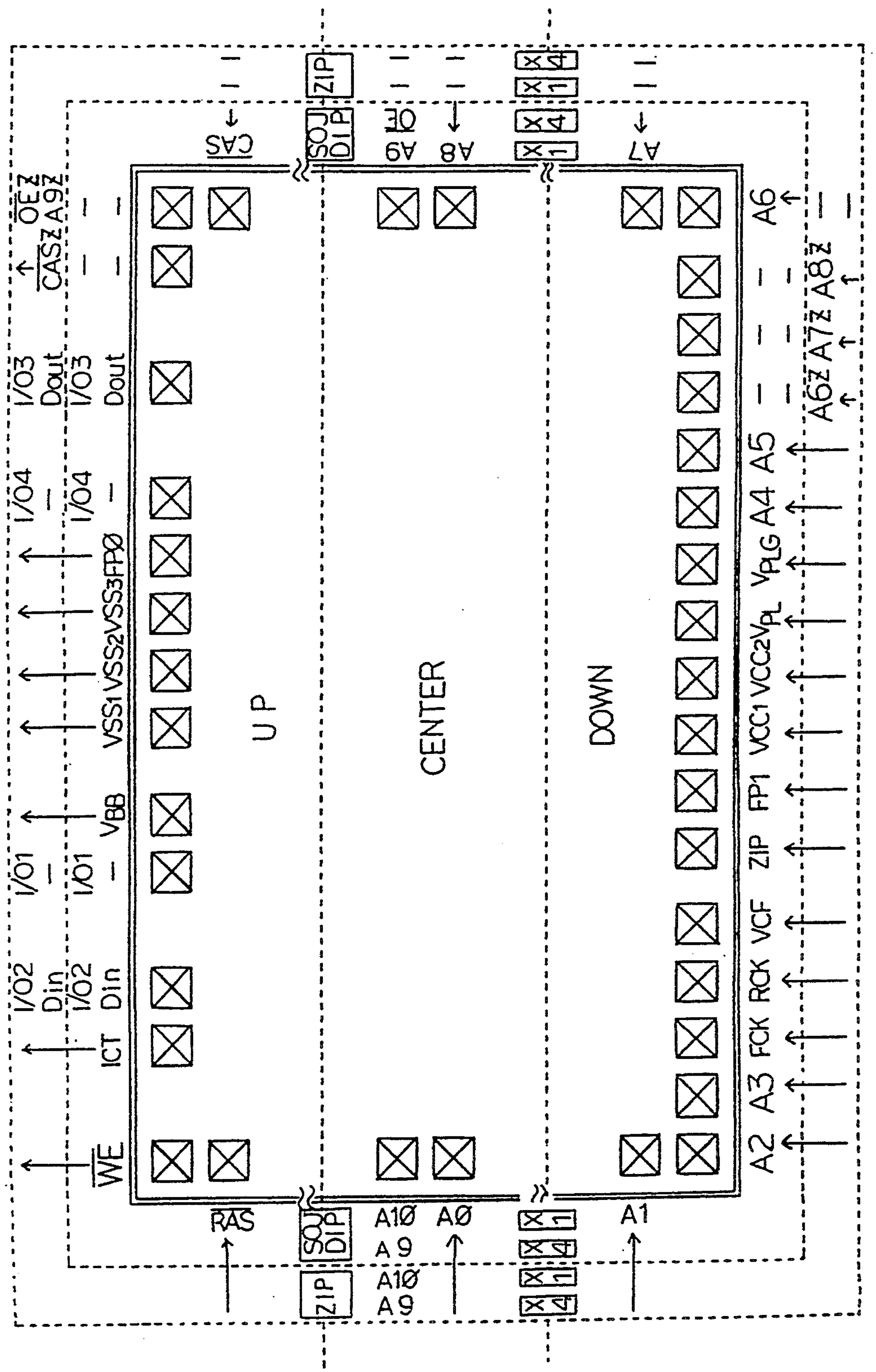
FIG. 12 is a pad arrangement diagram showing an embodiment of the present invention.

In FIG. 12, on the other hand, there is presented a pad arrangement diagram showing one embodiment of a common semiconductor substrate of the dynamic RAM according to the present invention. On the other hand, Table 5 enumerates the names and functions of the bonding pads shown in FIG. 12. In FIG. 12, the names of the pads to be used in the dynamic RAM of the DIP and SOJ package specifications are written inside of broken lines, and the names of the pads to be used in the dynamic RAM of the ZIP package specifications are written outside of the same. In FIG. 12, moreover, the righthand side of the semiconductor substrate surface corresponds to the upper side of the lead frame of the dynamic RAM of the ZIP specifications shown in FIGS. 10 and 11.

In case the dynamic RAM is of the ZIP package specifications, as has been described hereinbefore, the upper side of the lead frame is not formed with the bonding posts. As is apparent from FIG. 12, therefore, the pads $\overline{CAS}$ and A6 to A9 ($\overline{OE}$) disposed at the righthand side of the semiconductor substrate surface are replaced by pads $\overline{CASZ}$ and A6Z to A9Z ($\overline{OEZ}$) disposed at the upper and lower sides of the semiconductor substrate surface.

TABLE 5

| Pad Name | Function |
|---|---|
| A0–A10 (A0–A9) | Address Input |
| A6Z–A9Z | ditto (for ZIP) |
| Din | Data Input (× 1) |
| Dout | Data Output (× 1) |
| I/O1–I/O4 | Data Input/Output (× 4) |
| $\overline{RAS}$ | Row Address Strobe |
| $\overline{CAS}$ | Column Address Strobe |
| ($\overline{CASZ}$) | (ditto for ZIP) |
| $\overline{WE}$ | Write Enable |
| $\overline{OE}$ | Output Enable (× 4) |
| ($\overline{OEZ}$) | (ditto for ZIP) |
| VCC1–VCC2 | Power Supply Voltage (+5 V) |
| VSS1–VSS3 | Ground Potential |
| FP0, FP1 | Switching of Operation Modes |
| ZIP | Switching of Package Specs. |
| ICT, VBB, VPLG, VPL, FCK, VCF, RCK | for Various Probe Tests |

1.1.4. Type Developing Method

The dynamic RAM of this embodiment is classified into a total of twenty-one product types in accordance with their bit structures, operation modes and package shapes, as has been described hereinbefore. In this embodiment, therefore, any product type can be selectively realized by preparing a semiconductor substrate to be shared by all the twenty one product types, and by changing a portion of the photo mask for the semiconductor substrate or by executing the bonding treatment selectively for a predetermined pad. As a result, the dynamic RAM having the aforementioned twenty-one product types can be efficiently provided on the basis of the single common semiconductor substrate.

(1) Switching of Bit Structures

In the dynamic RAM of this embodiment, two kinds of x 1 and x 4 bit structures are prepared, as has been described hereinbefore. The switching of these bit structures cannot be accomplished at portions other than the portion in which the rate of the access time of the dynamic RAM is relatively determined, as is well known in the art. In this embodiment, therefore, the switching of the bit structures is realized by changing the photo mask partially at the individual connection switching points, as enclosed by broken lines in the circuit diagrams of FIGS. 50, 57, 58, 63, 66, 70, 71, 73 and 75, and by forming a coupling wiring line made of second aluminum layer selectively.

(2) Switching of Operation Modes

For the dynamic RAM of this embodiment, a total of seven kinds, based substantially on five different kinds, of operation modes can be provided, as has been enumerated in the foregoing Table 3 (although the invention is not limited to this). The switching of these operation modes can be accomplished at the portion in which the rate of the access time of the dynamic RAM is not relatively determined. In this embodiment, therefore, the common semiconductor substrate surface is equipped with the operation mode switching pads FP0 and FP1, as shown in FIG. 12 and enumerated in Table 5. By executing the bonding treatments selectively for those pads, the operation mode of the dynamic RAM can be selectively designated.

Table 6 enumerates the relations between the bonding treatments for the pads FP0 and FP1 and the operation modes of the dynamic RAM.

In case the dynamic RAM is made to have the x 1 bit structure, it is in the fast page mode on condition that neither the pad FP0 nor the pad FP1 is bonded, as enumerated in Table 6. Moreover, the dynamic RAM is brought into the static column mode, on condition that only the pad FP1 is bonded to the power supply voltage VCC of the circuit, and into the nibble mode on condition that only the pad FP0 is bonded to the ground potential VSS of the circuit, although not especially limitative thereto.

TABLE 6

| Bit Structure | Pad FP0 | Pad FP1 | Operation Mode FP | SC | NB | MW |
|---|---|---|---|---|---|---|
| × 1 | — | — | ○ | | | |
| | — | VCC | | ○ | | |
| | VSS | — | | | ○ | |
| × 4 | — | — | ○ | | | |
| | — | VCC | | ○ | | ○ |
| | VSS | — | ○ | | | |
| | VSS | VCC | | ○ | | ○ |

FP: Fast Page Mode
SC: Static Column Mode
NB: Nibble Mode
MW: Masked Write Mode

In case, on the other hand, the dynamic RAM is made to have the x 4 bit structure, it is brought into the fast page mode accompanied by no masked write mode function, on condition that neither the pad FP0 nor the pad FP1 is bonded, and into the static column mode accompanied by no masked write mode function, on condition that the pad FP1 is bonded to the power supply voltage VCC of the circuit, although not especially limitative thereto. Moreover, the dynamic RAM is brought into the fast page mode accompanied by the masked write mode function, on condition that the pad FP0 is bonded to the ground potential VSS of the circuit, and into the static column mode accompanied by the masked write mode function on condition that the pad FP1 is bonded to the power supply voltage VCC of the circuit.

The specific contents of the individual operation modes will be described in detail hereinafter.

(3) Switching of Package Specifications

The dynamic RAM of this embodiment is prepared with three kinds of package specifications, as has been described hereinbefore. Of these specifications, the DIP and SOJ packages and the ZIP package are different in their optimum arrangement positions of the bonding pads. In this embodiment, therefore, the pads for inputting the column address strobe signal $\overline{CAS}$ and the address signals A6 to A9 (or the output enable signal $\overline{OE}$ in the case of the x 4 bit structure) are exemplified by the pads $\overline{CAS}$ and A6 to A9 ($\overline{OE}$) arranged at the positions suited for the DIP and SOJ packages and by the pads $\overline{CASZ}$ and A6Z to A9Z ($\overline{OEZ}$) arranged at the positions suited for the ZIP package, as shown in FIG. 12 and enumerated in Table 5. On the other hand, the $\overline{CAS}$-system control circuit CTG and the individual address buffers (i.e., the data output control circuit OTG of the timing generator TG in the case of the x 4 bit structure) of the timing generator TG are equipped with input buffers or unit circuits corresponding to the pads, respectively, which are arranged in the vicinity of the corresponding pads. Those plural input buffers or unit circuits are selectively validated by providing the package specification switching pad ZIP and by executing the bonding treatments selectively for those pads, so that the package specifications of the dynamic RAM are selectively switched.

The specific circuit structures and operations of the input buffers and unit circuits provided for the aforementioned pads will be described in detail hereinafter.

3.1.5. Operation Cycles

Table 7 enumerates the operation cycles of one embodiment of the dynamic RAM according to the present invention. The dynamic RAM of this embodiment is classified into the twenty one product types in accordance with its bit structures, and operation modes and package shapes, as has been described hereinbefore, and ten kinds of operation cycles, as enumerated in Table 7, are prepared for each of the product type, although not especially limitative thereto. Of these, the first to fourth operation cycles can be either singly or continuously operated according to the operation modes of the dynamic RAM, and the second and third operation cycles can be combined with the masked write mode.

Incidentally, the dynamic RAM of this embodiment has an open test mode, which is specified by the JEDEC (Joint Electron Device Engineering Council), and a not-opened vendor test mode. The dynamic RAM is brought into the open test mode or the vendor test mode, when the corresponding set cycles are executed, and are released from that mode when the $\overline{RAS}$ only-refresh cycle or the seventh CBR refresh cycle is executed. The specific contacts of the individual test modes will be described hereinafter.

TABLE 7

| No. | Operation Cycle |
|---|---|
| 1 | Read Cycle |
| 2 | Early Write Cycle |
| 3 | Delayed Write Cycle |
| 4 | Read Modify Write Cycle |
| 5 | $\overline{RAS}$ Only-Refresh Cycle |
| 6 | Hidden Refresh Cycle |
| 7 | CBR Refresh Cycle |
| 8 | Counter Test Cycle |
| 9 | Open Test Mode Set Cycle |
| 10 | Vendor Test Mode Set Cycle |

FIGS. 25 to 41 present timing charts for specifying the input conditions for the several representatives of the operation cycles of Table 7. With reference to these Figures, the several representatives of the operation cycles of the dynamic RAM of this embodiment will be summarized in the following.

(1) Read Cycle

Figure 25:
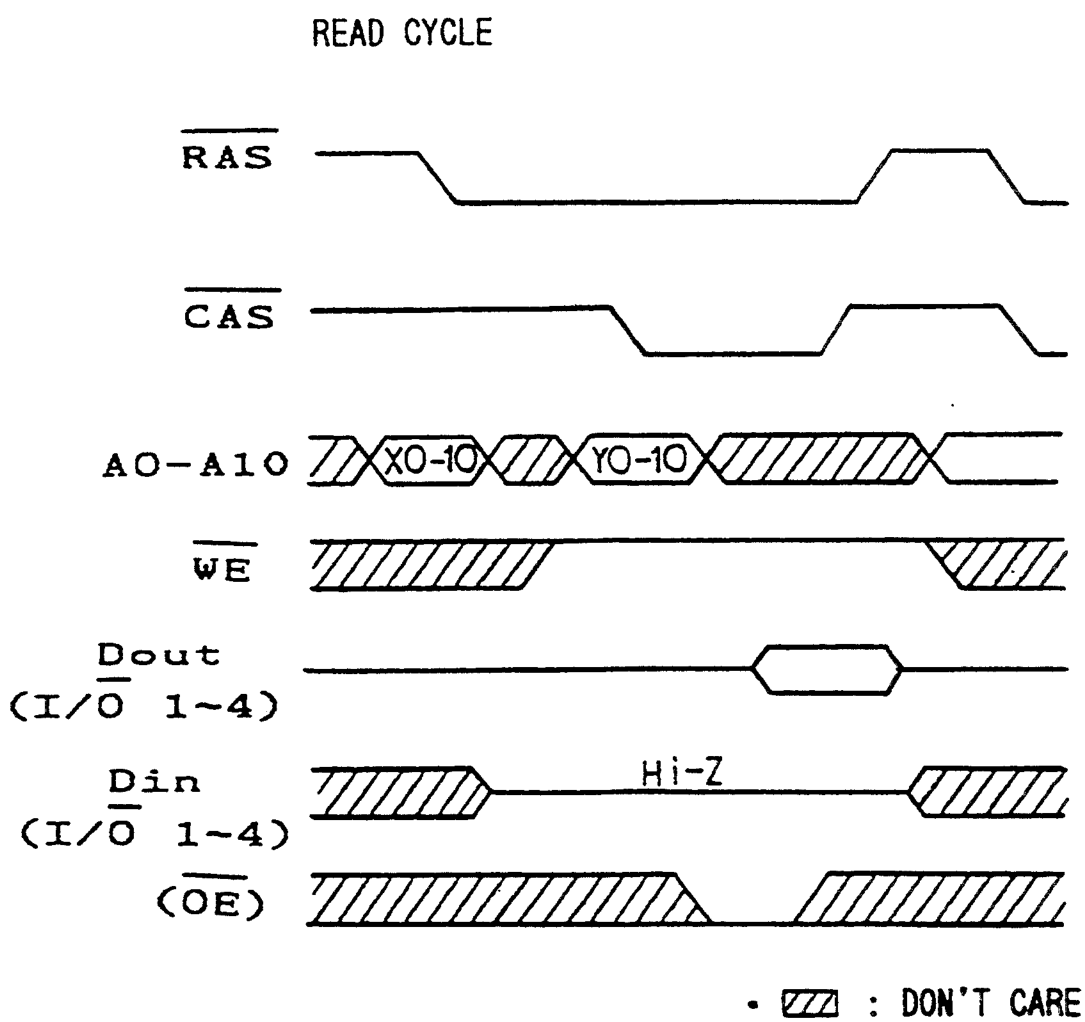
FIGS. 25 to 41 are timing charts showing one embodiment of each of the operation cycles of the dynamic RAM according to the present invention.
Figure 26:
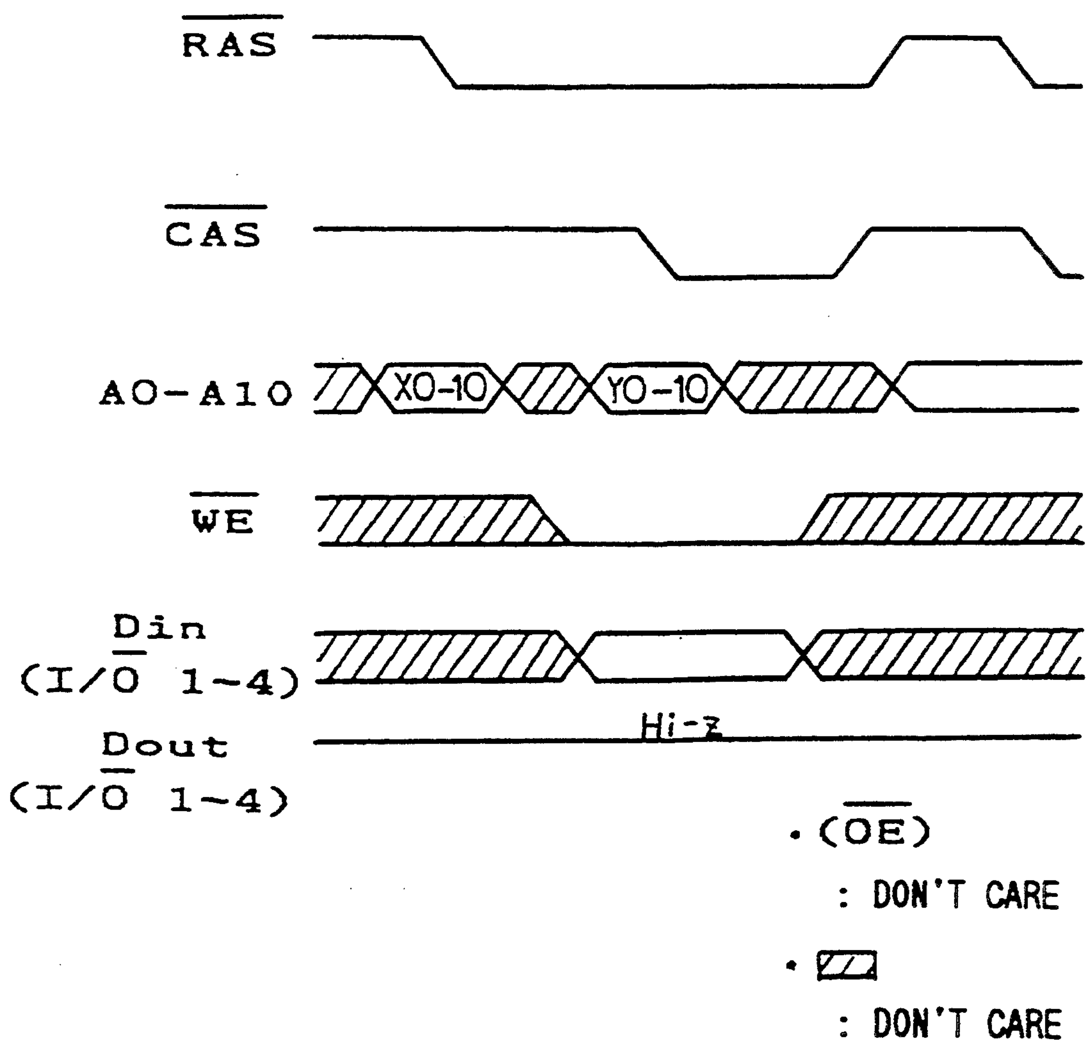
Figure 27:
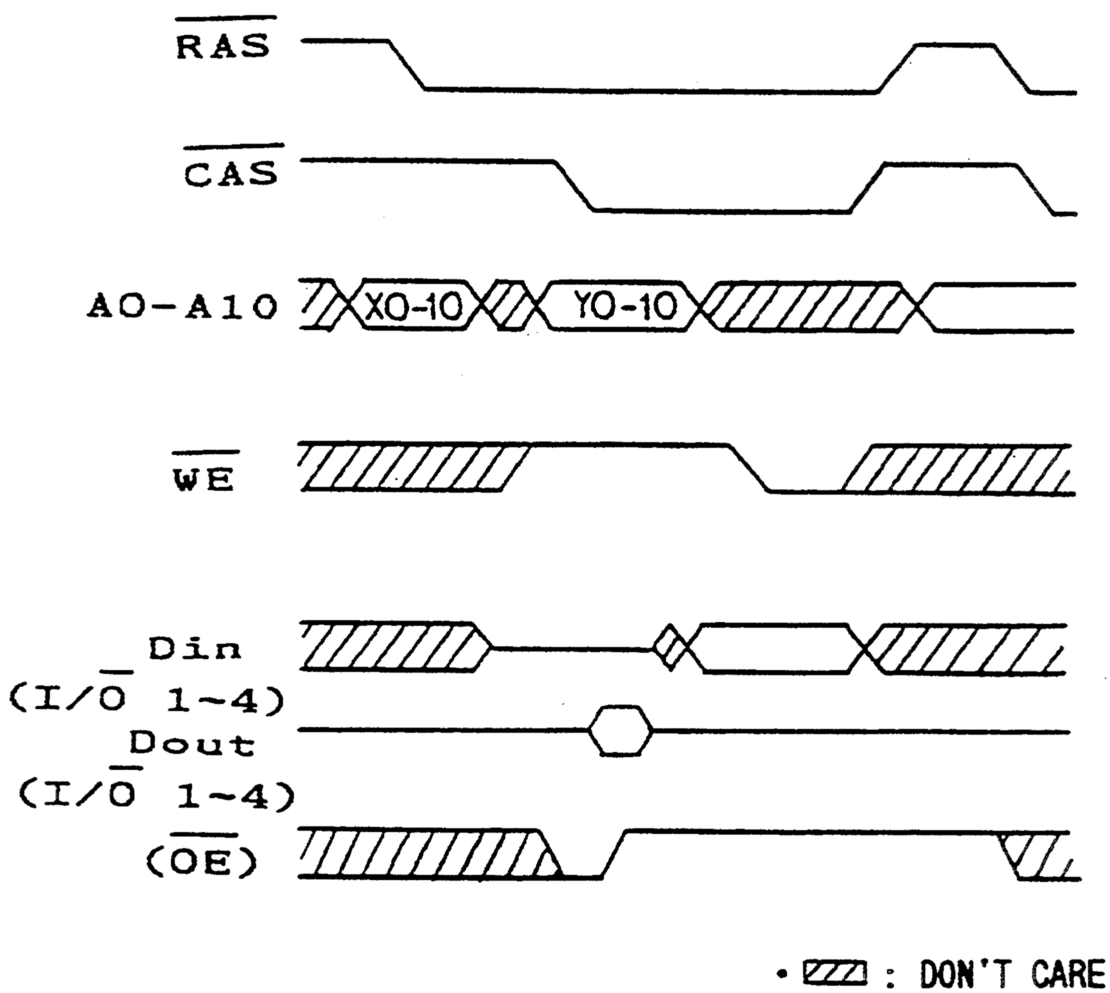

The dynamic RAM is brought into the read cycle on condition that the write enable signal $\overline{WE}$ takes the high level at the breaking edge of the column address strobe signal $\overline{CAS}$, as shown in FIG. 25. The address input terminals A0 to A10 (or A0 to A9 in the case of the x 4 bit structure) are fed with the X-address signals X0 to X10 (or X0 to X9 in the case of the x 4 bit structure) of 11 bits (or 10 bits in the case of the x 4 bit structure) in synchronism with the breaking edge of the row address strobe signal $\overline{RAS}$ and further with the Y-address signals Y0 to Y10 (or Y0 to Y9 in the case of the x 4 bit structure) in synchronism with the breaking edge of the column address strobe signal $\overline{CAS}$. A data output terminal Dout (or data input/output terminals I/O1 to I/O4 in the case of the x 4 bit structure) is usually in a high-impedance state so that it outputs a read data of designated address when a predetermined access time has elapsed. In the case of the x 4 bit structure at this time, the necessary condition is that the output enable signal $\overline{OE}$ is at the low level.

(2) Early Write Cycle

The dynamic RAM is brought into the early write cycle on condition that the write enable signal $\overline{WE}$ takes the low level at the breaking edge of the column address strobe signal $\overline{CAS}$, as shown in FIG. 2(5. The X-address signal and the Y-address signal are inputted under the same conditions as those of the aforementioned read cycle. Moreover, the data input terminal Din (or the data input/output terminals I/O1 to I/O4 in the case of the x 4 bit structure) is fed with the write data in synchronism with the breaking edge of the column address strobe signal $\overline{CAS}$.

(3) Delayed Write Cycle

The dynamic RAM starts the column address selecting operations like those of the read cycle because the write enable signal $\overline{WE}$ takes the high level at the breaking edge of the column address strobe signal $\overline{CAS}$. With a short delay, the dynamic RAM executes the write operation when the write enable signal $\overline{WE}$ is temporarily set to the low level. The data input terminal Din (or data input/output terminals I/O0 to I/O4) is fed with the write data in synchronism with the breaking edge of the write enable signal $\overline{WE}$. This is conditioned in the case of the x 4 bit structure that the output enable signal $\overline{OE}$ is at the high level.

(4) Read Modify Write Cycle

Figure 28:
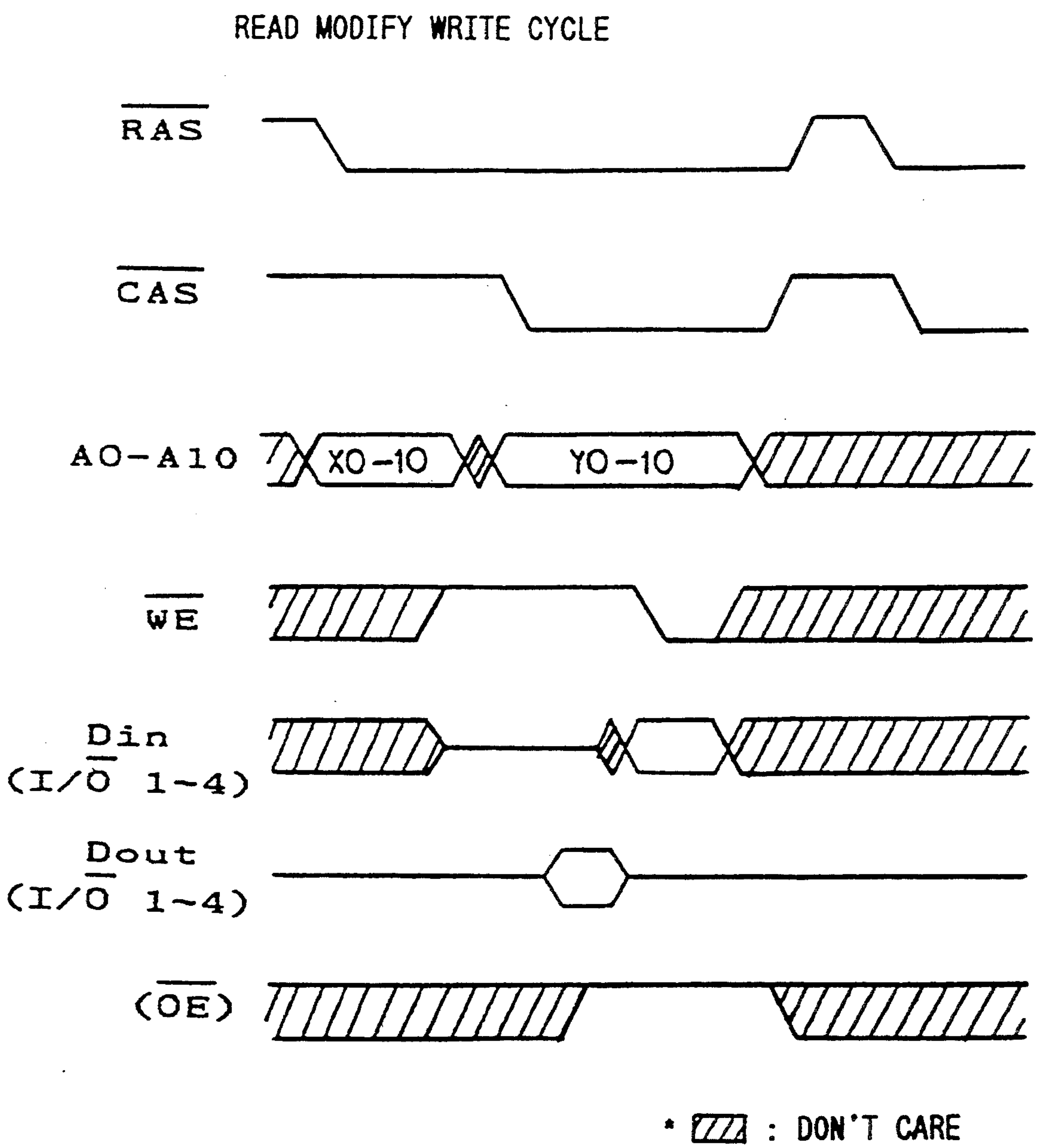

This is, as it were, an operation cycle which combines the aforementioned read cycle and delayed write cycle. The dynamic RAM starts the read cycle because the write enable signal WE takes the high level at the breaking edge of the column address strobe signal $\overline{CAS}$, as shown in FIG. 28. Then, the read data of designated address is outputted from the data output terminal Dout (or the data input/output terminals I/O0 to I/O4), and the write data fed from the data input terminal Din (or the data input/output terminals I/O0 to I/O4) is written in the aforementioned address at the instant when the write enable signal $\overline{WE}$ is temporarily set to the low level.

(5) Masked Write Cycle

Figure 29:
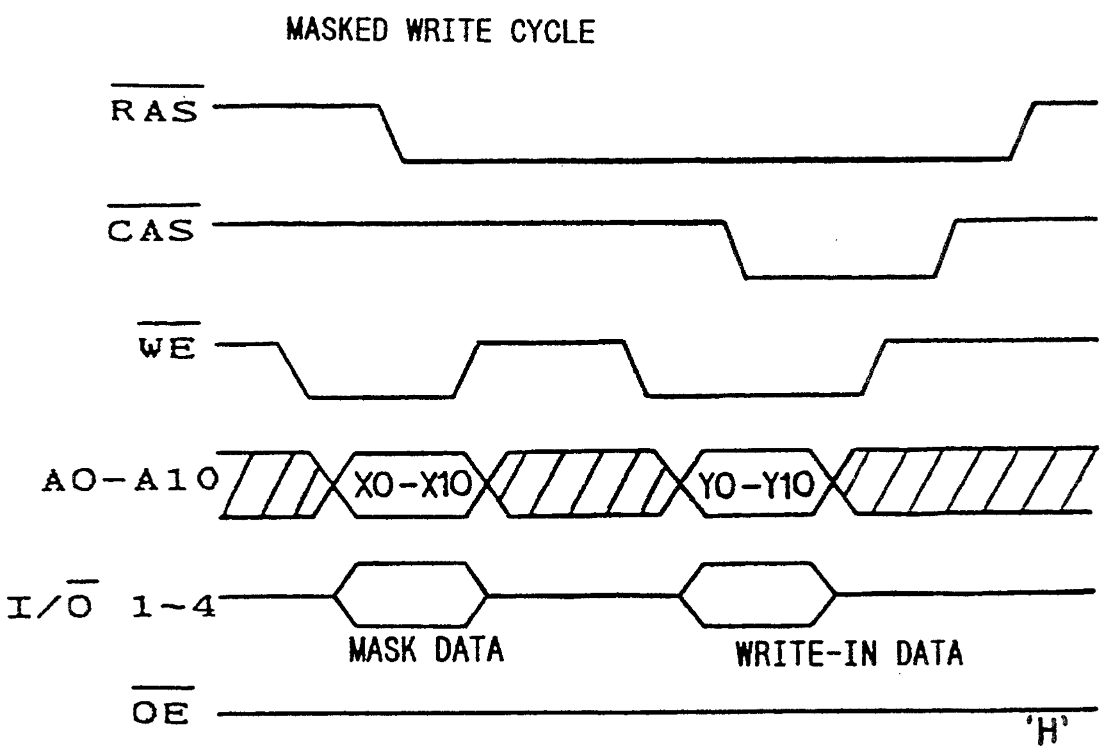

The dynamic RAM is brought into the masked write mode in the so-called "WBR ($\overline{WE}$ before $\overline{RAS}$) cycle" in which the write enable signal $\overline{WE}$ is set to the low level before the row address strobe signal $\overline{RAS}$, as shown in FIG. 29. In accordance with the combination of the column address strobe signal $\overline{CAS}$ and the write enable signal $\overline{WE}$, the dynamic RAM then executes the aforementioned early write cycle, delayed write cycle or read modify write cycle selectively. The data input/output terminals I/O0 to I/O4 are fed at first with a mask data of 4 bits in synchronism with the breaking edge of the row address strobe signal $\overline{RAS}$ and then with a write data of 4 bits in synchronism with the breaking of the column address strobe signal $\overline{CAS}$ or the second breaking edge of the write enable signal $\overline{WE}$. These write data are selectively written on condition that the aforementioned corresponding mask data are at the logic "0".

(6) FP Read Cycle

Figure 30:
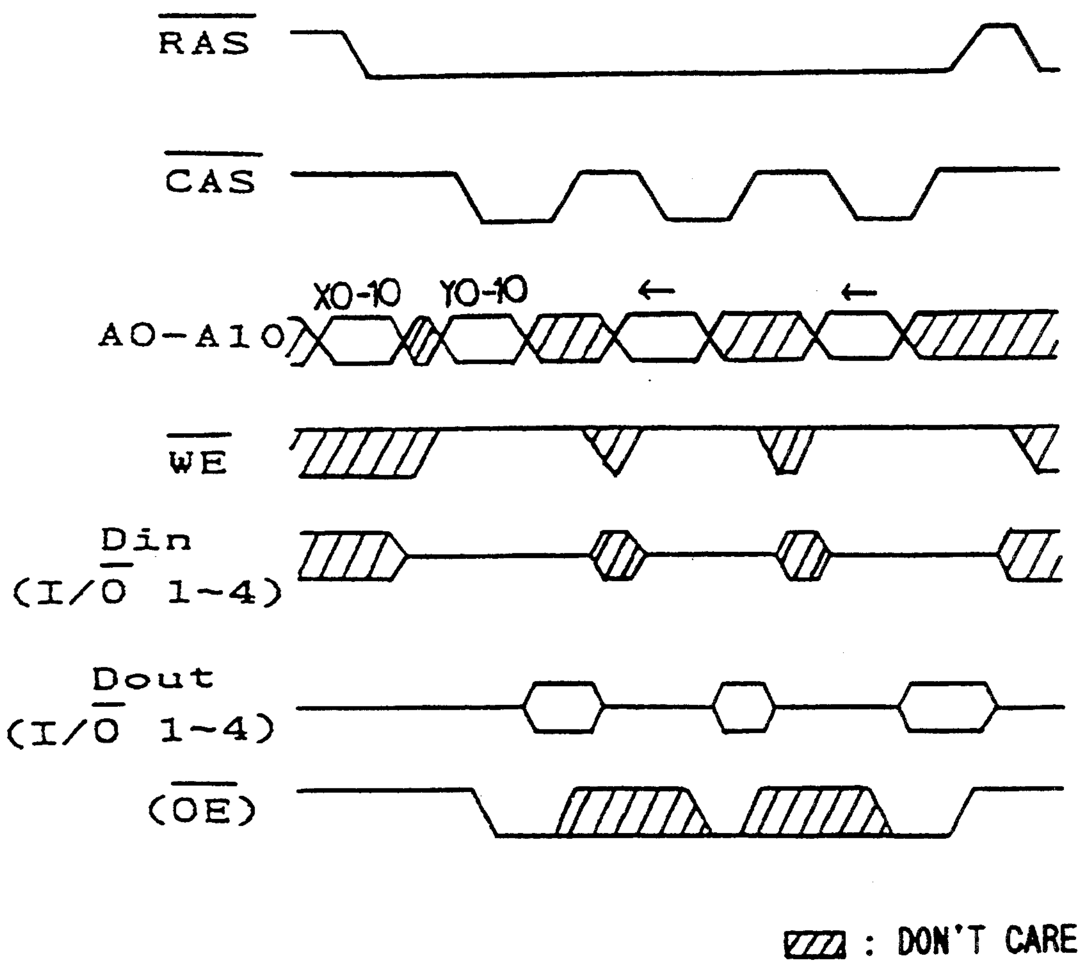

In the dynamic RAM set in the fast page mode, as shown in FIG. 30, the fast continuous read operation in the fast page mode is executed by setting the column address strobe signal $\overline{CAS}$ repeatedly to the low level with the row address strobe signal $\overline{RAS}$ being at the low level. The address input terminals A0 to A10 (or A0 to A9) are fed at first with the X-address signals X0 to X10 (or X0 to X9) in synchronism with the breaking edge of the row address strobe signal $\overline{RAS}$ and then repeatedly with the Y-address signals Y0 to Y10 (or Y0 to Y9) in synchronism with the breaking edge of the column address strobe signal $\overline{CAS}$. At each breaking edge of the column address strobe signal $\overline{CAS}$, the write enable signal $\overline{WE}$ is set to the high level. In the dynamic RAM, the word lines designated by the X-address signals are firstly selected at the break of the row address strobe signal $\overline{RAS}$, and the read data of that one or four of the memory cells coupled to the selected word lines, which are designated by the aforementioned Y-address signals, are sequentially outputted at each break of the column address strobe signal $\overline{CAS}$.

(7) FP Write Cycle

Figure 31:
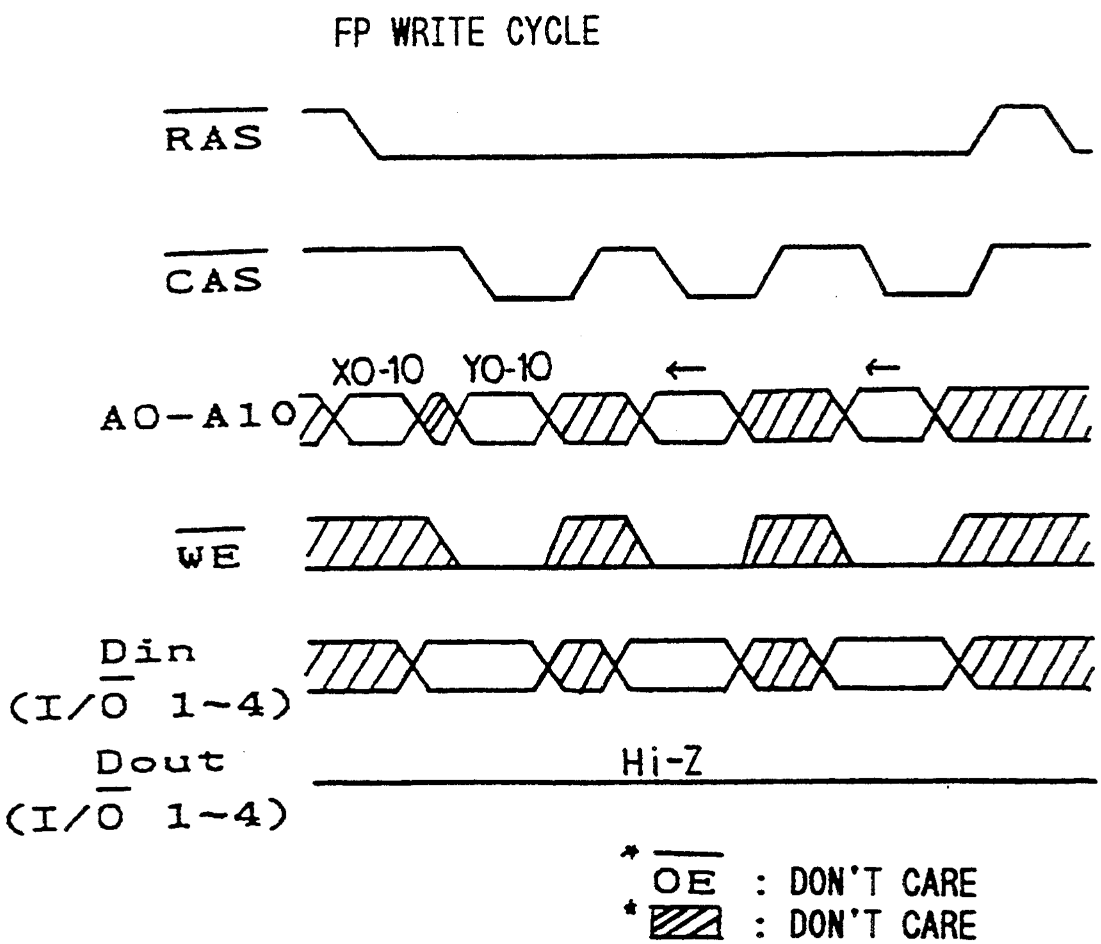

In case, in the dynamic RAM, the write enable signal $\overline{WE}$ takes the low level at each breaking edge of the column address strobe signal $\overline{CAS}$, as shown in FIG. 31, the dynamic RAM executes the fast continuous write operations by the early write cycle in the fast page mode. At this time, the data input terminal Din (or the data input/output terminals I/O0 to I/O4) are sequentially fed with a series of write data in synchronism with each breaking edge of the column address strobe signal $\overline{CAS}$. In case the write enable signal $\overline{WE}$ is set to the low level with a delay from each break of the column address strobe signal $\overline{CAS}$, the dynamic RAM executes the delayed write cycle or the read modify write cycle in the fast page mode.

(8) SC Read Cycle

Figure 32:
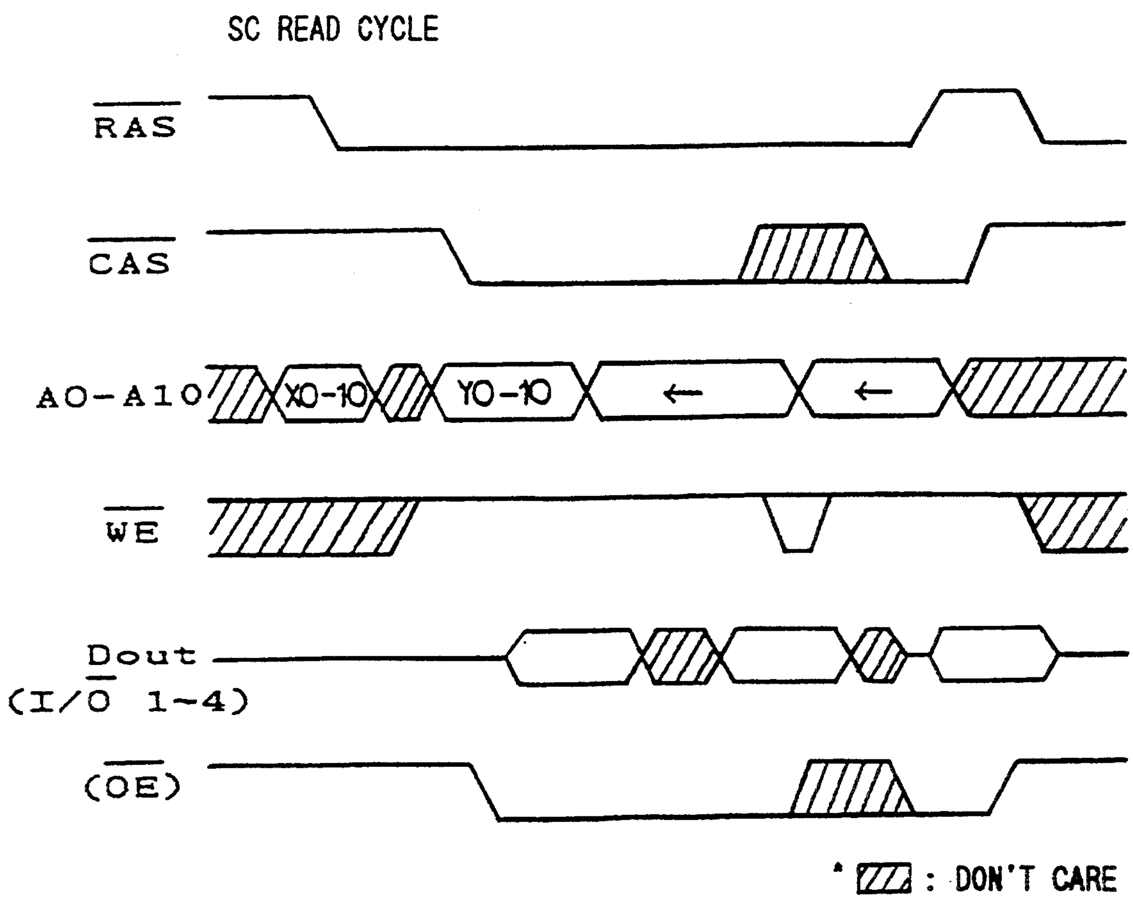

In the dynamic RAM in the static column mode, as shown in FIG. 32, the fast continuous read operation in the static column mode is executed by changing the Y-address signals AY0 to AY10 (or AY0 to AY9) fed to the address input terminals A0 to A10 (or A0 to A9) with the row address strobe signal $\overline{RAS}$ and the column address strobe signal $\overline{CAS}$ being at the low level. The dynamic RAM is equipped with an address transition detection circuit ATD (e.g. FIG. 2) which generates an active output signal when at least one of the Y-address signals changed. The dynamic RAM fetches at first the X-address signals X0 to X10 (or X0 to X9) fed through the address Input terminals in synchronism with the breaking edge of the row address strobe signal $\overline{RAS}$ and then selects the corresponding word lines. When the output signal of the address transition detection circuit ATD is an active signal, the read data of that one or four of the memory cells coupled to the selected word lines, which are designated by the new Y-address signals, are sequentially outputted.

(9) SC Write Cycle

Figure 33:
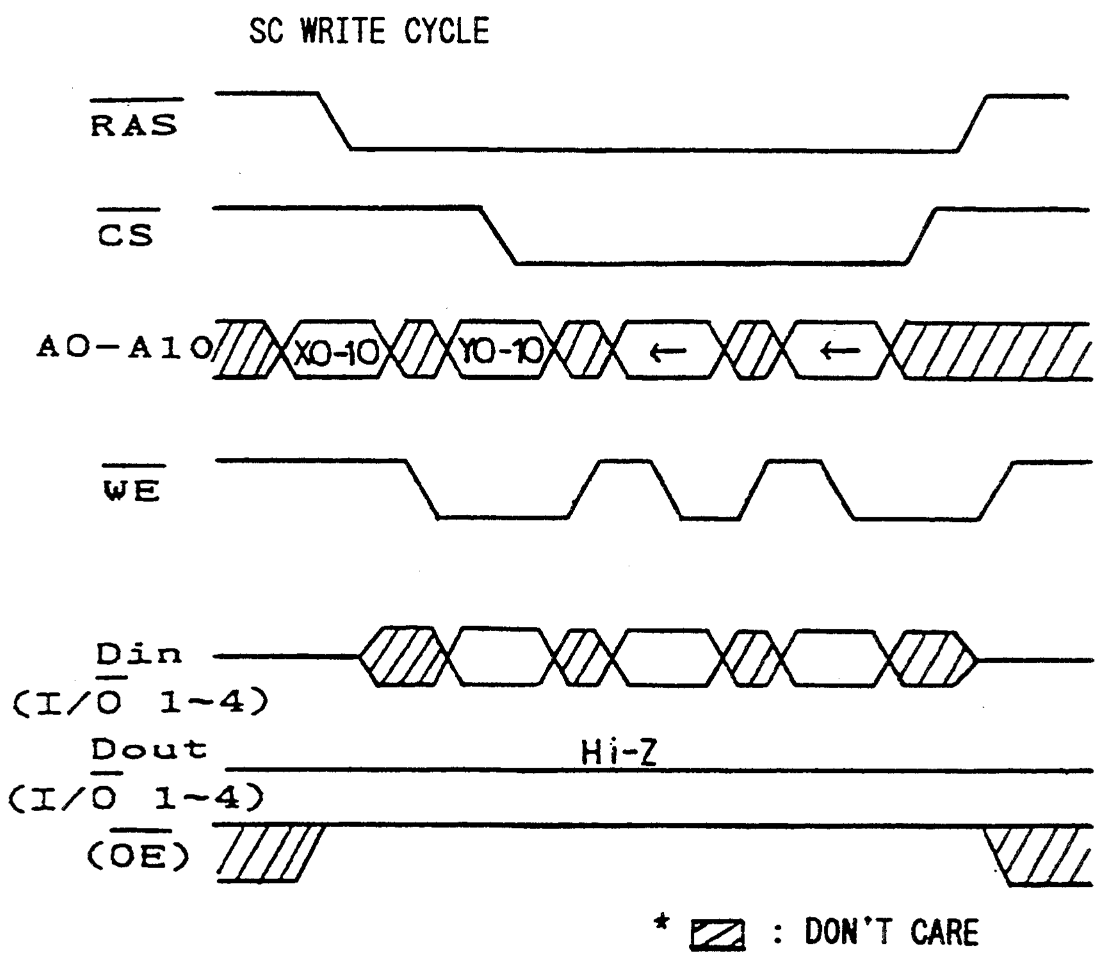

In the dynamic RAM in the static column mode, as shown in FIG. 33, the fast continuous write operation in the static column mode is executed by changing the write enable signal $\overline{WE}$ repeatedly to the low level. At this time, the data input terminal Din (or the data input/output terminals I/O1 to I/O4) is sequentially fed with a series of write data in synchronism with each breaking edge of the write enable signal $\overline{WE}$. The dynamic RAM executes the write cycle in a similar static column mode by changing the column address strobe signal $\overline{CAS}$ repeatedly to the low level while leaving the write enable signal $\overline{WE}$ at the low level.

(10) NB Read Cycle

Figure 34:
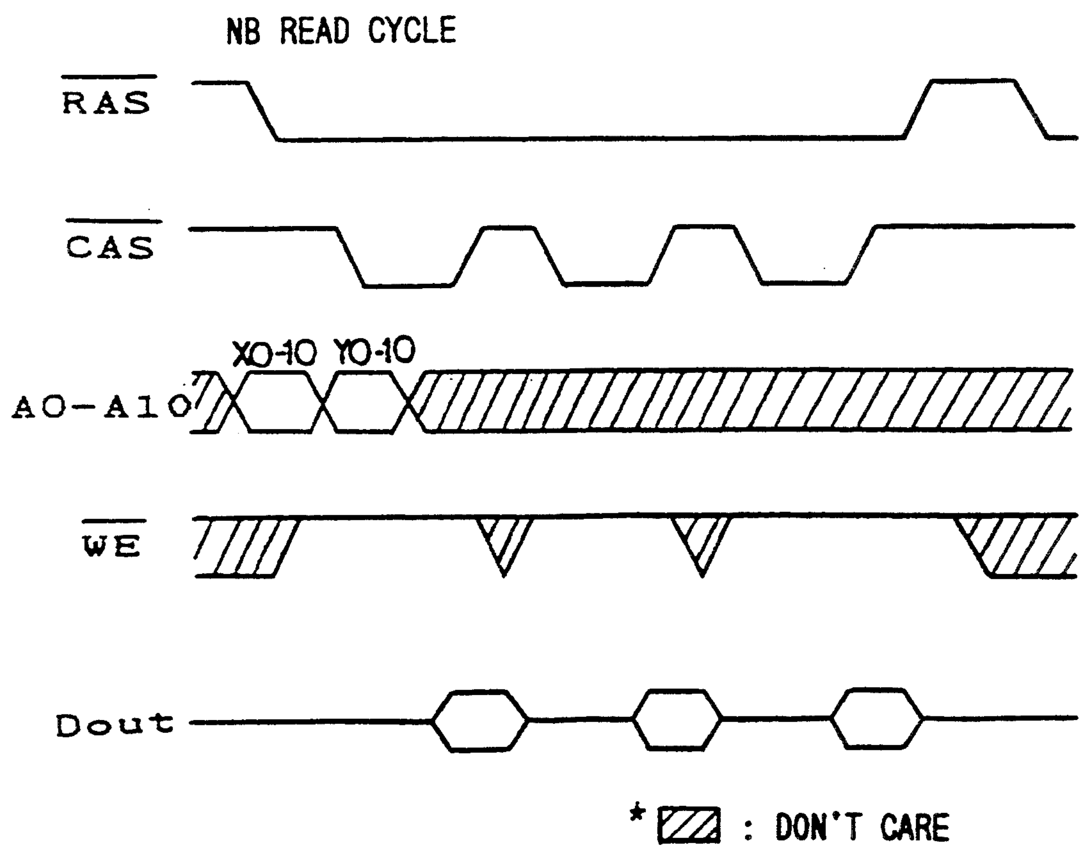

In the dynamic RAM in the nibble mode, as shown in FIG. 34, the 4 bit fast continuous read operation of the read cycle in the nibble mode is executed by setting the column address strobe signal $\overline{CAS}$ repeatedly to the low level with the row address strobe signal $\overline{RAS}$ being at the low level. The address input terminals A0 to A10 (or A0 to A9) are fed at first with the X-address signals X0 to X10 for designating the row address signals, in synchronism with the breaking edge of the row address strobe signal $\overline{RAS}$, and then with the Y-address signals Y0 to Y10 for designating the leading column address in synchronism with the breaking edge of the column address strobe signal $\overline{CAS}$. The write enable signal $\overline{WE}$ is set to the high level at each breaking edge of the column address strobe signal $\overline{CAS}$. In the dynamic RAM, the word lines designated with the X-address signals are firstly selected at the break of the row address strobe signal $\overline{RAS}$, and the read data of the four memory cells, to which the continuous addresses are assigned, are sequentially outputted from the memory cell designated by the aforementioned leading column address at each break of the column address strobe signal $\overline{CAS}$.

(11) NB Write Cycle

Figure 35:
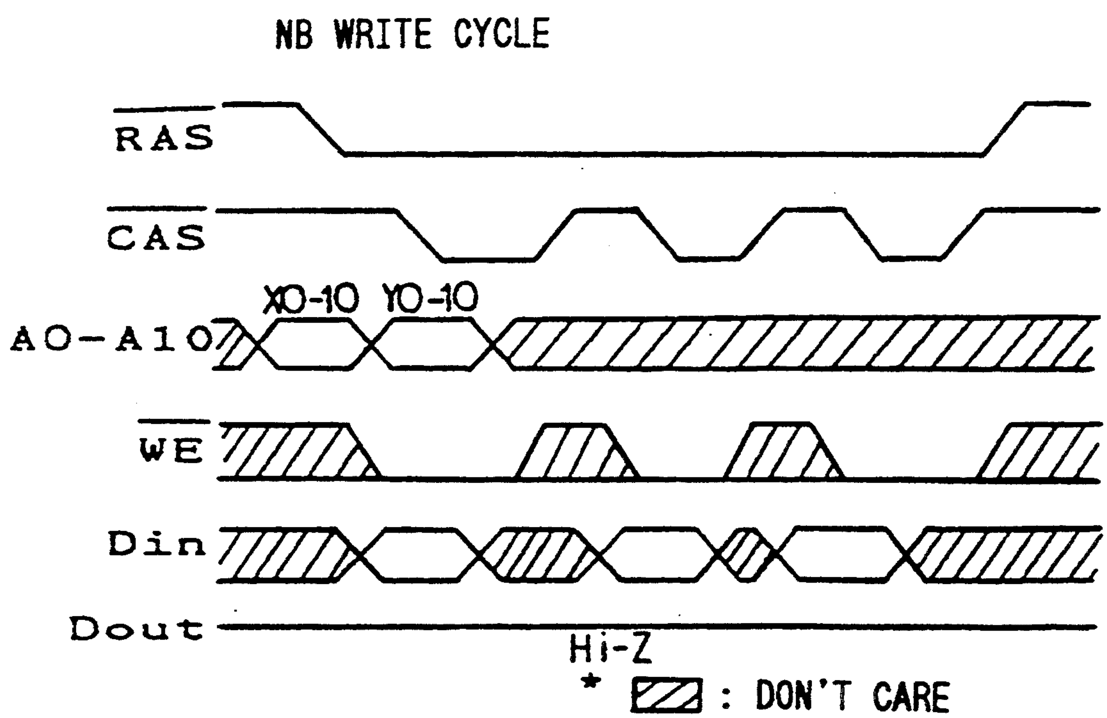

In case the write enable signal $\overline{WE}$ is set to the low level at each breaking edge of the column address strobe signal $\overline{CAS}$, as shown in FIG. 35, the dynamic RAM in the nibble mode executes the 4 bit fast continuous write operation by the early write cycle in the nibble mode. At this time, the data input terminal Din (or the data input/output terminals I/O1 to I/O4) is sequentially fed with a series of write data in synchronism with each breaking edge of the column address strobe signal $\overline{CAS}$. In case the write enable signal $\overline{WE}$ is set to the low level with a delay from each break of the column address strobe signal $\overline{CAS}$, the dynamic RAM selectively executes the delayed write cycle or the read modify write cycle in the fast page mode.

(12) $\overline{RAS}$ Only-Refresh Cycle

Figure 36:
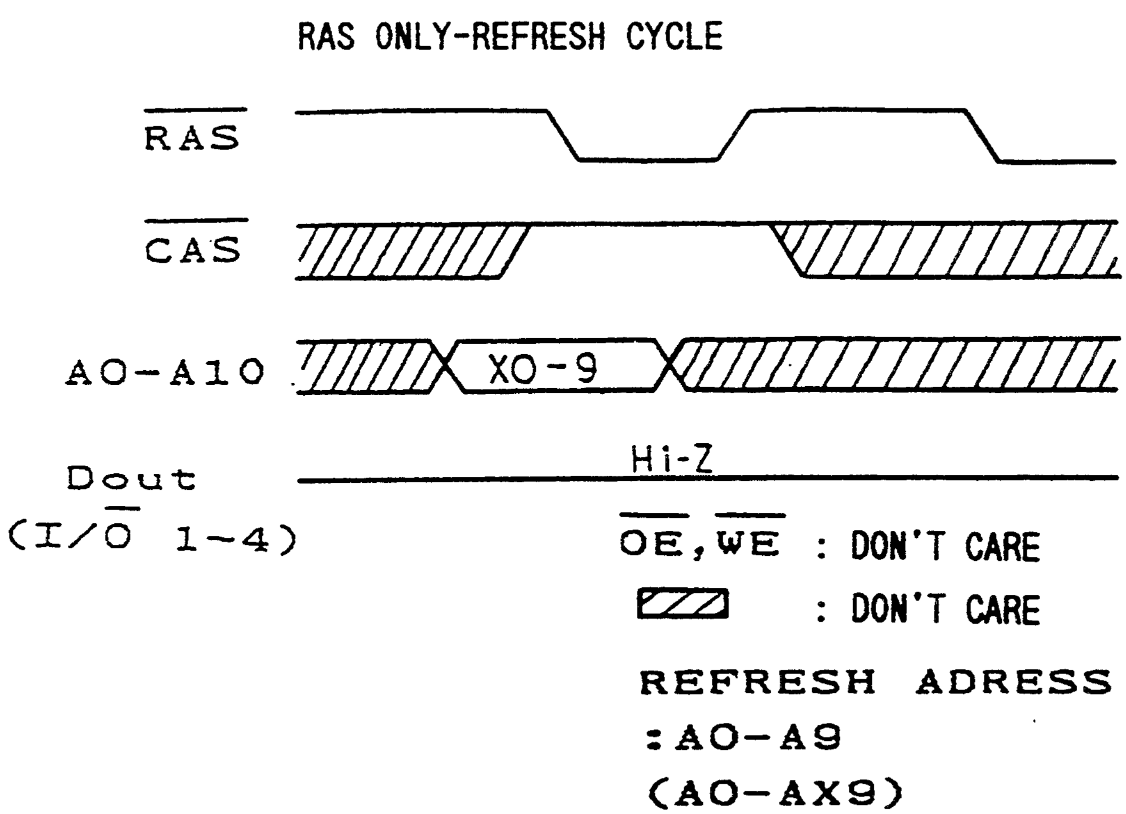

The dynamic RAM executes the $\overline{RAS}$ only-refresh cycle by setting the column address strobe signal $\overline{CAS}$ (the write enable signal $\overline{WE}$ is a "don't care") and only the row address strobe signal $\overline{RAS}$ to the low level, as shown in FIG. 36. The address input terminals A0 to A10 (or A0 to A9) are fed with the refresh addresses for designating the word lines to be refreshed, i.e., the X-address signals X0 to X9 in synchronism with the breaking edges of the row address strobe signal $\overline{RAS}$.

(13) Hidden Refresh Cycle

Figure 37:
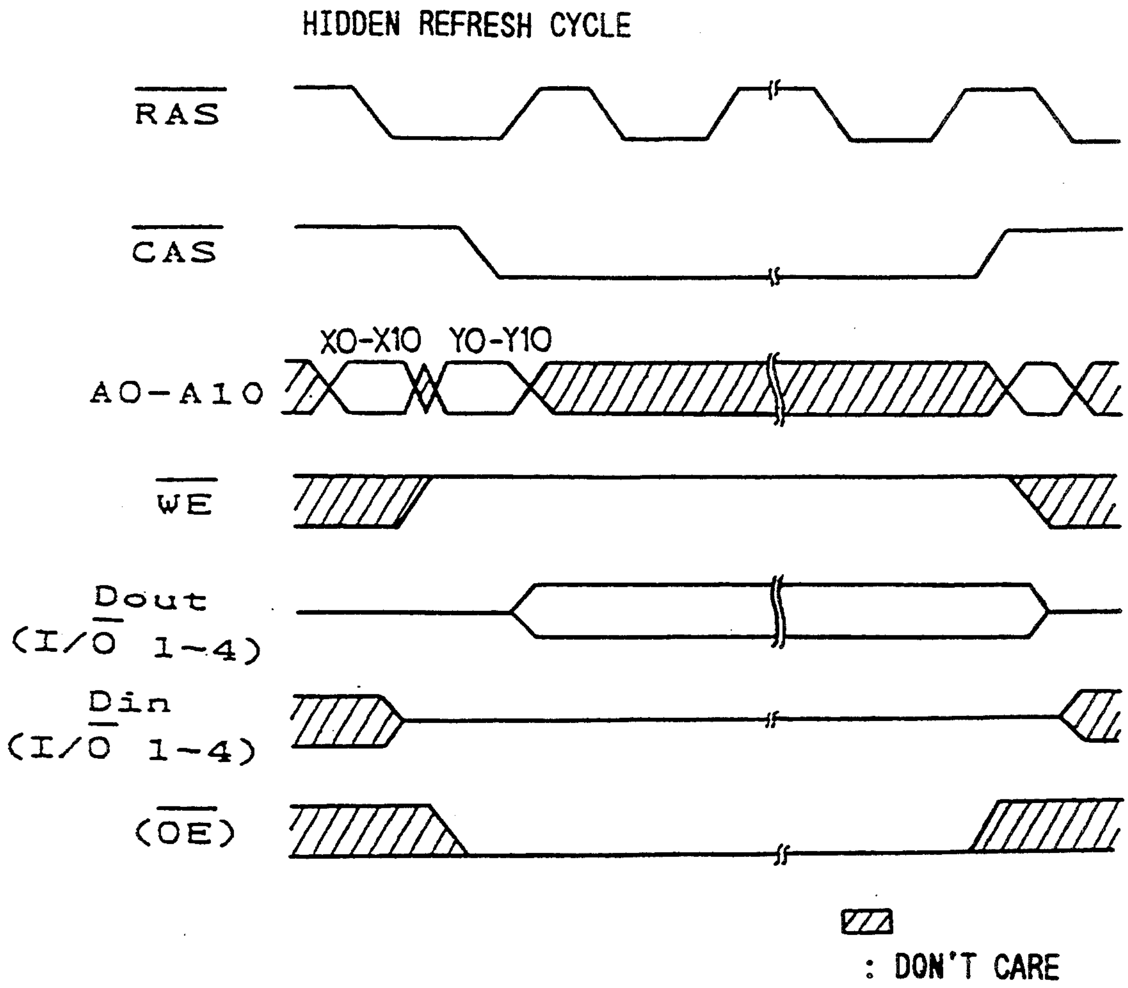

The dynamic RAM executes the hidden refresh cycle by changing the row address strobe signal $\overline{RAS}$ repeatedly to the low level with the column address strobe signal $\overline{CAS}$ being at the low level, after the end of the ordinary memory access, as shown in FIG. 37. In this hidden refresh cycle, the row address signals for designating the word lines to be refreshed are fed from the refresh counter RFC (e.g. FIG. 2). The hidden refresh cycle is equivalent to that of the case in which a CBR refresh cycle to be described in the following item is executed subsequent to the ordinary memory access.

(14) CBR Refresh Cycle

Figure 38:
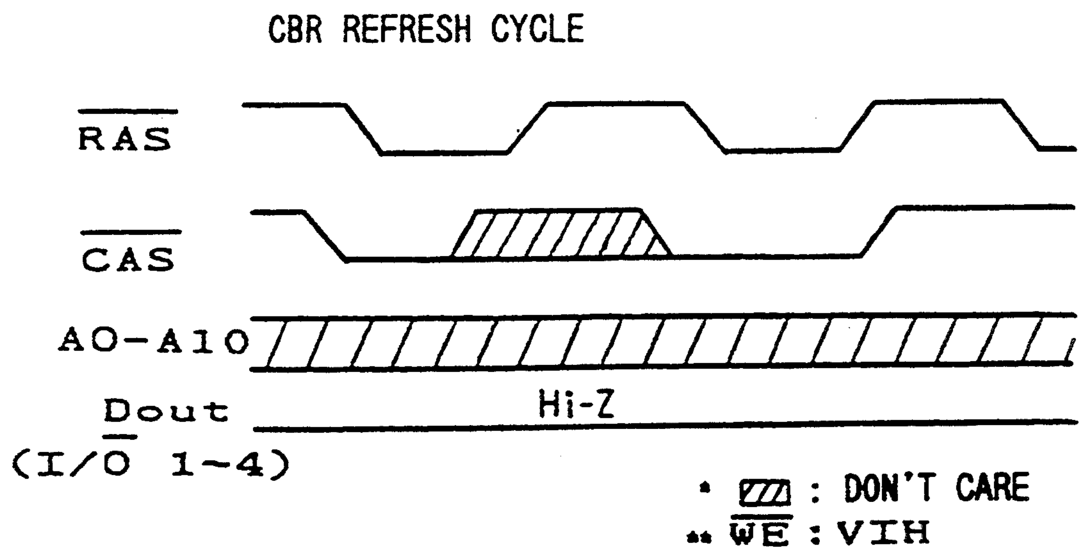

The dynamic RAM executes the CBR refresh cycle by the so-called "CBR" ($\overline{CAS}$ before $\overline{RAS}$) cycle, in which the column address strobe signal $\overline{CAS}$ is set to the low level before the row address strobe signal $\overline{RAS}$, as shown FIG. 38. At this time, the write enable signal $\overline{WE}$ has to be set to the high level, and the row address of the word lines to be refreshed is fed from the refresh counter RFC.

(15) Counter Test Cycle

Figure 39:
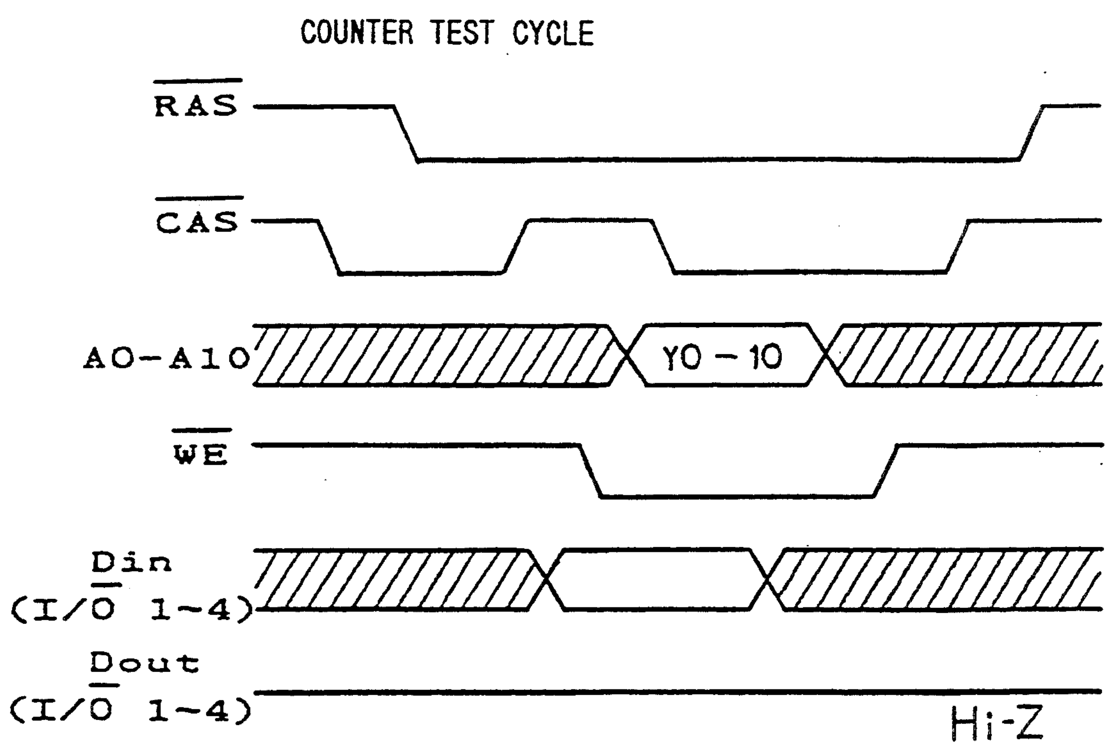

The dynamic RAM executes the counter test cycle by setting the column address strobe signal $\overline{CAS}$ repeatedly to the low level after the end of the foregoing CBR refresh cycle, as shown FIG. 39. The address input terminals A0 to A10 (or A0 to A9) are fed with the Y-address signals Y0 to Y10 (or Y0 to Y9) in synchronism with the breaking edge of the second or later column address strobe signal $\overline{CAS}$. As a result, the dynamic RAM can execute the read or write test selectively for the memory cells coupled to the selected word lines in the CBR refresh cycle.

(16) Open Test Mode Set Cycle

Figure 40:
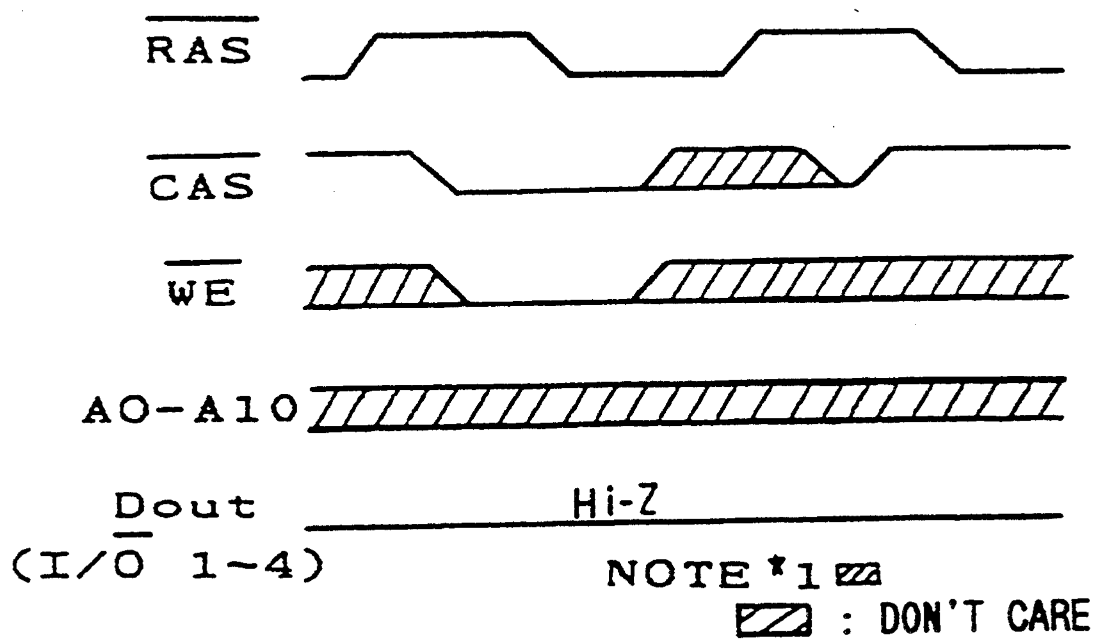

The dynamic RAM is brought into the open test mode by establishing the so-called WCBR ($\overline{WE}.\overline{CAS}$ before $\overline{RAS}$) cycle, in which the column address strobe signal $\overline{CAS}$ and the write enable signal $\overline{WE}$ are set to the low level before the row address strobe signal $\overline{RAS}$, as shown in FIG. 40.

The dynamic RAM is released from this open test mode when the aforementioned $\overline{RAS}$ only-refresh cycle or CBR refresh cycle is executed.

(17) Vendor Test Mode Set Cycle

Figure 41:
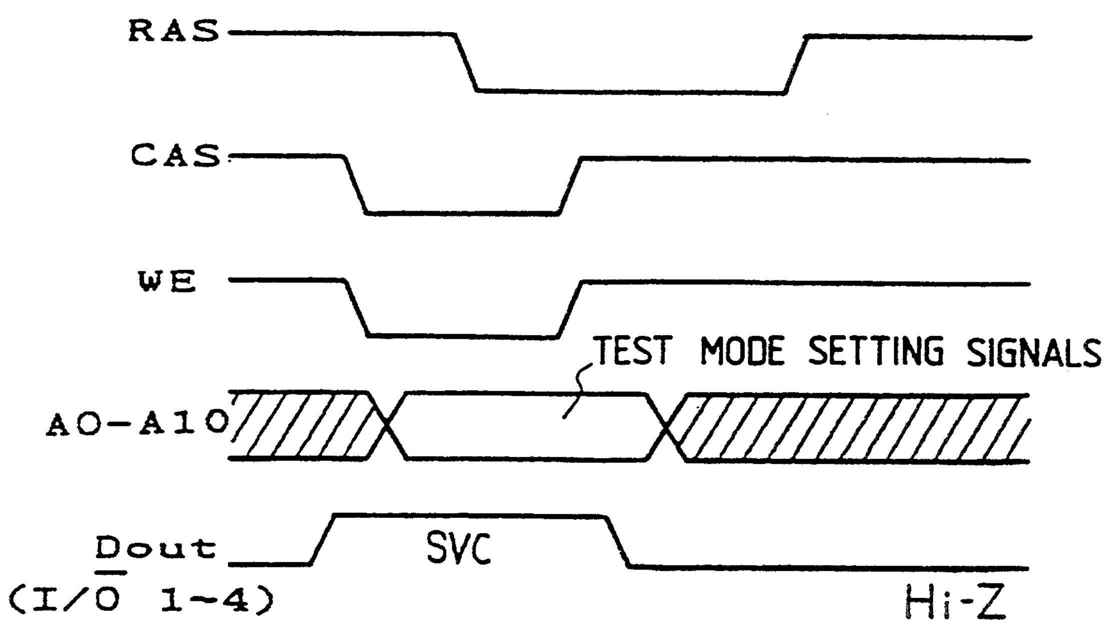

The dynamic RAM is brought into the vendor test mode when the data output terminal Dout (or the data input/output terminal I/O3 in the case of the x 4 bit structure) is fed with a high voltage SVC of 10 V higher than the power supply voltage of the circuit and when the aforementioned WCBR cycle is caused, as shown in FIG. 41. The address input terminals A0 to A9 and A10 (or the output enable signal $\overline{OE}$ in the case of the x 4 bit structure) are fed with the test mode setting signal for designating the content of the vendor test mode in synchronism with the breaking edge of the row address strobe signal $\overline{RAS}$.

The dynamic RAM is released from this vendor test mode when the aforementioned $\overline{RAS}$ only refresh cycle or CBR refresh cycle is executed.

3.1.6. Test Method

The dynamic RAM of this embodiment has the open test mode monitor specified in the JEDEC and the unique vendor test mode, as has been described hereinbefore. These test modes can be executed through the external terminals of the dynamic RAM after the package sealing. The dynamic RAM is further equipped with a plurality of test pads for several probe tests at wafer steps.

(1) Open Test Mode

The dynamic RAM of this embodiment is brought into the open test mode by executing the so-called WCBR cycle in which the column address strobe signal $\overline{CAS}$ and the write enable signal $\overline{WE}$ are set to the low level before the row address strobe signal $\overline{RAS}$, as has been described hereinbefore.

If the read cycle is executed in this open test mode, in the inside of the dynamic RAM, the stored data of every two bits, i.e., totally eight bits, are simultaneously read and collated from the four memory arrays to be simultaneously selected, As a result, an output signal of the high level is sent out from the data output terminal Dout, if these data are coincident for all their bits. Otherwise an output signal of the low level is sent out. In the case of the dynamic RAM of the x 4 bit structure, the output signals sent out from the data input/output terminals I/O0 to I/O4 can be caused to correspond to the collated results of the corresponding stored data of 2 bits.

The dynamic RAM is released from the aforementioned open test mode by executing the RAS only-refresh cycle or CBR refresh cycle, as has been described hereinbefore.

By preparing such open test mode, the user of the dynamic RAM can text the validity of a aeries of memory areas efficiently.

(2) Vendor Test Mode

The dynamic RAM of this embodiment is brought into the vendor test mode by feeding the high voltage SVC higher than the power supply voltage of the circuit to the data output terminal Dout (or the data input/output terminal I/O3 in the case of the x 4 bit structure) and by executing the aforementioned WCBR cycle, as has been described hereinbefore. At this time, the address input terminals A0 to A9 and A10 (or the output enable signal $\overline{OE}$ in the case of the x 4 bit structure) are fed with the test mode setting signals in synchronism with the breaking edge of the row address strobe signal $\overline{RAS}$ so that the specific contents of the vendor test mode are designated.

Table 8 enumerates the specific test mode which is prepared as the vendor test mode of the dynamic RAM of this embodiment. As tabulated in the same Table, the test mode setting signals to be fed as the address signals A3 to A8 are not used but in "Don't care".

In Table 8, the dynamic RAM is caused at first to have a binary mode if the tenth bit of the test mode setting signal to be fed as the address signal A9 is set to the logic "0" whereas the other bits are set to the logic "1". If the read cycle is executed at this time, the dynamic RAM executes the 8 bit read/collate tests like the aforementioned open test mode.

Next, the dynamic RAM is caused to have a ternary mode if the tenth bit of the aforementioned test mode setting mode is set to the logic "1". If the read cycle is executed at this time, the dynamic RAM likewise executes the 8 bit read/collate tests. As a result, If the all the bits (or the two corresponding bits in the case of x 4 bits) are coincident at the logic "0" or "1", the dynamic RAM sends out the output signal of the corresponding high or low level from the data output terminal Dout (or the data input/output terminals I/O1 to I/O4). In case the read data are not coincident, the output of the data output terminal Dout (or the corresponding data input/output terminals I/O1 to I/O4) is brought into the high-impedance state.

the validity confirming tests of the internal circuit can be executed by the fine current measurements.

(3) Probe Tests

Table 9 enumerates the probe testing test pads which are mounted in the dynamic RAM of this embodiment. These test pads are used in the probe tests, which are conducted at the wafer stage of the dynamic RAM, for example, and have no meaning after the packaging.

TABLE 9

| Pad Name | Application |
|---|---|
| ICT | Stop of Standby Current |
| VBB | Feed of Substrate Back Bias Voltage |
| VPLG | Stop of Plate Voltage Generator |
| VPL | Feed of Plate Voltage |
| FCK | Check of Fuse |
| VCF | Supply of Fuse Check Voltage |
| RCK | Redundant Check |

In Table 9, the pad ICT is given, when fed with the power supply voltage VCC, a function to stop the operations a reference potential generator VL and the substrate back bias voltage generator VBB, although not especially limitative thereto, as will be described hereinafter, so that the standby current of the dynamic RAM is stopped. At this time, the dynamic RAM can be fed with an arbitrary substrate back bias voltage VBB through a pad VBB to test and confirm the dependency of the internal circuit upon the substrate back bias voltage. If the standby current is stopped, it is possible to execute the tests for confirming the validity of the internal circuit by the fine current measurements.

Next, the pad VPLG is given an action to stop the operation of the voltage generator HVC when fed with the power supply voltage VCC, as will be described hereinafter. At this time, the dynamic RAM can be fed with an arbitrary plate voltage VPL through the pad

TABLE 8

| Test Mode Setting Signals | | | | | | | | | | | | |
|---|---|---|---|---|---|---|---|---|---|---|---|---|
| A0, | A1, | A2, | A3, | A4, | A5, | A6, | A7, | A8, | A9, | A10, | ($\overline{OE}$) | Test Contents |
| 1 | 1 | 1 | — | — | — | — | — | — | 0 | 1 | (1) | Binary Mode (× 8) |
| 1 | 1 | 1 | — | — | — | — | — | — | 1 | 1 | (1) | Ternary Mode (× 8) |
| 0 | 0 | 1 | — | — | — | — | — | — | 0 | 1 | (1) | VPL Stress Mode 1 (0 V) |
| 0 | 1 | 0 | — | — | — | — | — | — | 0 | 1 | (1) | VPL Stress Mode 2 (VCC) |
| 0 | 1 | 1 | — | — | — | — | — | — | 0 | 0 | (0) | VBB Stop Mode |

Moreover, the dynamic RAM is brought into the second VPL stress mode by setting the third and eleventh bits of the test mode setting signal, which is fed to the address signals A2 and A10, to the logic "1" and the remaining bits to the logic "0" and by setting the second bit of the test mode setting signal, which is fed as the address signal A1, in place of the aforementioned third bit to the logic "1". If, on the other hand, the second and third bits of the test mode setting signal to be fed as the address signals A1 and A2 are set to the logic "1" whereas the remaining bits are set to the logic "0", the dynamic RAM is brought into the VBB stop mode. In the dynamic RAM of these test modes, the operations of those voltage generators VG1 and VG2 of a built-in voltage generator HVC or a substrate back bias voltage generator VBBG, which have relatively large current supply capacities, are stopped. In the aforementioned first and second VPL stress modes, moreover, the plate voltage VPL is selectively fixed at the ground potential or the power source voltage VCC of the circuit. As a result, the function tests of the memory cells in the VPL stress state, after packaged, can be accomplished so that VPL to test and confirm the dependency of the memory cells upon the plate voltage.

On the other hand, the pad FCK is given an action to check the fuses of the redundant circuit when fed with the power supply voltage VCC, as will be described hereinafter. The dynamic RAM of this embodiment is equipped with four sets of redundant word lines and four sets of corresponding X-system redundant circuits and Y-system redundant circuits, as will be described hereinafter. Each of these X-system redundant circuits and Y-system redundant circuits is composed of one enable circuit and eight address comparators having fuses. As a result, at the start of the supply of the power supply voltage VCC to the pad FCK, the selection signal for designating one of the X- or Y-system redundant circuits selectively is fed as the X-address signals X5 to X8 or the Y-address signals Y2 to Y5. After this, the selection signal for designating one of the enable circuit or address comparator of each of the redundant circuits selectively is fed as the X-address signals X0 or X1 to X8, the X-address signal X4 or the Y-address signals Y1 to Y8. At this time, the pad VCF is fed with the power supply voltage for the fuse check so that the whole or partial disconnection of the fuse can be tested and confirmed by measuring the flow rate of the current flowing through the selected one of the fuses from that power supply voltage.

Moreover, the pad RCK is given an action to force each redundant circuit into the selected state when fed with the power supply voltage VCC. As a result, the redundant word lines or redundant data lines can be selected to have their validity tested and confirmed before the execution of the redundant data lines.

The specific structure and operations of the test mode control circuit will be described in detail hereinafter.

3.1.7. Fundamental Layout

Figure 13:
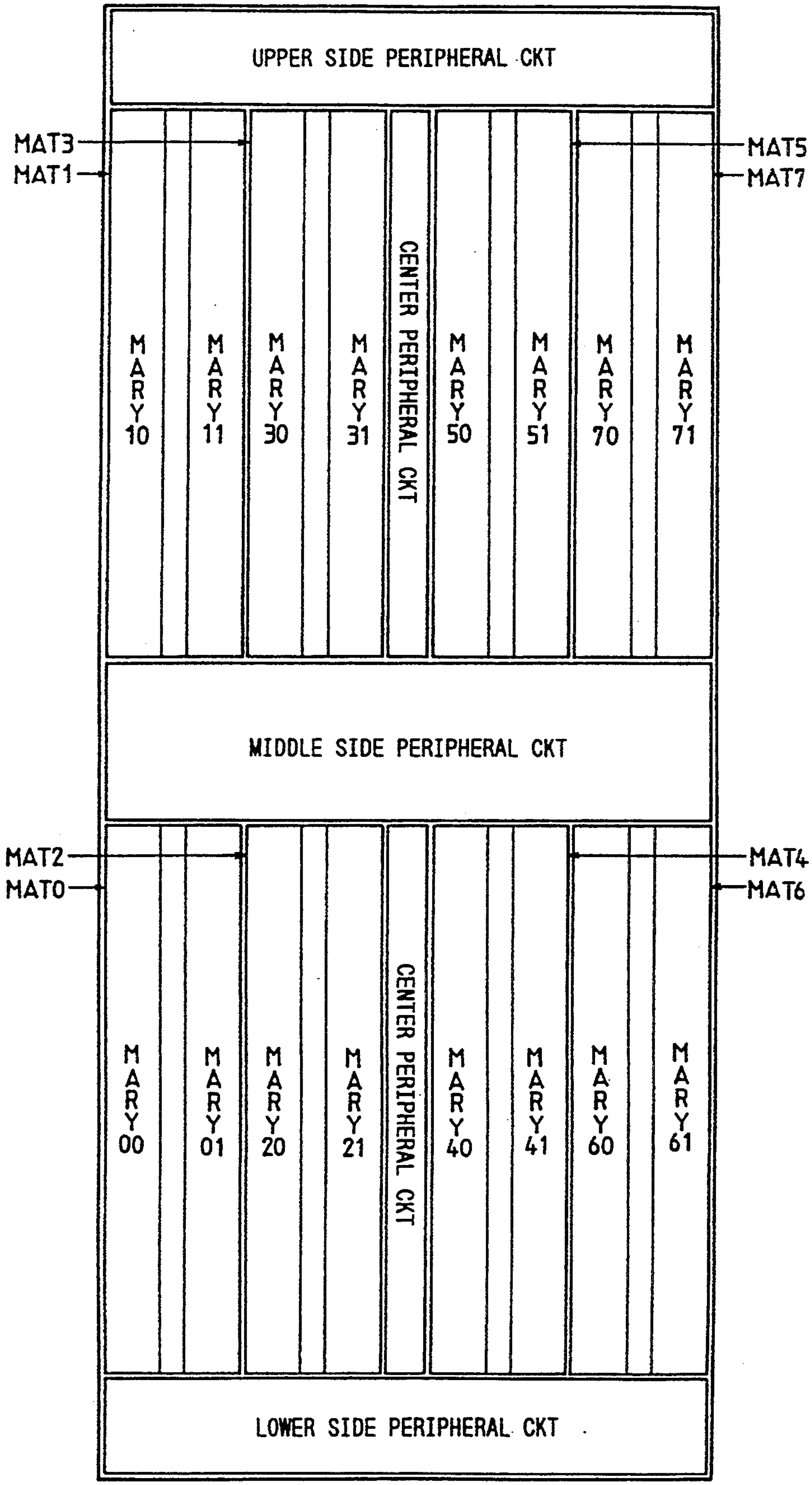
FIG. 13 is an arrangement diagram showing the overall structure of one embodiment of the dynamic RAM according to the present invention.

FIG. 13 is an arrangement diagram showing one embodiment of the common semiconductor substrate of the dynamic RAM according to the present invention. Incidentally, in the following description, the lefthand side of the semiconductor substrate surface of FIG. 13 corresponds to the lower side of the semiconductor substrate surface, and the righthand side corresponds to the upper side of the semiconductor substrate surface. Accordingly, the upper side of the semiconductor substrate surface of FIG. 13 will be called the righthand side of the semiconductor substrate surface, and the lower side will be called the lefthand side of the semiconductor substrate surface. Moreover, the center line in parallel with the longer sides of the semiconductor substrate surface will be called the longitudinal center line, whereas the center line in parallel with the shorter sides will be called the transverse center line.

In FIG. 13, the dynamic RAM of this embodiment is equipped with eight memory mats MAT0 to MAT7, as has been described hereinbefore. Of these, the four memory mats MAT0, MAT2, MAT4 and MAT6 are arranged below a portion of the peripheral circuits, which are arranged along the transverse center line of the semiconductor substrate surface, namely, below the middle side peripheral circuit, and another portion of the peripheral circuit, i.e, the lower side peripheral circuit is arranged at the outer side of those four memory mats and along the lower side of the semiconductor substrate surface. On the other hand, the remaining four memory mats MAT1, MAT3, MAT5 and MAT7 are arranged above the aforementioned middle side peripheral circuit, and another portion of the peripheral circuit, i.e., the upper side peripheral circuit is arranged at the outer side of those four remaining memory mats and along the upper side of the semiconductor substrate surface. Between the memory mats MAT3 and MAT5 and between the memory mats MAT2 and MAT4, respectively, there are arranged other portions of the peripheral circuit, i.e., center peripheral circuits.

The memory mats MAT0 to MAT7 include Y-address decoders YAD0 to YAD7, and paired memory arrays MARY00 and MARY01 to MARY70 and MARY71. These memory arrays adopt the divided word line system, as will be described hereinafter, and the individual word lines are arranged longitudinally, as it is called so, in which they are started from the word line driving circuits contained in the middle side peripheral circuit toward the individual shorter sides of the semiconductor substrate surface. As a result, the arrangement of the X-system selection circuit for determining the access time is optimized to speed up the operations of the dynamic RAM.

Figure 14:
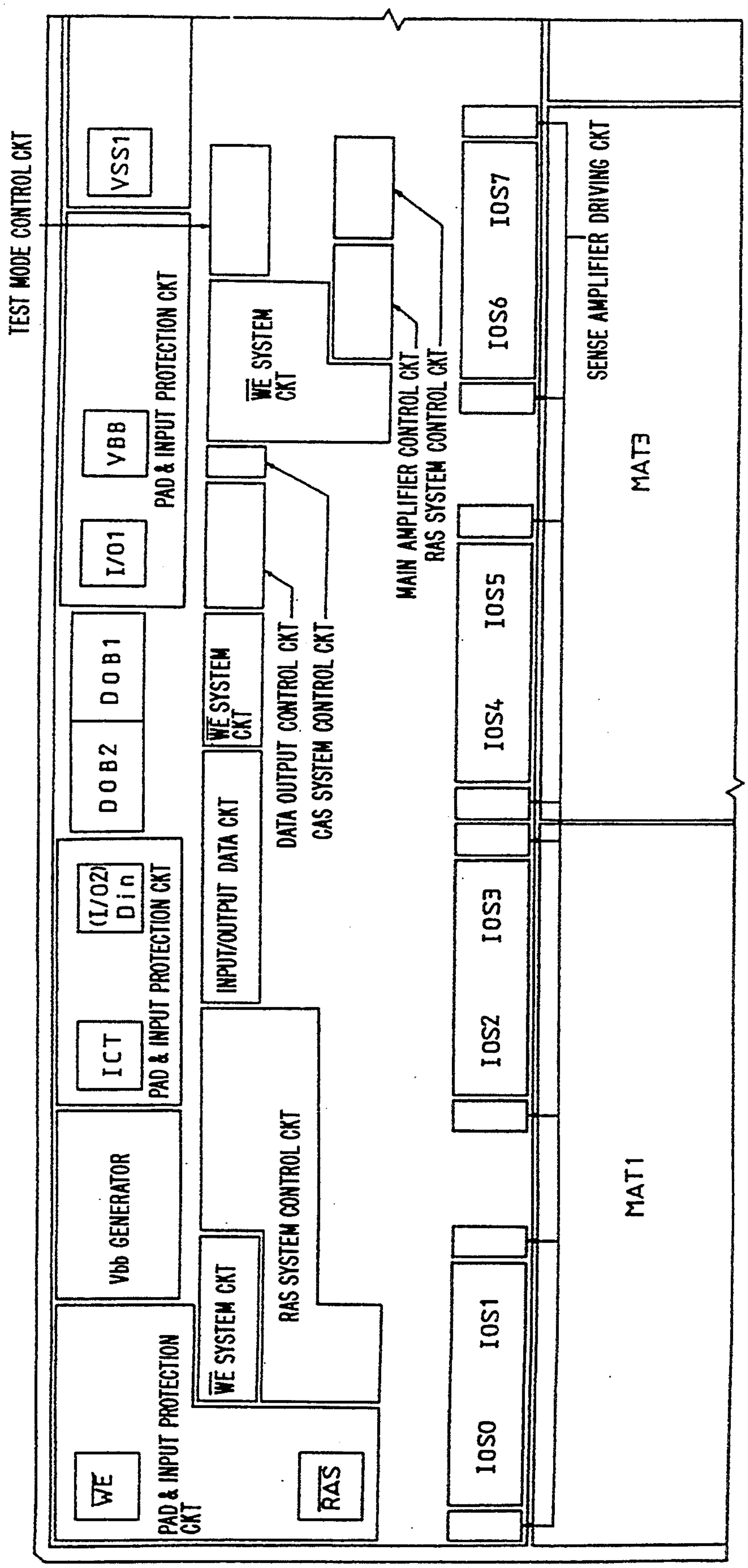
FIGS. 14 to 22 are partial or enlarged arrangement diagrams showing the embodiment of FIG. 13.
Figure 15:
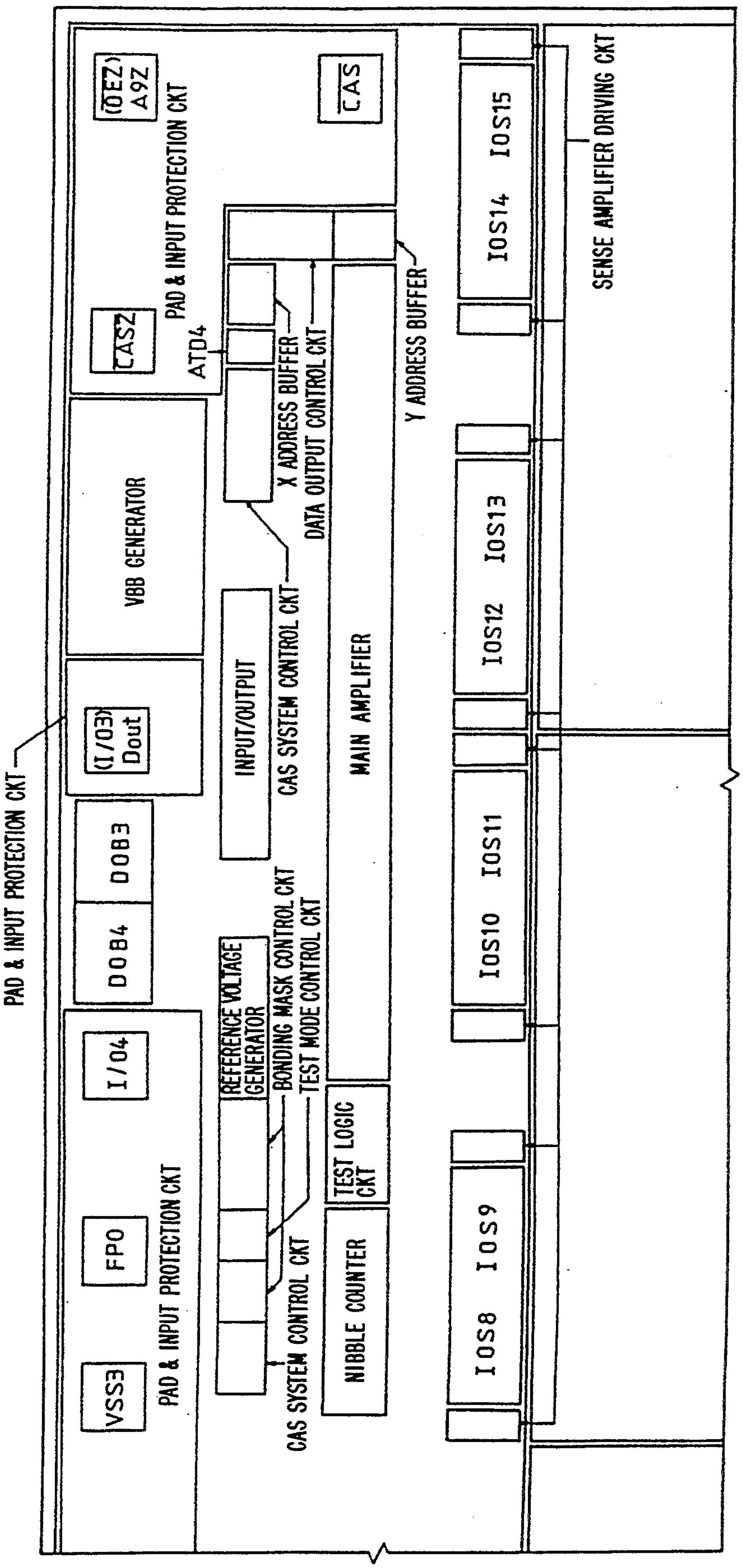
Figure 16:
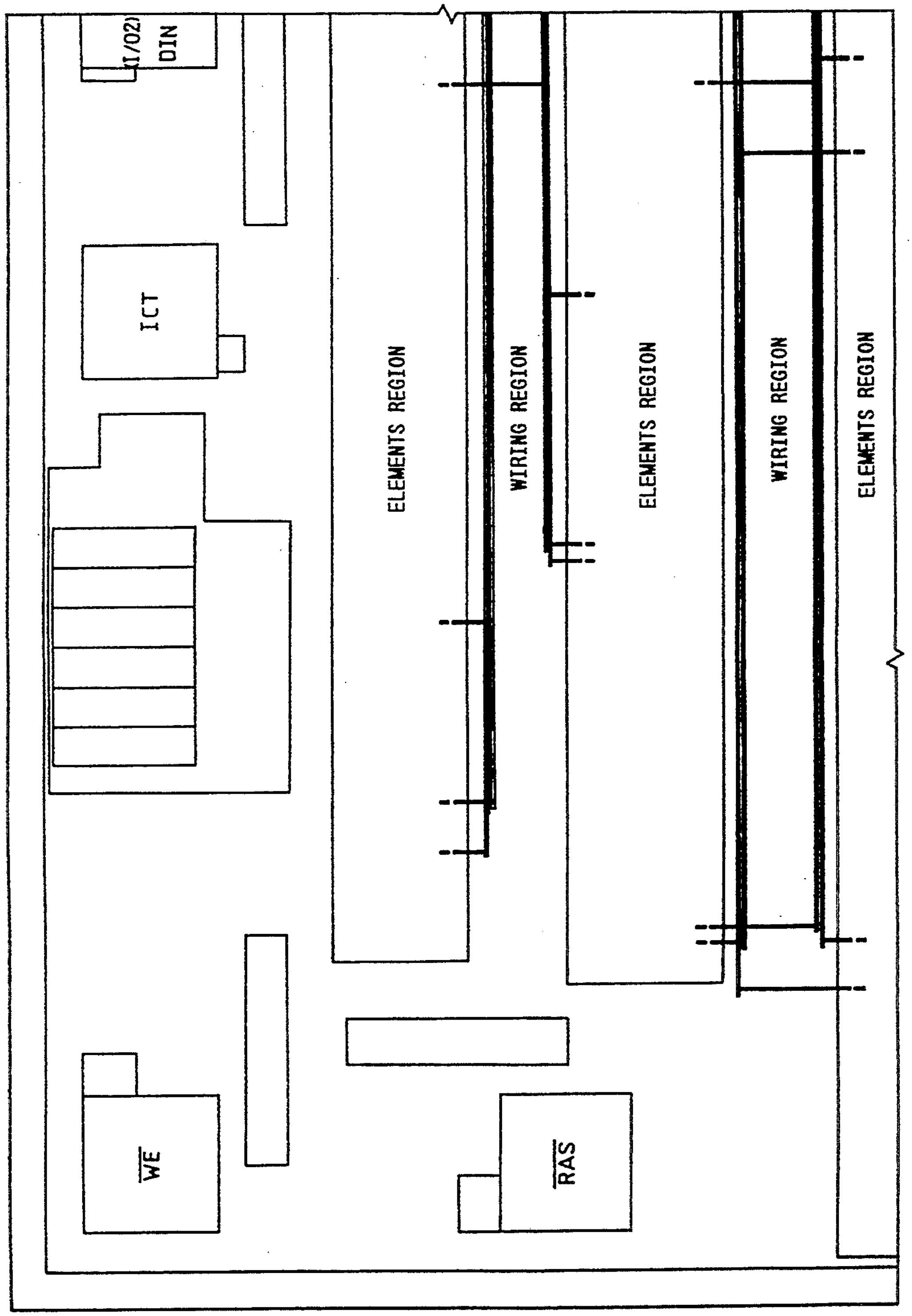

FIGS. 14 and 15 present arrangement diagrams showing embodiments of the upper side portion of the semiconductor substrate surface, i.e., the upper side peripheral circuit of FIG. 13. FIG. 16 is an enlarged arrangement diagram showing the upper side peripheral circuit of FIG. 14.

In FIG. 14, the semiconductor substrate surface is arranged at its lefthand upper corner with the pad $\overline{WE}$, and the pad $\overline{RAS}$ is arranged below the pad $\overline{WE}$ whereas the pads ICT, Din (or I/O2 in the case of the x 4 bit structure), I/O1, VBB, VSS1 and VSS2 are arranged at the righthand side of the same, although not especially limitative thereto. These pads are surrounded by their corresponding input protection circuits. Moreover, a portion of the substrate back bias voltage generator VBBG is arranged between the pads $\overline{WE}$ and ICT. Between the pads Din (or I/O2) and I/O1, there are arranged corresponding data output buffers DOB2 and DOB1. Above the memory mats MAT1 and MAT3, there are arranged the corresponding common I/O line selection circuits IOS0 to IOS7 and the sense amplifier driving circuit, and control circuits for the main amplifiers MA0 to MA3 and $\overline{RAS}$- and $\overline{WE}$-systems are arranged between those circuits and the aforementioned pads.

Next, in FIG. 15, the semiconductor substrate surface is arranged at its righthand corner with the pad A9Z (or $\overline{OEZ}$ in the case of the x 4 bit structure), and the pad $\overline{CAS}$ is arranged below the pad A9Z whereas the pads $\overline{CASZ}$, Dout (or I/O3 in the case of the x 4 bit structure), I/O4, FP0 and VSS3 are arranged at the lefthand side of the same. These pads are surrounded by their corresponding input protection circuit. In the vicinity of the pad A9Z (or $\overline{OE}$), on the other hand, there are arranged the corresponding unit circuits of the X-address buffer XAB and the Y-address buffer YAB. Moreover, another portion of the substrate back bias voltage generator VBBG is arranged between the pads $\overline{CASZ}$ and Dout (or I/O3). Between the pads Dout (or I/O3) and I/O4, there are arranged the corresponding data output buffers DOB3 and DOB4. Above the memory mats MAT5 and MAT7, there are arranged the corresponding common I/O selection circuits IOS8 to IOS15 and the sense amplifier driving circuit, and control circuits for the main amplifiers MA4 to MA7 and the $\overline{CAS}$ system are arranged between those circuits and the aforementioned pads.

In this embodiment, the layout region of each peripheral circuit of the dynamic RAM is classified in accordance with the applications into the elements regions formed in band shapes and wiring regions formed between the elements regions, as represented in the enlarged arrangement diagram of FIG. 16. Of these, the elements regions are formed with circuit elements such as MOSFETs (Insulated Gate Type Field Effect Transistors) constituting the individual peripheral circuits, and the wiring regions are formed with signal lines for coupling those circuit elements. As a result, it is made efficient to design the layout of the peripheral circuits composed of the random logic circuits.

Incidentally, the wiring regions of FIG. 16 are made of two metallic wiring layers of aluminum or its alloy, although not especially limitative thereto. Of these, the upper second aluminum wiring layer Al2 is made to have a larger film thickness than that of the lower first aluminum wiring layer Al1, In this dynamic RAM, therefore, the aforementioned second aluminum wiring layer Al2 is used as the main signal line for coupling the individual circuit elements, and the aforementioned first aluminum wiring layer Al1 is used as a lead-out signal line for coupling the circuit elements formed in the element regions and the corresponding main signal line. As a result, the resistance of the main signal line arranged over a relatively long range can be suppressed to shorten the signal transmission delay time thereby to promote the speed-up of the dynamic RAM.

Figure 99A:
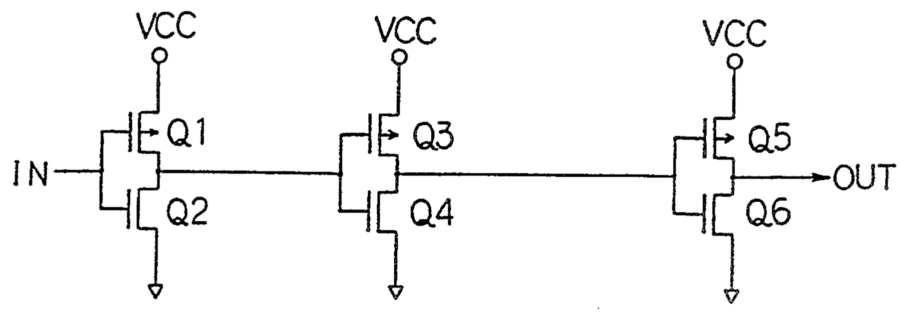
FIG. 99 is an arrangement diagram showing one embodiment of the MOSFETs included in the peripheral circuit of the dynamic RAM according to the present invention.
Figure 99B:
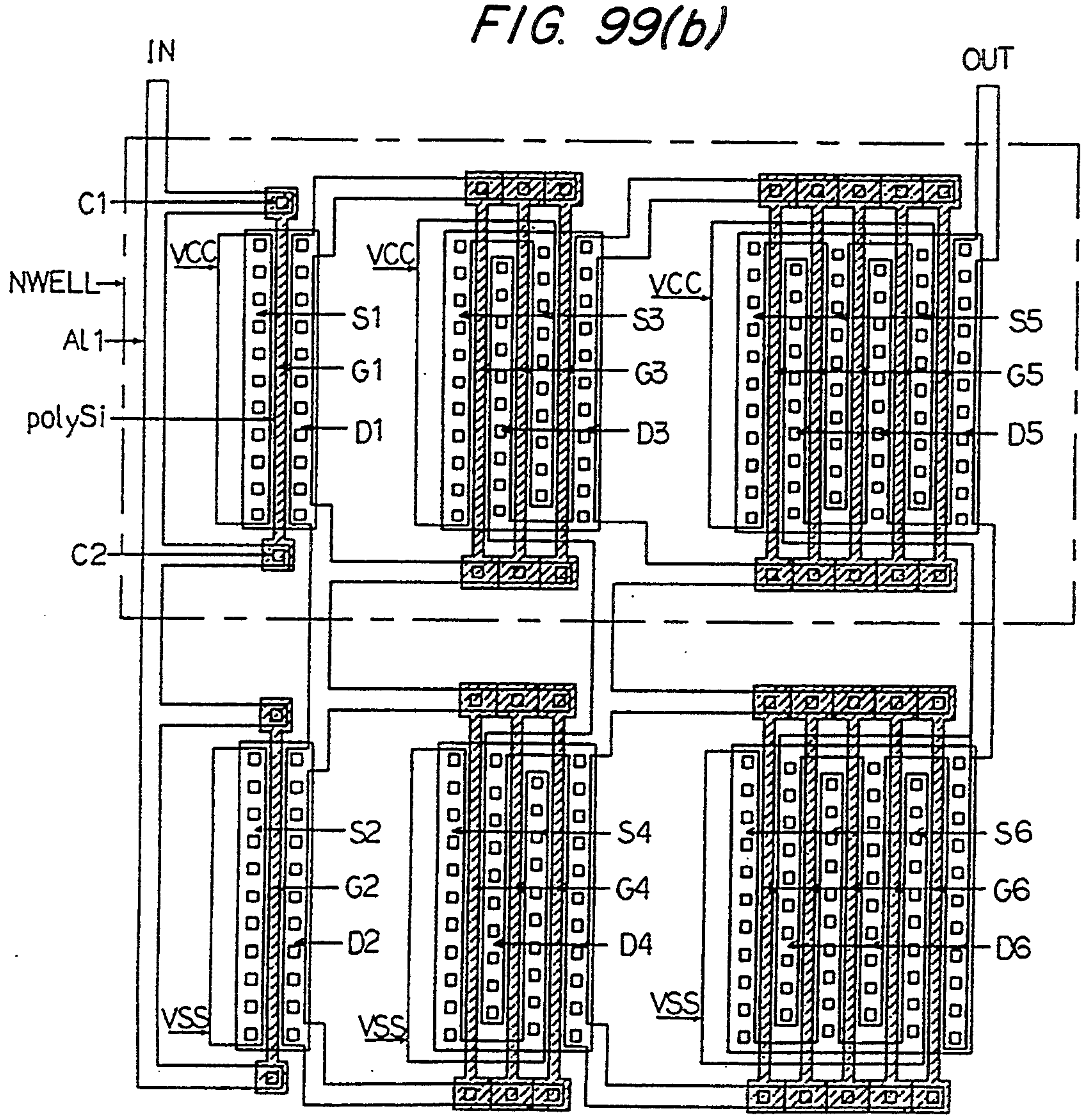

As shown in FIG. 99(*a*), on the other hand, each peripheral circuit of the dynamic RAM is equipped with a signal transmission route in which CMOS (Complementary MOSFET) logic gate circuits, for example, are combined. In this embodiment, MOSFETs Q1 to Q6 constituting the aforementioned CMOS logic gate circuit have their gate electrodes made of gate layers G1 to G6, which are formed between substantially corresponding source regions S1 to S6 and drain regions D1 to D6, namely, through a predetermined insulating film, as shown in FIG. 99(*b*). Those gate layers are formed of polysilicon layers (i.e., poly Si) having a relatively high resistance, although not especially limitative thereto. As a result, the input signal transmitting aluminum wiring layer Al1 corresponding to the gate layers G1 to G6 of each MOSFET is branched, although not especially limitative thereto, and coupled to the corresponding gate layer G1 through two contacts C1 and C2 disposed outside of each gate. As a result, the transmission delay time of the input signal to each gate layer is substantially shortened to speed up the operation of each MOSFET and accordingly the peripheral circuit.

Figure 17:
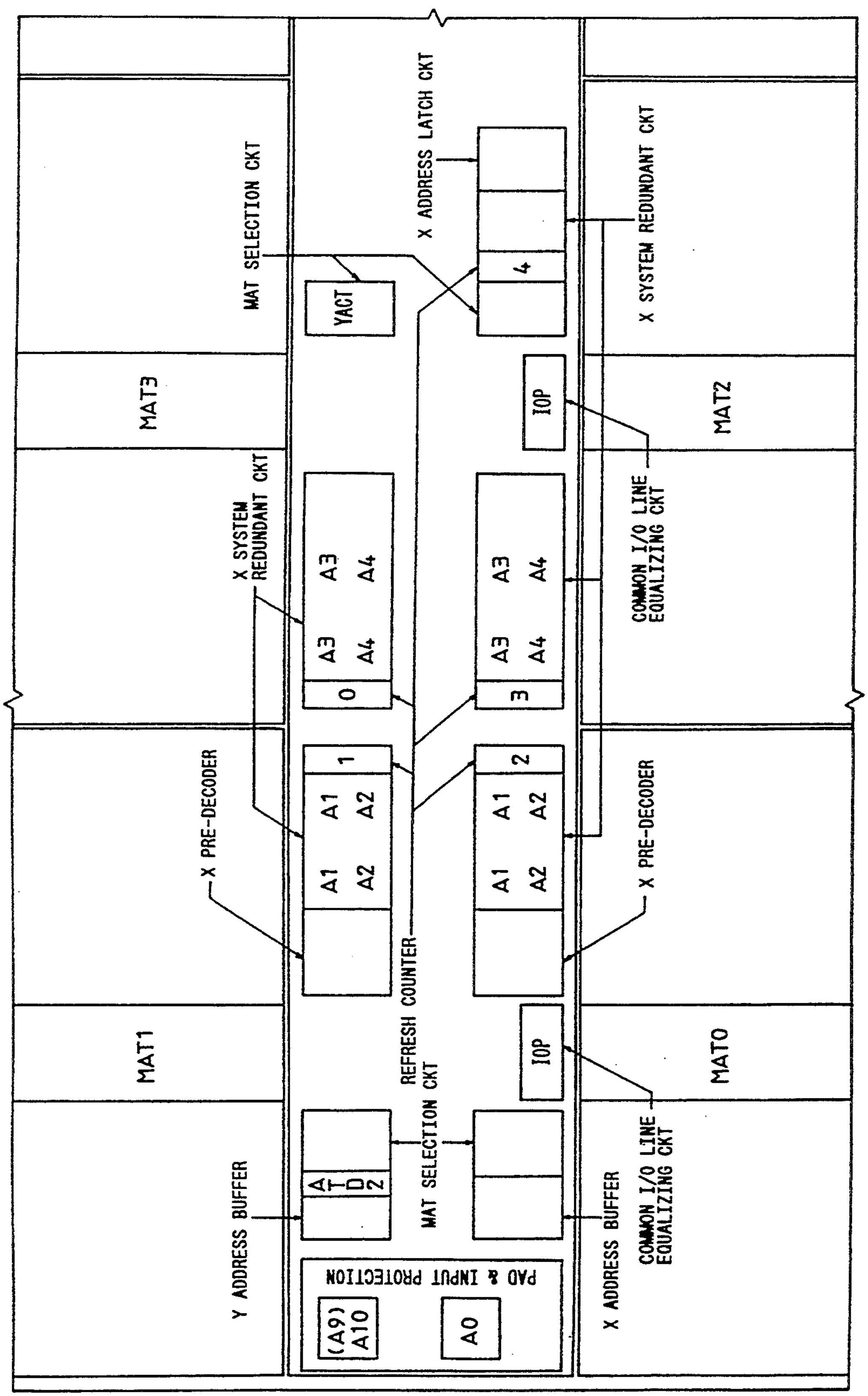
Figure 18:
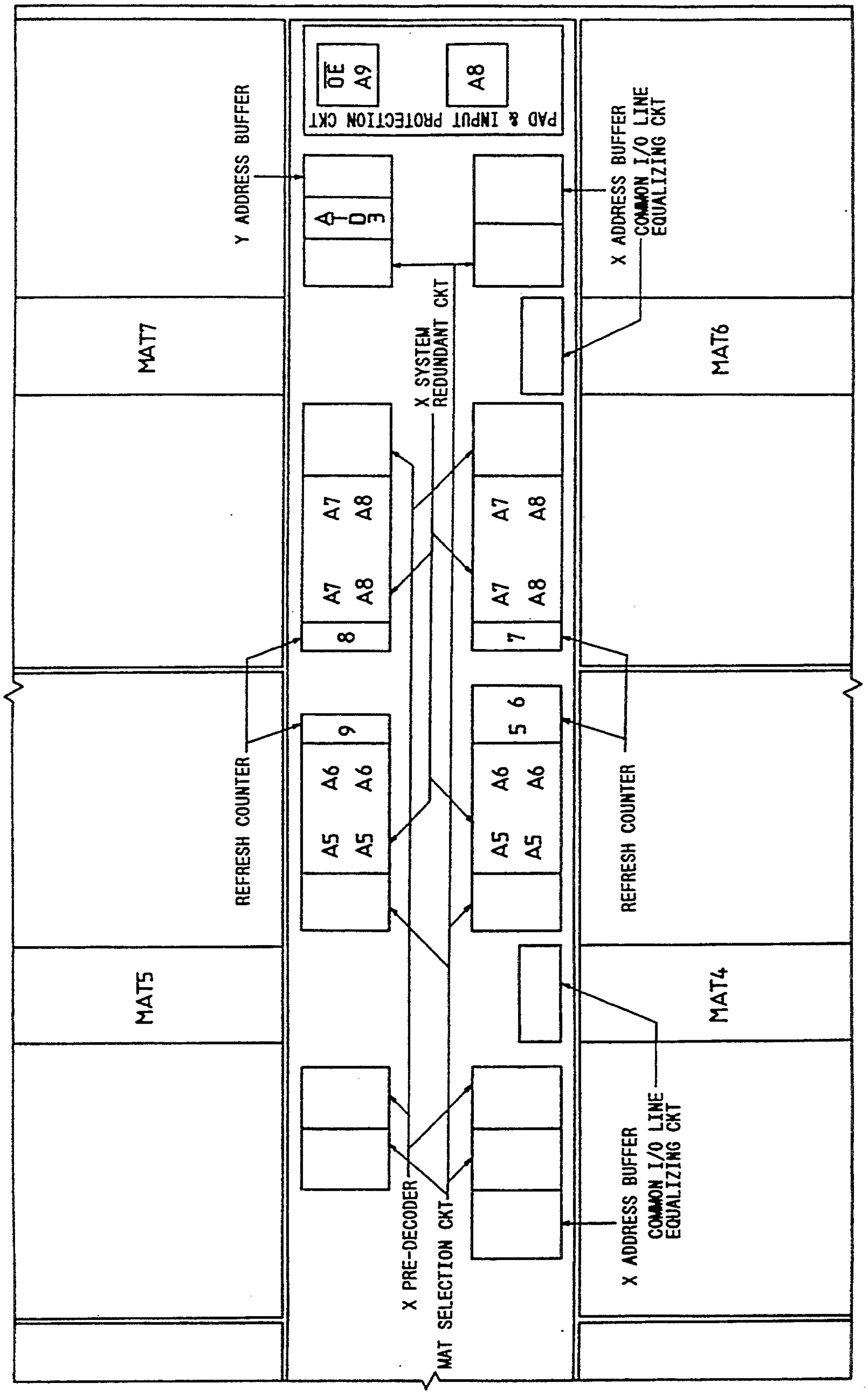

FIGS. 17 and 18 present the arrangement diagrams showing embodiments of the middle side peripheral circuit of the semiconductor substrate surface of FIG. 13.

In FIG. 17, the semiconductor substrate surface is arranged at its central lefthand end with the pads A10 (or A9 in the case of the x 4 bit structure) and A0, although not especially limitative thereto. These pads are surrounded by the corresponding input protection circuit. In the vicinity of these pads, moreover, there are arranged the corresponding unit circuits of the Y-address buffer YAB, the address transition detection circuit ATD and the X-address buffer XAB such that they are generally symmetric with respect to the transverse center line of the semiconductor substrate surface. At the righthand side of those unit circuits, moreover, there are arranged the corresponding unit circuits of an X-predecoder PXAD and an X-system redundant circuit XRC such that they are also generally symmetric with respect to the transverse center line of the semiconductor substrate surface.

In the dynamic RAM of this embodiment, as will be described hereinafter, each memory array is equipped with four sets of common I/O lines, which are arranged to extend through the two memory arrays arranged symmetrically with respect to the transverse center line of the semiconductor substrate surface. Moreover, the inverted and uninverted signal lines constituting each common I/O line are intersected generally at the center of the semiconductor substrate surface and are equalized, as will be described hereinafter. As shown in FIG. 17, therefore, common I/O line equalizing circuits IOEQ0 and IOEQ1 disposed to correspond to the memory mats MAT0 and MAT1 to MAT2 and MAT3 are arranged on the extensions of the corresponding common I/O lines in the middle side peripheral circuit.

As shown in FIG. 18, on the other hand, the semiconductor substrate surface is arranged at its central righthand end with the pads A9 (or $\overline{OE}$ in the case of the x 4 bit structure) and A8, although not especially limitative thereto. These pads are surrounded by the corresponding input protection circuit. In the vicinity of these pads, moreover, there are arranged the corresponding unit circuits of the Y-address buffer YAB, the address transition detection circuit ATD and the X-address buffer XAB such that they are generally symmetric with respect to the transverse center line of the semiconductor substrate surface. At the lefthand side of those unit circuits, there are also arranged the corresponding unit circuits of the X-predecoder PXAD and the X-system redundant circuit XRC such that they are generally symmetric with respect to the transverse center line of the semiconductor substrate surface. On the extensions of the individual common I/O lines, there are arranged common I/O equalizing circuits IOEQ2 and IOEQ3 which correspond to the memory mats MAT4 and MAT5 to MAT6 and MAT7.

Thus, the layout and its design can be made efficient by arranging the unit circuits of the X-predecoder PXAD and the X-system redundant XRC composing the middle side peripheral circuit symmetrically with respect to the transverse center line of the semiconductor substrate surface.

Figure 19:
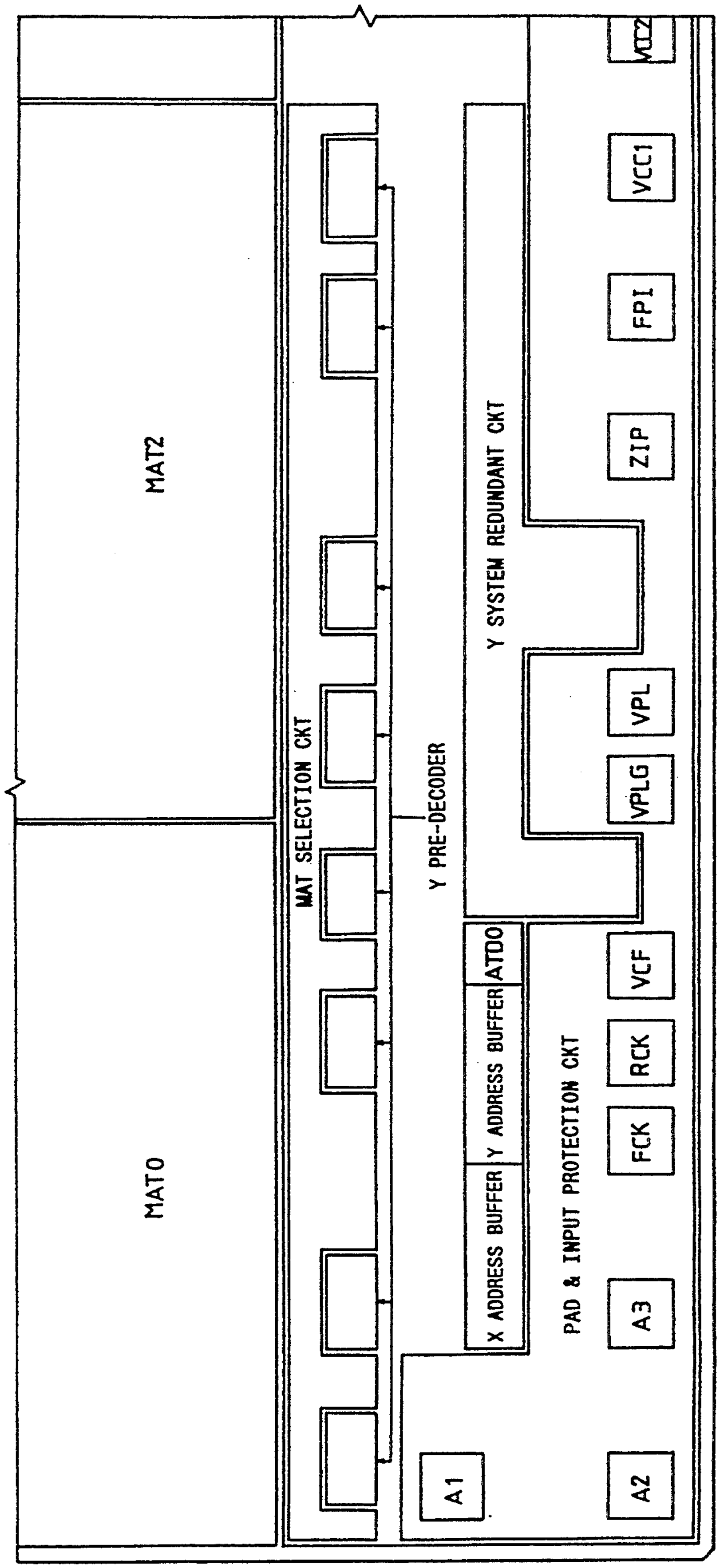
Figure 20:
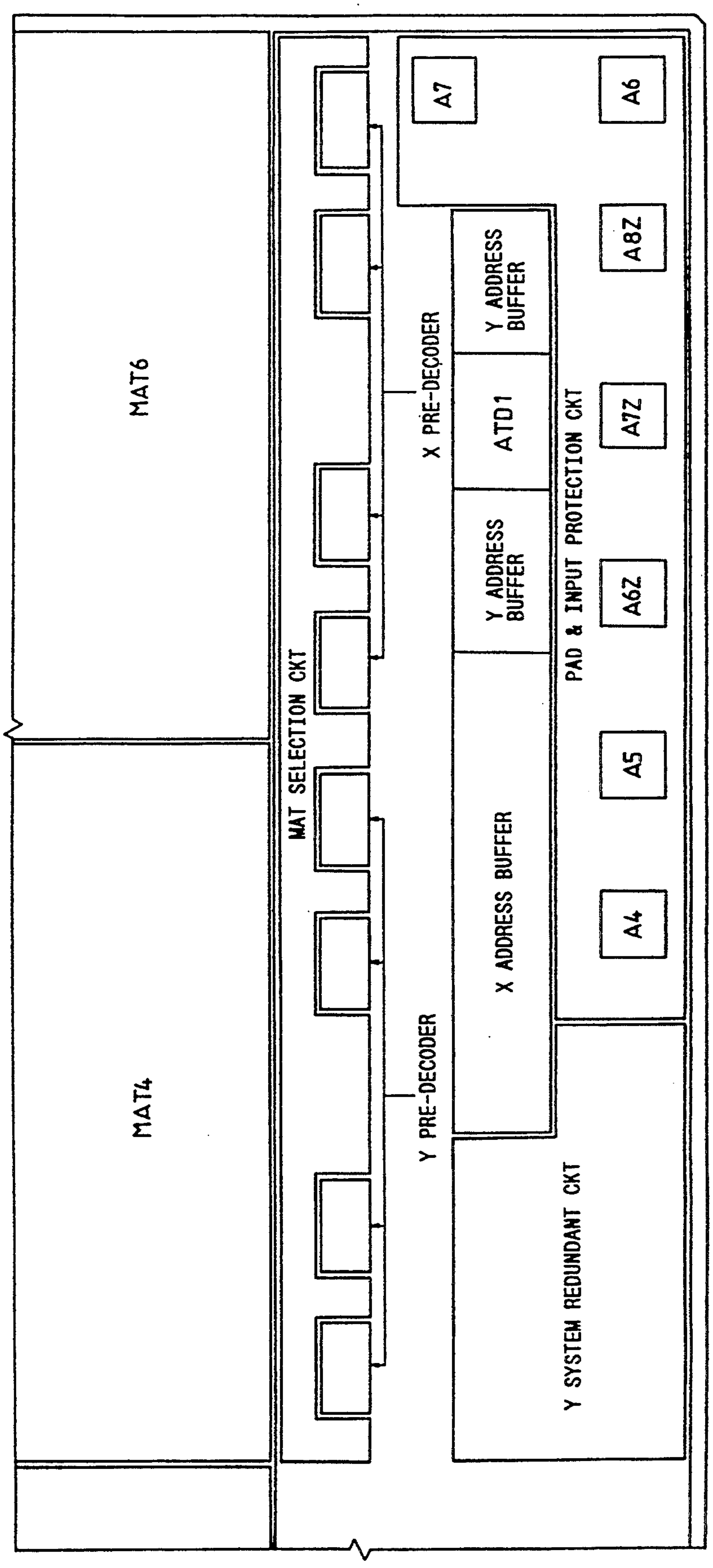
Figure 21:
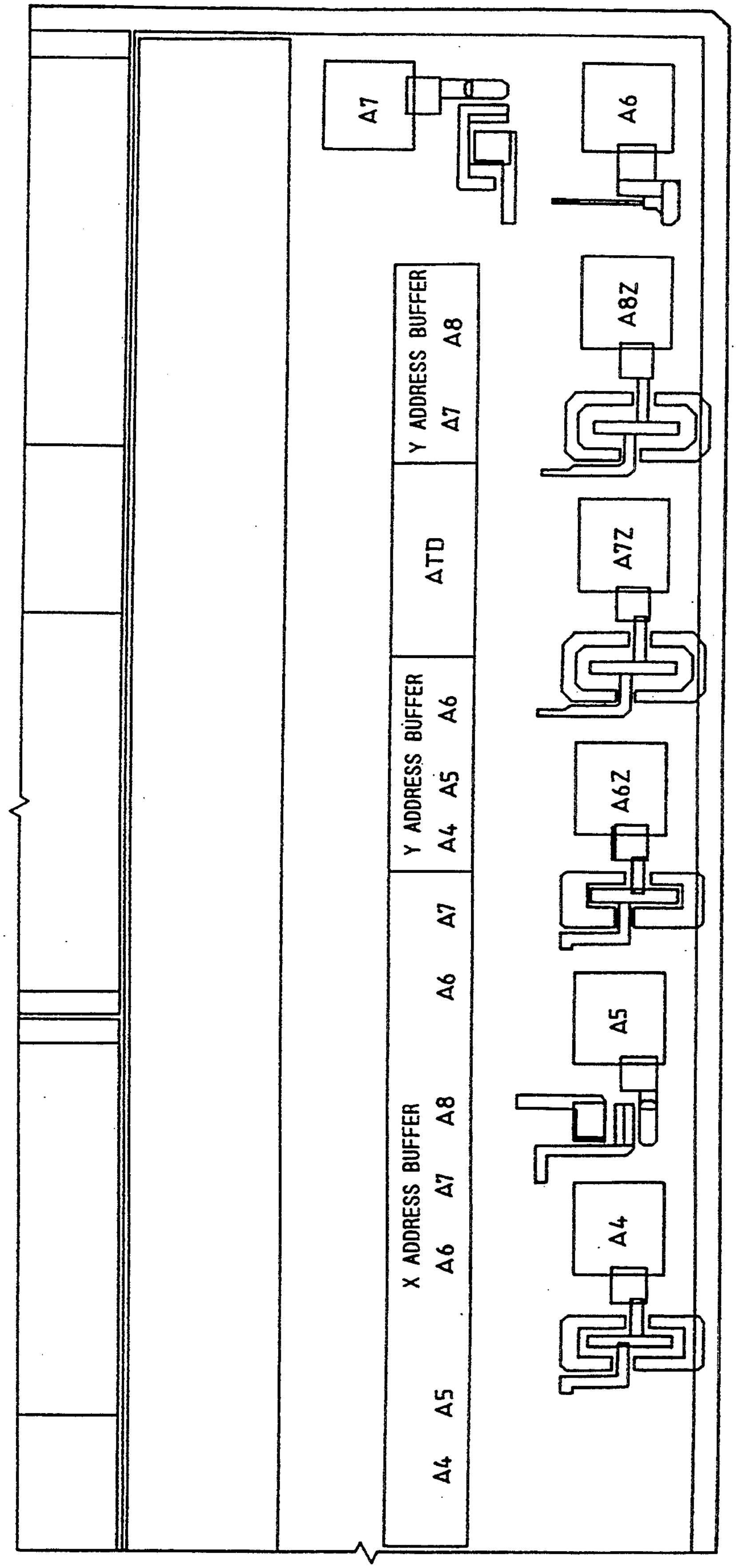
Figure 22:
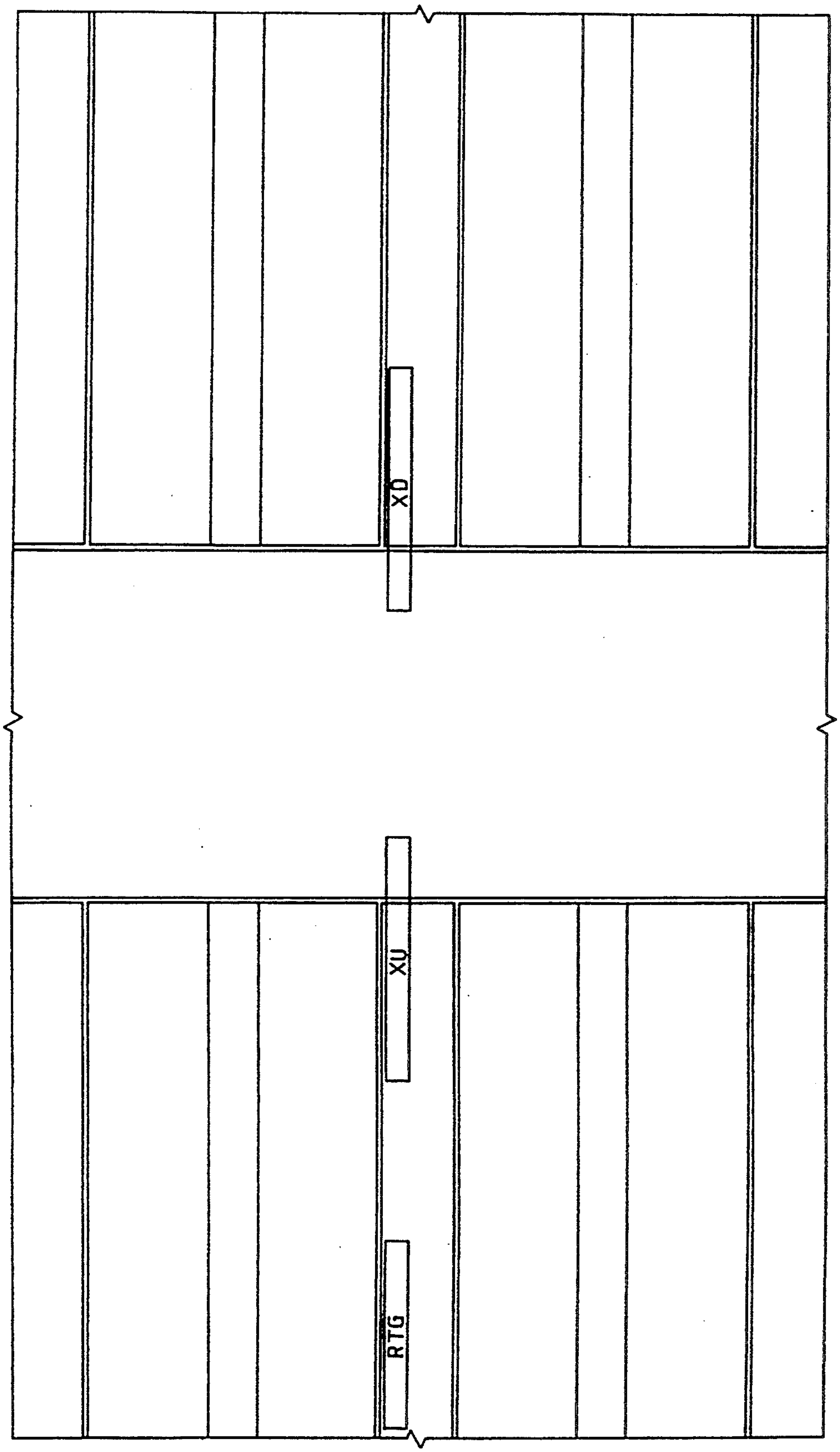

FIGS. 19 and 20 present arrangement diagrams showing embodiments of the lower side portion of the semiconductor substrate surface of FIG. 13, i.e., the lower side peripheral circuit. Moreover, FIG. 21 is an enlarged arrangement diagram showing a portion of the lower side peripheral circuit of FIG. 20.

In FIG. 19, the semiconductor substrate surface is arranged at its lefthand lower end with the pad A2, and the pad A1 is arranged above the pad A2 whereas the pads A3, FCK, RCK, VCF, VPLG, VPL, ZIP, FP1, VCC1 and VCC2 are arranged at the righthand side of the same, although not especially limitative thereto. These pads are surrounded by the corresponding input protection circuit. In the vicinity of the pads A1 to A3, there are arranged the unit circuits which correspond to the X-address buffer XAB, the Y-address buffer YAB and the address transition detection circuit ATD. Between those pads and the memory mats MAT0 and MAT2, moreover, there are arranged portions of a Y-predecoder PYAD and a Y-system redundant circuit YRC.

As shown in FIG. 20, on the other hand, the semiconductor substrate surface is arranged at its righthand lower end with the pad A6, and the pad A7 is arranged above the pad A6 whereas the pads A8Z, A7Z, A6Z, A5 and A4 are arranged at the lefthand side of the same, although not especially limitative thereto. These pads are surrounded by the corresponding input protection circuit. In the vicinity of these pads, there are arranged the unit circuits which correspond to the X-address buffer XAB, the Y-address buffer YAB and the address transition detection circuit ATD. Between the aforementioned pads and the memory mats MAT4 and MAT6, moreover, there are arranged portions of the X-predecoder PXAD and the Y-predecoder PYAD.

In this embodiment, the individual unit circuits of the X-address buffer XAB, the Y-address buffer YAB and the address transition detection circuit ATD are arranged in the vicinity of the corresponding bonding pads, as has been described hereinbefore. Of these, the unit circuit of the Y-address buffer YAB is basically arranged in a position closer to the corresponding pad than the corresponding unit circuit of the X-address buffer XAB, as shown in FIG. 21. In the dynamic RAM adopting the address multiplex method, as is well known in the art, the access time is determined in accordance with the transmission delay time of the Y-address signal to be fed later. In this embodiment, the transmission delay time of the Y-address signal is shortened to speed up the dynamic RAM by arranging each unit circuit of the Y-address buffer YAB in a position closer to the corresponding pad. Since, moreover, each unit circuit of the address transition detection circuit ATD is arranged in the vicinity of the corresponding pad, the undesirable transmission delay time of the address transition detection circuit ATD is shortened to speed up the operation of the dynamic RAM in the static column mode.

1.1.8. Power Supply System

Figure 23:
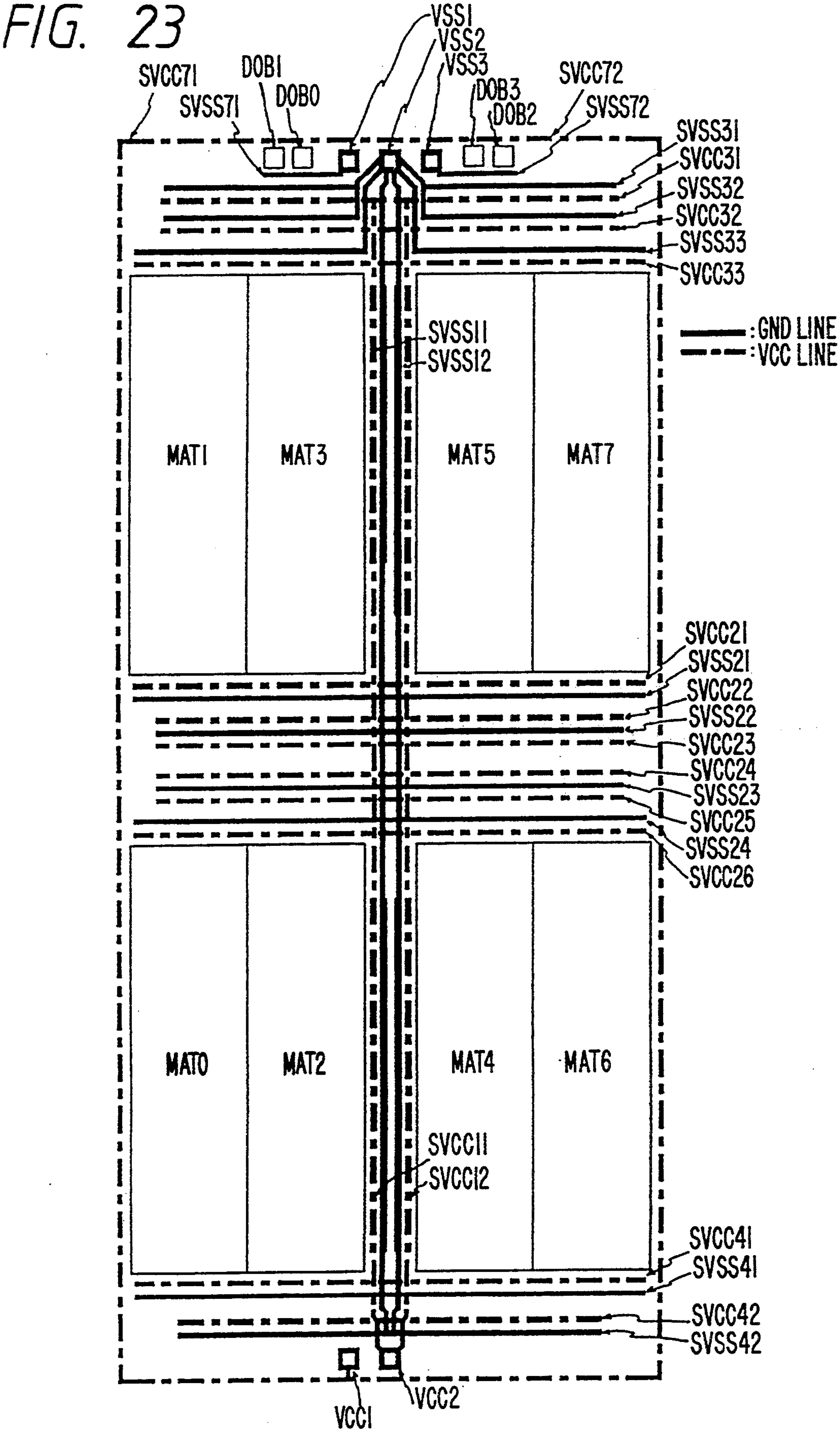
FIGS. 23 and 24 are power supply trunk line diagrams showing two embodiments of the dynamic RAM according to the present invention.

FIG. 23 presents a power supply trunk line diagram showing one embodiment of the dynamic RAM according to the present invention. As has been described hereinbefore, the dynamic RAM of this embodiment is supplied as its power supply with the power supply voltage VCC of the circuit around +5 V and the ground potential VSS, which are fed to the individual circuits through the two metallic wiring layers made of aluminum or its alloy. In FIG. 23, the power supply trunk lines for supplying the aforementioned power supply voltage VCC of the circuit are indicated by single-dotted lines, and the power supply trunk lines for supplying the aforementioned ground potential VSS of the circuit are indicated by solid lines. In each power supply trunk line, moreover, the so-called "double supply lines" made by coupling the first and second aluminum layers Al1 and Al2 in parallel are indicated by thick lines.

In FIG. 23, as has been described hereinbefore, the dynamic RAM is equipped with: the eight memory mats MAT0 to MAT7 divided and arranged by the longitudinal center line and the transverse center (straight) line of the semiconductor substrate surface; and the peripheral circuits which are arranged partly along the aforementioned two center lines and partly at the outside of the aforementioned memory mats and in parallel with the shorter sides of the semiconductor substrate surface. In this embodiment, six parallel power voltage supply lines SVCC21 to SVCC26 and four ground potential supply lines (or second power supply lines) SVSS21 to SVSS24 are arranged along the transverse center line of the semiconductor substrate surface. Moreover, three voltage supply lines SVCC31 to SVCC33 and three ground potential supply lines SVSS31 to SVSS33 (or third power supply lines), and two power voltage supply lines SVCC41 and SVCC42 and two ground potential supply lines (or fourth power supply lines) SVSS41 and SVSS42 are arranged outside of the memory array and along the individual shorter sides of the semiconductor substrate surface. These power voltage supply lines and the ground potential supply lines are commonly coupled through two power voltage supply lines SVCC11 and SVCC12 and ground potential supply lines (or first Power supply lines) SVSS11 and SVSS12, which are arranged along the longitudinal center line of the semiconductor substrate surface.

In this embodiment, the aforementioned power voltage supply lines SVCC11 and SVCC12 are coupled to a pad VCC2 which is arranged in the position closest to the intersections with the aforementioned power voltage supply lines SVCC41 and SVCC42. The aforementioned ground potential supply lines SVSS11 and SVSS12 are coupled to a pad VSS2 which is arranged in the position closest to the intersections with the aforementioned ground potential supply lines SVSS31 to SVSS33. Moreover, these power voltage supply lines SVCC11 and SVCC12 and ground potential supply lines SVSS11 and SVSS12 are mostly the so-called "double supply lines", in which the two aluminum wiring layers Al1 and Al2 are coupled in parallel, as indicated by the thick lines in FIG. 23. As a result, the total impedance of those power supply trunk lines is reduced to suppress the power source noises so that the operations of the dynamic RAM can be stabilized and speeded up.

Here, the dynamic RAM of this embodiment is equipped with the two pads VCC1 and VCC2 for supplying the power voltage of the circuit and the three pads VSS1 to VSS3 for supplying the ground potential of the circuit. Of these, the pad VCC2 is coupled to the aforementioned power voltage supply lines SVCC11 and SVCC12, whereas the pad VSS2 is coupled to the aforementioned ground potential supply lines SVSS11 and SVSS12. In this embodiment, the remaining pad VCC1 is coupled to the power voltage supply lines SVCC71 and SVCC72 for supplying the power voltage of the circuit to the data output buffers DOB0 to DOB3, as shown in FIG. 23. The pads VSS1 and VSS3 are coupled to the ground potential supply lines SVSS71 and SVSS72, respectively, for supplying the ground potential of the circuit to the aforementioned data output buffers DOB0 to DOB3. In other words, the power supply trunk lines for supplying the relatively high operation currents intermittently to the data output buffers DOB0 to DOB3 are separated in the portions of the pads and the bonding wires from the power supply trunk lines for other general peripheral circuits. As a result, the power source noises to be generated by the simultaneous operations of the data output buffers DOB0 to DOB3 can be suppressed to stabilize the operations of the dynamic RAM better.

Figure 24:
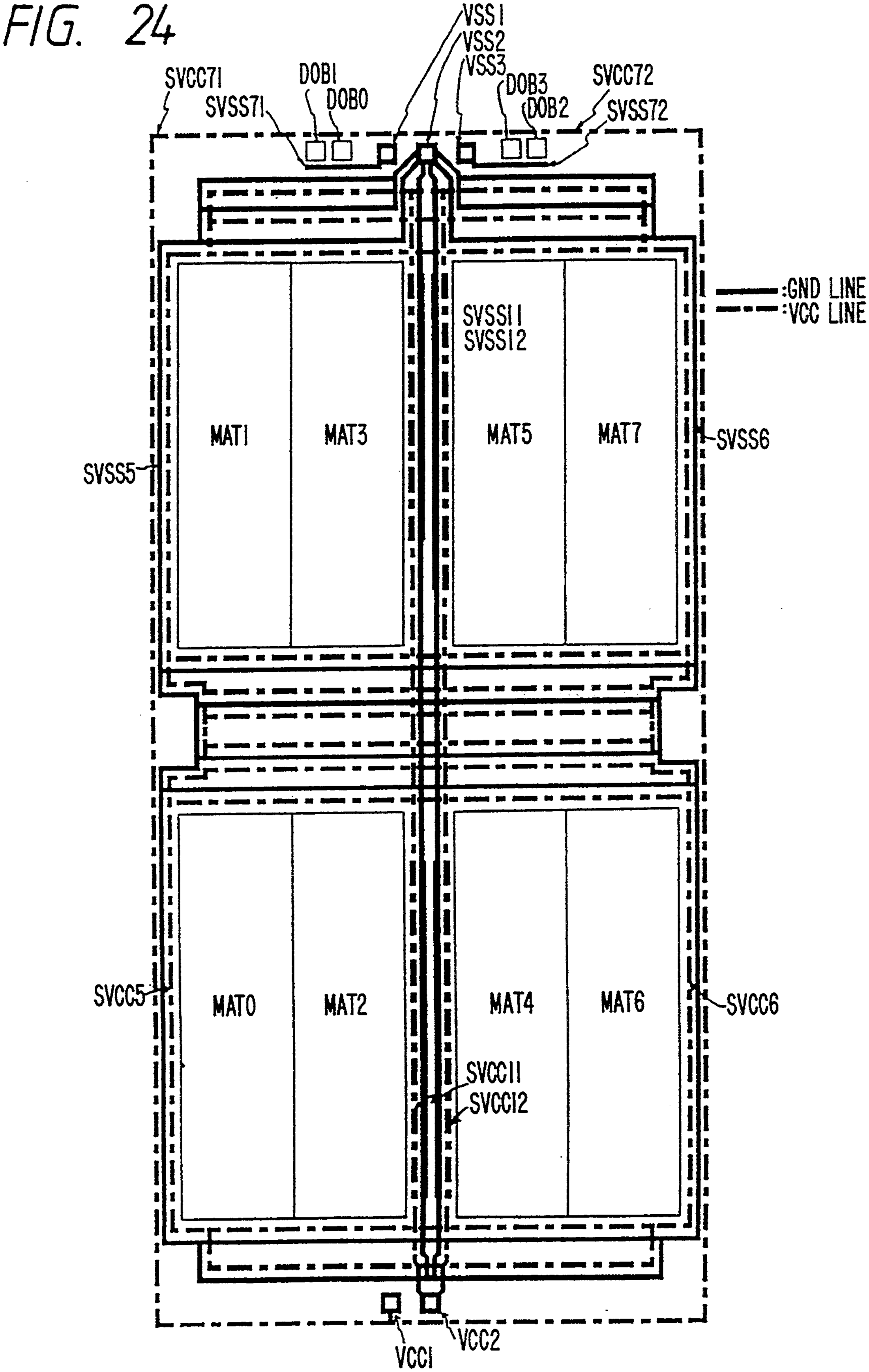

FIG. 24 is a diagram showing the power supply trunk lines of another embodiment of the dynamic RAM according to the according to the present invention.

In FIG. 24, the semiconductor substrate surface of the dynamic RAM is equipped, in addition to those lines of FIG. 23, with a power voltage supply line SVCC5, a ground potential supply line SVSS5 (or a fifth power supply line), a power voltage supply line SVCC6 and a ground potential supply line (or a sixth power supply line) SVSS6, which are arranged outside of the memory mats and along the individual longer sides of the semiconductor substrate surface. These power voltage supply lines and ground potential supply lines are coupled at their one-side ends with the corresponding pads VCC2 or-VSS2, respectively, and to the other ends of the aforementioned power voltage supply lines SVCC21 to SVCC26, SVCC41 and SVCC42 and the ground potential supply lines SVSS21 to SVSS24, SVSS41 and SVSS42. This causes the power supply trunk lines of the dynamic RAM to have lower impedances and stabilized operations.

1.1.9. Address Structure and Selection Method

Figure 83:
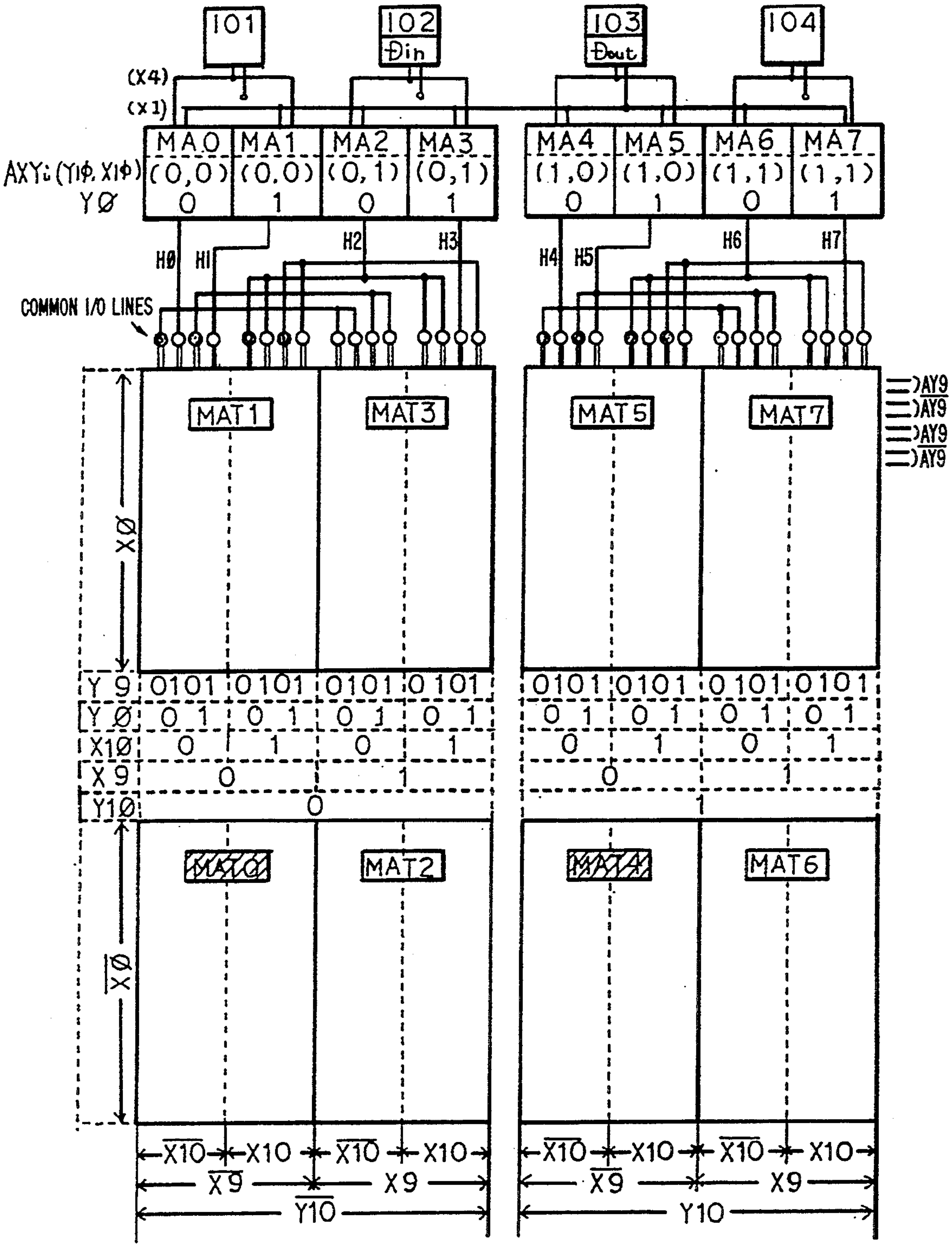
FIGS. 83 and 84 are conceptional diagrams showing the mat selection and the selection method, respectively.
Figure 84:
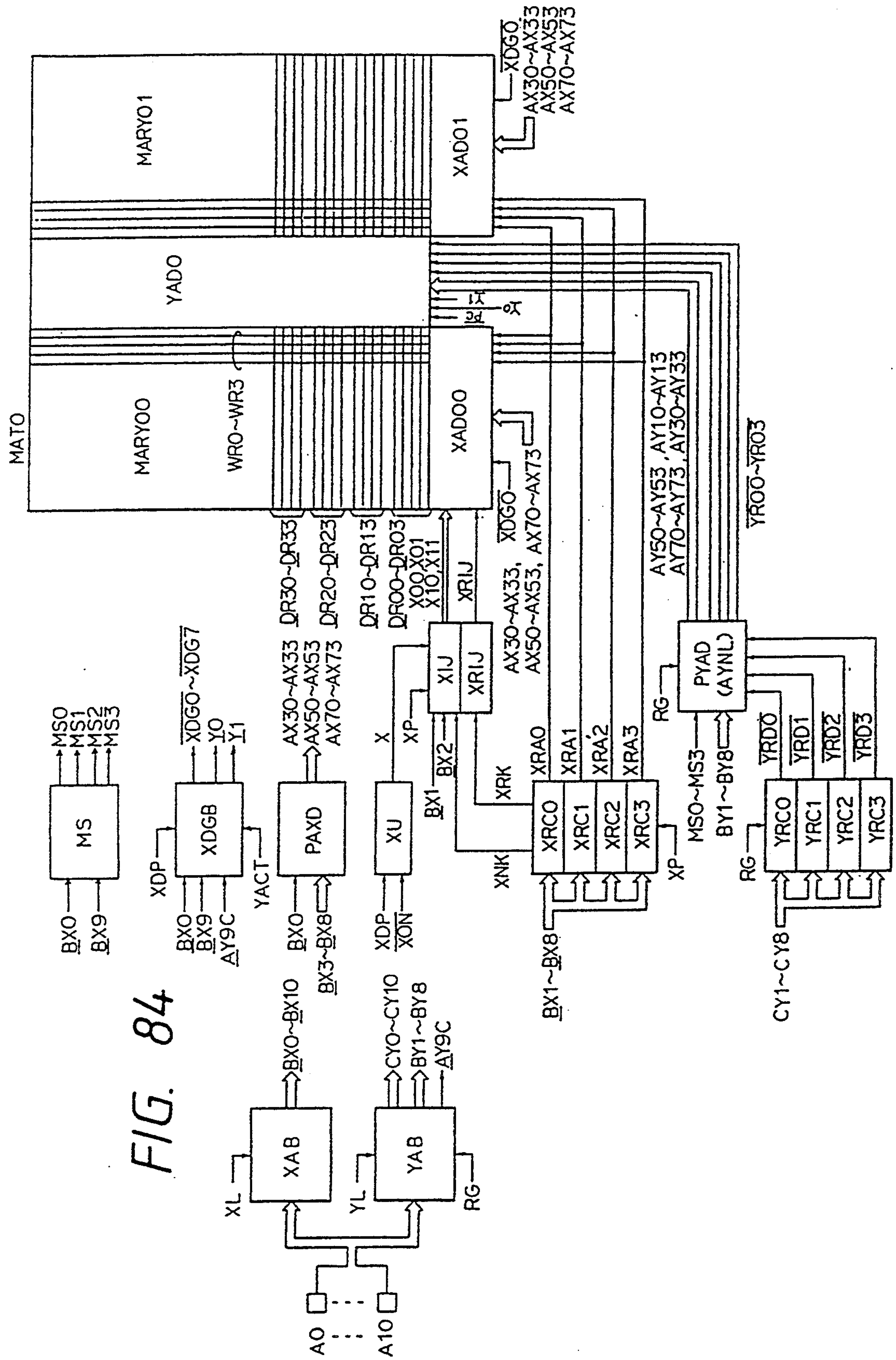
Figure 85:
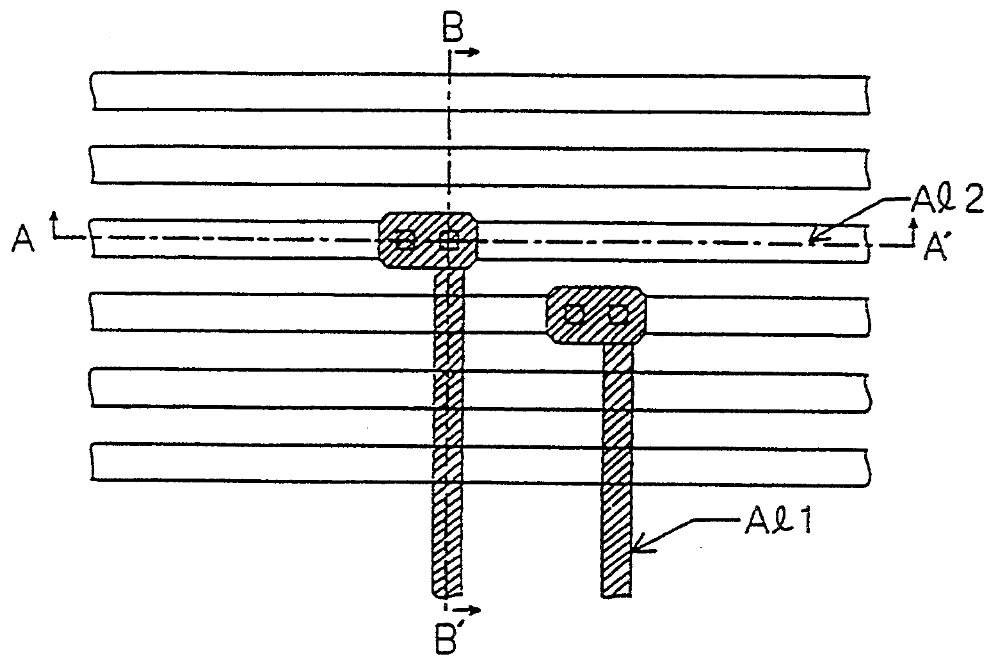
FIGS. 85(A & B) is a sectional view showing one embodiment of the wiring regions of the dynamic RAM according to the present invention.
Figure 85A:
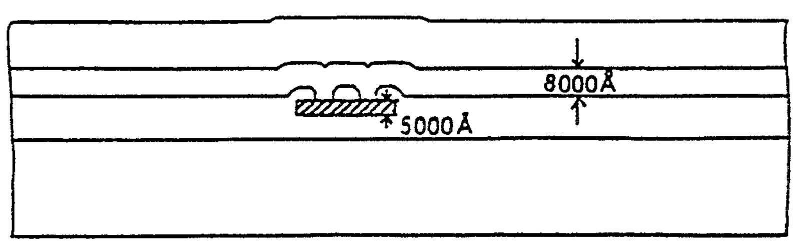
Figure 85B:
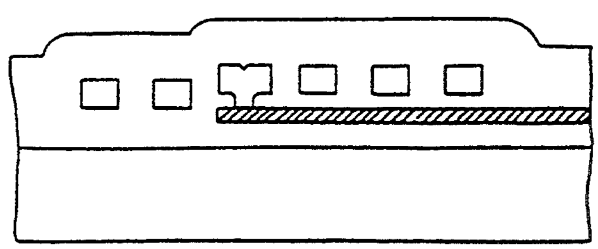

FIG. 83 presents a conceptional diagram for explaining the address structure of the dynamic RAM according to the present invention. Moreover, FIG. 84 presents a conceptional diagram for explaining the array structure, the redundant structure and the selection system of the aforementioned dynamic RAM.

The dynamic RAM of this embodiment is equipped, as has been described hereinbefore, with the eight memory mats MAT0 to MAT7 which include the paired memory arrays MARY00 and MARY01 to MARY70 and MARY71 and their direct peripheral circuits. As represented by the memory arrays MARY00 and MARY01 of FIG. 84, the two memory arrays constituting each memory mat include: 256 word lines W0 to W255 and four redundant word lines WR0 to WR3 arranged in parallel with the vertical direction; 1,024 sets of complementary data lines $\overline{\text{D0}}$ to $\overline{\text{D1,023}}$ and 16 sets of redundant complementary data lines $\overline{\text{DR00}}$ to $\overline{\text{DR03}}$ to $\overline{\text{DR30}}$ to $\overline{\text{DR33}}$ arranged in parallel with the horizontal direction; and a number of dynamic memory cells arranged in a lattice shape at the points of intersections of those word lines and complementary data lines. As will be described hereinafter, the word lines and complementary data lines constituting each memory array are divided or grouped into four sets, each of which is prepared with a unit circuit of an X-address decoder XAD or a Y-address decoder YAD.

In this embodiment, the aforementioned memory mats MAT0 to MAT7 make the pairs of the MAT0 and MAT1, MAT2 and MAT3, MAT4 and MATS, and MAT6 and MAT7, which are arranged symmetrically across the corresponding X-address decoders, as has been described hereinbefore. These memory mats are equipped with corresponding eight sets of common I/O lines. Of these, the four common I/O lines are arranged to extend through the corresponding memory arrays MARY00 and MARY10 to MARY60 and MARY 70 at the lefthand side of each of the memory mats (e.g. see FIG. 13), and the remaining four sets of common I/O lines are arranged to extend through the corresponding memory arrays MARY01 and MARY11 to MARY61 and MARY71 at the righthand side of each memory mat. IN other words, the dynamic RAM of this embodiment is equipped with totally thirty two common I/O lines, every two sets of which are coupled to the corresponding I/O line selection circuits IOS0 to IOS15 (this is discussed in further detail hereinafter with regard to FIG. 68). These common I/O selection lines have their every two sets of input/output terminals coupled commonly to the corresponding main amplifiers MA0 to MA7. As a result, eight sets of common I/O lines are selectively connected with the main amplifiers MA0 to MA7.

The aforementioned memory mats MAT0 to MAT7 are simultaneously brought into their selected states in which two of them MAT0 and MAT4, MAT1 and MAT5, MAT2 and MAT6, or MAT3 and MAT7, as hatched in FIG. 83, for example, so that the corresponding four memory arrays simultaneously come into their selected states, although not especially limitative thereto. Then, two sets from each memory arrays, i.e., totally eight sets of complementary data lines are simultaneously selected and are connected with the main amplifiers MA0 to MA7 through the corresponding two sets, totally eight sets of common I/O lines. As a result, each memory array has a substantial address space of 256 addresses for its rows and 512 addresses for its columns. Of these, the row address space of each memory array is selectively designated at corresponding X-address decoders XAD00 and XAD01 to XAD70 and XAD71, and the column address space is selectively designated at the corresponding Y-address decoders YAD0 to YAD7.

In FIG. 84, the x-address signals X0 to X10 (or X0 to X9) and the Y-address signals Y0 to Y10 (OF Y0 to Y9) fed in a timing sharing manner through the address input terminals A0 to A10 (or A0 to A9 in the case of the x 4 bit structure) are fetched and latched by the corresponding X-address buffer XAB and Y-address buffer YAB in response to a latching timing signal XL or YL. As a result, complementary internal address signals $\overline{\text{BX0}}$ to $\overline{\text{BX10}}$ are formed in a manner to correspond to the X-address signals X0 to X10, and internal address signals CY0 to CY10 in a manner to correspond to the Y-address signals Y0 to Y10. Moreover, a complementary internal address signal $\overline{\text{AY9C}}$ is formed in a manner to correspond to the Y-address signal Y9, and internal address signals BY1 to BY8 are formed by gate-controlling the aforementioned internal address signals CY1 to CY8 in response to a timing signal RG.

The complementary internal address signals $\overline{\text{BX0}}$ and $\overline{\text{BX9}}$ are fed to a mat selection circuit MS and an X-decoder control circuit XDGB. This X-decoder control circuit XDGB is further fed with the aforementioned complementary internal address signal $\overline{\text{AY9C}}$. On the basis of the aforementioned complementary internal address signals $\overline{\text{BX0}}$ to $\overline{\text{BX9}}$, the mat selection circuit MS selectively forms mat selection signals MS0 to MS3. These mat selection signals are used to bring two of the memory mats MAT1 to MAT7 simultaneously into their selected states. On the other hand, the X-decoder control circuit XDGB forms inverted selection signals $\overline{\text{XDG0}}$ to $\overline{\text{XDG7}}$ selectively in the combination of $\overline{\text{XDG0}}$ and $\overline{\text{XDG4}}$, $\overline{\text{XDG1}}$ and $\overline{\text{XDG5}}$, $\overline{\text{XDG2}}$ and $\overline{\text{XDG6}}$, or $\overline{\text{XDG3}}$ and $\overline{\text{XDG7}}$ on the basis of the aforementioned complementary internal address signals $\overline{\text{BX0}}$ and $\overline{\text{BX9}}$. On the basis of the aforementioned complementary internal address signal $\overline{\text{AY9C}}$, the X-decoder control circuit XDGB forms complementary selection signals $\overline{\text{Y0}}$ and $\overline{\text{Y1}}$ selectively. Of these, the inverted selection signals $\overline{\text{XDG0}}$ to $\overline{\text{XDG7}}$ are fed to the corresponding X-address decoders XAD00 and XAD01 to XAD70 and XAD71, respectively, to bring them selectively into the operative states. Moreover, the complementary selection signals $\overline{\text{Y0}}$ and $\overline{\text{Y1}}$ are fed to the Y-address decoders YAD0 to YAD7 so that they may be used to designate two sets from the four sets of complementary data lines in the selected complementary data line groups. As a result, the X-address signals X0 and X9 are used to designate two of the memory mats MAT0 to MAT7 selectively, and the Y-address signal Y9 is used to designate two of the four sets of common I/O lines selectively for the individual memory arrays.

Next, the complementary internal address signals $\overline{\text{BX1}}$ and $\overline{\text{BX2}}$ of 2 bits are fed to a word line drive signal generator XIJ. This word line drive signal generator XIJ is fed with a word line selection timing signal X from a word line selection timing signal generator XU and an internal signal XNK from the X-system redundant circuit XRC. The aforementioned word line selection timing signal X is formed in synchronism with an inverted timing signal $\overline{\text{XON}}$ and has a boost level higher than the power supply voltage VCC of the circuit.

Here, the X-redundant circuit XRC is equipped with four unit circuits XRC0 to XRC3 provided for the aforementioned redundant word lines WR0 to WR3. These unit circuits include: eight fuse means for latching the defective addresses which are assigned to the corresponding redundant word lines; and address comparators for comparing and collating the defective addresses latched by the fuse means and the X-addresses of 8 bits, i.e., the complementary internal address signals $\overline{BX1}$ to $\overline{BX8}$ given from the outside when in the memory access. In this embodiment, the address comparator provided for each unit circuit of the X-system redundant circuit XRC is equipped with both a coincidence detection circuit for deciding that the aforementioned defective address and the given address are coincident in all the bits and an incoincidence detection circuit for deciding the incoincidence. These detection circuits are of the so-called "selective extraction type" in which the charges of the predetermined output nodes precharged in response to a timing signal XP are selectively extracted in accordance with the results of the address comparison and collation. As a result, an internal signal XNK indicating that the aforementioned defective address and the given address are coincident in all the bits and an internal signal XRK indicating the incoincidence are exclusively changed to the high level. Since the internal signals can be used as they are, without any strobing of a predetermined timing, for the logical conditions of the subsequent circuit, the operations of the X-system redundant circuit XRC or the critical path can be speeded up.

The word line drive signal generator XIJ is basically composed, like the X-system redundant circuit XRC, of a selective extraction type circuit for operating in response to the timing signal XP. On condition that the aforementioned internal signal XNK is at the low level, namely, that the defective addresses assigned to all the redundant word lines and the given X-addresses are not coincident, the word line drive signal generator XIJ transmits the aforementioned word line selection timing signal XP selectively to form the word line selection drive signal X00, X01, X10 or X11. These word line selection drive signals are fed to the X-address decoders XAD00 and XAD01 to XAD70 and XAD71 so that they are used to designate four of the word lines in the selected word line group selectively.

If the corresponding defective address and the given X-address are coincident in all the bits in any of the unit circuits of the X-system redundant circuit XRC, the output signals of the corresponding unit circuit, i.e., the internal signals XRA0 to XRA3 are selectively left at the low level whereas the aforementioned internal signal XNK is at the high level, although not especially limitative thereto. As a result, the operations of the aforementioned word line drive signal generator XIJ are stopped, but a redundant drive signal generator XRIJ comes into its operative state because the internal signal XRK is at the low level. In this operative state, the redundant word line drive signal generator XRIJ transmits the aforementioned word line selection timing signal X selectively to have its output signal of the redundant word line selection drive signal XRIJ. This redundant word line selection drive signal XRIJ is fed together with the aforementioned internal signals XRA0 to XRA3 to the X-address deciders XAD00 and XAD01 to XAD70 and XAD71 so that they are used to bring the redundant word lines WR0 to WR3 of each memory array selectively into the selected state.

Moreover, the remaining complementary internal address signals $\overline{BX3}$ to $\overline{BX8}$ of 6 bits are fed to the X-predecoder PXAD. This X-predecoder PXAD sets predecode signals AX30 to AX33, AX50 to AX53 and AX70 to AX73 selectively to the high level by combining every 2 bits of the aforementioned internal address signals $\overline{BX3}$ to $\overline{BX8}$ sequentially and by decoding them. These predecode signals are fed to the X-address decoders XAD00 and XAD01 to XAD70 and XAD71 so that they are used to designate the word line groups of each memory array selectively.

The X-address decoders XAD00 and XAD01 to XAD70 and XAD71 are selectively brought into the operative states when the aforementioned corresponding inverted selection signals $\overline{XDG0}$ to $\overline{XDG7}$ are set to the low level. In these operative states, each of the X-address decoders brings the corresponding one word line or redundant word line selectively into the selected state at the high level by combining the aforementioned word line selection drive signals X00, X01, X10 and X11 or the redundant word line selection drive signal XRIJ and the predecode signals AX30 to AX33, AX50 to AX53 and AX70 to AX73.

Of the internal address signals outputted from the Y-address buffer YAB, on the other hand, the internal address signals CY1 to CY8 of 8 bits are fed to the Y-system redundant circuit YRC. Like the aforementioned X-system redundant circuit XRC, the Y-system redundant circuit YRC includes four unit circuits YRC0 to YRC3 provided for the redundant complementary data lines $\overline{DR00}$ to $\overline{DR03}$ through $\overline{DR30}$ to $\overline{DR33}$. Each of these unit circuits includes: eight fuse means for latching the defective addresses assigned to the corresponding redundant complementary data lines; and address comparators for deciding that those defective addresses and the Y-addresses fed when in the memory access are coincident. Each of the unit circuits of the Y-system redundant circuit YRC is selectively brought into the operative state in response to the timing signal RG. In this operative state, each of the unit circuits of the Y-system redundant circuit YRC compares and collates the corresponding defective address and the given address, i.e., the internal address signals CY1 to CY8 bit by bit to set its output signals, i.e,. the inverted internal signals $\overline{YRD0}$ to $\overline{YRD3}$ selectively to the low level on condition that those addresses are coincident for all the bits. Those inverted internal signals $\overline{YRD0}$ to $\overline{YRD3}$ are fed to the Y-predecoder PYAD.

The Y-predecoder PYAD is further fed with the internal address signals BY1 to BY8 of 8 bits from the Y-address buffer YAB and the mat selection signals MS0 to MS3 from the mat selection circuit MS. The Y-predecoder PYAD is selectively brought into the operative state in response to the timing signal RG. In this operative state, the Y-predecoder PYAD combines and decodes the aforementioned internal address signals BY1 to BY8 sequentially by two bits to set predecode signals AY10 to AY13, AY30 to AY33, AY50 to AY53, and AY70 to AY73 selectively to the high level on condition that the aforementioned inverted internal signals $\overline{YRD0}$ to $\overline{YRD3}$ are at the high level. Specifically, the predecode signals AY10 to AY13 are selectively set to the high level in accordance with the internal address signals BY1 and BY2, when the inverted internal signal $\overline{YRD0}$ is at the high level, and the predecode signals AY30 to AY33 are selectively set to the high level in accordance with the internal address signals BY3 and BY4 when the inverted internal signal $\overline{YRD1}$ is at the high level. Likewise, the predecode signals AY50 to AY53 are selectively set to the high level in accordance with the internal address signals BY5 and BY6, when the inverted internal signal $\overline{YRD2}$ is at the high level, and the predecode signals AY70 to AY73 are selectively set to the high level in accordance with the internal address signals BY7 and BY8 when the inverted internal signal $\overline{YRD3}$ is at the high level. These predecode signals are fed to the Y-address decoders YAD0 to YAD7 so that they are used to designate the complementary data line groups in each memory array selectively.

If, in any unit circuit of the Y-system redundant circuit YRC, the corresponding defective address and the given Y-address are coincident for all the bits, the corresponding output signal, i.e,. the inverted internal signals $\overline{YRD0}$ to $\overline{YRD3}$ are set to the low level. As a result, the corresponding predecode signal is not formed in the Y-predecoder PYAD, but the inverted internal signals $\overline{YR0}$ to $\overline{YR3}$ are selectively set to the low level. These inverted internal signals are fed to the Y-address decoders YAD0 to YAD7 so that they are used to designate the redundant complementary data line groups selectively.

The Y-address decoders YAD0 to YAD7 are selectively brought into their operative states in response to the inverted timing signal $\overline{PC}$. In these operative states, the Y-address decoders YAD0 to YAD7 combine the aforementioned complementary selection signals Y0 and Y1 and the predecode signals AY10 to AY13, $\overline{AY30}$ to $\overline{AY33}$, AY50 to AY53 and $\overline{AY70}$ to AY73 or the inverted internal signals $\overline{YR0}$ to $\overline{YR3}$ to select and connect every two sets of the complementary data lines or redundant complementary data lines of the corresponding memory array with two sets of corresponding common I/O lines.

In the dynamic RAM of this embodiment, as shown in FIG. 83, every two of the memory mats MAT0 to MAT7 are simultaneously brought into the selected states in accordance with the X-address signals X0 and X9 of 2 bits. In the total of four memory arrays constituting two memory mats to be simultaneously brought into the selected states, totally four word lines each designated by the X-address signals X1 to X8 of 8 bits are brought into the selected states. In each of the memory arrays, moreover, totally eight sets of complementary data lines, every two sets of which are designated by the Y-address signals Y1 to Y8 of 8 bits, are brought into the selected states and connected with the eight sets of corresponding common I/O lines.

Of the totally thirty two common I/O lines disposed in the dynamic RAM, the eight sets of common I/O lines to be selectively connected with the eight sets of designated complementary data lines are connected with the corresponding main amplifiers MA0 to MAT through the common I/O line selection circuits IOS0 to IOS15. When the dynamic RAM is made to have the x 1 bit structure, the main amplifiers MA0 to MA7 are selectively brought into the operative states in response to the Y-address signal Y0 of the least significant bit and the X-address signal X10 and the Y-address signal Y10 of the most significant bit are selectively coupled to the data input terminal Din or the data output terminal Dout. When the dynamic RAM is made to have the x 4 bit structure, on the other hand, the four main amplifiers are selectively brought into the operative states in response to the Y-address signal Y0 of the least significant bit and are selectively coupled to the corresponding data input/output terminals I/O1 to I/O4. When the dynamic RAM has the x 1 bit structure and the nibble mode, every four of the main amplifiers MA0 to MA7 are selectively brought into the operative states and coupled to the data input terminal Din or the data output terminal Dout in response to the output signal of the nibble counter.

When in the x 1 bit structure, the dynamic RAM of this embodiment is made to have the address space of 2,048 for both the row and column addresses so that it is given a storage capacity of the so-called "4 megabits". When the dynamic RAM is made to have the x 4 bit structure, the X-address signal X10 and the Y-address signal X10 of the most significant bit are invalidated, and the dynamic RAM is made to have the address space of 1,024 for both the row and column addresses.

Figure 80:
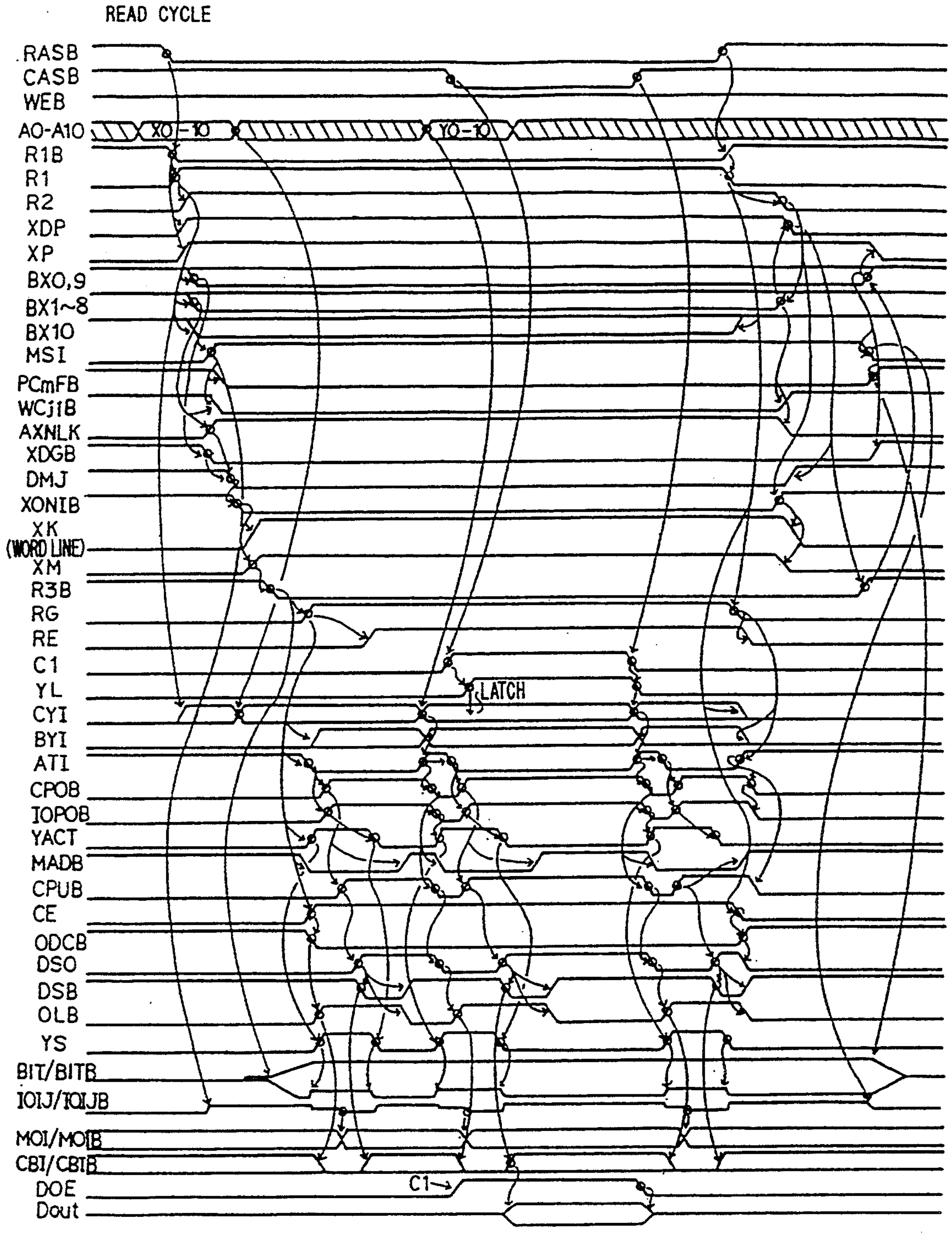
FIGS. 80 to 82 are signal waveform charts showing one embodiment of the dynamic RAM according to the present invention.
Figure 81:
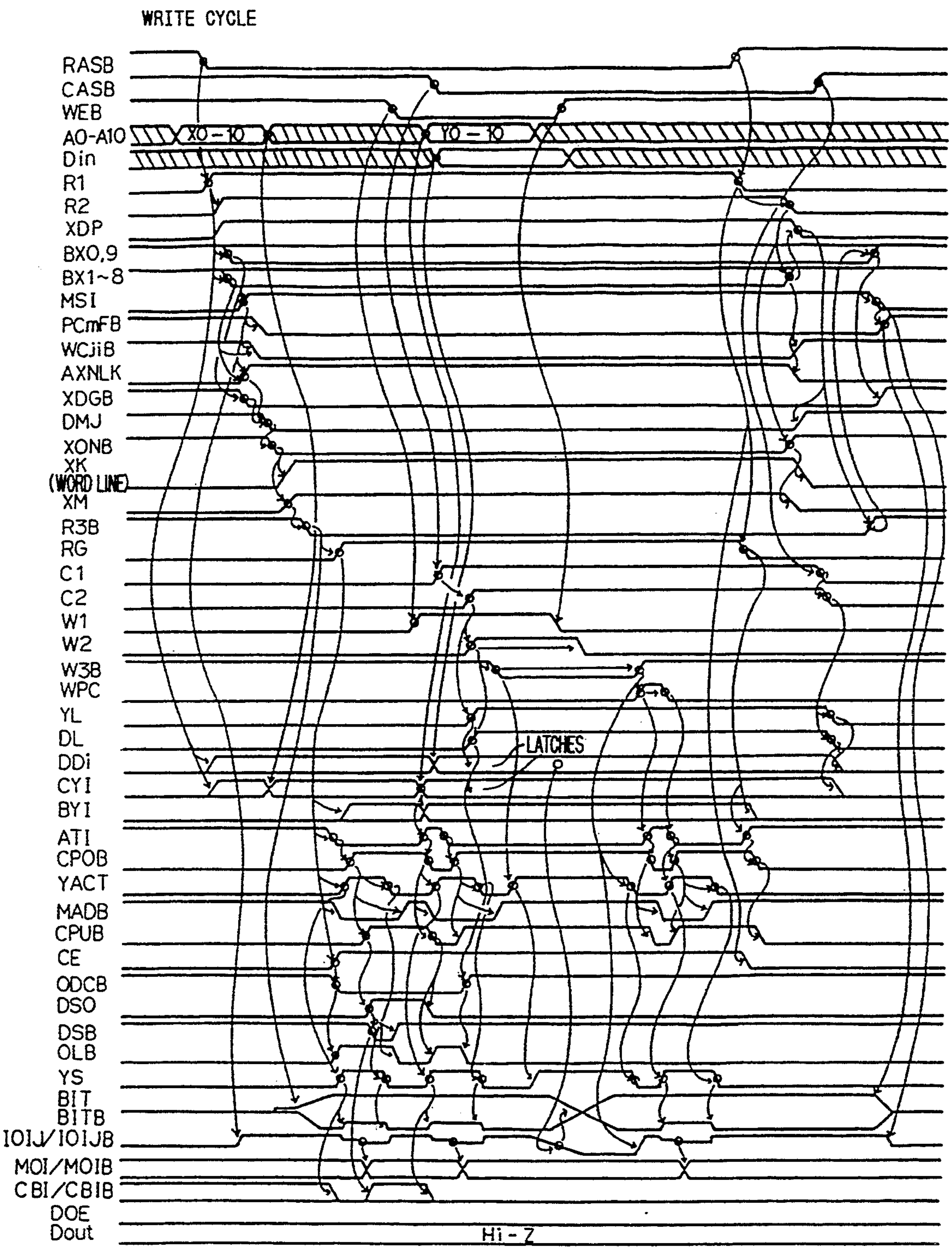
Figure 82:
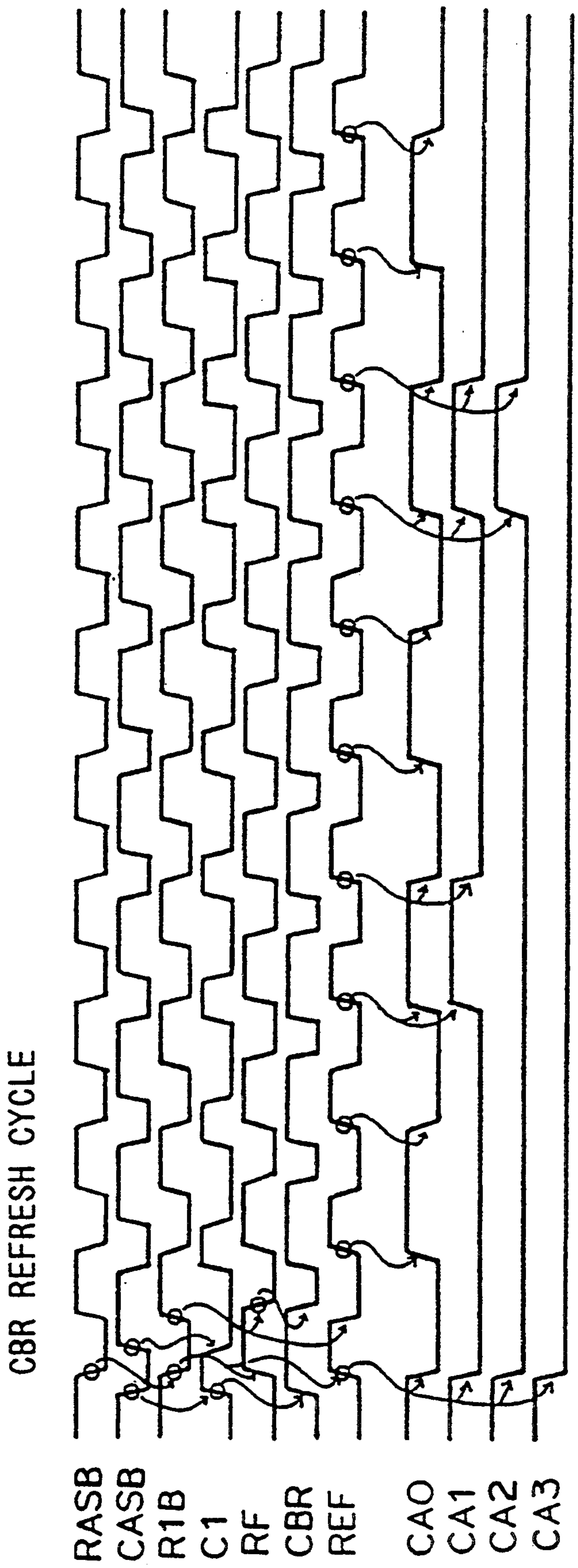
Figure 86A:
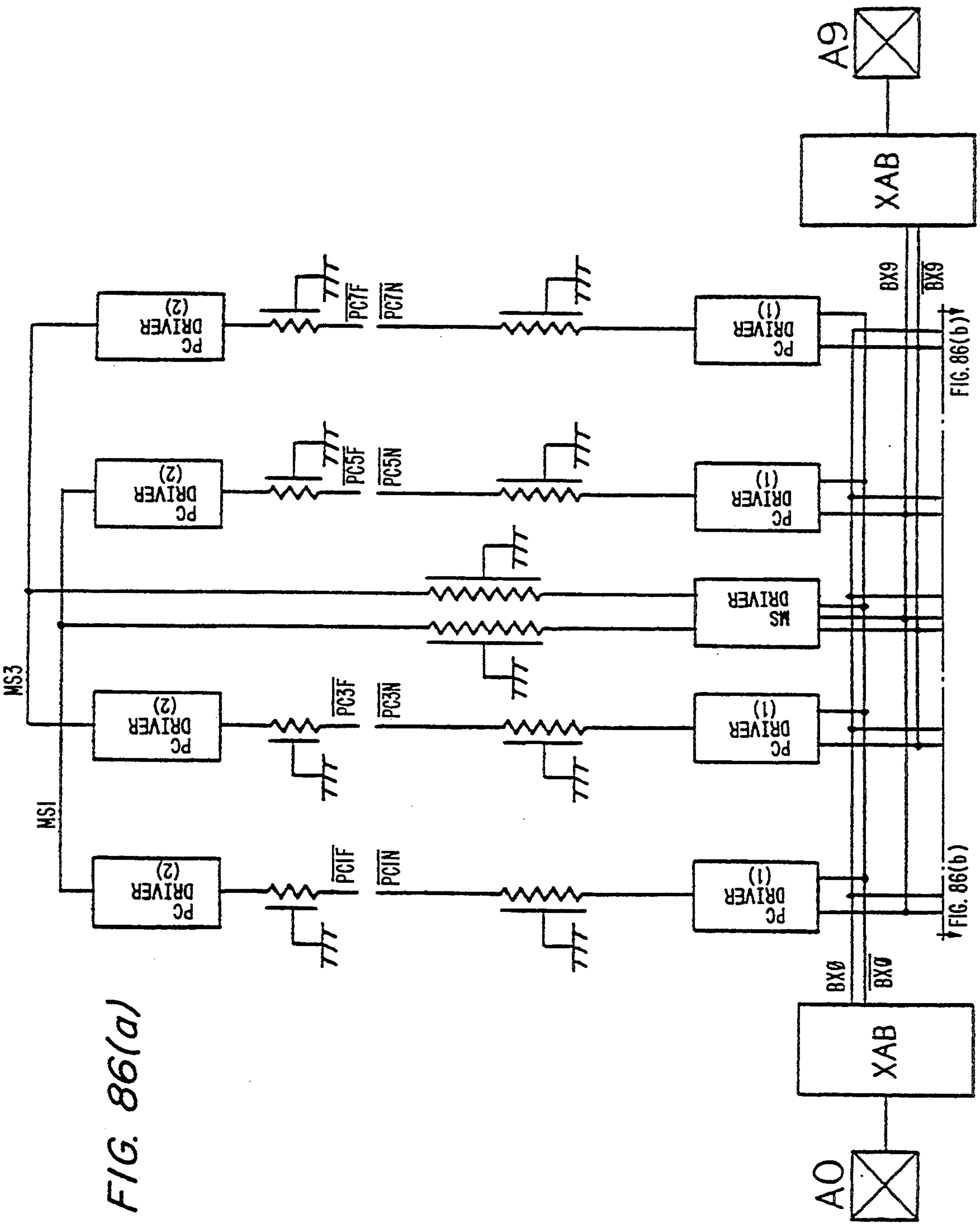
FIGS. 86 to 88 are arrangement diagrams showing one embodiment of the precharge control signal lines, the monitoring word lines, and the sense amplifiers.
Figure 86B:
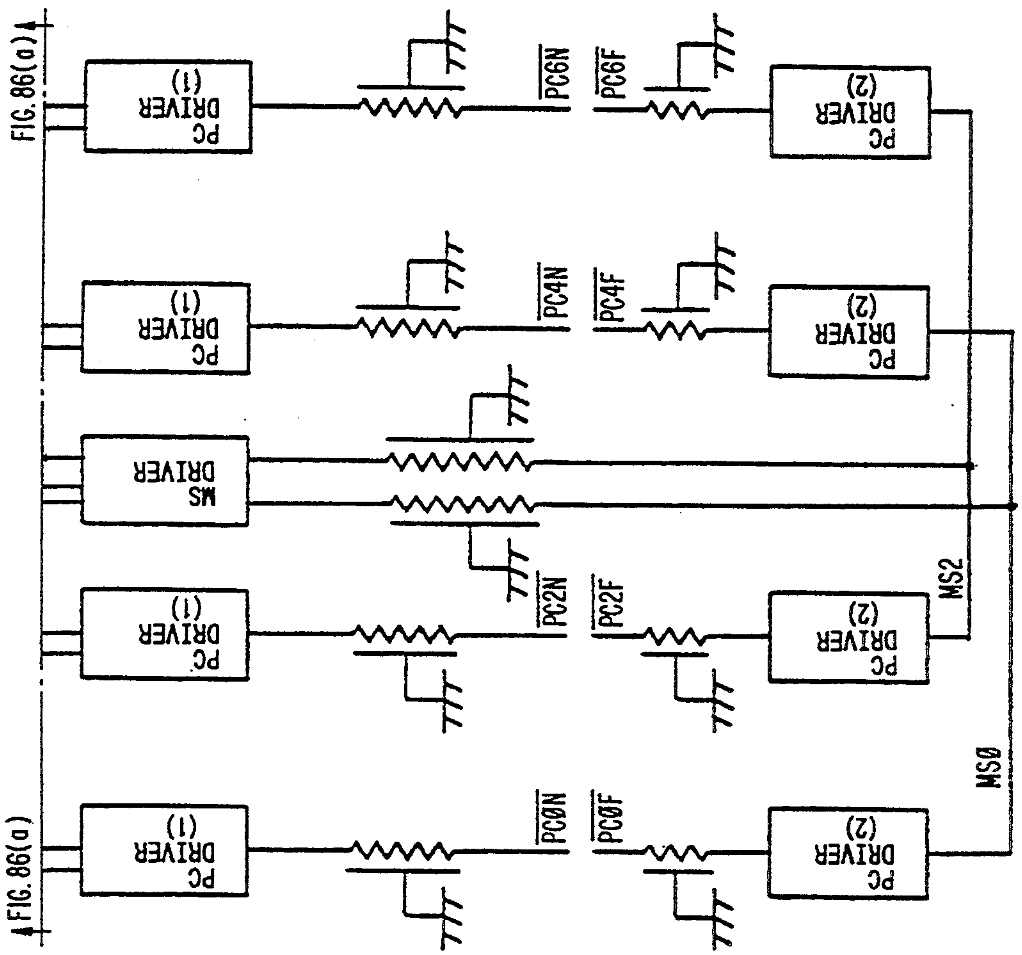
Figure 87:
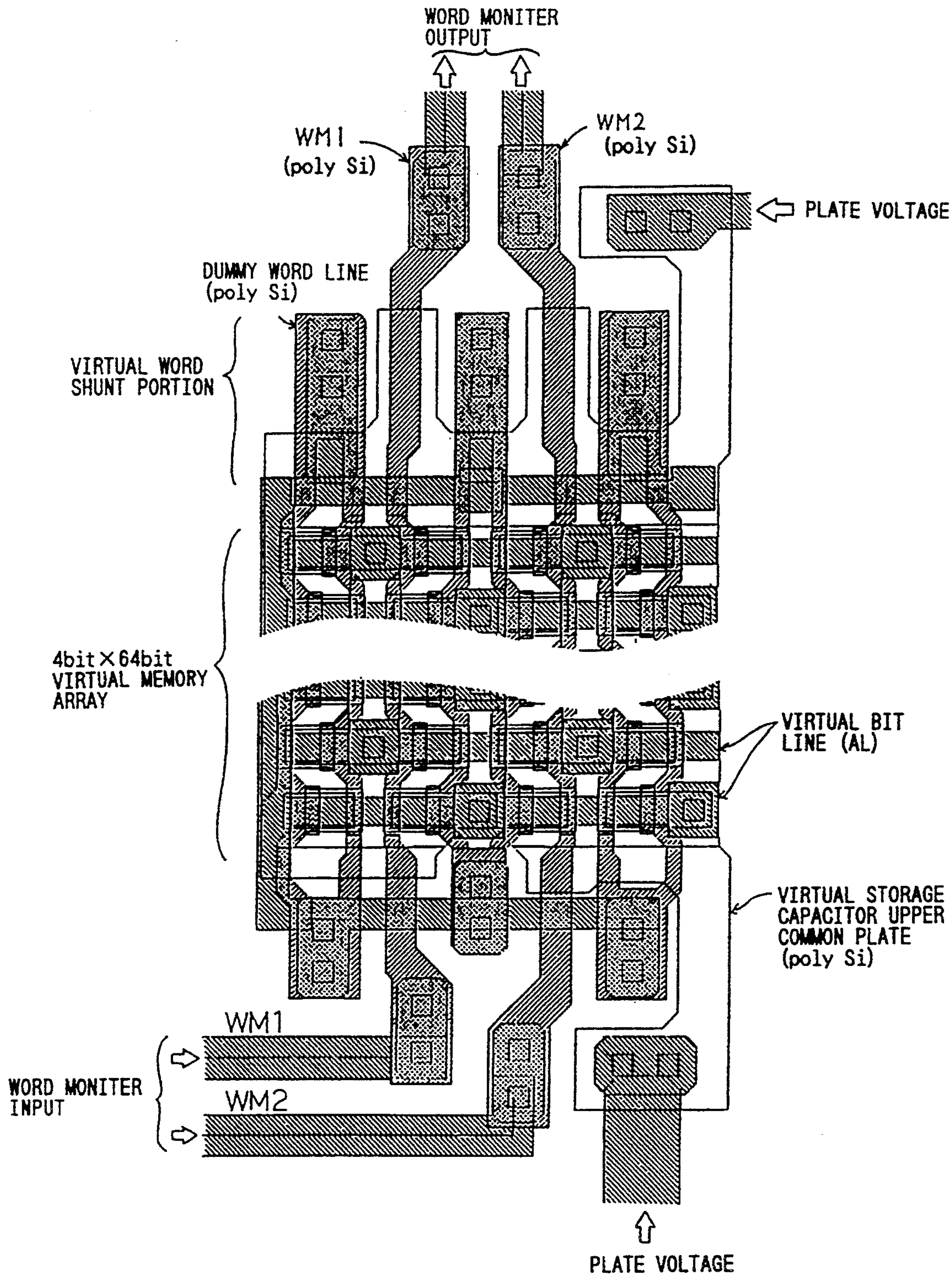
Figure 88A:
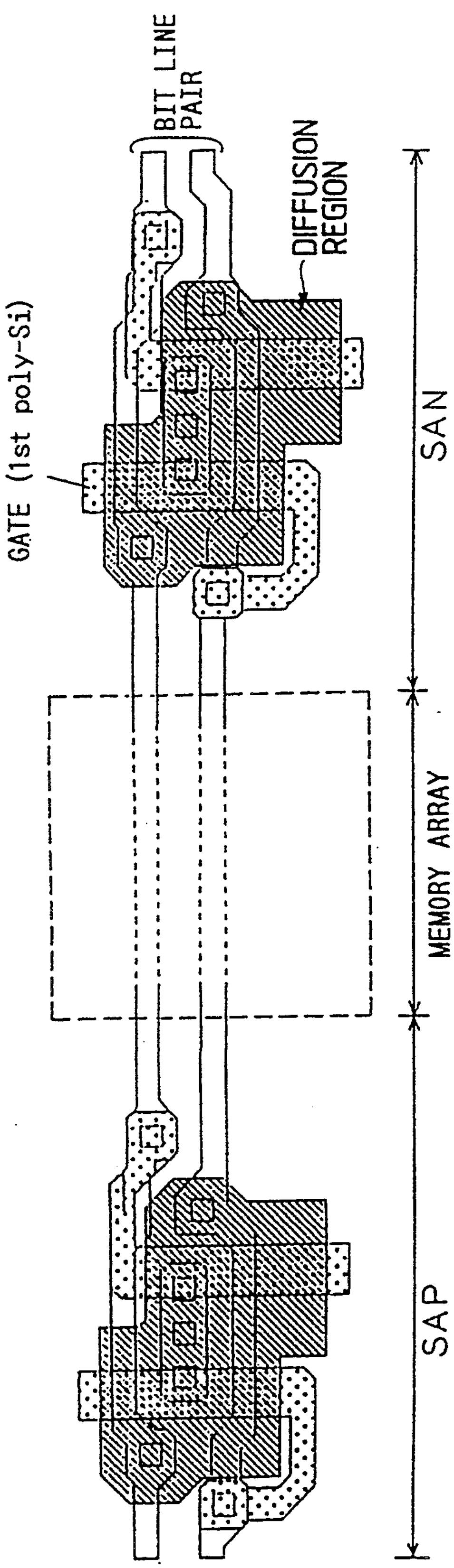
Figure 88B:
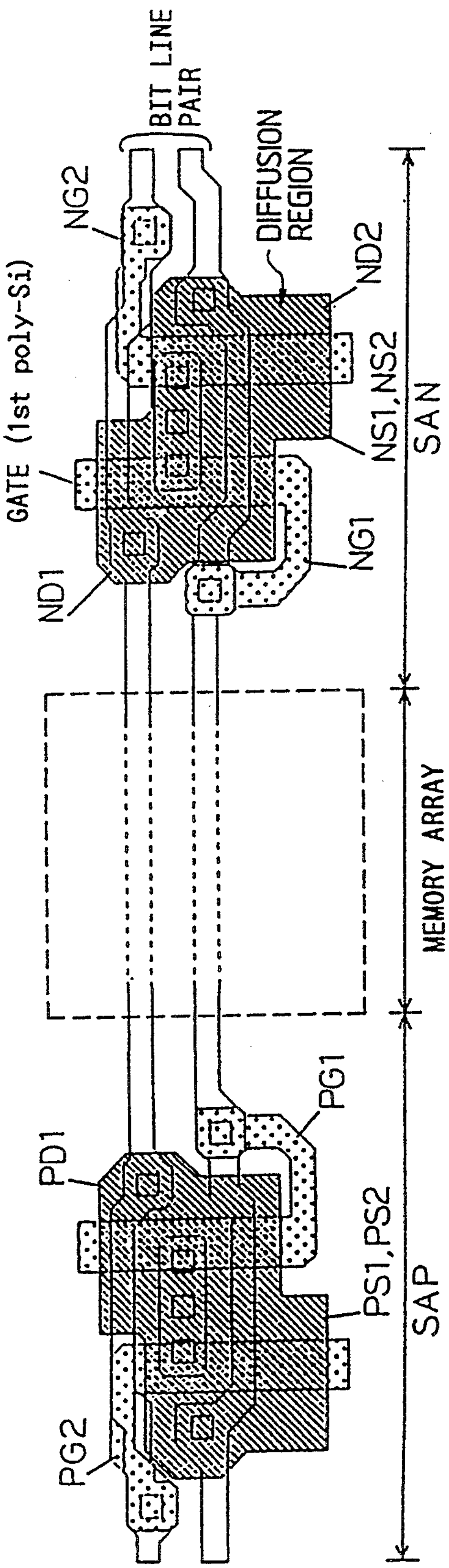
Figure 89:
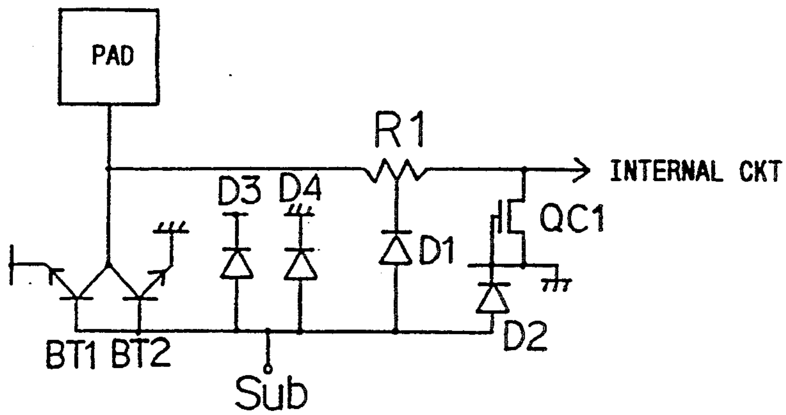
FIGS. 89 and 90 are equivalent circuit diagrams showing several embodiments of the input protection circuit of the dynamic RAM according to the present invention.
Figure 90:
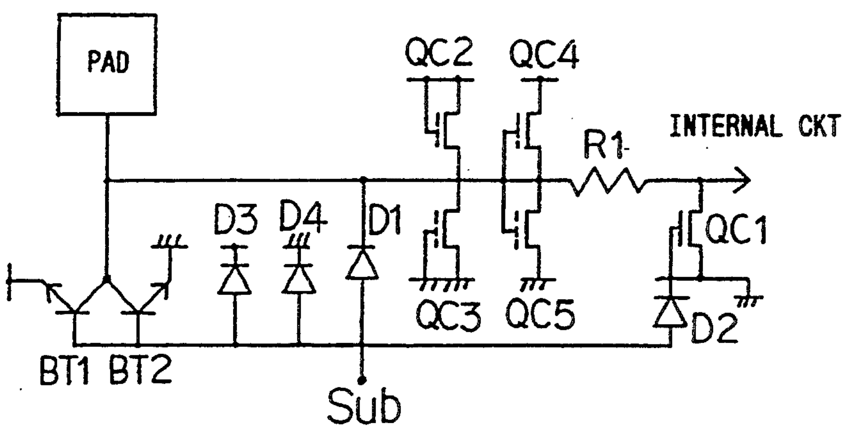
Figure 91:
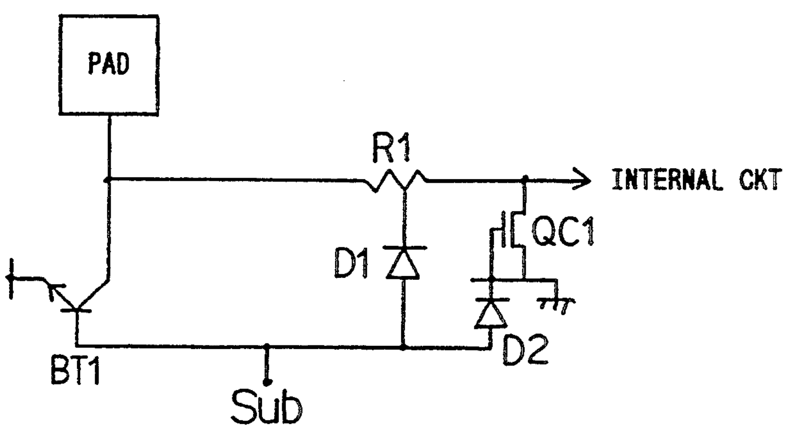
FIG. 91 is an equivalent circuit diagram showing one example of the input protection circuit of the dynamic RAM from a previously developed arrangement.

1.2. Specific Structures, Layout, Operations and Features of Individual Portions FIGS. 42 to 79 present circuit diagrams showing embodiments of the individual portions of the dynamic RAM according to the present invention. Moreover, FIGS. 80 and 81 present timing charts of the embodiments of the read cycle and write cycle of the dynamic RAM of this embodiment, and FIG. 82 presents a timing chart of embodiment of the refresh counter RFC. Still moreover, FIG. 86 presents a conceptional arrangement diagram showing one embodiment of the precharge control signal lines of the dynamic RAM of this embodiment, and FIGS. 87 and 88 present arrangement diagrams showing the embodiments of the monitoring word lines and a sense amplifier. Furthermore, FIGS. 89 to 91 present circuit diagrams showing the several embodiments of the input protection circuit of the dynamic RAM of this embodiment, and FIGS. 92 to 98 present arrangement diagrams showing the several embodiments of the aforementioned input protection circuit. With reference to these Figures, the specific structures, layout, operations, and features of the individual portions of the dynamic RAM of this embodiment will be summarized in the following.

Incidentally, in the following circuit diagrams, the MOSFET having their channel (or back gate) portions indicated at arrows are of the P-channel types and distinguished from the N-channel MOSFETs having no arrow. Moreover, each circuit diagram is written at its righthand end with the block name of the corresponding peripheral circuit and below the block name with the layout positions (i.e., the upper side peripheral circuit at U, and the middle and lower side peripheral circuits at C and D, respectively) of the individual peripheral circuits and the number of the peripheral circuits in the parenthesized forms. Moreover, the signals of negative logic are usually made to have over-lined names but may be ended by letter "B".

1.2.1. Memory Mat

The dynamic RAM of this embodiment is equipped with the paired eight memory mats MAT0 and MAT1 to MAT6 and MAT7, as has been described hereinbefore. These memory mats include, as represented by the memory mats MAT0 to MAT1 of FIG. 78: corresponding Y-address decoders YAD0 and YAD1 to YAD6 and YAD7; and paired memory arrays MARY00 and MARY01 to MARY70 and MARY71, sense amplifiers SAP00.SAN00 and SAP01.SAN01 to SAP70.SAN70 and SAP71.SAN71, column switches CSW00 and CSW01 to CSW70 and CSW71, and X-address decoders XAD00 and XAD01 to XAD7O and XAD71, which are symmetrically arranged with respect to those Y-address decoders.

1.2.2. Memory Array

Figure 78A:
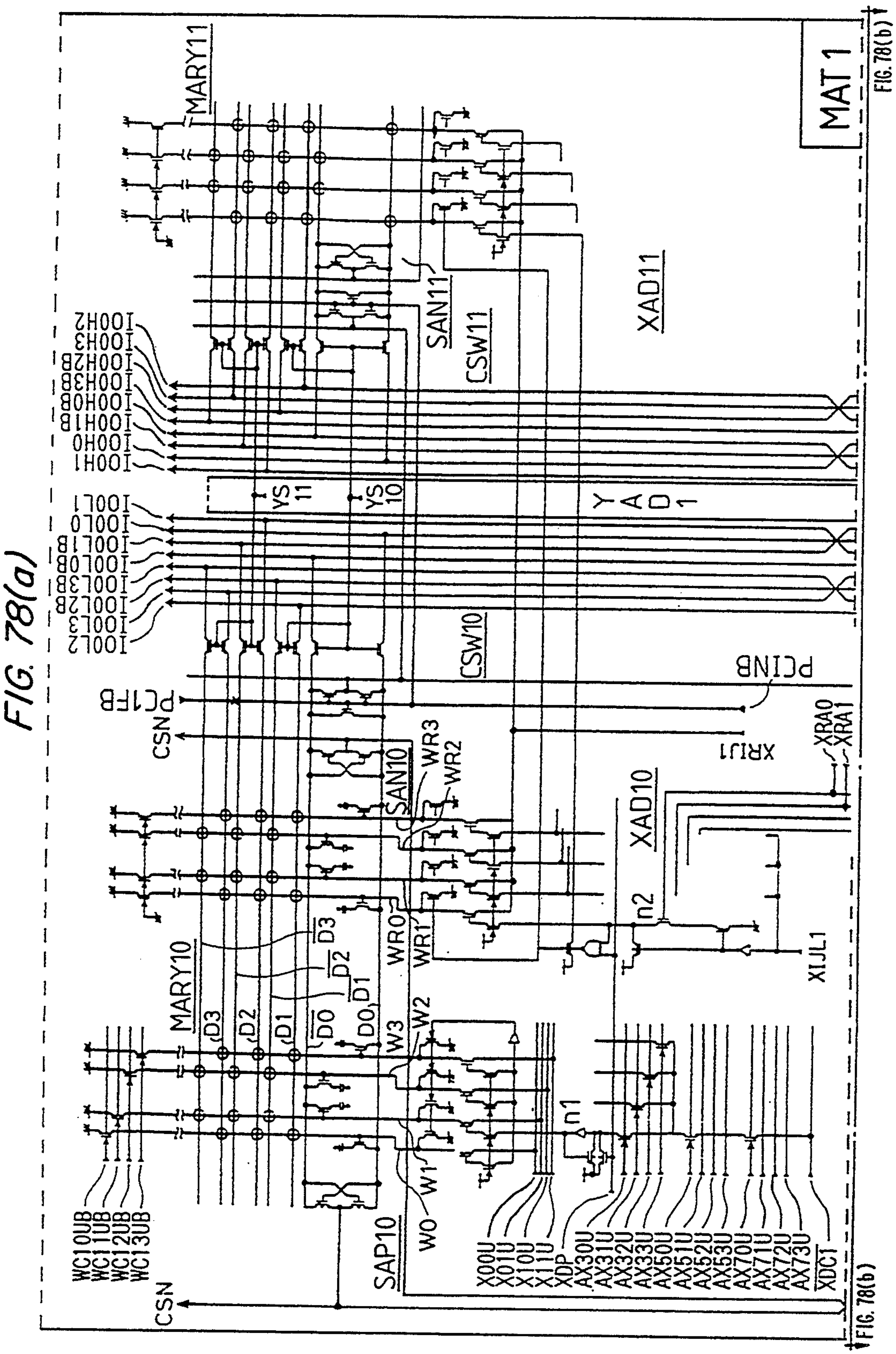
Figure 78B:
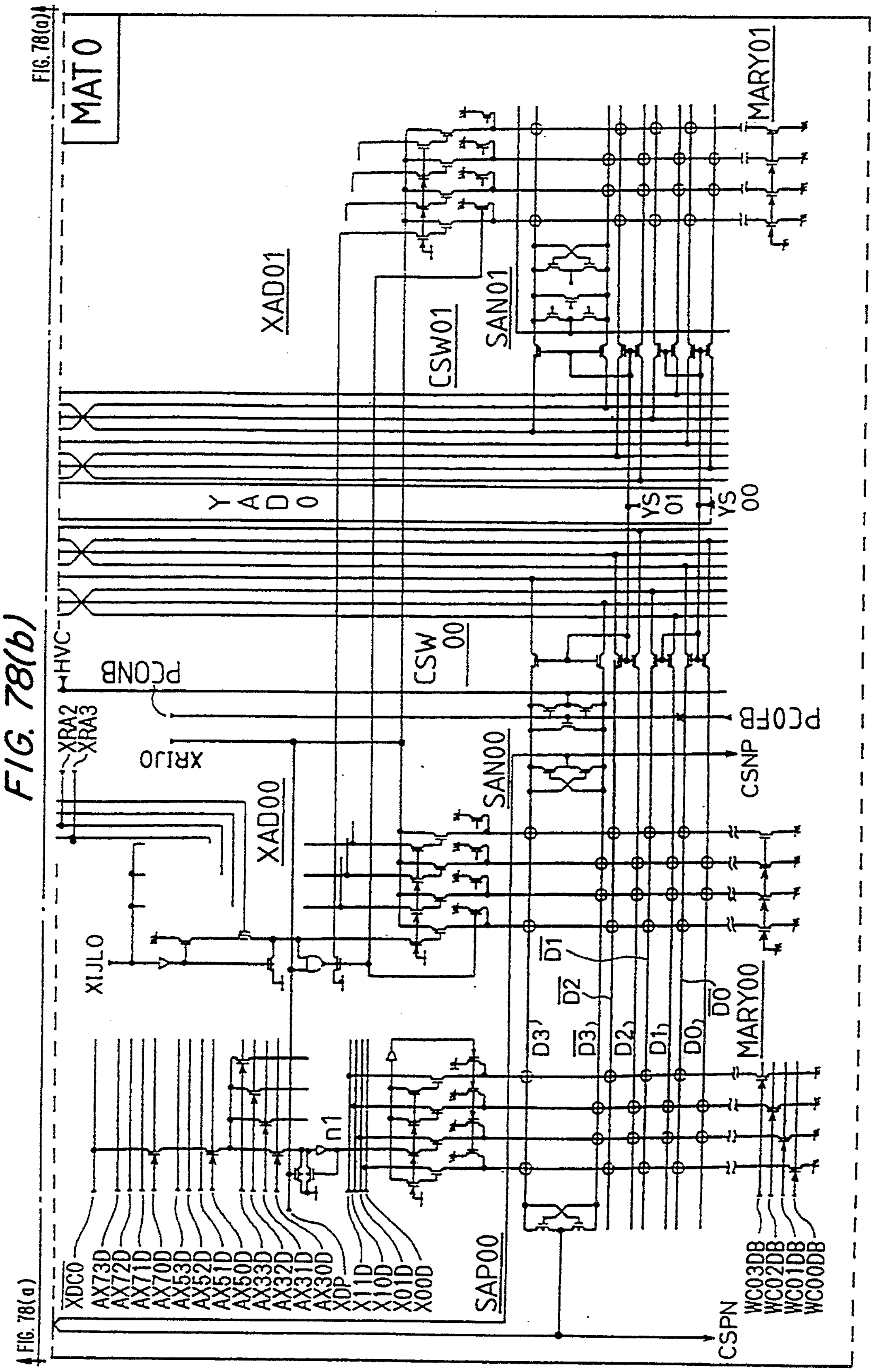

The memory arrays MARY00 and MARY01 to MARY70 and MARY71 constituting the memory mats MAT0 to MAT7 include, as exemplified in FIG. 78: 256 word lines W0 to W255 and four redundant word lines WR0 to WR3 arranged in parallel with the vertical direction; 1,024 sets of complementary data lines D0 to D1,023 arranged in parallel with the horizontal direction; and 16 sets of not-shown redundant complementary data lines DR0 to DR15, although not especially limitative thereto. At the points of intersections of those word lines and complementary data lines, there are arranged in a lattice shape 260×1,040 dynamic memory cells.

The dynamic memory cells constituting each memory array include the information storing capacitors and the address selecting MOSFETs, as shown in FIG. 78, although not especially limitative thereto. Of these, the input/output terminals of 260 memory cells arranged in a common column, i.e., the drains of the address selecting MOSFETs are alternately coupled with a predetermined regularity to the uninverted or inverted signal lines of the corresponding complementary data lines or redundant complementary data lines. Moreover, the control terminals of the 1,040 memory cells arranged in a common row, i.e., the gates of the address selecting MOSFETs, are commonly coupled to the corresponding word lines or redundant word lines, respectively.

The word lines and redundant word lines constituting each memory array are divided into groups of four lines, and unit circuits for the X-address decoders are prepared for the word line groups. Likewise, the complementary data lines and redundant complementary data lines constituting each memory array are divided into groups of four sets, and the unit circuits for the Y-address decoders are prepared for the four sets of complementary data lines, i.e., totally sixteen sets of complementary data lines.

The word lines and redundant word lines constituting each memory array are coupled at one hand to the ground potential of the circuit through the corresponding clearing MOSFETs, as exemplified in FIG. 78, although not especially limitative thereto, and at the other to the corresponding unit circuits of the corresponding X-address decoders XAD00 and XAD01 to XAD70 and XAD71. On the other hand, the complementary data lines and redundant complementary data lines constituting each memory array are coupled at one hand to the corresponding unit circuits of the corresponding sense amplifiers SAP00 and SAP01 to SAP70 and SAP71, although not especially limitative thereto. At the other, those complementary data lines and redundant complementary data lines are coupled to the corresponding unit circuits of the corresponding sense amplifiers SAN00 an SAN01 to SAN70 and SAN71 and further to the corresponding switch MOSFETs of the corresponding column switches CSW00 and CSW01 to CSW70 and CSW71.

1.2.3. X-Address Decoder

The unit circuits of the X-address decoders XAD00 and XAD01 to XAD70 and XAD71 include four word line drive MOSFETs which are provided for the four word lines of the corresponding word line groups of the memory array, as exemplified in FIG. 78. These word word line drive MOSFETs have their sources coupled to the corresponding word lines and their drains fed from the word line drive signal generator XIJ with the corresponding word line selection drive signals X00, X01, X10 and X11 (in which the signals to be fed to the individual memory array are suffixed by the letter U or D in accordance with the layout position of the memory array or indicated at the number of the memory mats but will be abbreviated so as to avoid the complicated description). Moreover, the word line drive MOSFETs have their gates coupled commonly to an internal node n1 through the corresponding cut MOSFETs. The internal node n1 is coupled to the output terminal of the inverter circuit. Between the input terminal of the inverter circuit and the inverted selection signal lines $\overline{\text{XDG0}}$ to $\overline{\text{XDG7}}$, there are connected the three series MOSFETs which have their gates made receptive of a predetermined combination of the predecode signals AX30 to AX33, AX50 to AX53 and AX70 to AX73 to constitute the so-called "decoder tree", As a result, the aforementioned internal node n1 is selectively set to the high level when the corresponding inverted selection signals $\overline{\text{XDG0}}$ to $\overline{\text{XDG7}}$ are set to the low level and when the aforementioned predecode signals are set altogether in a predetermined combination to the high level. As a result, the word line selection drive signal X00, X01, X10 or X11 to be selectively set to the boost level is transmitted to the corresponding word line in the corresponding word line group to bring the word line selectively into the selected state.

In case the defective address assigned to any of the redundant word lines WR0 to WR3 is designated, any of the word line selection drive signals is fixed at the low level, as has been described hereinbefore, so that the corresponding internal signals XRA0 to XRA3 are selectively left at the low level. Moreover, the redundant word line selection drive signal XRIJ is set to the boost level so that the corresponding internal signals XIJL0 to XIJL7 are selectively set to the low level. At the instant when the precharging timing signal XDP is set to the high level, the internal node n2 is selectively left at the high level so that the boost level of the aforementioned redundant word line selection drive signal XRIJ is selectively transmitted to the corresponding redundant word line to bring the redundant word line into the selected state.

1.2.4. Sense Amplifier

The sense amplifiers of the dynamic RAM of this embodiment include, as shown in FIG. 78: the sense amplifiers SAP00 and SAP01 to SAP70 and SAP71 arranged outside of the corresponding memory array; and the sense amplifiers SAN00 and SAN01 to SAN70 and SAN71 arranged inside of the same, although not especially limitative thereto.

Of these, the sense amplifiers SAP00 and SAP01 to SAP70 and SAP71 are equipped with 1,040 unit circuits provided for the complementary data lines and redundant complementary data lines of the memory array. Each unit circuit includes a pair of P-Channel MOSFETs which have their gates and drains connected crossly with each other, as exemplified in FIG. 78. The crossly connected gates and drains of the P-channel MOSFETs are coupled to the corresponding complementary data lines of the memory array, and the sources of the same are commonly coupled to a common source line CSPN or CSNP.

On the other hand, the sense amplifiers SAN00 and SAN01 to SAN70 and SAN71 are equipped with 1,040 unit circuits which are provided for the complementary data lines and redundant complementary data lines of the memory array. Each unit circuit includes a pair of N-channel MOSFETs having their gates and drains connected crossly with each other, as exemplified in FIG. 78. The commonly connected gates and drains of those N-channel MOSFETs are coupled to the corresponding complementary data lines of the memory array and have their sources coupled commonly to the aforementioned common source line CSNP or CSPN.

Each unit circuit further includes a precharge circuit which is composed of: two N-channel MOSFETs connected in series between the uninverted signal line and the inverted signal lines of each complementary data line of the memory array; and one N-channel MOSFET connected in parallel with the former two MOSFETs. All the gates of those MOSFETs are commonly coupled to one another and to the corresponding precharge control signals PC0NB to PC7NB. On the other hand, the commonly coupled nodes of the two series connected MOSFETs are commonly fed with a predetermined constant HVC. Here, the center voltage of the constant voltage HVC is set at one half or +2.5 V of the power supply voltage VCC of the circuit.

From the foregoing description, one pair of the P-channel MOSFETs composing each unit circuit of the sense amplifiers SAP00 and SAP01 to SAP70 and SAP71 constitutes one unit amplifier together with one pair of N-channel MOSFETs composing the sense amplifiers SAN00 and SAN01 to SAN70 and SAN71. These unit amplifiers are selectively brought into the operative states when a predetermined combination of the power supply voltage and the ground potential of the circuit is fed to the corresponding common source lines CSPN and CSNP. In these operative states, each unit amplifier amplifies the fine read signal, which is outputted through the corresponding complementary data line from the memory cell coupled to the word line of the memory array in the selected state, to produce a binary read signal at the high or low level.

Here, the source regions PS1 and PS2, drain regions PD1 and PD2 and gate regions PC1 and PC2 constituting the aforementioned sense amplifiers SAP00 and SAP01 to SAP70 and SAP71, and the source regions NS1 and NS2, drain regions ND1 and ND2 and gate regions NG1 and NG2 constituting the aforementioned sense amplifiers SAN00 and SAN01 to SAN70 and SAN71 are formed symmetrically with respect to the straight line perpendicular to the extending direction of the corresponding complementary data lines and in parallel with the aforementioned straight line, as shown in FIG. 88(*b*). In case a mask registration is lost in the fabrication process, the changes of the parasitic capacities in the uninverted and inverted signal lines of the individual complementary data lines are offset. As a result, the capacity balance in the complementary data lines is maintained to retain the signal amount margin so that the reading operations of the dynamic RAM are stabilized.

On the other hand, the three N-channel MOSFETs composing the precharge circuit of each unit circuit of the sense amplifiers SAN00 and SAN01 to SAN70 and SAN71 are selectively brought into the ON states when the dynamic RAM is brought into the unselected state and when the corresponding precharge control signals PC0NB to PC7NB are set to the high level. As a result, the uninverted signal lines and inverted signal lines constituting the individual complementary data lines of the memory array are shorted to have their levels set to the aforementioned constant voltage HVC.

Figure 46A:
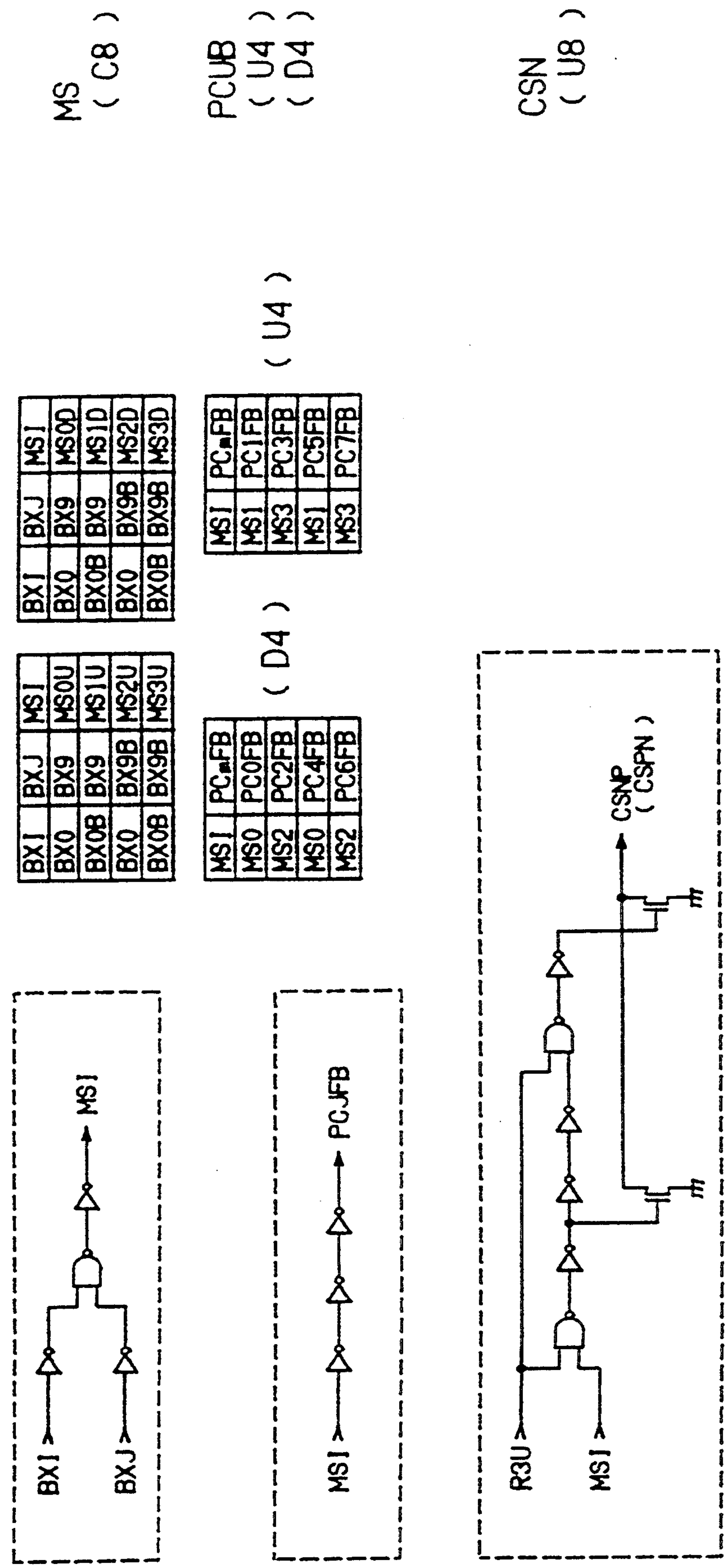
Figure 46B:
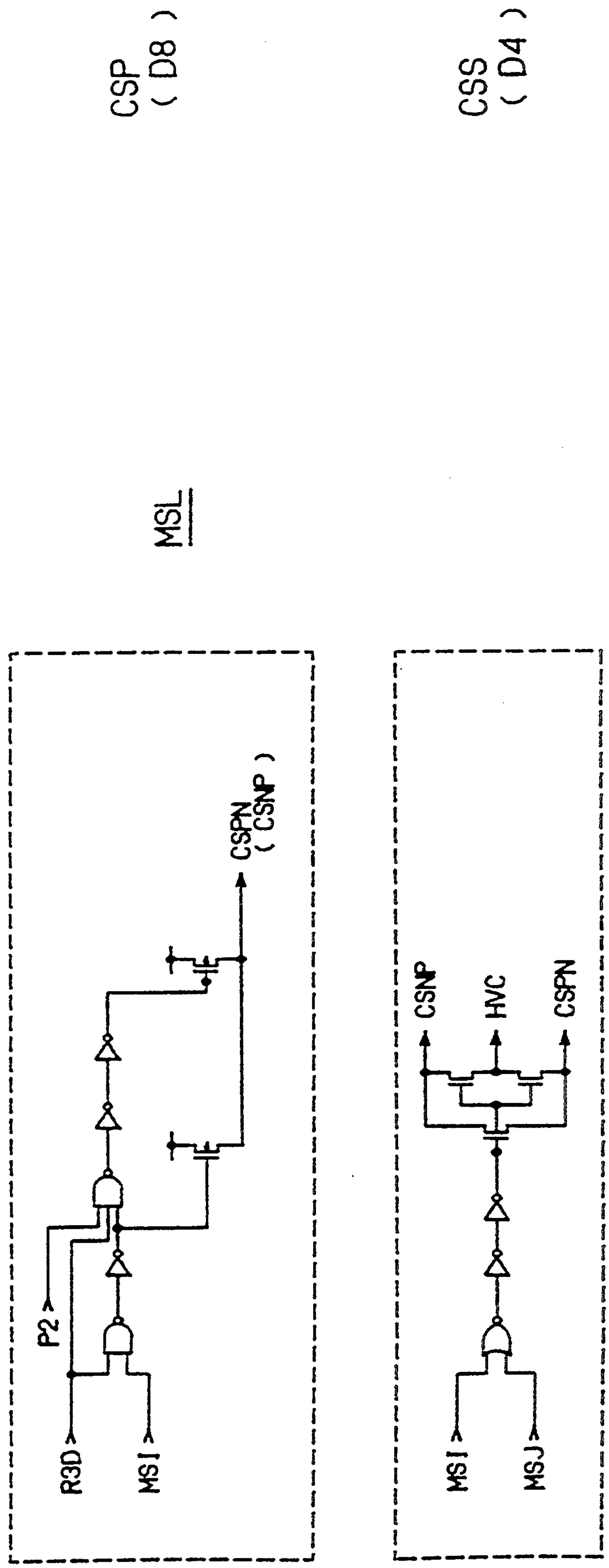
Figure 46C:
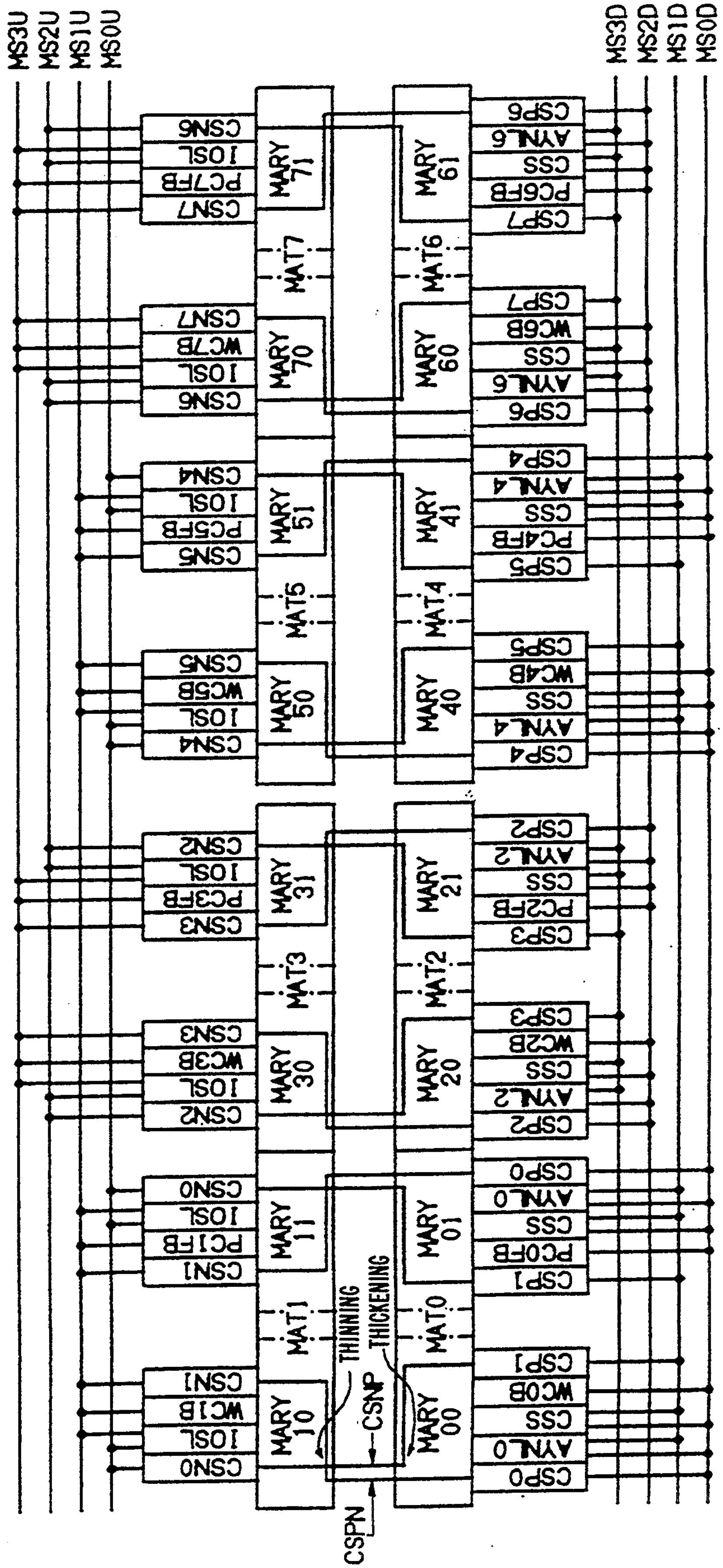
Figure 47A:
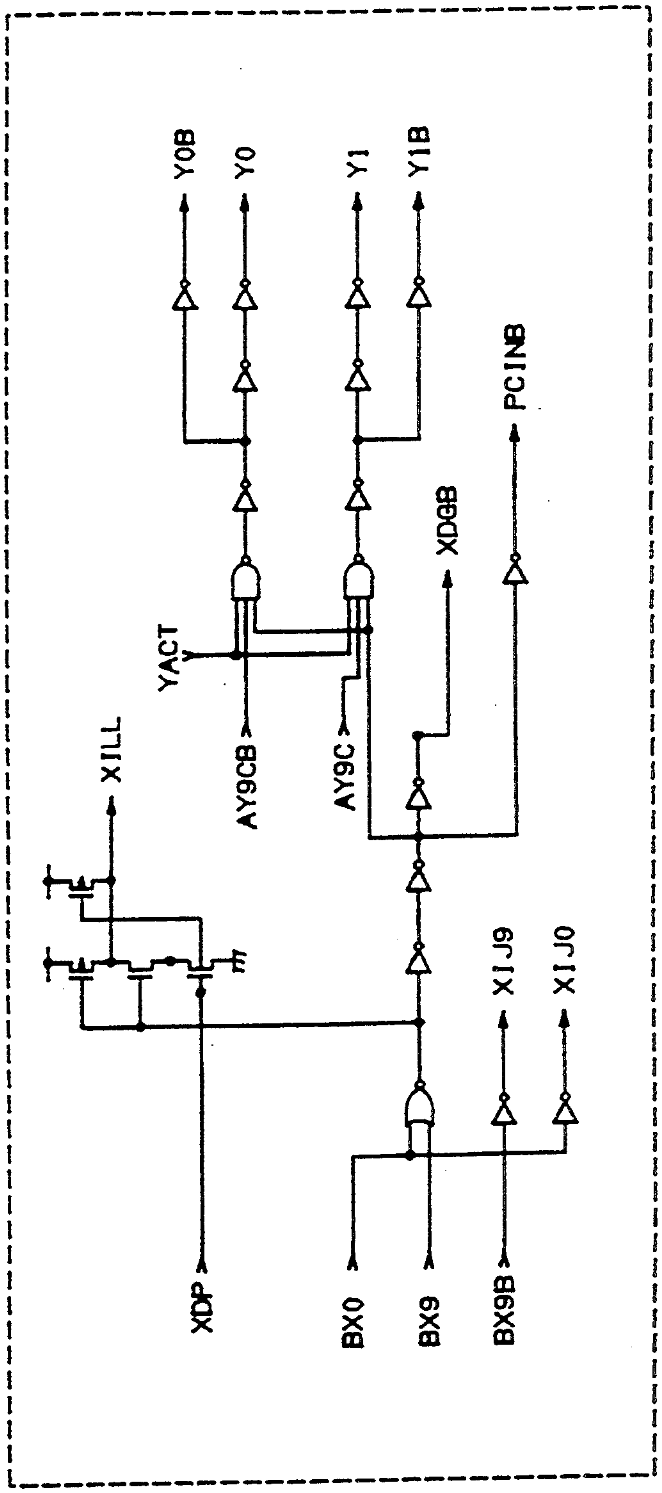
Figure 47B:
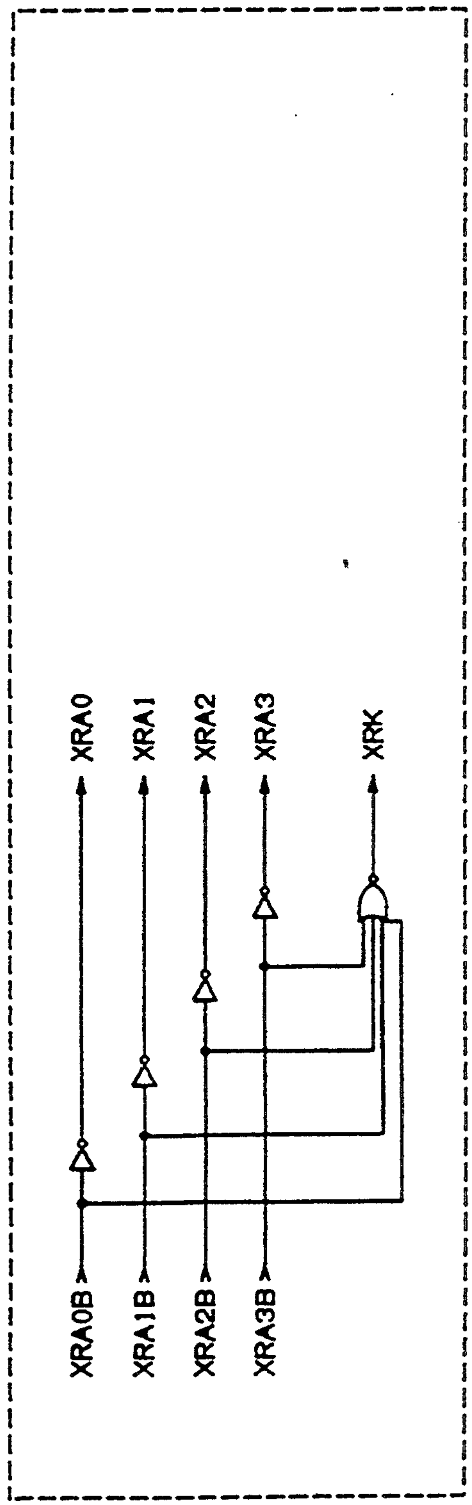
Figure 47C:
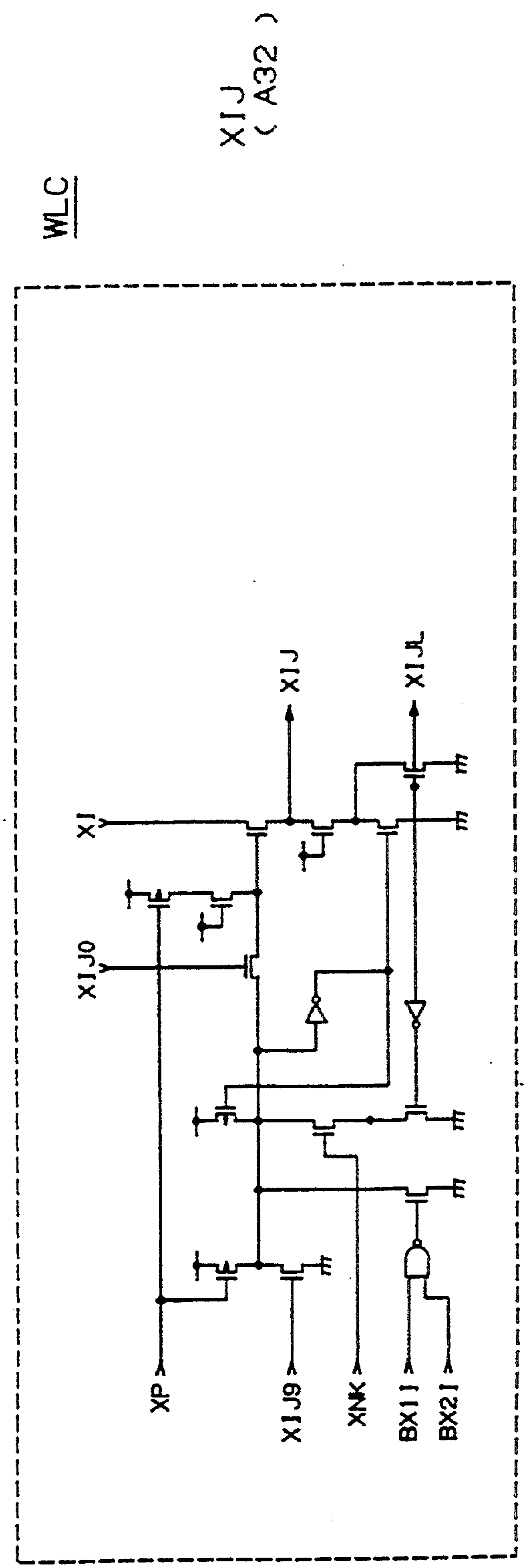
Figure 47D:
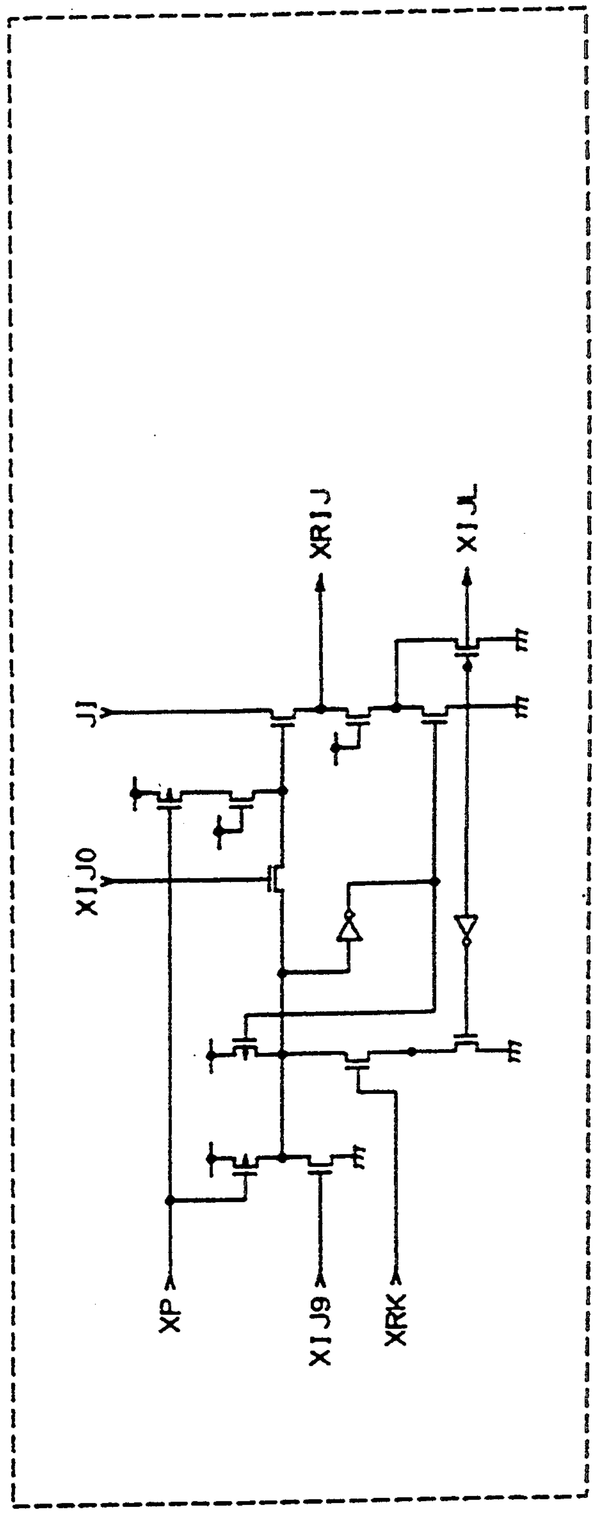

Incidentally, in the dynamic RAM of this embodiment, the aforementioned common source lines CSPN and CSNP provided for the two memory arrays of each paired memory mat are formed to cross each other at the central portion of the semiconductor substrate surface. As shown in FIG. 78, more specifically, the sources of the paired N-channel MOSFETs composing the sense amplifier SAN00 in the memory array MARY01 are commonly connected with the common source line CSPN with which are commonly connected the sources of the P-channel MOSFETs composing the sense amplifier SAP00 in the memory array MARY00. On the other hand, the sources of the paired P-channel MOSFETs composing the sense amplifier SAP00 in the memory array MARY01 are commonly connected with the common source line CSNP with which are commonly connected the sources of the paired N-channel MOSFETs composing the sense amplifier SAN00 in the memory array MARY00. As shown in FIG. 46, similar common connections of the common sources are also accomplished in other memory mats.

The common source line CSPN of each of the paired memory arrays is coupled, as shown in FIG. 46, at its upper end to common source line drive circuits CSN1, CSN3, CSN5 and CSN7 of the corresponding odd numbers and at its lower end to common source line drive circuits CSP0, CSP2, CSP4 and CSP6 of the corresponding even numbers. Likewise, the common source line CSNP of each of the paired memory arrays is coupled at its upper end to common source line drive circuits CSN0, CSN2, CSN4 and CSN6 of the corresponding even numbers and at its lower end to common source line drive circuits CSP1, CSP3, CSP5 and CSP7 of the corresponding odd numbers. The aforementioned common source lines CSPN and CSNP thus paired are further coupled at their lower ends to the corresponding common source line equalizing circuit CSS.

The common source line drive circuits CSN0 to CSN7 are made to have the circuit structure, as exemplified in FIG. 46, to feed the ground potential of the circuit selectively to the corresponding common source line CSNP or CSPN in response to the timing signal R3 and the mat selection signals MS0 to MS3. Likewise, the common source line drive circuits CSN0 to CSN7 feed the power supply voltage of the circuit selectively to the corresponding common source line CSPN or CSNP in response to the timing signals R3 and P2 and the mat selection signals MS0 to MS3. On the other hand, the common source line equalizing circuit CSS is selectively brought into the operative state, when any of the mat selection signals MS0 to MS3 is set to the low level, to short the corresponding common source lines CSPN and CSNP to the half-precharge level such as the constant voltage HVC. When the corresponding mat selection signal is set to the high level, the operations of the common source line equalizing circuit CSS are selectively stopped.

From the description thus far made, the common source line CSPN of each pair of the memory arrays is used to feed the ground potential of the circuit to the sense amplifier disposed thereabove and the power supply voltage of the circuit to the sense amplifier disposed therebelow, and the common source line CSNP is used to feed the power supply voltage of the circuit to the sense amplifier disposed thereabove and the ground potential of the circuit to the sense amplifier disposed therebelow. As a result, the common source line CSPN may be thinned, if desired, at the intersection with the corresponding common source line CSNP, as exemplified in FIG. 46. As a result, the common source lines and the common source line drive circuits can be shared, while stabilizing the operations of the sense amplifiers, to reduce the area required for the layout of the memory arrays and their peripheral portions.

On the other hand, the precharge control signal line for controlling the precharge circuit of each sense amplifier unit circuit is driven from its outer end by a precharge control signal PC0FB or PC1FB and from its inner end by a precharge control signal PC0NB or PC1NB. Thus, the operations of the precharge circuit are speeded up while reducing the thickness of the precharge control signal lines. Incidentally, the aforementioned precharge control signals PC0FB and PC1FB are formed from internal address signals BX0 and BX9 through a total of six steps of logic gate circuits, as indicated by the mat selection circuit MS and the precharge control circuit PCUB of FIG. 46. On the other hand, the aforementioned precharge control signals PC0NB and PC1NB are formed from the aforementioned internal address signals BX0 and BX9 through a total of four steps of logic gate circuits, as indicated by the X-decoder control circuit XDGB of FIG. 47. Between the precharge control signals PC0FB and PC1FB and the corresponding precharge control signals PC0NB and PC1NB, there is established a timing difference, by which is fed a through current to the precharge signal lines. In this embodiment, therefore, the difference in the transmission time is eliminated by cutting the aforementioned precharge control signal lines at a position inversely proportional to the transmission delay time of the two precharge control signals, as indicated by letter X in FIG. 78.

1.2.5. Column Switch & Common I/O Line

The dynamic RAM of this embodiment is equipped, as has been described hereinbefore, with sets of common I/O lines IO0L0 to IO0L3, IO2L0 to IO2L3, IO4L0 to IO4L3 and IO6L0 to IO6L3, and IO0H0 to IO0H3, IO2H0 to IO2H3, IO4H0 to IO4H3 and IO6H0 to IO6H3, for each vertical pair of memory arrays. These common I/O lines have their uninverted and inverted signal lines intersecting at the central portion of the two vertically paired memory arrays, as has been described hereinbefore, and are equalized by the corresponding common I/O line equalizing circuits IOEQ0 to IOEQ3, as shown in FIG. 62.

Figure 62:
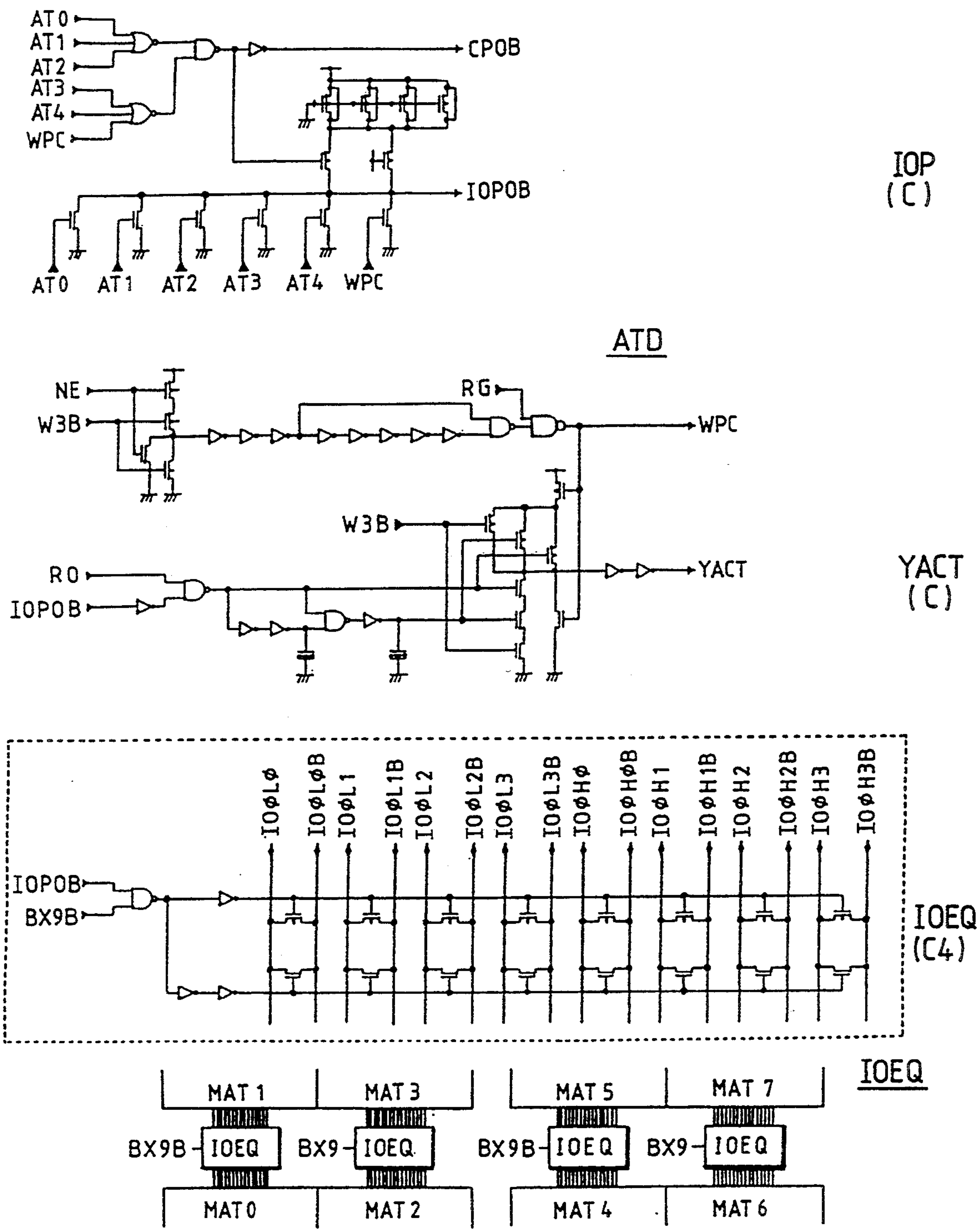

These common I/O line equalizing circuits IOEQ0 to IOEQ3 include eight pairs of complementary transmission gate MOSFETs which are connected between the uninverted and inverted signal lines of eight sets of common I/O lines for each pair of memory mats, as shown in FIG. 62. These transmission gate MOSFETs are usually in ON states and are selectively brought into OFF states on condition that the output signal, i.e., the inverted internal signal IOP0B of a common I/O lien precharge control circuit IOP is set to the high level and that the corresponding inverted internal address signal BX9B or uninverted internal address signal BX9 is set to the high level.

The output signal IOP0B of the aforementioned common I/O line precharge control circuit IOP is selectively set to the low level when any of the output signals AT0 to AT4 of the individual portions of the address transition detection circuit ATD or an internal signal WPC is set to the high level, as shown in FIG. 62. Of these signals, the output signals AT0 to AT4 of the address transition detection circuit ATD are fixed at the high level when the dynamic RAM is brought into the unselected state, as will be described hereinafter. When the dynamic RAM is brought into the selected state, those output signals are temporarily set to the high level, after once to the low level, as a result that the corresponding Y-address signal is changed. On the other hand, the internal signal WPC is formed by a Y-system activation circuit YACT of FIG. 62 and is temporarily raised to the high level, at the rising edge of an inverted internal timing signal W3B for forming write pulses WYP, i.e., immediately after the end of the writing operation, when the dynamic RAM is brought into the fast page mode or static column mode, thereby to form a start signal for starting the reading operation after the writing operation. As a result, even in the absence of the address transition, the common I/O line precharge control circuit IOP and the Y-system activation circuit YACT are started to effect the series of reading operations starting from the common I/O line equalizations. The internal signal WPC is left at the low level when the dynamic RAM is in the nibble mode.

The output signal IOP0B of the common I/O precharge control circuit IOP is set steadily to the low level, when the dynamic RAM is brought into the unselected state, but is once set to the high level, when the dynamic RAM is brought into the selected state, and then temporarily to the low level in response to either the output signals AT0 to AT4 of the address transition detection circuit ATD or the internal signal WPC. As a result, the uninverted and inverted signal lines of each common I/O lines are usually held in the shorted states and are selectively released from their shorted states in accordance with the logic level of the internal address signal BX9, i.e., the X-address signal X9 when the dynamic RAM is brought into the selected state. Moreover, those signals lines are temporarily brought into the shorted states again when the change in the Y-address signal is detected by the address transition detection circuit ATD or immediately after the writing operations in the fast page mode or static column mode are ended.

Thus, the common I/O line equalizing circuits IOEQ0 to IOEQ3 are arranged at the central portion so that the common I/O lines arranged a relatively long range over the vertically paired two memory arrays are equalized at a high speed.

The aforementioned common I/O lines are commonly coupled to every four sets of the complementary data lines of the corresponding memory array through the corresponding switch MOSFETs of the column switches CSW00 and CSW01 to CSW70 and CSW71, as exemplified in FIG. 78, Every two sets of the gates of those switch MOSFETs are commonly coupled and are fed with the corresponding data line selection signals YS00 and YS01 from the corresponding Y-address decoder YAD0 or YAD1, although not especially limitative thereto. As a result, adjacent two sets, i.e., totally four complementary data lines, are simultaneously selected from the two memory arrays constituting each memory mat are simultaneously selected and are connected to the common I/O lines IO0L0 and IO0L2 or IO0L1 and IO0L3, and the common I/O lines IO0H0 and IO0H2 or IO0H1 and IO0H3.

1.2.6. Y-Address Decoder

The Y-address decoders YAD0 to YAD7 are equipped with: sixteen unit circuits provided for the sixteen sets of complementary data lines of the corresponding memory array; and four unit circuits provided for four sets of redundant complementary data lines. Of these, the unit circuits provided for the sixteen sets of complementary data lines include a plurality of P-Channel and N-channel MOSFETs which are connected in parallel and in series between an internal node n3 and the power supply voltage of the circuit or the timing signal line $\overline{PC}$ (although the mat selection number m or n is omitted, as in the following), as exemplified in FIG.

79. These MOSFETs constitute a series of decoder trees by having their gates fed with the predecode signals AY10 to AY13, AY30 to, AY33, AY50 to AY53 and AY70 to AY73 in a corresponding combination. As a result, the internal node n3 of each unit circuit is selectively set to the low level on condition that the timing signal $\overline{PC}$ is at the low level and that all the corresponding predecode signals are at the high level.

The aforementioned internal node n3 of each unit circuit is set to the level of the aforementioned data line selection signals YS00 and YS01 through the negative logical product circuit of the corresponding complementary selection signals Y0 and Y1. Here, these complementary selection signals Y0 and Y1 are selectively set to the logic "1" when the Y-system activation signal YACT is at the high level and when the complementary internal address signal AY9C, i.e., the Y-address signal Y9 is at the logic "0" or "1", as shown in the X-decoder control circuit XDGB of FIG. 47. As a result, the data line selection signal YS0 is selectively set to the high level when all the predecode signals AY10, AY30, AY50 and AY70 are at the high level and when the complementary selection signal Y0 is at the logic "1", namely, when the Y-address signal Y9 is at the logic "0". Moreover, the data line selection signal YS1 is selectively set to the high level when all the predecode signals AY10, AY30, AY50 and AY70 are at the high level and when the complementary selection signal Y1 is at the logic "1", namely, when the Y-address signal Y9 is at the logic "1". It is needless to say that all those data line selection signals are selectively formed for each memory mat in response to the mat selection signal and so on.

On the other hand, the unit circuit of the individual Y-address decoder provided for four sets of redundant complementary data lines is constructed of two negative logic product circuits which are made receptive of the aforementioned complementary selection signals Y0 and Y1 and the corresponding inverted internal signals $\overline{YR0}$ to $\overline{YR3}$, as exemplified in FIG. 79, although not especially limitative thereto. In these unit circuits, the nodes to be fed with the aforementioned inverted internal signals $\overline{YR0}$ to $\overline{YR3}$ correspond to the aforementioned internal node n3. Moreover, the output signals of the individual unit circuits are fed as redundant data line selection signals YSR0 to YSR7 to the two sets of corresponding redundant complementary data lines of each redundant word line group. As a result, the redundant data line selection signal YSR0 is selectively set to the high level when the corresponding inverted internal signal $\overline{YR0}$ is at the low level and when the complementary selection signal Y0 is at the logic "1", namely, when the Y-address signal Y9 is at the logic "0". The redundant data line selection signal YSR1 is selectively set to the high level when the corresponding inverted internal signal $\overline{YR1}$ is at the low level and when the complementary selection signal Y1 is at the logic "1", namely, when the Y-address signal Y9 is at the logic "1". It is needless to say that those redundant data line selection signals are selectively formed for each memory mat.

1.2.7. X-Address Buffer

Figure 50A:
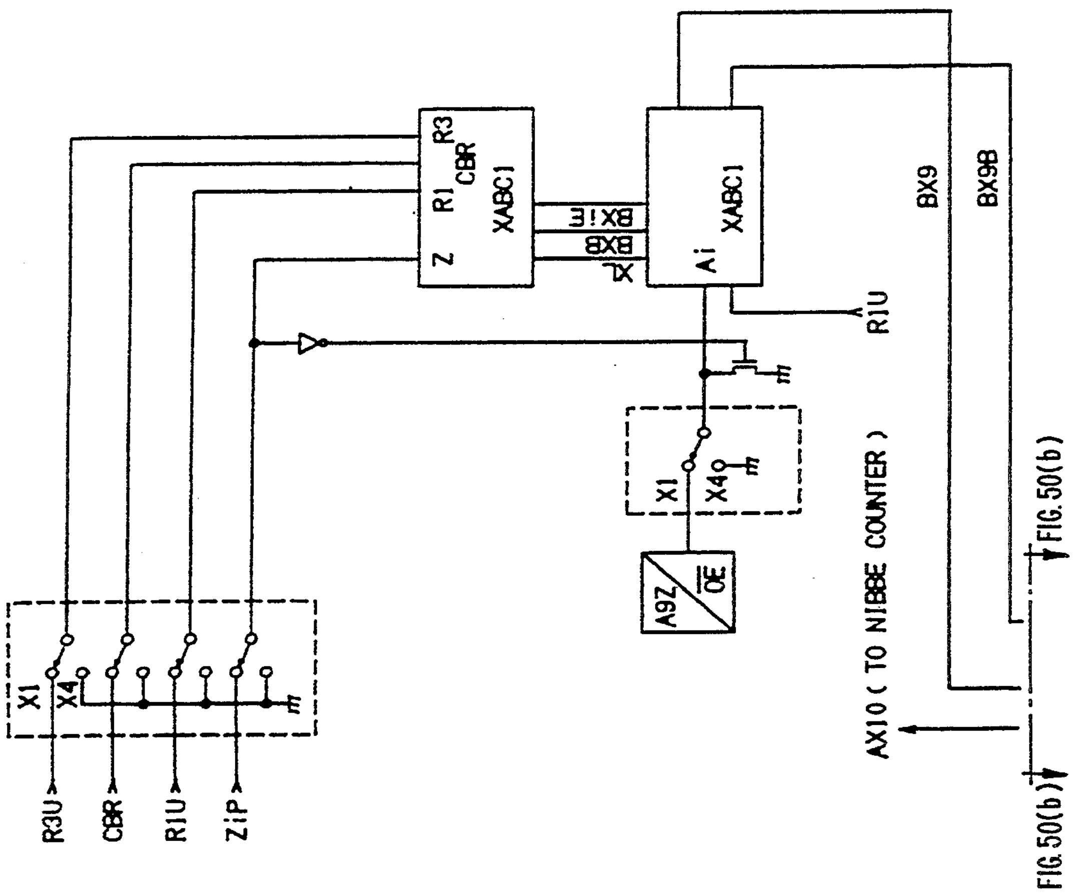
Figure 50B:
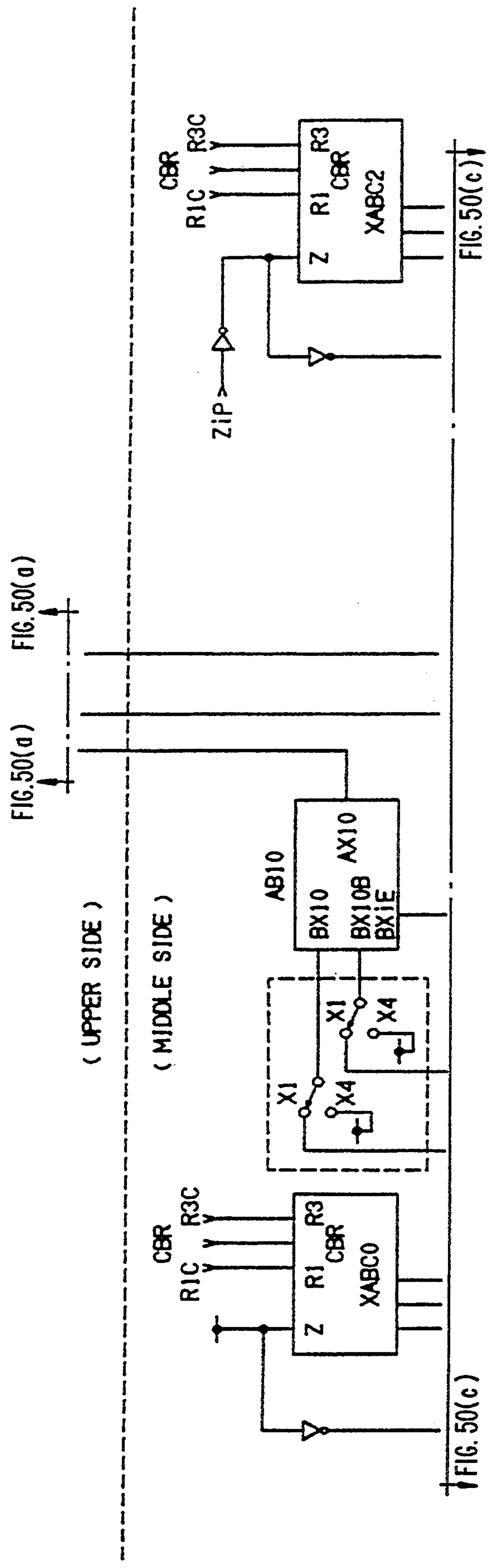
Figure 50C:
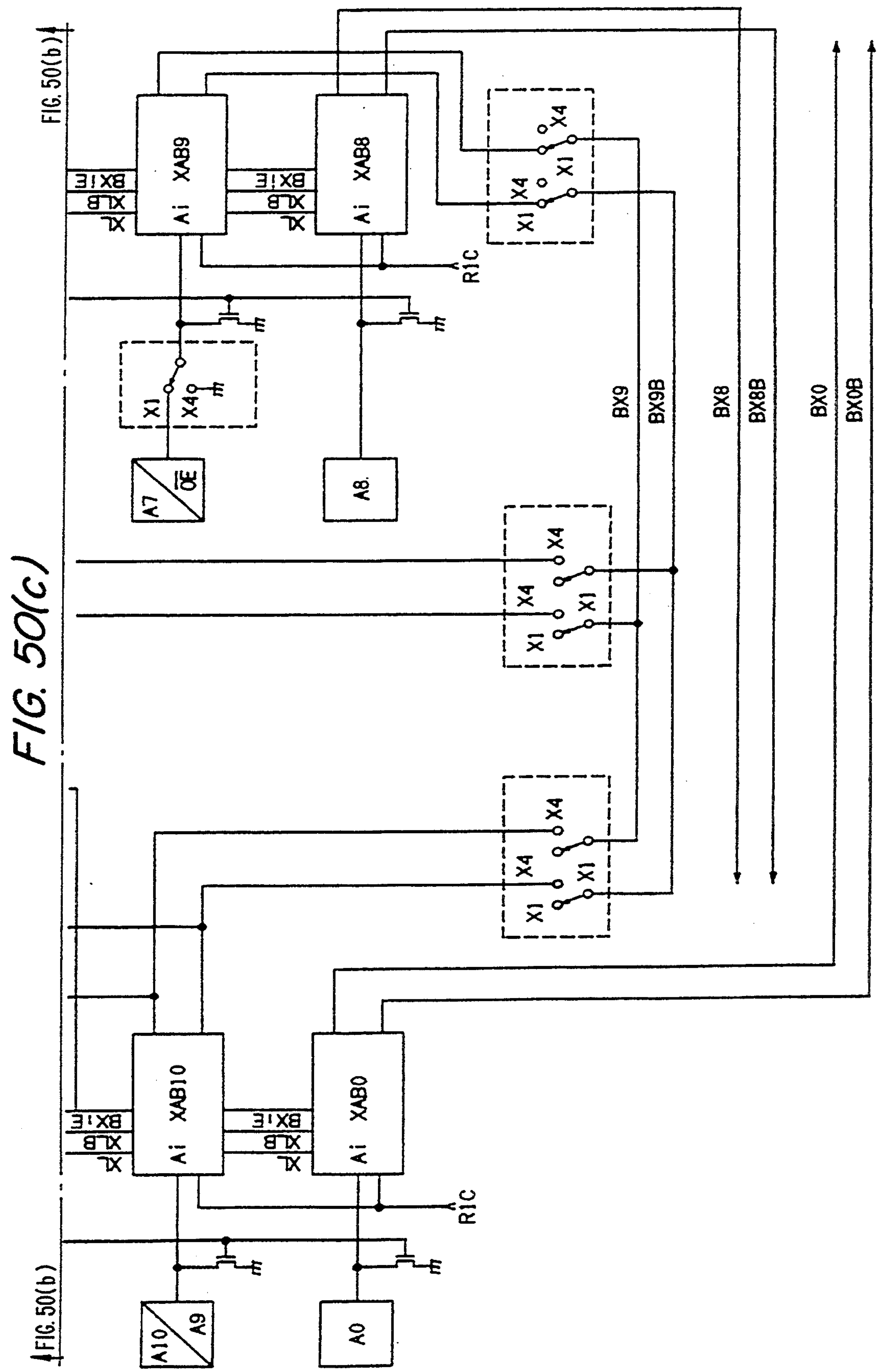
Figure 51A:
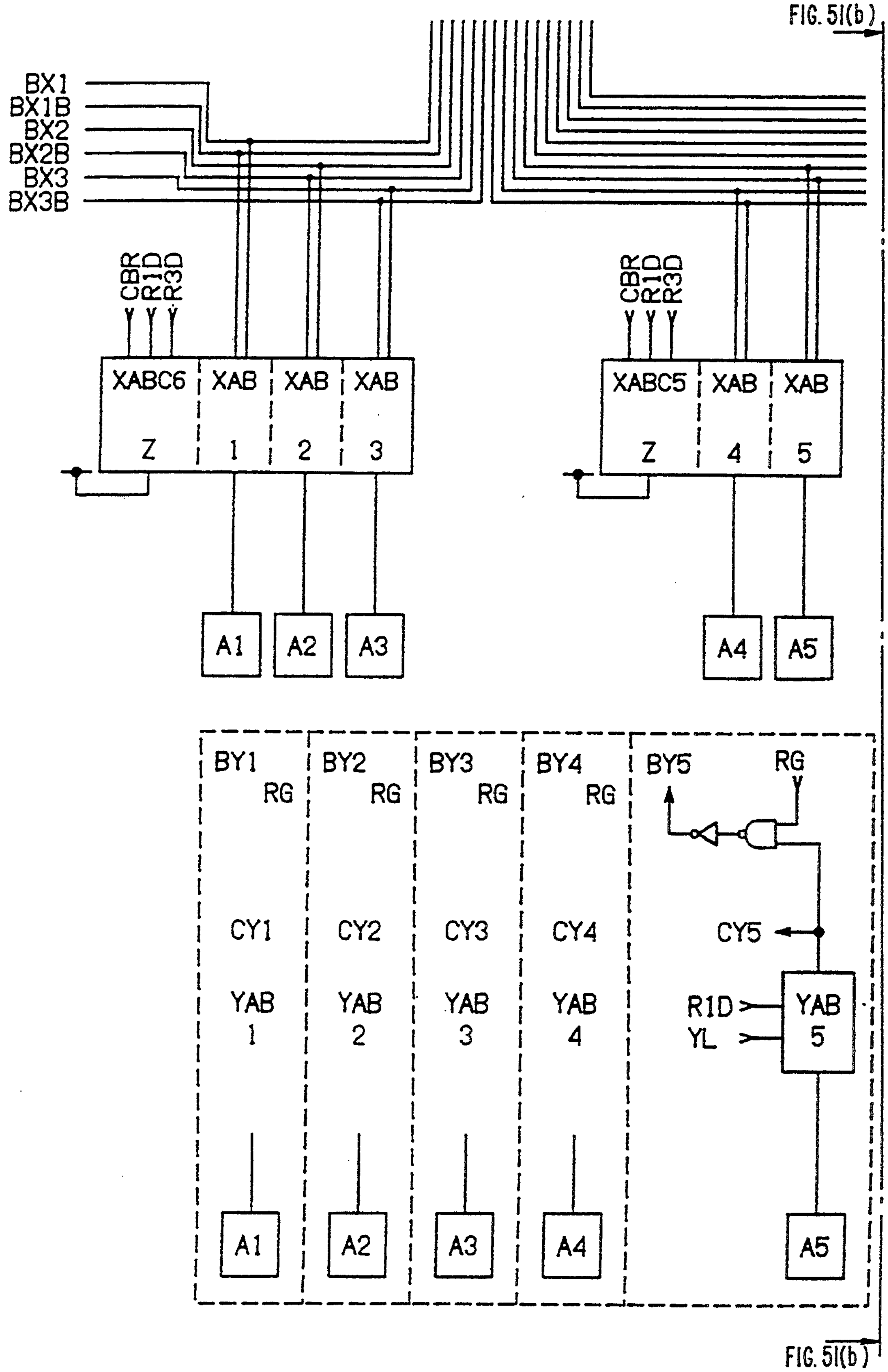
Figure 51B:
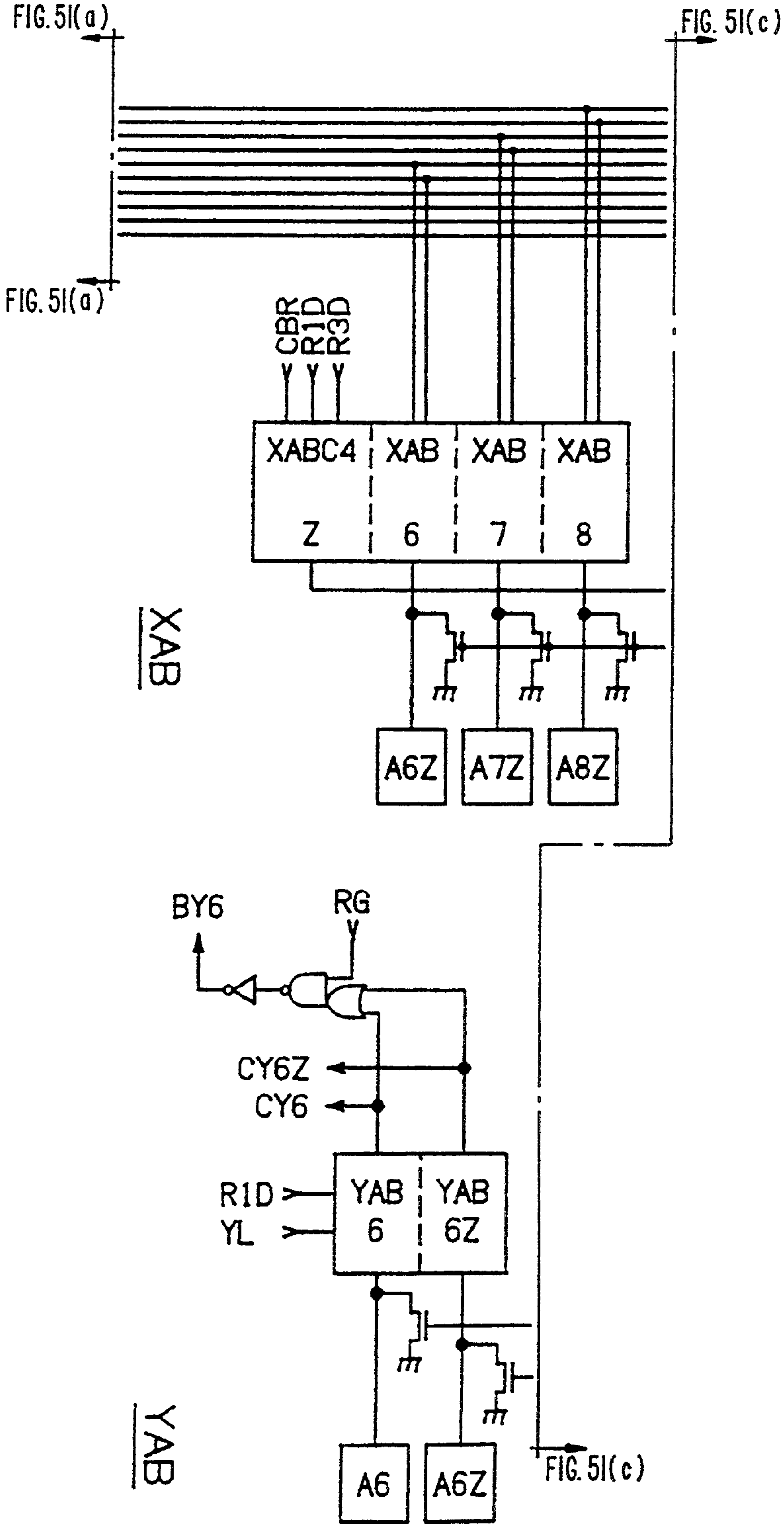
Figure 51C:
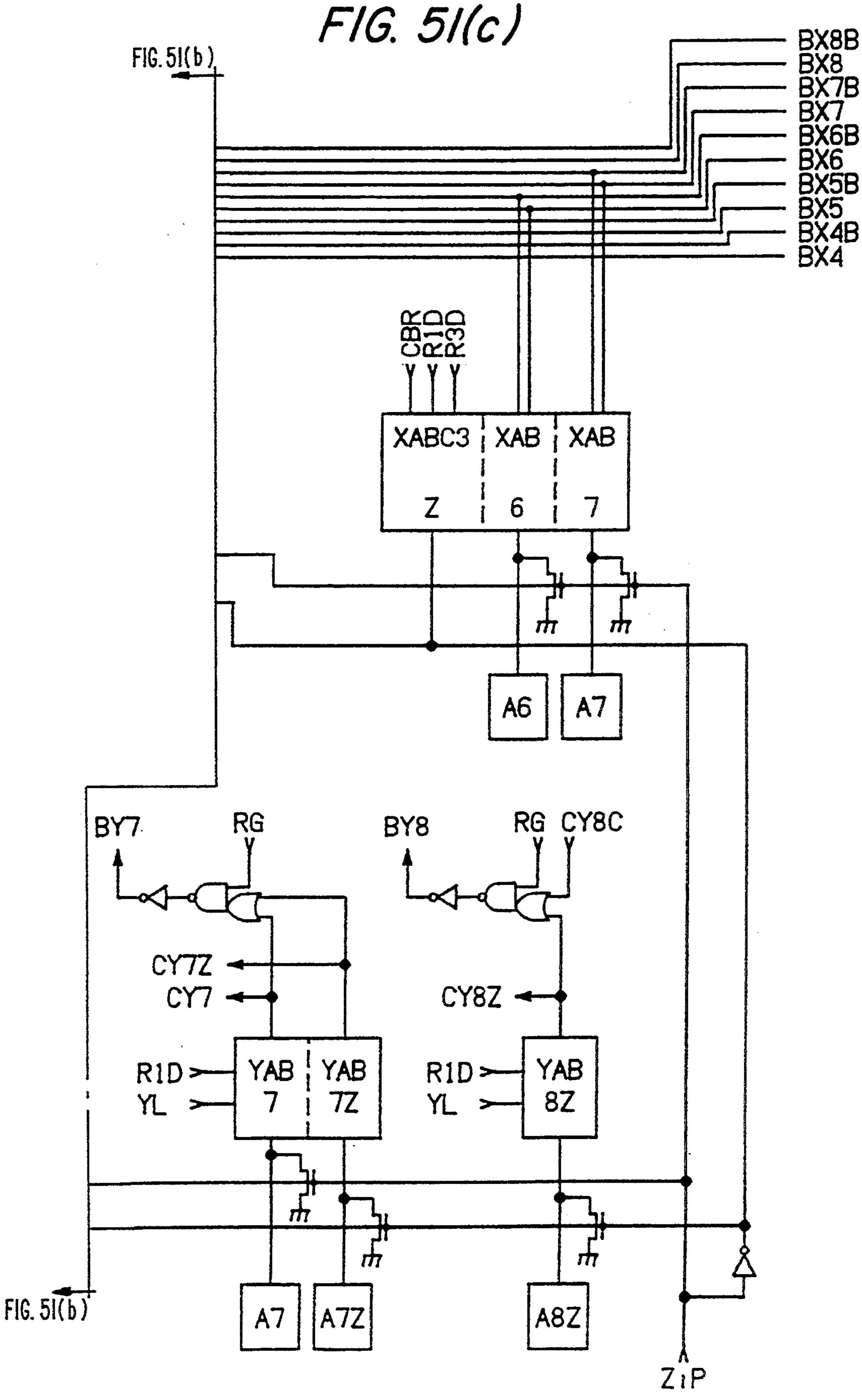

As shown in FIGS. 50 and 51, the X-address buffer XAB is equipped with: eleven unit circuits XAB0 to XAB10 provided for the address input terminals A0 to A8 and A9 (or the output enable signal input terminal $\overline{OE0}$ in the case of the x 4 bit structure) and A10 (or the address input terminal A9 in the case of the x 4 bit structure); and four unit circuits XAB6Z to XAB9Z provided for address input terminals A6Z to A8Z and A9Z (or the output enable signal input terminal $\overline{OEZ}$ in the case of the x 4 bit structure). These unit circuits are arranged in the vicinity of the corresponding bonding pads, and address buffer control circuits XABC0 to XABC6 are provided for one or plural unit circuits arranged in the vicinity.

The X-address buffer XAB is further equipped with: a plurality of input control MOSFETs connected between the input terminal Ai of each unit circuit and the ground potential of the circuit; and a plurality of switching points to be selectively formed with predetermined aluminum wiring lines in accordance with the bit structure of the dynamic RAM. The aforementioned input control MOSFETs have their gates fed selectively with the inverted internal signal $\overline{ZIP}$. Here, the internal signal ZIP and its inverted signal $\overline{ZIP}$ are set to the low level, when the dynamic RAM is brought into the DIP or SOJ package shape and when the pad ZIP is opened, and to the high level when the dynamic RAM is brought into the ZIP package shape and when the aforementioned pad ZIP is bonded to the power supply voltage of the circuit. As a result, the input terminals Ai of the unit circuits XAB6 to XAB9 are forcibly shorted to the ground potential of the circuit when the dynamic RAM is brought into the ZIP package shape, and the input terminals AI of the unit circuits XAB6Z to XAB9Z are forcibly shorted to the ground potential of the circuit when the dynamic RAM is brought into the DIP or SOJ package shape. The input control MOSFETs corresponding to the unit circuits XAB0 to XAB5, XAB9 and XAB10 are steadily held in the OFF states by having their gates fed with the inverted signal of the power supply voltage of the circuit, i.e., the fixed low-level signal.

Figure 49A:
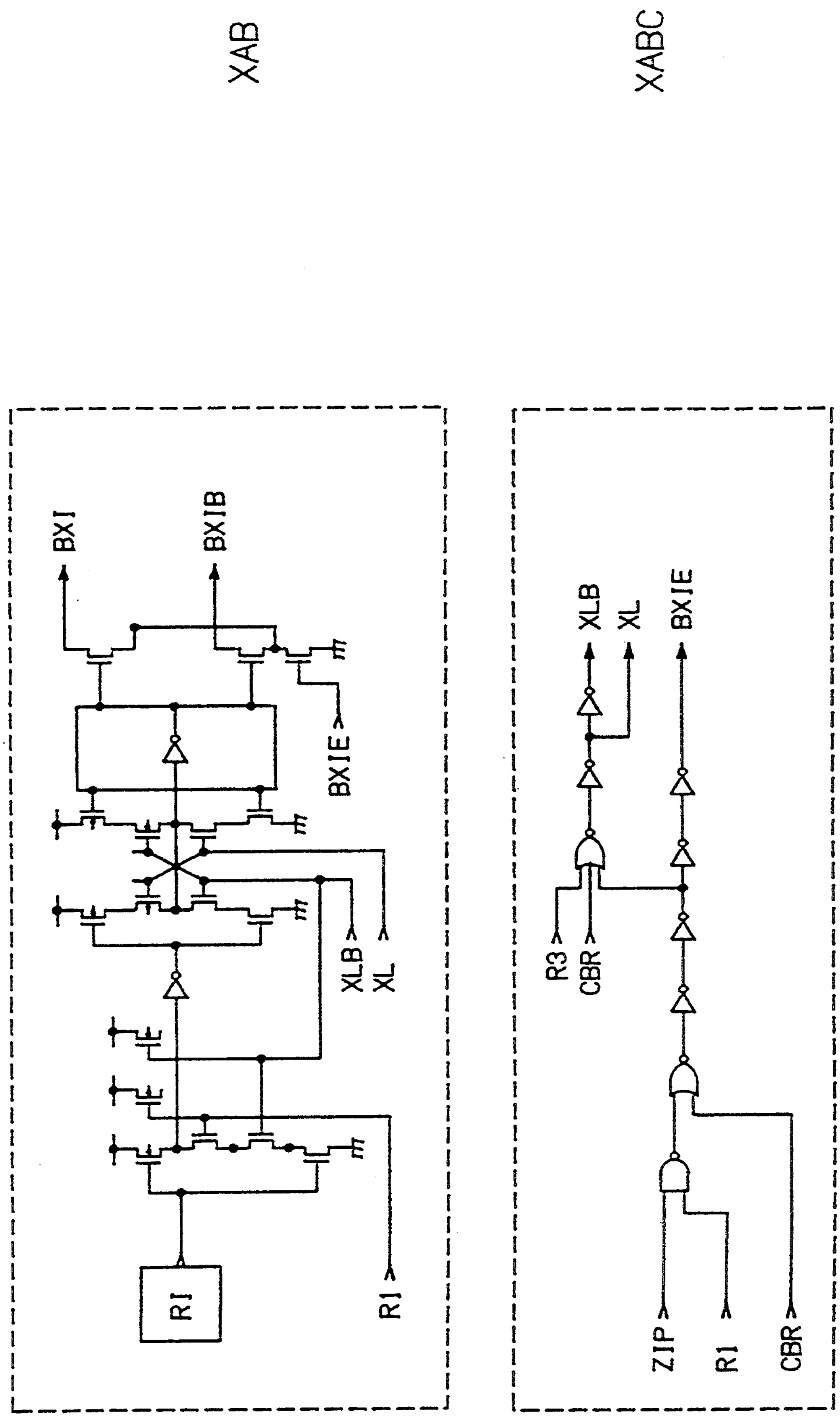
Figure 49B:
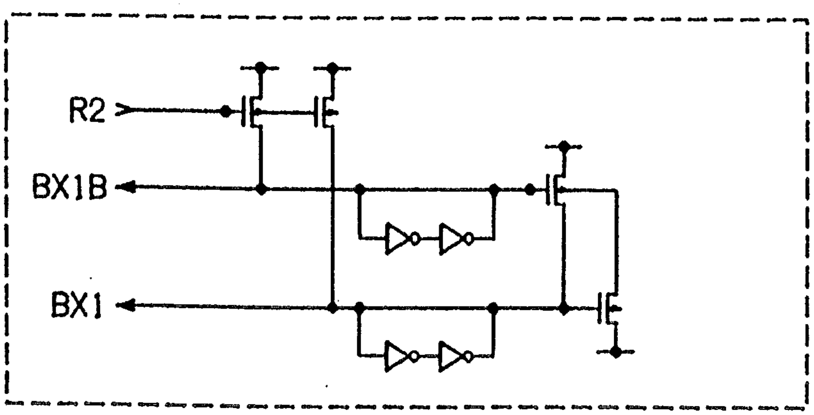
Figure 49C:
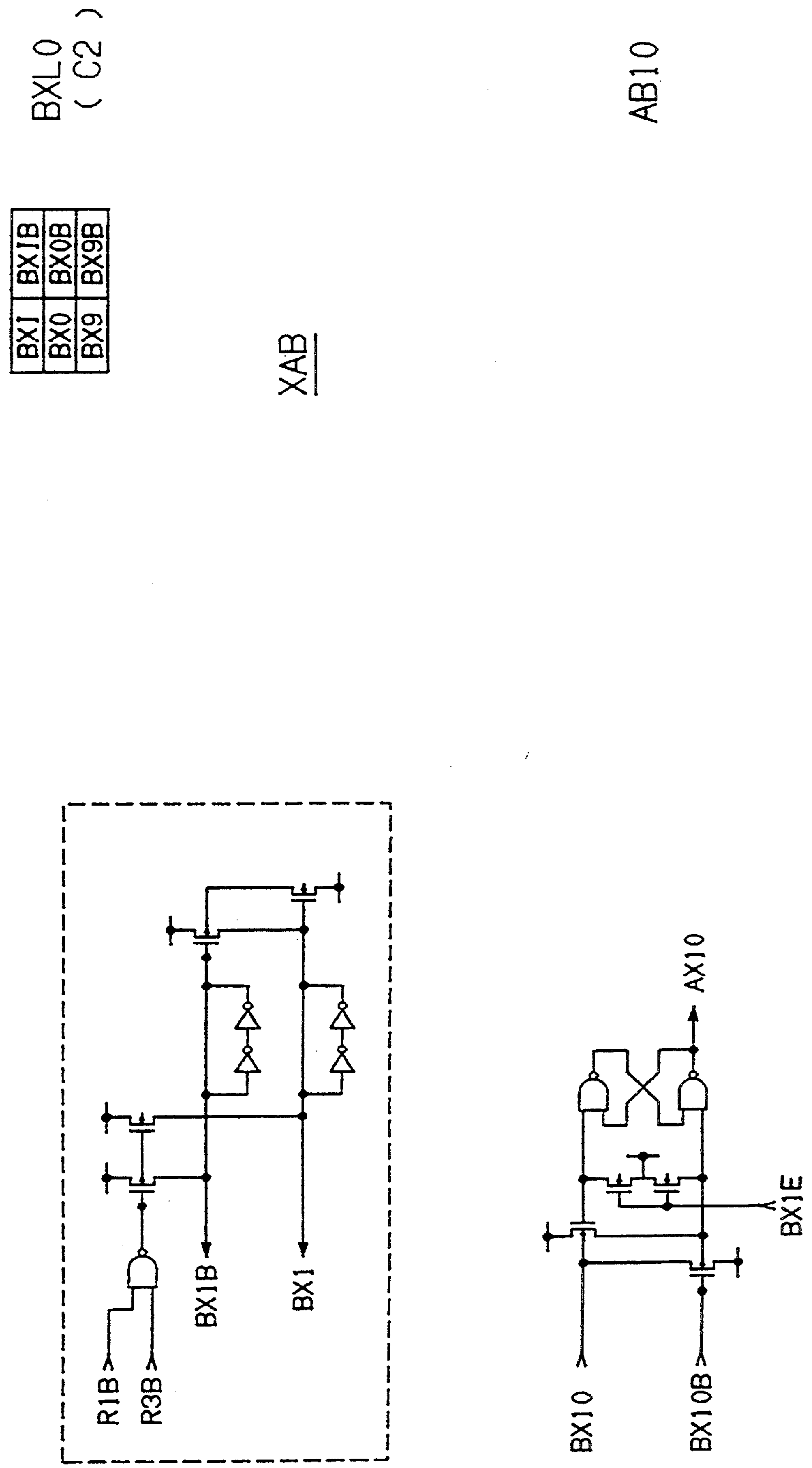

The address buffer control circuits XABC0 to XABC6 include: a 2-input NAND gate circuit having its two input terminals made receptive of input signals Z and R1; and a 2-input NOR gate circuit having its one input terminal made receptive of the output signal of the aforementioned NAND gate circuit and its other input terminal made receptive of the input signal CBR, as exemplified in FIG. 49. The output signal of the NOR gate circuit is fed through two inverter circuits to the third input terminal of a 3-input NOR gate circuit and further through two inverter circuits to form an output signal BXIE. The first and second input terminals of the aforementioned 3-input NOR gate circuit are fed with the input signals R3 and CBR so that the output signals are fed through one or two inverters to form the uninverted timing signal XL and the inverted timing signal XLB.

In this embodiment, the input terminals Z of the address buffer control circuits XABC2 and XABC3 are fed with the aforementioned inverted internal signal $\overline{ZIP}$, and the input terminals Z of the address buffer control circuits XABC1 and XABC4 are fed with the aforementioned internal signal ZIP. On the other hand, the input terminals Z of the address buffer control circuits XABC0, XABC5 and XABC6 are coupled to the power supply voltage of the circuit. The input terminals R1 and R3 of the individual address buffer control circuits are fed with the timing signals R1 and R3 from the $\overline{RAS}$-system control circuit RTG of the timing generator TG, and the input terminal CBR is fed with the internal signal CBR. Here, this internal signal CBR is selectively set to the high level at a predetermined timing when the dynamic RAM is brought into the CBR refresh cycle, as will be described hereinafter.

From the description thus far made, the internal signal BXIE to be outputted from each address buffer control circuit is selectively set to the high level in accordance with the timing signal R1 when both the corresponding input signals Z and R1 are at the high level whereas the input signal CBR is at the low level, namely, when the dynamic RAM is packaged in a corresponding manner and brought into the selected state in a cycle other than the CBR refresh cycle. Likewise, the complementary timing signal XL to be outputted from each address buffer control circuit is set to the logic "1" under the same condition as that of the aforementioned internal signal BXIE and is returned to the logic "0" at the instant when the timing signal R3 is at the high level.

Each unit circuit of the X-address buffer XAB includes: a 3-input NAND gate circuit made receptive of the corresponding address signal AI, timing signal R1 and inverted timing signal XLB; and one pair of clocked inverter circuits adapted to be complementarily brought into the transmission state in response to the aforementioned complementary timing signal XL. Of these, one clocked inverter circuit has its input terminal fed with the inverted output signal of the aforementioned NAND gate circuit, and the other clocked inverter circuit is latched together with a downstream inverter circuit. As a result, each address signal is transmitted to the aforementioned latch on condition that the timing signal R1 is at the high level and that the complementary timing signal XL is at the logic "0". When the complementary timing signal XL is at the logic "1" the aforementioned latch is brought into the latching state kept away from the influences of the input address signal.

Each unit circuit of the X-address buffer XAB further includes a pair of output MOSFETs of open drain type, which have their individual gates fed with the inverted and uninverted output signals of the aforementioned latch, respectively, and their individual drain potentials used as the output signal BXI and inverted output signal BXIB of the corresponding unit circuit. The commonly connected sources of those output MOSFETs are connected with the ground potential of the circuit through the MOSFET which has its gate made receptive of the aforementioned internal signal BXIE.

The output terminal BXI and the inverted output terminal BXIB of the unit circuits XAB1 to XAB5 are coupled to the complementary input terminal of the corresponding terminal circuit BXL1, although not especially limitative thereto. Moreover, the output terminal BX1 and inverted output terminal BXIB of the unit circuits XAB6 to XAB8 are coupled to the complementary output terminals of the corresponding unit circuits XAB6Z to XAB8Z and then to the complementary input terminal of the corresponding terminal circuit BXL1. Likewise, the output terminal BXI and inverted output terminal BXIB of the unit circuit XAB0 are coupled to the complementary input terminal of the corresponding terminal circuit BXL0. Moreover, the output terminal BXI and inverted output terminal BXIB of the unit circuit XAB9 are coupled to the complementary output terminal of the corresponding unit circuit XAB9Z and then to the complementary input terminal of the corresponding terminal circuit BXL0. The complementary input terminals of the foregoing ten terminal circuits BXL1 and BXL0 are commonly connected with the complementary output terminals of the corresponding bits of the refresh counter RFC, which will be described hereinafter. These terminal circuits and their precharge circuits, and the individual unit circuits of the refresh counter RFC are arranged at the middle side portion of the semiconductor substrate surface. As a result, the outputs of the unit circuits other than that XAB10 of the X-address buffer XAB are-logically summed with the output of the corresponding bit of the refresh counter RFC. It goes without saying that the outputs of the unit circuits XAB6 to XAB9 of the X-address buffer XAB are logically summed with the outputs of the corresponding unit circuits XAB6Z to XAB9Z. In these logical connections, the outputs of the individual unit circuits of the X-address buffer XAB are selectively activated as a result that the corresponding internal signal BXIE is at the high level.

Thus, a plurality of unit circuits provided for the individual package shapes of the X-address buffer XAB or the individual unit circuits of the X-address buffer XAB and corresponding unit circuits of the refresh counter RFC are connected in the logical shape so that the address buffer can have its logical step number be reduced while giving the logical structure the degree of freedom. Thus, the unit circuits are provided for the individual package shapes and arranged in the vicinity of the corresponding pads so that their input capacity can be reduced to couple those output signals logically without adversely affecting the transmission delay time of the address signals. As a result, the dynamic RAM can be speeded up while reducing the number of circuit elements of the X-address buffer XAB and the area necessary for the layout.

On the other hand, the output terminal BX1 and inverted output terminal BXIB of the unit circuit XAB10 are coupled to the complementary input terminal of the terminal circuit AB10. The output signal of this terminal circuit AB10 is fed as an internal address signal AX10 to a later-described nibble counter circuit NC. When the dynamic RAM is made to have the x 4 bit structure, the output of the unit circuit XAB10 corresponds to the output of the aforementioned unit circuit XAB9.

The terminal circuits BXL1 and BXL0 include: a pair of latches provided for the aforementioned output terminal BXI and its inverted output terminal $\overline{BXI}$; and a pair of reset MOSFETs connected between those output terminals and the power supply voltage of the circuit. Of these, the reset MOSFET of the terminal circuit BXL1 has its gate fed with a timing signal R2, and the reset MOSFET of the terminal BXL0 has its gate fed with the output signal of a NAND gate circuit, which is made receptive of inverted timing signals R1B and R3B, namely, the logical sum of the timing signals R1 and R3. As a result, the complementary internal address signals BX1 to BX8 to be transmitted through the terminal circuit BXL1 are activated, when the timing signal R2 is at the high level, and are reset when the timing signal R2 is at the low level. Likewise, the complementary internal address signals BX0 and BX9 to be transmitted through the terminal circuit BXL0 are activated, when the inverted timing signal R1B is at the low level, and are reset when the inverted timing signal R3B is at the high level. The output signals of the individual unit circuits, i.e., the complementary internal address signals BX0 to BX9 have their uninverted and inverted signals set to the high level when the dynamic RAM is brought into the unselected state and when the individual unit circuits are brought into the aforementioned reset state. When the dynamic RAM is brought into the selected state and released from the aforementioned reset state, those uninverted or inverted signals are selectively set to the low level in response to the X-Address signals X0 to X10 fed when in the memory access.

As has been described hereinbefore, the complementary internal address signals BX0 and BX9 are used to form the mat selection signals MS0 to MS3, and the necessary condition for the operation sequence of the dynamic RAM is that those signals are finally reset. Thus, the sequence control by the internal address signals can be accomplished by changing the reset timings of the individual address signals intentionally in accordance with their applications, As a result, the structure of the peripheral circuits is simplified to speed up the operations of the dynamic RAM accordingly.

1.2.8. Mat Selection Circuit

The mat selection circuit MSL includes, as shown in FIG. 46: totally eight unit circuits MS provided for every four memory mats at the upper and lower sides and made receptive of the complementary internal address signals BX0 and BX9 in a predetermined combination; the aforementioned common source drive circuits CSN and CSP; and the common source line equalizing circuit CSS. The output signals of the aforementioned unit circuits MS are fed as the mat selection signals MS0 to MS3 providing the basis for the selecting operations to the individual circuits of the dynamic RAM.

1.2.9. Word Line Control Circuit

The word line control circuit WLC is equipped, although not especially limitative thereto, with: two word line selection timing signal generators XU and XD provided for every four memory mats at the upper and lower sides; four X-decoder monitor circuits DECM provided for each pair of memory mats and adapted to be simultaneously brought into the selected states; and eight word line clear circuits WCUB, eight X-decoder control circuits XDGB, eight redundant word line drive signal generators XRIJ and thirty two word line drive signal generators XIJ provided for each memory mat.

Figure 45A:
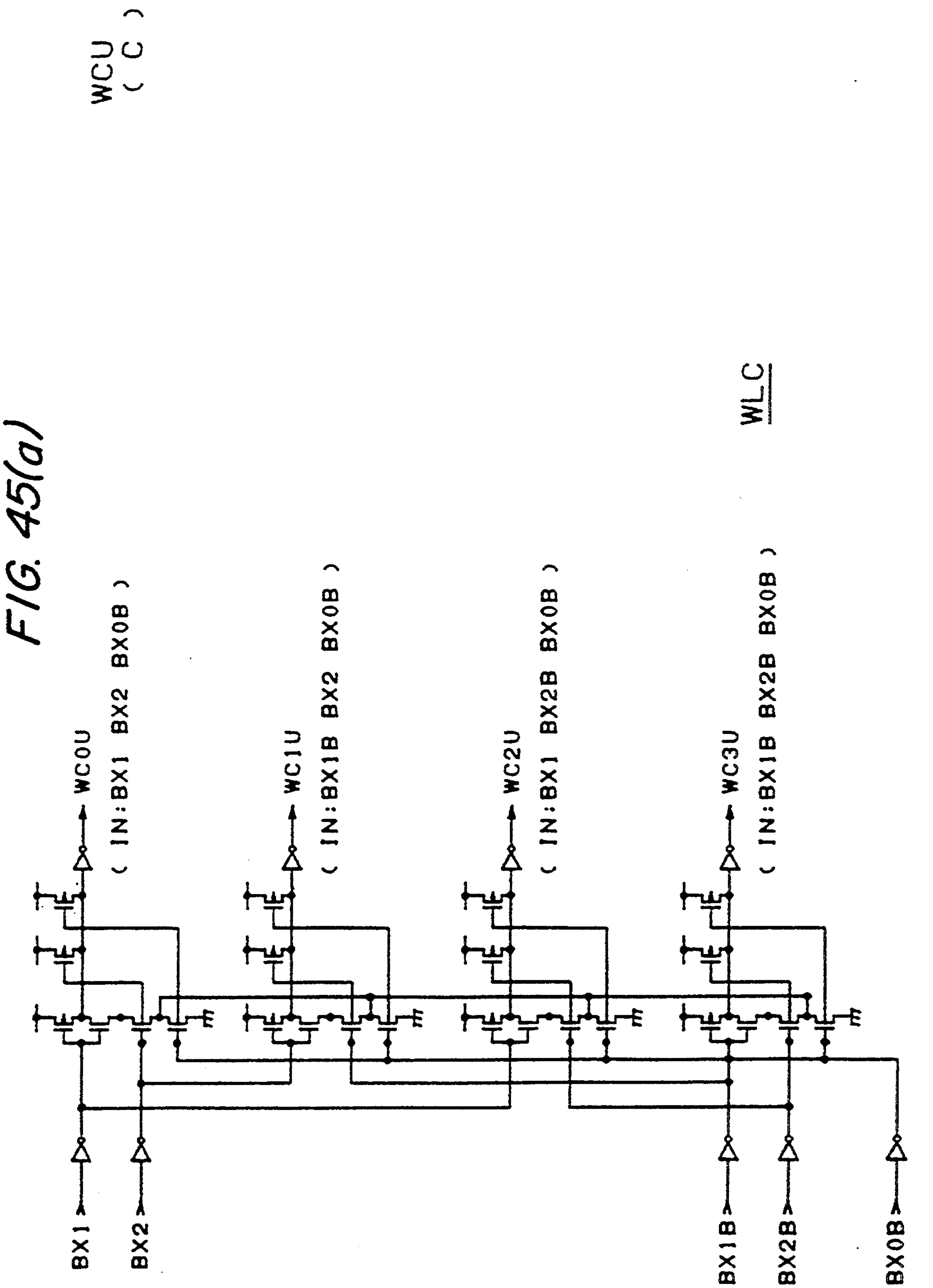
Figure 45B:
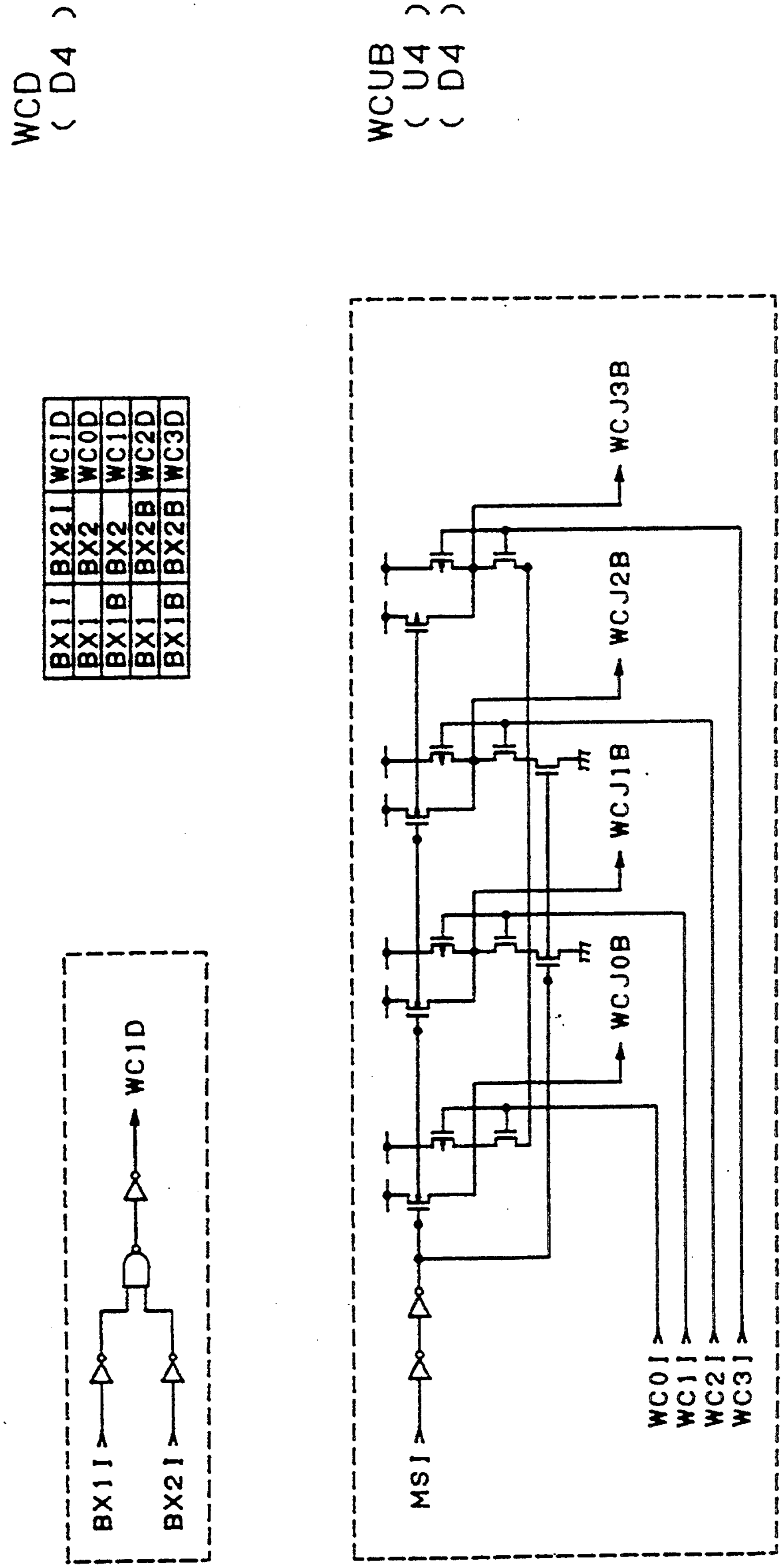
Figure 45C:
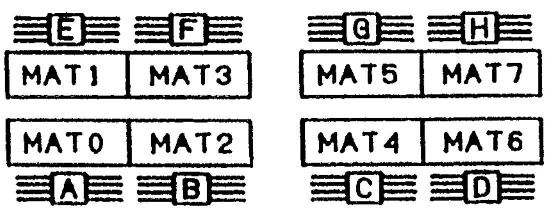

Of these circuits, the word line clear circuits WCUB form inverted word line clear signals WC00B to WC03B through WC70B to WC73B, as shown in FIG. 45, on the basis of the internal signals WC0U to WC3U and WC0D to WC3D which in turn are selectively formed in a word line clear signal generator WCU or WCD in accordance with the complementary internal address signals BX0 to BX2. Those inverted word line clear signals are set all to the high level, when the dynamic RAM is in the unselected state, and selectively to the low level when the dynamic RAM is in the selected state. As a result, in the corresponding memory mats MAT0 to MAT7, the word line clear MOSFET corresponding to one of the four word lines constituting each word line group is turned OFF and is released from the short circuit to the ground potential of the circuit.

On the basis of the X-system decoder precharge signal XDP and the mat selecting complementary internal address signals BX0 and BX9, as shown in FIG. 47, the X-decoder control circuits XDGB then selectively form the inverted internal signal SDGB for activating the X-address decoders XAD00 and XAD01 to XAD70 and XAD71 and the internal signal XIJL for activating the later-described word line drive signal generator XIJ and the redundant word line drive signal generator XRIJ. As has been described hereinbefore, the X-decoder control circuits XDGB additionally have functions to form the aforementioned precharge control signal PCINB selectively on the basis of the aforementioned inverted internal signal XDGB and to form the complementary selection signal Y0 and Y1 selectively on the basis of the complementary internal address signal AY9C.

Figure 44B:
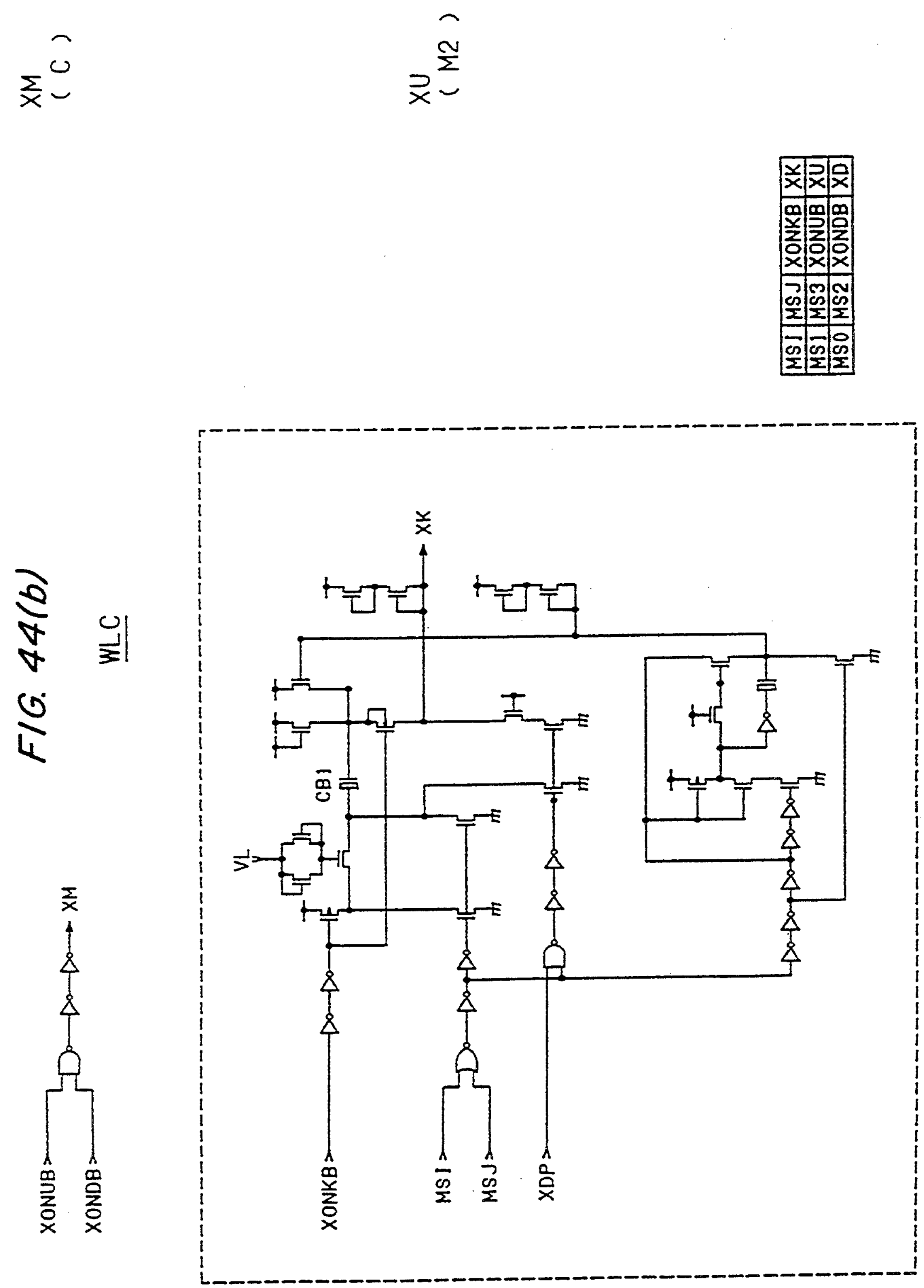

Moreover, the X-decoder monitor circuits DECM include a plurality of MOSFETs corresponding to the decoder tree and the word line drive MOSFETs of the individual unit circuits of the aforementioned X-address decoder XAD, as exemplified in FIG. 44, and have transmission characteristics substantially equivalent to those of the unit circuits. Each of the X-decoder monitor circuits is triggered by both the internal signal XDGB outputted from the corresponding X-decoder control circuit XDGB and that one of the precharge signals AX30 to AX33, which has the heaviest load. An internal signal DMJ at the low level is formed at the timing at which the selection of the corresponding X-address decoder XAD is ended. One pair of internal signals DMJ corresponding to the memory mat at the upper or lower side are combined through the negative logical sum circuit and are logically multiplied by the timing signal R2 to form an inverted internal signal XONUB or XONDB. These inverted internal signals are fed as trigger signals to the corresponding word line selection timing signal generators XU and XD and further as the internal signal XM through the negative logical sum circuit to the word line monitor circuit of the $\overline{RAS}$-system control circuit RTG.

The word line selection timing signal generators XU and XD individually include boost capacities CB1, as shown in FIG. 44. These boost capacities CB1 are precharged to take the high level at their righthand electrodes and the low level at their lefthand electrodes when the dynamic RAM is brought into the unselected state. When the dynamic RAM is selected, moreover, the boost capacities CB1 are given the high level at their lefthand electrodes when the corresponding mat selection signals MS0 to MS3 are at the high level and when the aforementioned corresponding inverted internal signal XONUB or XONDB is at the low level. As a result, the righthand electrodes are raised to the boost level higher than the power supply voltage of the circuit so that the word line selection timing signal XU or XD is set to the aforementioned boost level. This word line selection timing signals XU and XD are fed to the word line drive signal generator XIJ and the redundant word line drive signal generator XRIJ.

On the basis of the aforementioned internal signal XIJL corresponding to the aforementioned word line selection timing signal XU or XD and the word line selecting complementary internal address signals BX1 and BX2, as shown in FIG. 47, the word line drive signal generator XIJ forms the boost-level word line selection drive signal XIJ, e.g., X00, X01, X10 and X11 selectively and feeds it to the corresponding X-address decoder. The word line drive signal generator XIJ is fed, as has been described hereinbefore, from the X-system redundant circuit XRC with the internal signal XNK which is selectively set to the high level when the address fed when in the memory access and the defective address assigned to any redundant word line are coincident. When the internal signal XNK is set to the high level, the operations of the word line drive signal generator XIJ are substantially stopped to form none of the aforementioned word line selection drive signals.

Likewise, on the basis of the aforementioned internal signal XIJL corresponding to the aforementioned word line selection timing signal XU or XD and the internal signal XRK, the redundant word line drive signal generator XRIJ forms the redundant word line drive signal XRIJ at the boost level and feeds it to the corresponding X-address decoder. Here, the internal signal XRK is formed as the logical sum signal of the inverted internal signals XRA0B to XRA3B, as shown in the transmission circuit XRA of FIG. 47. These inverted internal signals are selectively set to the high level, when the address to be fed when in the memory access and the defective address assigned to any redundant word line are incoincident, so that the aforementioned internal signal XRK is selectively set to the high level. When the internal signal XRK is at the high level, the operations of the redundant word line drive signal generator XRIJ are substantially stopped to form none of the aforementioned redundant word line drive signal XRIJ. In other words, the boost-level word line selection timing signals XU and XD formed by the word line selection timing signal generator XU or XD are transmitted, as the word line selection drive signal X00, X01, X10 or X11, through the word line drive signal generator XIJ when the internal signal XRK is at the high level. When the internal signal XNK is at the high level, on the other hand, the word line selection timing signals XU and XD are transmitted as the redundant word line selection drive signal XRIJ through the redundant word line drive signal generator XRIJ.

Figure 48A:
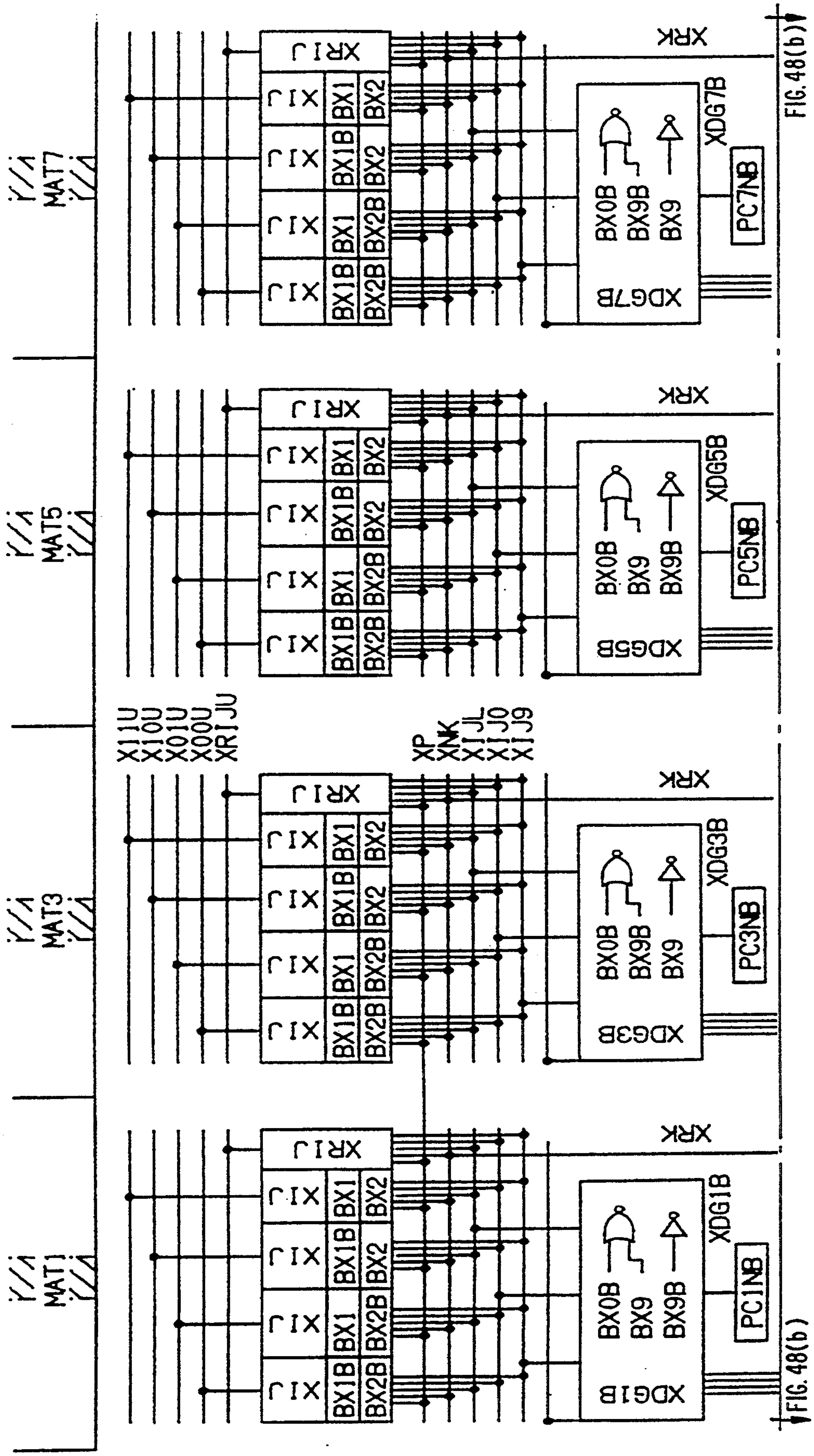
Figure 48B:
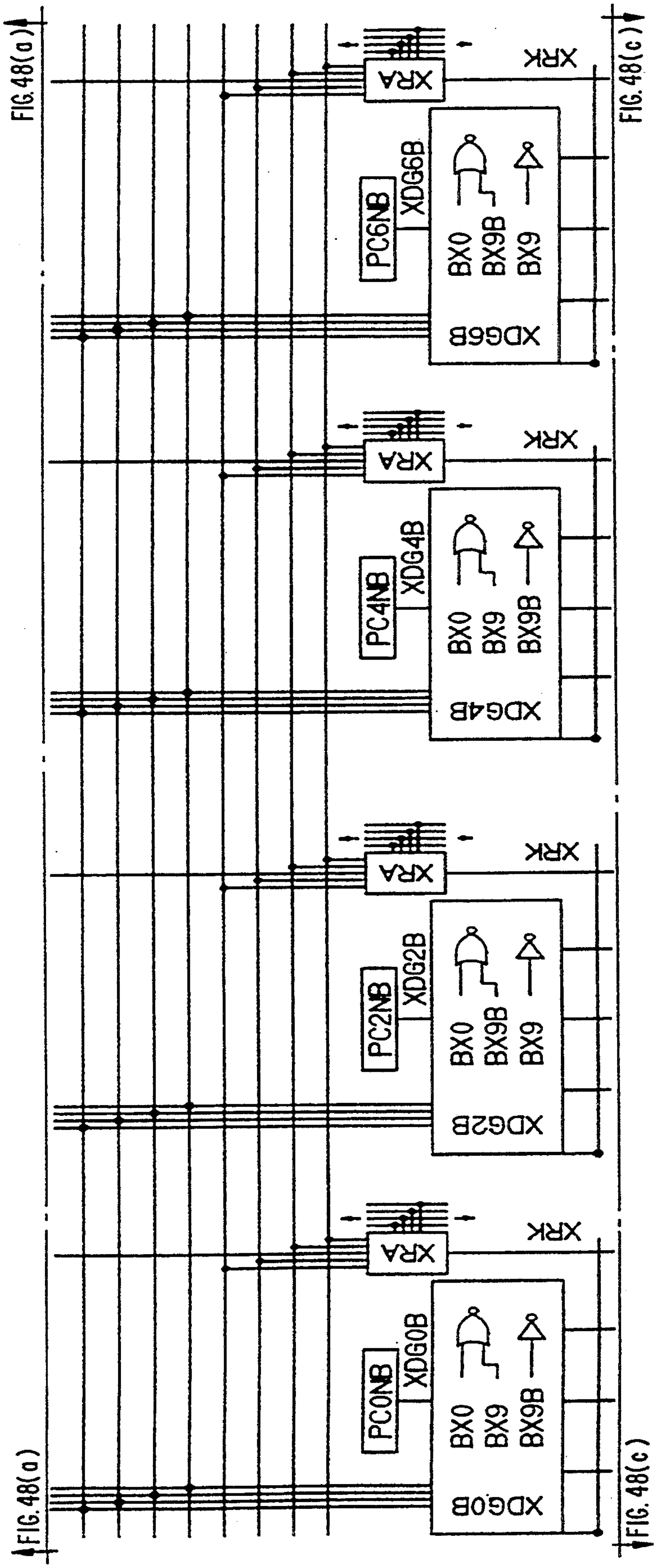
Figure 48C:
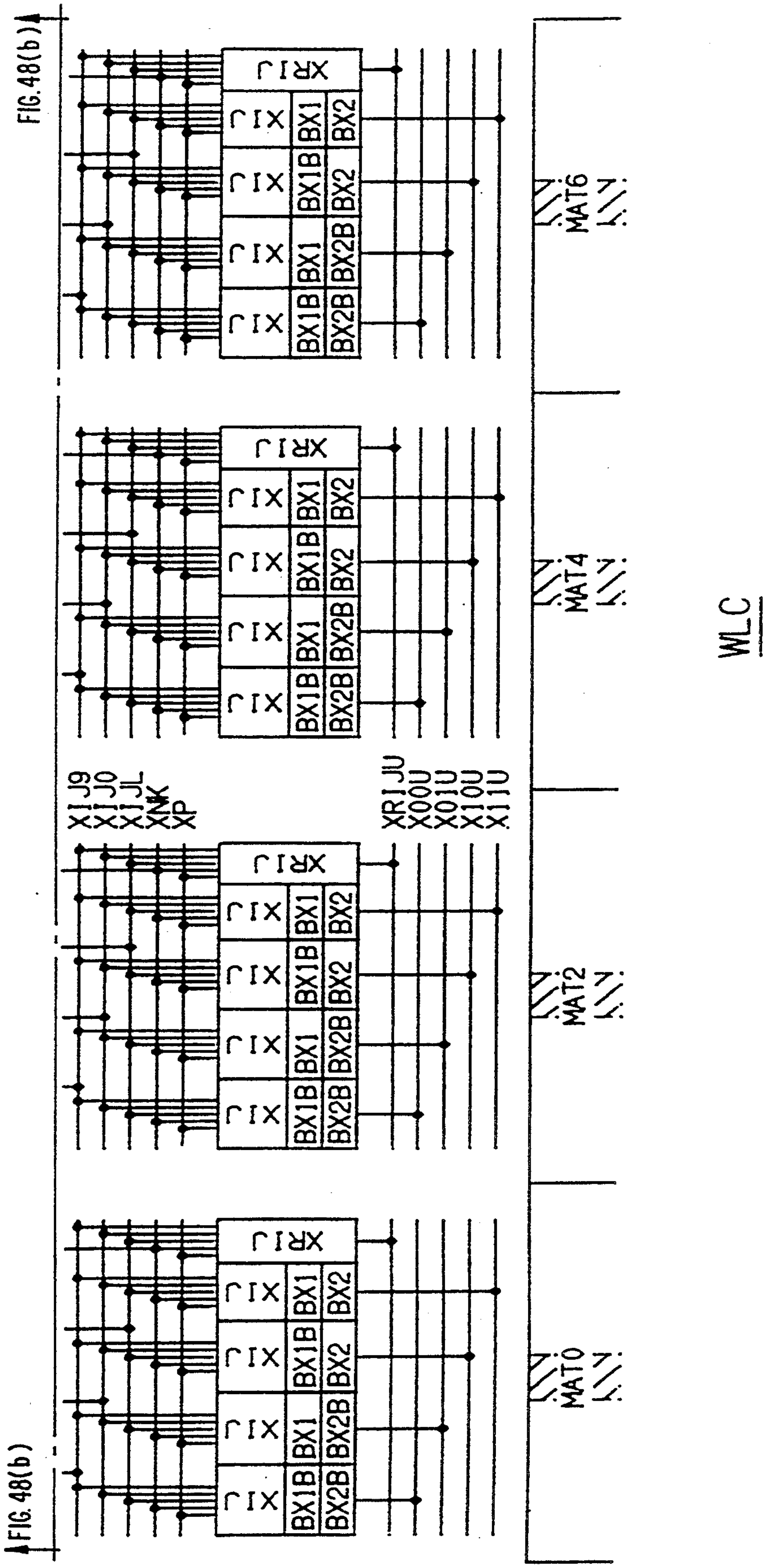

Reference should be made to FIG. 48, in which are summarized the relations among the complementary internal address signals, the individual internal signals, the word line selection timing signals, the word line selection drive signals, and the redundant word line selection drive signals, which are to be fed to the aforementioned word line control circuit WLC.

1.2.10. X-Predecoder

The X-predecoder PXAD is equipped, although not especially limitative thereto, with: three unit circuits AXNL, i.e., AX3U, AX5U and AX7U provided for the upper memory mat; and three unit circuits AXNL, i.e., AX3D, AX5D and AX7D provided for the lower memory mat.

Of these, the unit circuits AX3U, AX5U and AX7U are selectively brought into operative states, when the inverted internal address signal BX0B is at the low level, to decode the corresponding complementary internal address signals BX3 and BX4, BX5 and BX6, or BX7 and BX8 in combination thereby to form predecode signals AX30U to AX33U, AX50U to AX53U, or AX70U to AX73U selectively. These predecode signals are commonly fed to the eight X-address decoders XAD10 and XAD11, XAD30 and XAD31, XAD50 and XAD51, and XAD70 and XAD71 disposed at the upper side.

Likewise, the unit circuits AX3D, AX5D and AX7D are selectively brought into operative states, when the uninverted internal address signal BX0 is at the low level, to decode the corresponding complementary internal address signals BX3 and BX4, BX5 and BX6, or BX7 and BX8 in combination thereby to form predecode signals AX30D to AX33D, AX50D to AX53D, or AX70D to AX73D selectively. These predecode signals are commonly fed to the eight X-address decoders XAD00 and XAD01, XAD20 and XAD21, XAD40 and XAD41, and XAD60 and XAD61 disposed at the lower side.

Figure 52A:
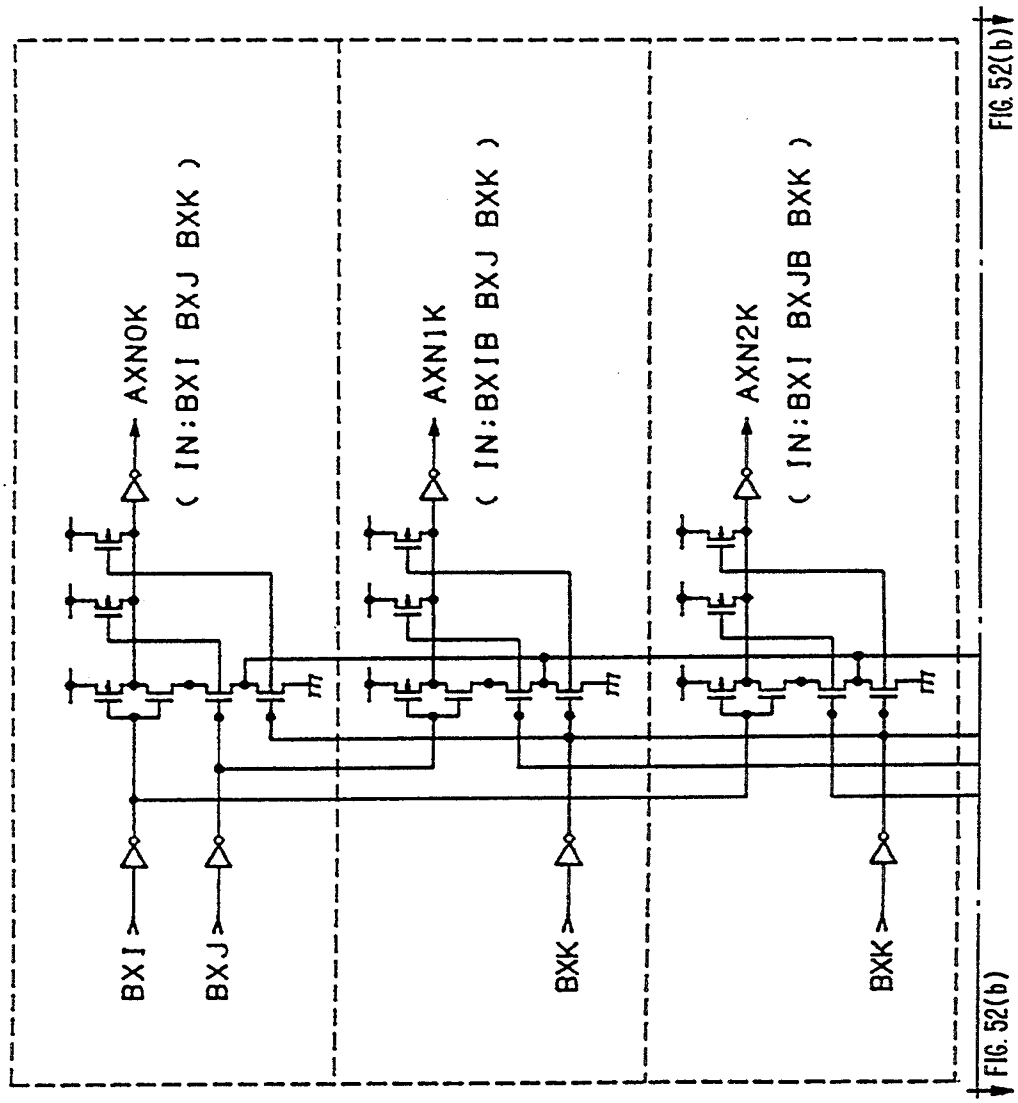
Figure 52B:
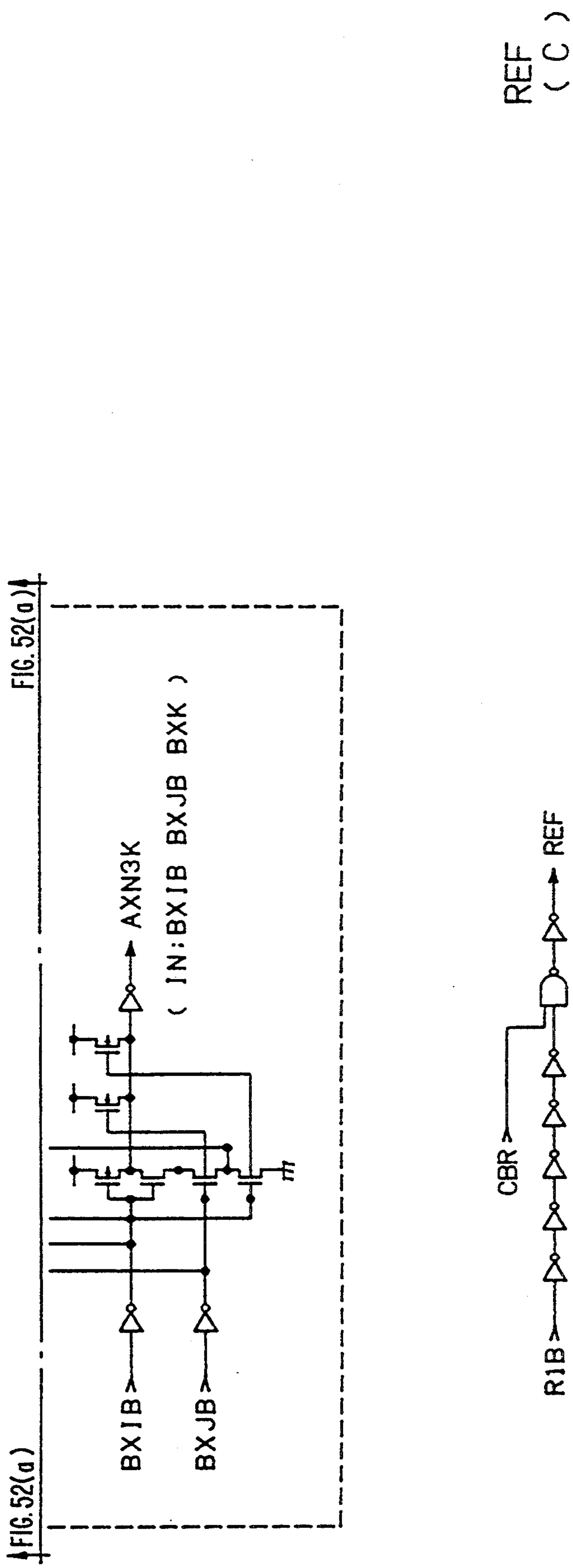
Figure 52C:
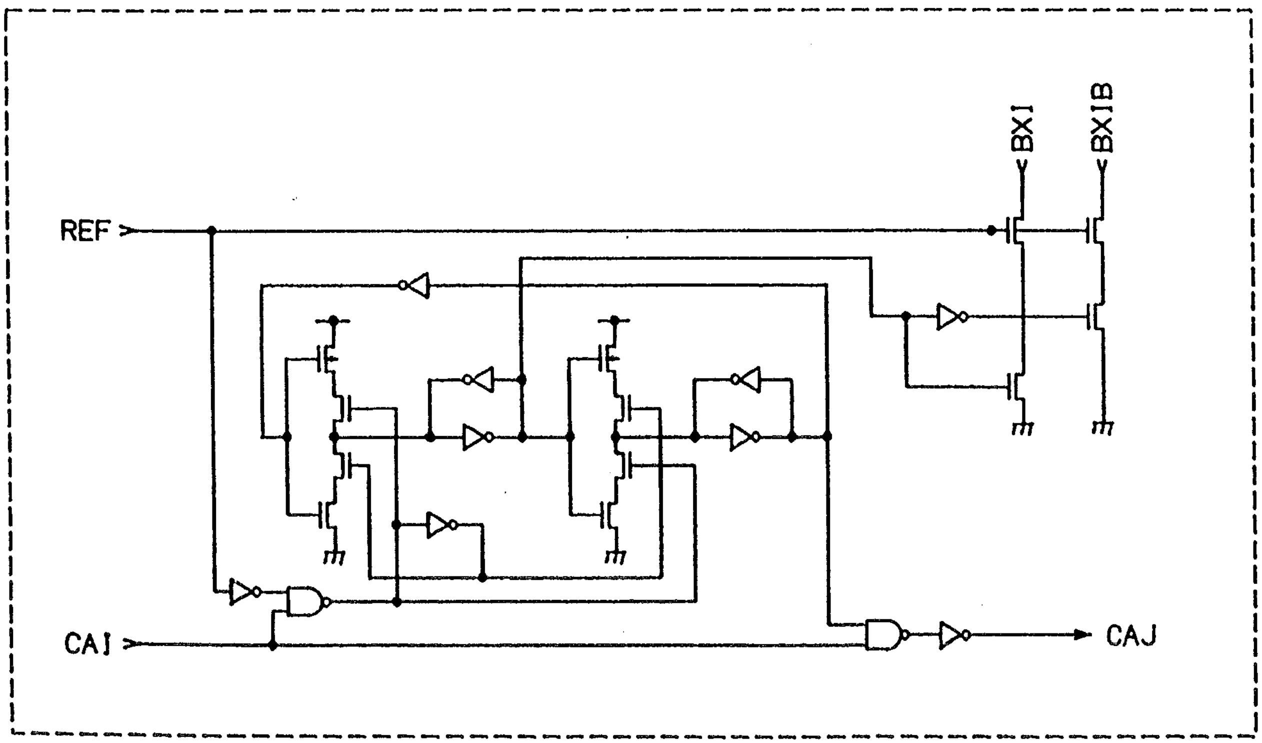

Each unit circuit AXNL of the X-predecoder PXAD include four 3-input logical product circuits which are made receptive commonly of the uninverted internal address signal BX0 or the inverted internal address signal $\overline{BX0}$ and of a predetermined combination of the uninverted and inverted signals of the corresponding complementary internal address signals of 2 bits, as exemplified in FIG. 52. As has been described hereinbefore, the complementary internal address signals BX0 to BX10 have both their uninverted and inverted signals set to the high level, when the dynamic RAM is brought into the unselected state, and either of their uninverted or inverted signal set selectively into the low level in response to the address signal fed when in the memory access when the dynamic RAM is brought into the selected state. As a result, the output signals of the individual unit circuits AXNL of the X-predecoder PXAD, i.e., the aforementioned predecode signals,are all fixed at the low level, when the dynamic RAM is brought into the unselected state, and are selectively set to the high level when the dynamic RAM is brought into the selected state.

In this embodiment, each unit circuit of the X-predecoder PXAD is provided for each of the upper and lower memory mats, as has been described hereinbefore, and is selectively brought into the operative state in response to the complementary internal address signal BX0. Moreover, the output signal of the unit circuit is selectively set to the high level, when the unit circuit is brought into the operative state, so that the downstream X-decoder is selectively brought into the operative state. As a result, the upper and lower memory mats and their peripheral circuits are selectively brought into the operative states in response to the complementary internal address signal BX0 so that the power consumption of the dynamic RAM is reduced.

1.2.11. X-System Redundant Circuit

The dynamic RAM of this embodiment is equipped with the four redundant word lines, as has been described hereinbefore, and accordingly with the four X-system redundant circuits XRC0 to XRC3 which are provided for the redundant word lines. Each of these X-system redundant circuits includes: one redundant enable circuit XRE; and eight address comparators XCMP provided for the complementary internal address signals BX1 to BX8.

Figure 53A:
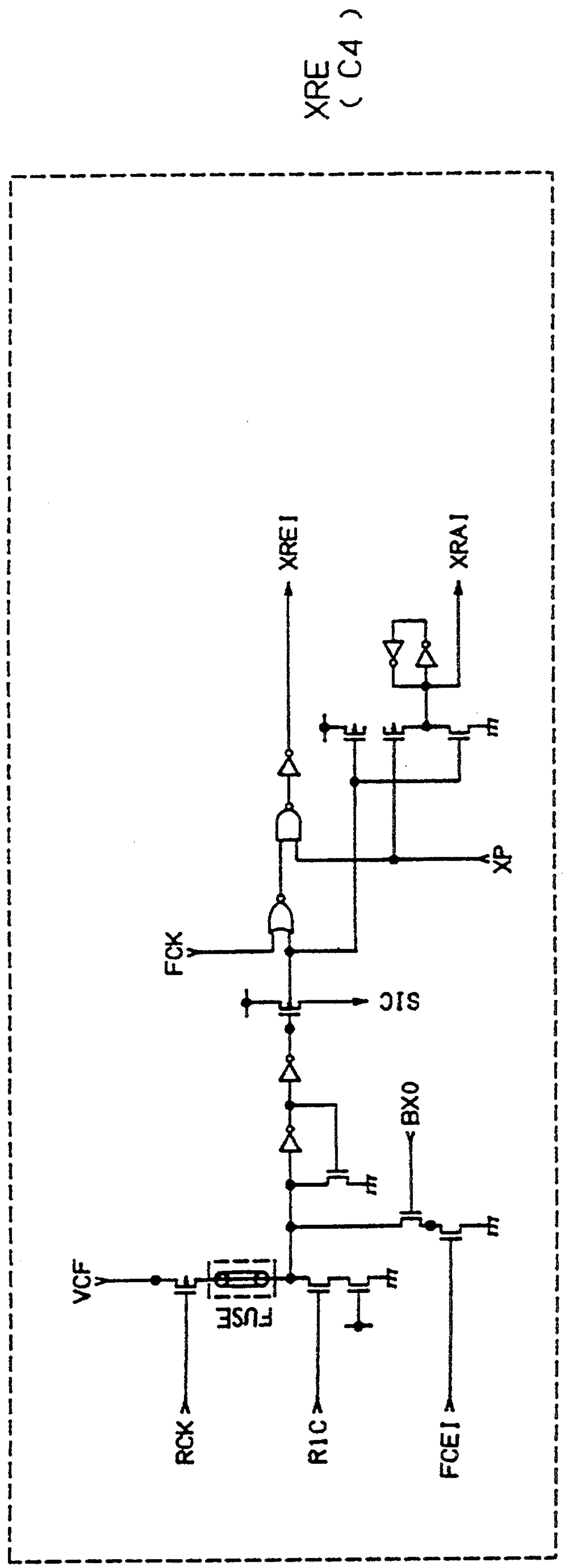
Figure 53B:
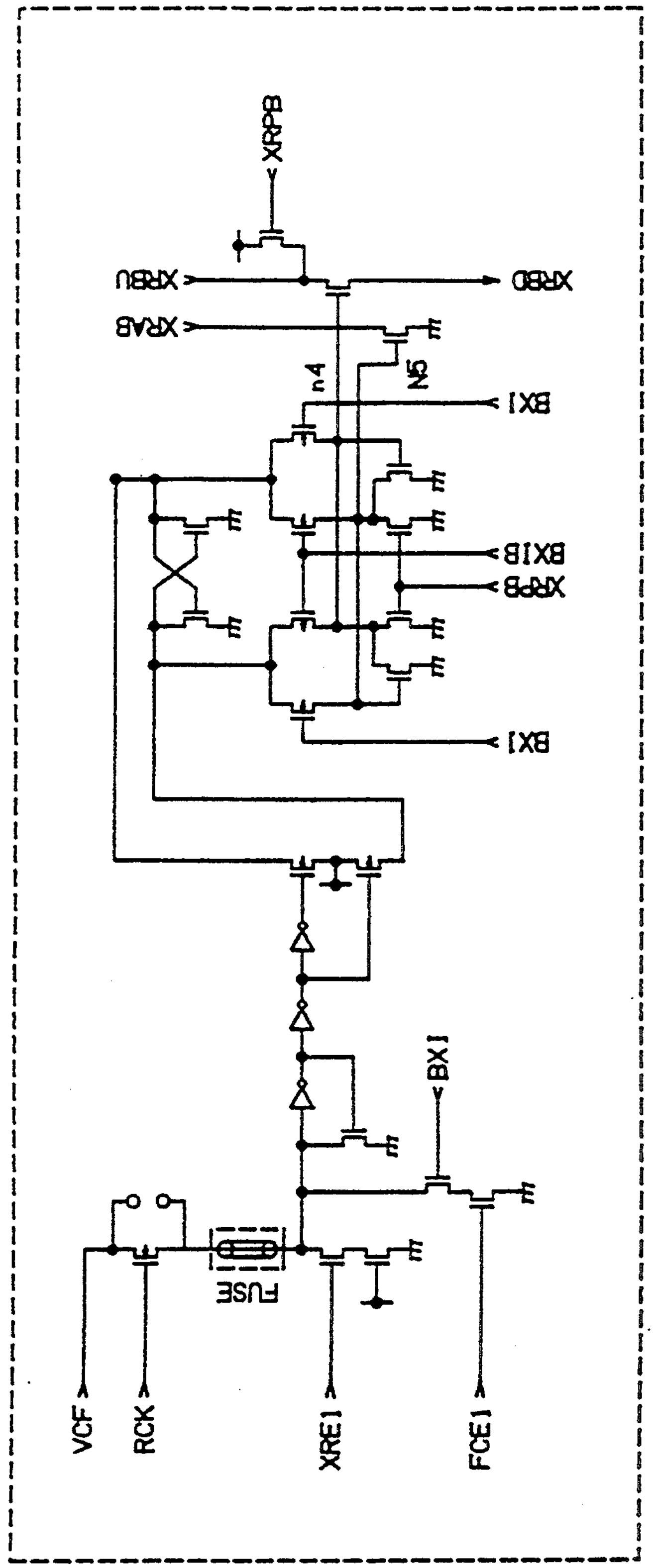
Figure 53C:
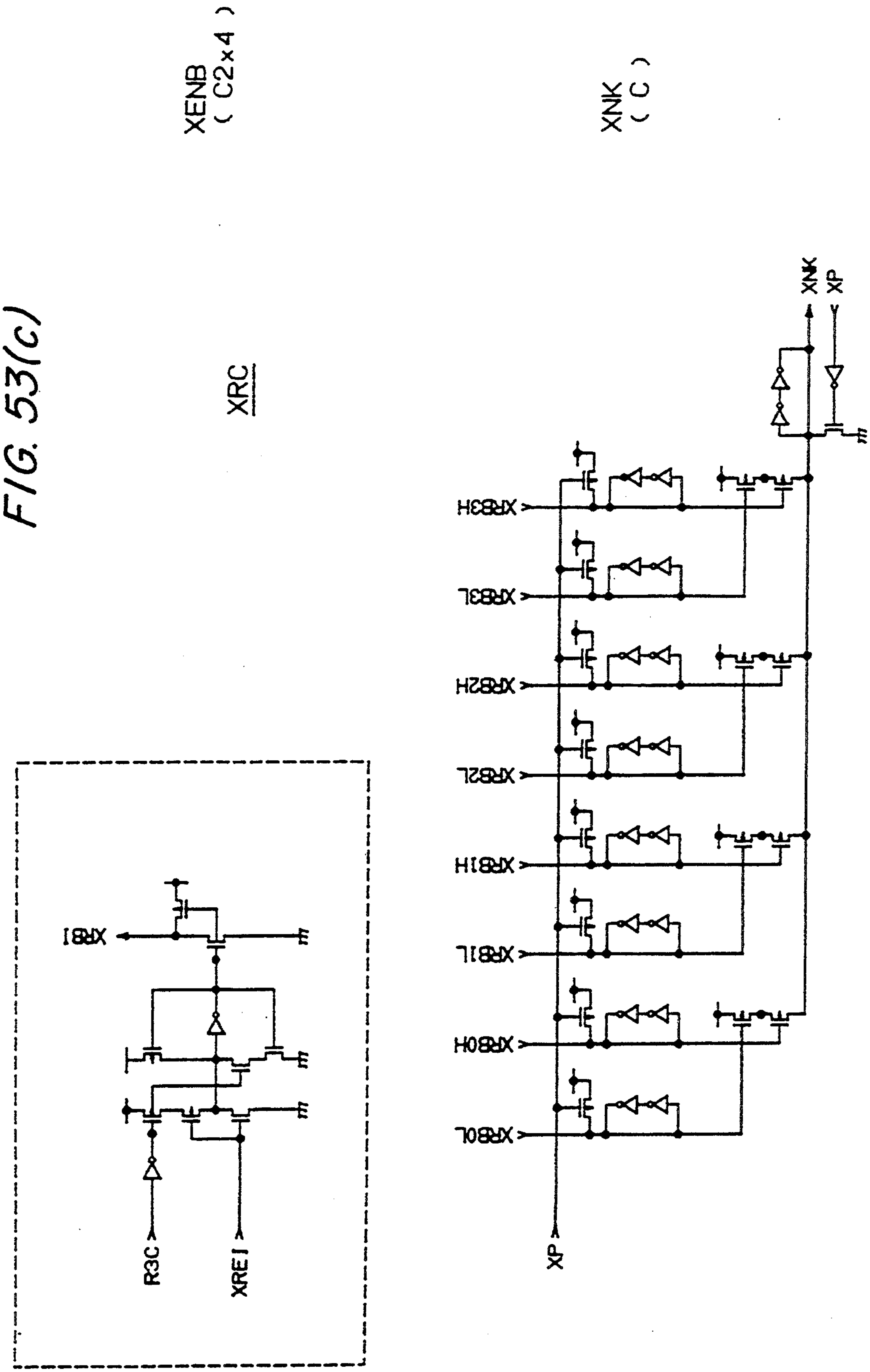
Figure 54:
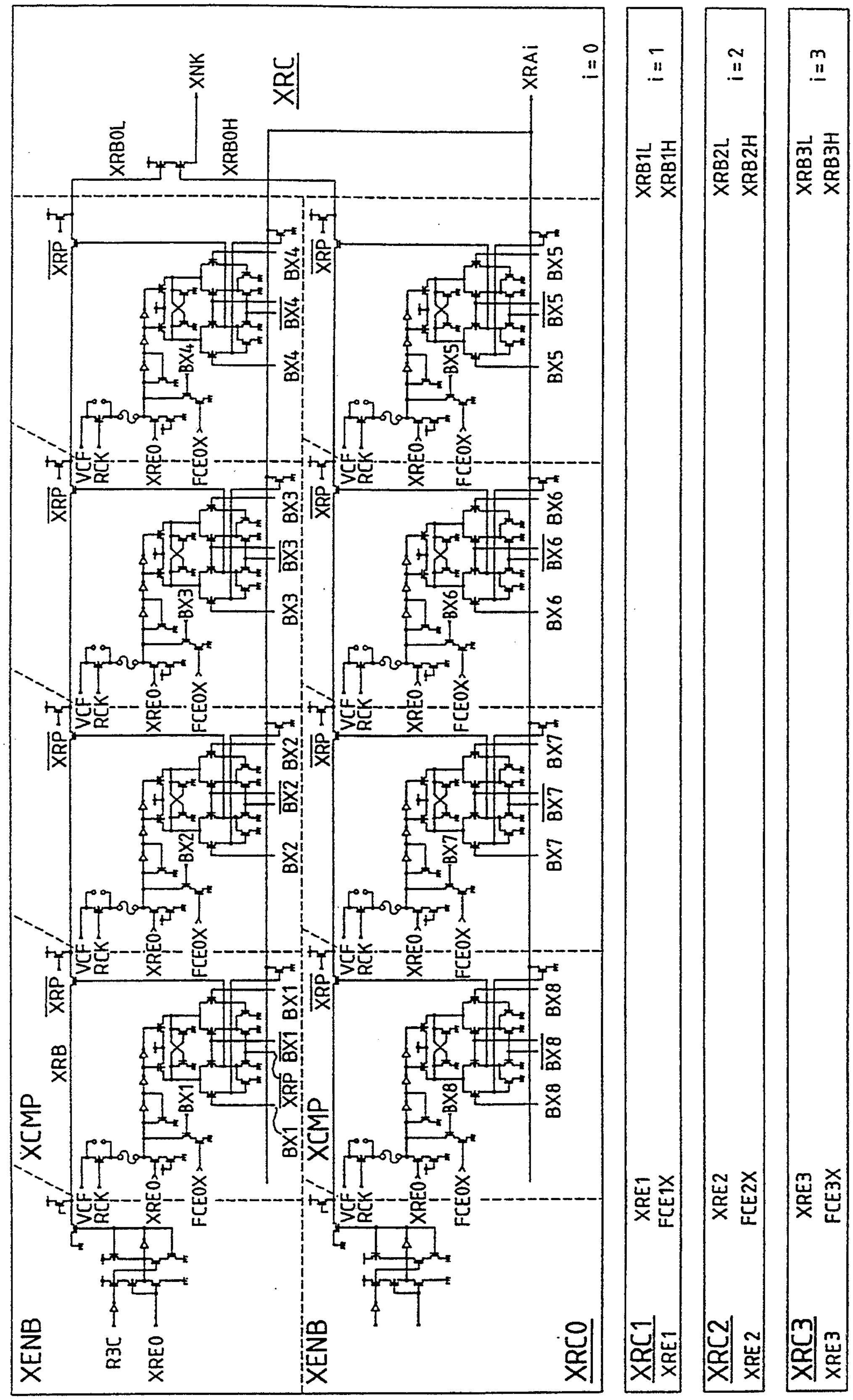

Of these, the redundant enable circuit XRE includes fuse means FUSE which is selectively cut when the corresponding redundant word line is switched to the defective word line detected to be troubled, namely, when the corresponding X-system redundant circuit is activated, as exemplified in FIG. 53. When those fuse means FUSE are cut, the output signals XREI of the individual redundant enable circuit XRE, i.e., the internal signals XRE0 to XRE3 are set to the high level so that the corresponding eight address comparators XCMP are substantially brought into the operative states.

The redundant enable circuit XRE is additionally given the function to precharge the incoincidence detection node XRAI of the address comparator XCMP, i.e., the internal nodes XRA0 to XRA3, together with the later-described fuse checking and the redundancy checking functions.

As shown in FIG. 53, on the other hand, the address comparator XCMP includes fuse means FUSE which is selectively cut when the corresponding bit of the defective address assigned to the corresponding X-system redundant circuit takes the logic "1". Further inclusive is a coincidence detection circuit and an incoincidence detection circuit for deciding the coincidence or incoincidence between the corresponding bit of the assigned defective address and the corresponding bit of the address to be fed when in the memory access, i.e., the complementary internal address signals $\bar{B}$X1 to $\bar{B}$X8. Each address comparator is selectively brought into the operative state when the aforementioned corresponding internal signals XRE0 to XRE3 are at the high level. At this time, an internal node n4 is set to the high level, when the corresponding addresses are coincident, so that output terminals XRB0 and XRBU are shorted through the corresponding N-channel MOSFET. In case the corresponding addresses are incoincident, on the other hand, an internal node n5 is set to the high level so that the output terminal XRAB and the ground potential of the circuit are shorted through the corresponding N-channel MOSFET.

The address comparator XCMP additionally has the later-described fuse checking function and the redundancy checking function.

Every four of the aforementioned output terminals XRB0 and XRBU of the address comparator XCMP constituting each X-system redundant circuit XRC are chain-coupled. Those output terminals are coupled at their one end to a corresponding terminal circuit XENB and at the other to the corresponding input terminal of the common terminal circuit XNK. As a result, in any of the X-system redundant circuits, the output signal of the terminal circuit XNK, i.e, the internal signal XNK is selectively set to the high level on condition that all the output terminals XRB0 and XRBU of the corresponding eight address comparators are shorted, namely, that the assigned defective addresses and the addresses to be fed when in the memory access are coincident for all bits.

Likewise, the aforementioned output terminals XRAB of the eight address comparators XCMP constituting each X-system redundant circuit XRC are commonly coupled to the aforementioned corresponding incoincidence detection nodes XRA0 to XRA3. The levels of those incoincidence detection nodes are inverted in the transmission circuit XRA of FIG. 47 and are fed as the corresponding aforementioned internal signals XRA0 to XRA3 to the individual X-address decoders so that their logical sum is taken in the aforementioned transmission circuit XR to form the aforementioned internal signal XRK. As a result, in all the X-system redundant circuits, the aforementioned internal signal XRK is selectively set to the high level on condition that the output terminal XRAB of any of the corresponding eight address comparators XCMP is coupled to the ground potential of the circuit, namely, that the assigned defective address and the address to be fed when in the memory access are incoincident for any bit.

Figure 76:
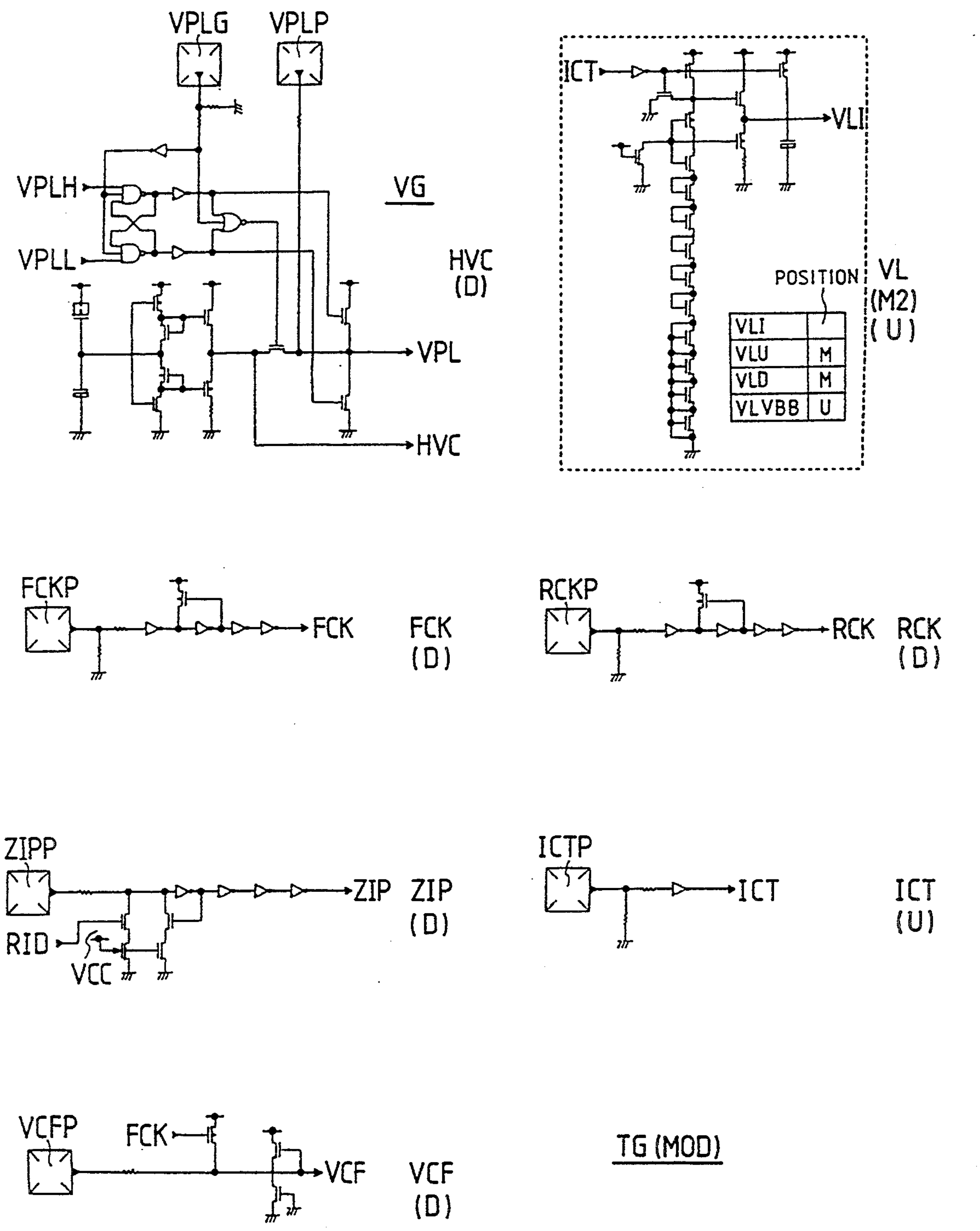

When the dynamic RAM is brought into the fuse check mode, the pad FCK is fed with the power supply voltage VCC, as shown in FIG. 76, so that the internal signal FCK is raised to the high level. Moreover, the predetermined fuse checking power supply voltage VCF is fed to the pad VCF and further to the redundant enable circuit and address comparator of each X-system redundant circuit. At this time, a selection signal for designating the X-system redundant circuits XRC0 to XRC3 selectively is fed as the address input signals X5 to X8 is fed and latched in a latch FCE, as shown in FIG. 74. The output signals of these latches are fed as the fuse check enable signals, i.e, the internal signals FCE0X to FCE3X to the corresponding redundant enable circuit XRE. After the selections signals have been fetched in the aforementioned latches FCE, the fuse selection signals for designating the fuses of the individual X-system redundant circuits, i.e., the redundant enable circuits or address comparators, selectively are fed as the address input signals X0 to X8.

In the redundant enable circuits XRE of the individual X-system redundant circuits, the current routes through the fuse means FUSE are formed when the corresponding aforementioned internal signals FCE0X to FCE3X are at the high level and when the corresponding uninverted internal address signal BX0 is at the high level. In the address comparators XCMP of the individual X-system redundant circuits, on the other hand, the current routes through the fuse means FUSE are formed when the corresponding aforementioned internal signals FCE0X to FCE3X are at the high level and when the corresponding uninverted internal address signals BX1 to BX8 are at the high level. As a result, the whole or partial disconnections of the fuse means FUSE of the redundant enable circuits or the address comparators can be selectively detected by measuring the current values fed from the fuse checking power supply voltage VCF to the individual X-system redundant circuits.

When the dynamic RAM is brought into the redundant check mode, on the other hand, the power supply voltage VCC of the circuit is fed to the pad RCK of FIG. 76 so that the internal signal RCK is set to the high level. At this time, the testing addresses given to the individual redundant word lines are fed as the X-address signals X1 to X8, i.e., the complementary internal address signals $\bar{B}$X1 to $\bar{B}$X8.

In each X-system redundant circuit, the P-channel MOSFET connected between the voltage supply point VCF of the redundant enable circuit XRE and the corresponding fuse means FUSE is brought at first into the OFF state (see FIG. 53). As a result, the output signals of the individual redundant enable circuits, i.e., the redundant enable signals XRE0 to XRE3 are raised to the high level no matter what disconnected state the fuse means FUSE might take, so that all the address comparators are brought altogether into the operative states. At this time, in each address comparator, the P-channel MOSFET connected between the aforementioned voltage supply point VCF and the corresponding fuse means FUSE is brought into the OFF state. Thus, the defective addresses to be assigned to each X-system redundant circuit are substantially fixed in accordance with the short-circuit route which is selectively formed in parallel with the aforementioned P-channel MOSFET. As a result, the corresponding XRA0 to XRA3 and the aforementioned internal signals XNK are set to the high level, on condition that those defective addresses and the aforementioned testing addresses are coincident in all bits, and the aforementioned internal signals XRK are selectively set to the high level on condition that the same are incoincident in any bit. Thus, prior to the redundancy relief, the redundant word lines WR0 to WR3 are selectively brought into the selected state so that the validity of the memory cells to be coupled to those redundancy word lines can be tested and confirmed in advance.

1.2.12. Refresh Counter

The refresh counter RFC is constructed of: one count pulse generator REF and ten unit circuits RC connected substantially in series (e.g. see FIG. 52). Of these, the count pulse generator REF forms the count pulses REF on the basis of the inverted timing signal RIB and the internal signal CBR which is selectively set to the high level in the CBR refresh cycle. Moreover, each unit circuit RC includes a master latch and a slave latch connected in series, to perform a predetermined counting operation in accordance with the aforementioned count pulse REF and the carry input signal CAI (wherein the carry input terminal of the unit circuit RC of the first bit is coupled to the power supply voltage VCC of the circuit), which is fed from the unit circuit RC of the upstream step, as shown in FIG. 82.

The complementary output terminals of the individual bits of the refresh counter RFC are selectively coupled to the ground potential of the circuit in synchronism with the aforementioned count pulse REF and through an open drain type output MOSFET. These complementary output terminals are commonly connected with the complementary input terminals of the corresponding terminal circuit BXL1 or BXL0 and are logically connected with the complementary output terminals of the corresponding unit circuit of the X-address buffer XAB. Thus, the X-address signal transmission delay time is shortened while reducing the area necessary for the layout of the X-system selection circuit.

1.2.13. Y-Address Buffer

Figure 56:
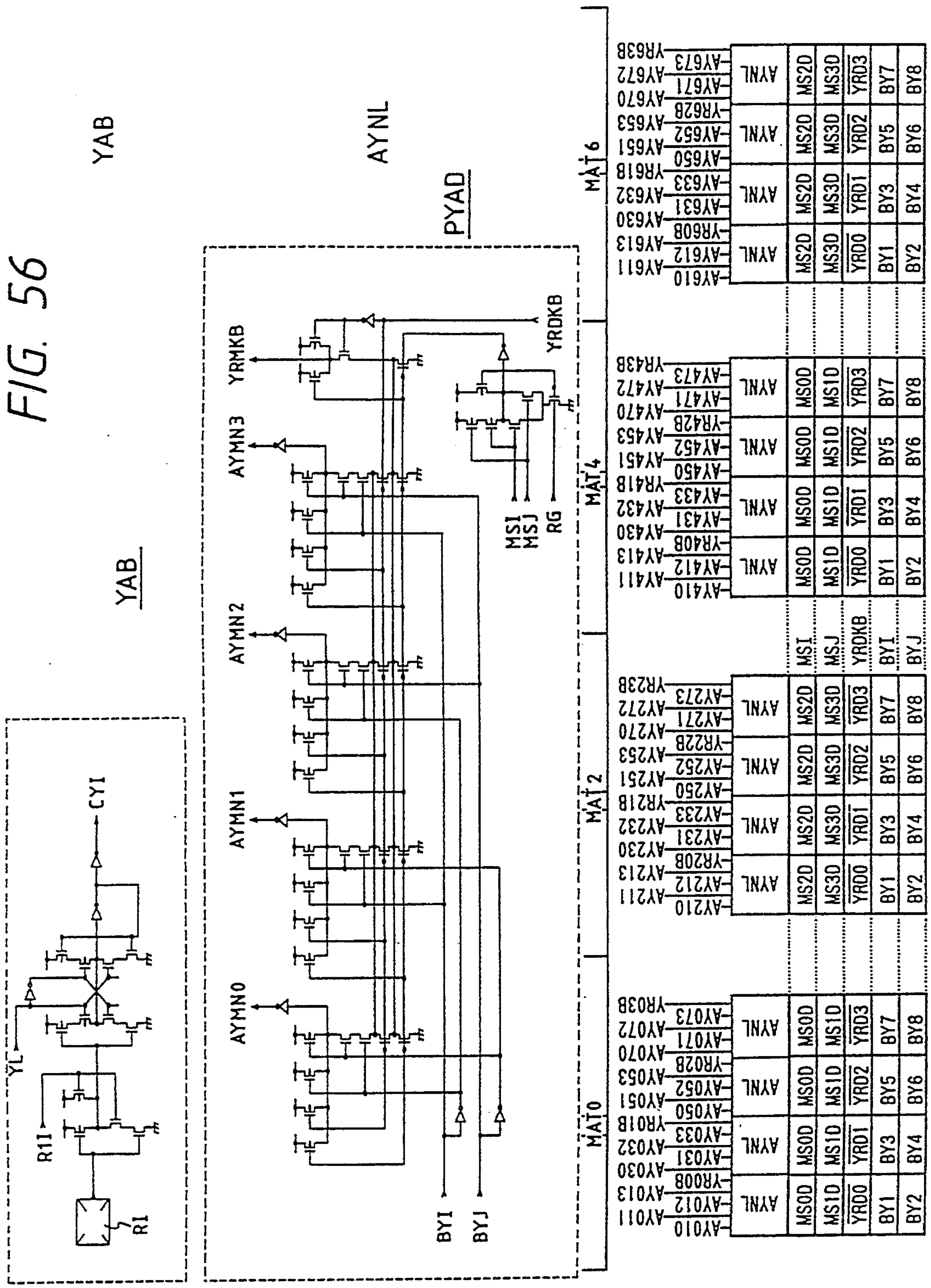
Figure 57:
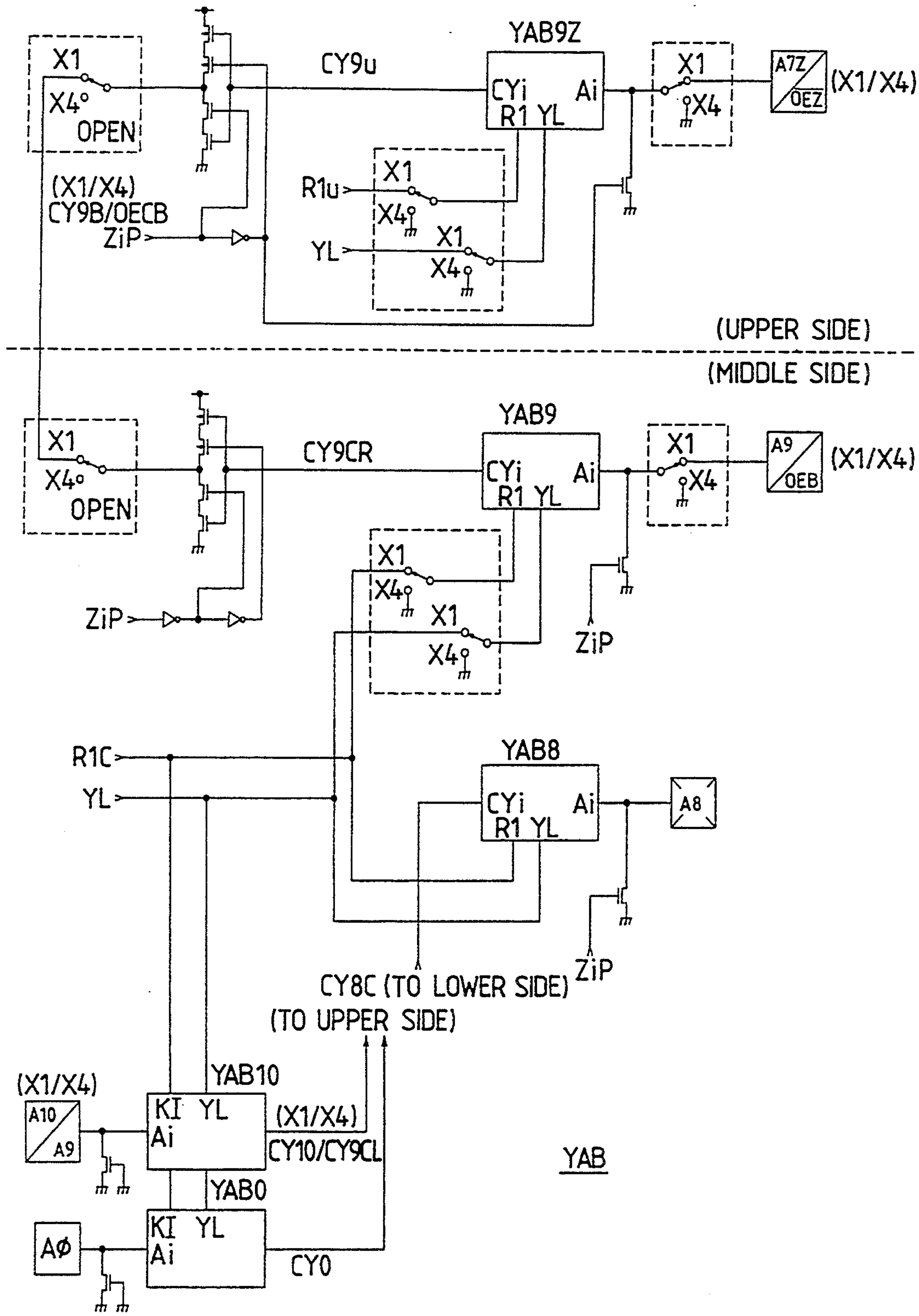
Figure 58:
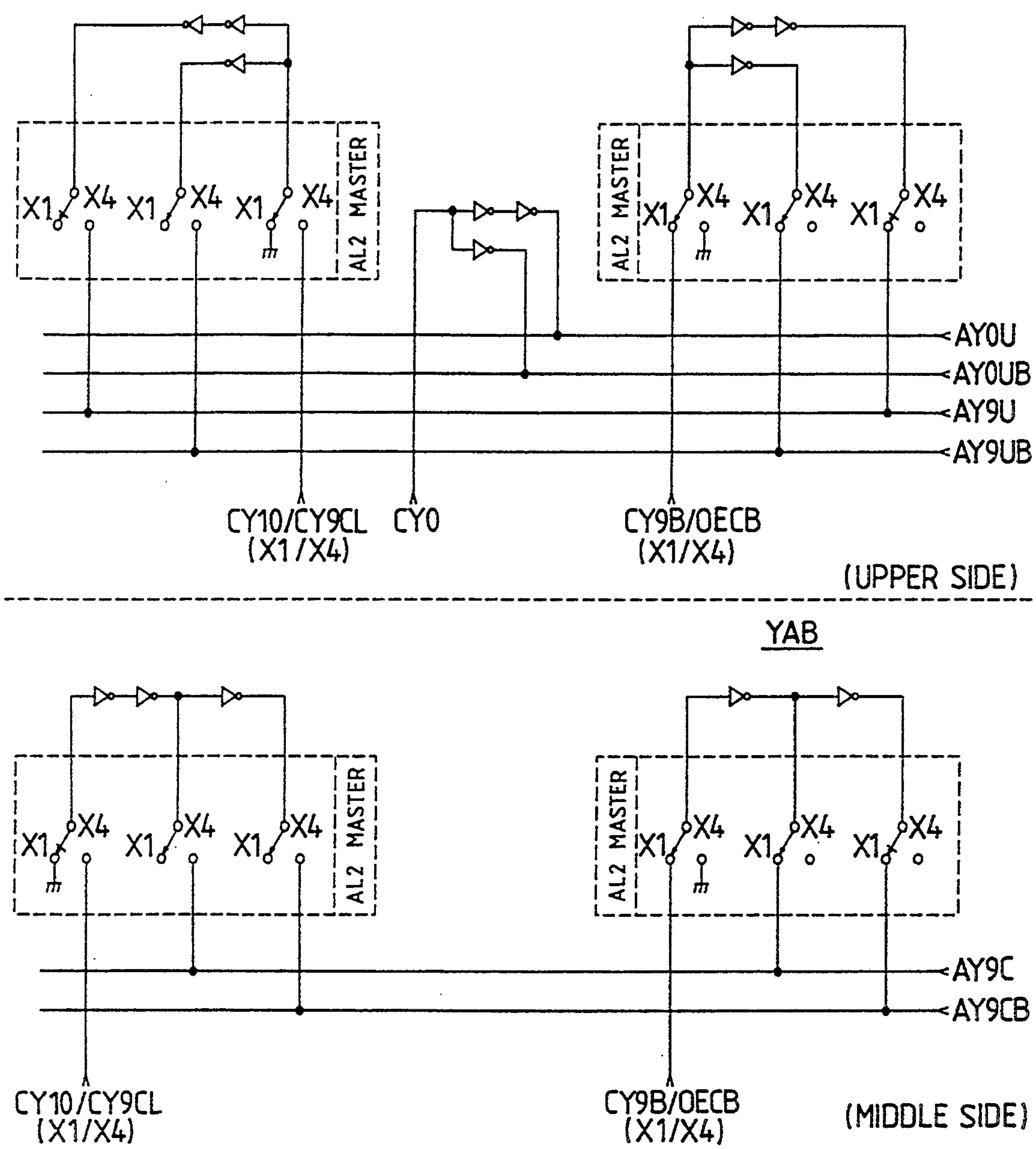

As shown in FIGS. 51 and 57, the Y-address buffer YAB is equipped with: eleven unit circuits YAB0 to YAB10 provided for the address input terminals A0 to A8, A9 (or the output enable signal input terminal OE) and A10 (or A9); and four unit circuits YAB6Z to YAB9Z provided for the address input terminals A6Z to A8Z and A9Z (or the output enable signal input terminal OEZ) and adapted to be selectively validated when the dynamic RAM is made to have the ZIP package shape. These unit circuits are made to have the structure, as shown in FIG. 56, and to fetch and latch the corresponding address signal in response to the timing signal YL.

The output signals of the unit circuits YAB0 to YAB5 are fed as the internal address signals CY0 to CY5 to the Y-system redundant circuits YRC0 to YRC3 and the address transition detection circuit ATD. Of these, the output signals of the unit circuits YAB1 to YAB5 are logically multiplied with the timing signal RG and are fed as the internal address signals BY1 to BY5 to the Y-predecoder PYAD. On the other hand, the output signals of the unit circuits YAB6 to YAB8 and YAB6Z to YAB8Z are fed as the internal address signals CY6 to CY8 and CY6Z to CY8Z to the aforementioned Y-system redundant circuits YRC0 to YRC3 and the address transition detection circuit ATD. Those output signals are logically multiplied with the aforementioned timing signal RG and are then fed as the internal address signals BY8 to BY8 to the Y-predecoder PYAD. Moreover, the output signals of the unit circuits YAB9 and YAB9Z are fed as internal address signals CY9CR and CY9U to the unit circuits of the address transition detection circuit ATD and are logically coupled through the corresponding clocked inverter circuit to form an internal address signal CY9B. This internal address signal CY9B, the output signal of the unit circuit YAB10, i.e., the internal address signal CY10 (or CY9CL) and the aforementioned internal address signal CY0 are fed through the connection switching point of FIG. 58 to form complementary internal address signals AY0U and AY9U or AY9C, which are fed to the common I/O line selection circuit IOS.

In this embodiment, as exemplified in FIG. 57, the internal address signal line CY9B arranged over the semiconductor substrate surface between the upper-side peripheral circuit and the middle-side peripheral circuit is utilized, when the dynamic RAM has the x 4 bit structure, as the signal line OECB for transmitting the internal signal OECB which is formed on the basis of the output enable signal $\overline{OE}$ by the master slice. As a result, the number of the signal lines to be arranged a relatively long range over a relatively narrow wiring region is reduced to make the layout efficient.

1.2.14. Y-Predecoder

The Y-predecoder PYAD is equipped, as shown in FIG. 56, with every four for the vertically paired two memory mats, namely, totally sixteen unit circuits AYNL, i.e., AY01, AY03, AY05 and AY07 to AY61, AY63, AY65 and AY67. Of these, the four unit circuits AY01 to AY61 are fed with the corresponding 2-bit internal address signals BY1 and BY2 and the inverted internal signal $\overline{YRD0}$, and the unit circuits AY03 to AY63 are fed with the internal address signals BY3 and BY4 and the inverted internal signal $\overline{YRD1}$. Likewise, the four unit circuits AY05 to AY65 are fed with the internal address signals BY5 and BY6 and the inverted internal signal $\overline{YRD2}$, and the unit circuits AY07 and AY67 are fed with the internal address signals BY7 and BY8 and the inverted internal signal $\overline{YRD3}$.

Here, the inverted internal signals $\overline{YRD0}$ to $\overline{YRD3}$ are formed by the later-described Y-system redundant circuits YRC0 to YRC3 and are selectively set to the low level when the defective addresses assigned to the corresponding redundant complementary data lines and the addresses to be fed when in the memory access are incoincident.

The individual unit circuits of the Y-predecoder PYAD are made to have the circuit structure, as exemplified in FIG. 56, and are selectively brought into the operative states in accordance with the mat selection signals MSI and MSJ, i.e, MS0 to MS3. In these operative states, the individual unit circuits combine and decode the corresponding aforementioned 2-bit internal address signals and raise the predecode signals AY010 to AY013, AY030 to AY033, AY050 to AY053 and AY070 to AY073 through AY610 to AY613, AY630 to AY633, AY650 to AY653 and AY670 to AY673 selectively to the high level on condition that the corresponding inverted internal address signals $\overline{YRD0}$ to $\overline{YRD3}$ are at the high level. When, moreover, the corresponding inverted internal signals $\overline{YRD0}$ to $\overline{YRD3}$ are at the low level, those unit circuits do not form the corresponding aforementioned predecode signals but set the corresponding inverted internal signals YRMKB, i.e., YR00B to YR03B to YR60B to YR63B selectively to the low level. These predecode signals or the inverted internal signals are fed to the corresponding Y-address decoders YAD0 and YAD1 to YAD6 and YAD7.

1.2.15. Y-System Redundant Circuit

The dynamic RAM of this embodiment is equipped with the four sets of redundant complementary data line groups, as has been described hereinbefore, and accordingly with the four Y-system redundant circuits YRC0 to YRC3 which are provided for the redundant data line groups. Each of these Y-system redundant circuits includes: one redundant enable circuit YRE; and eight address comparators YCMP provided for the internal address signals CY1 to CX8.

Figure 59A:
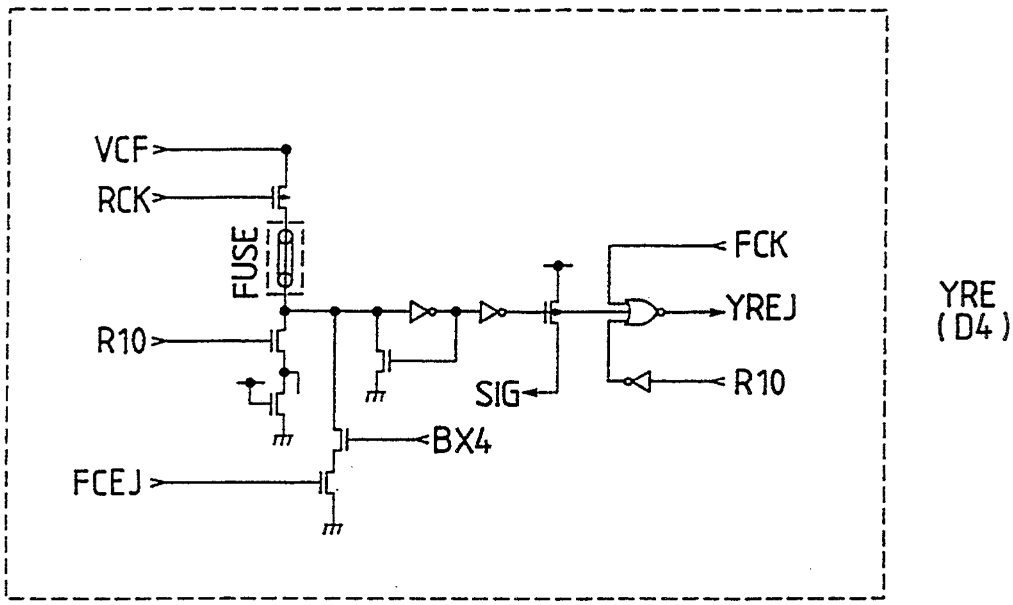
Figure 59B:
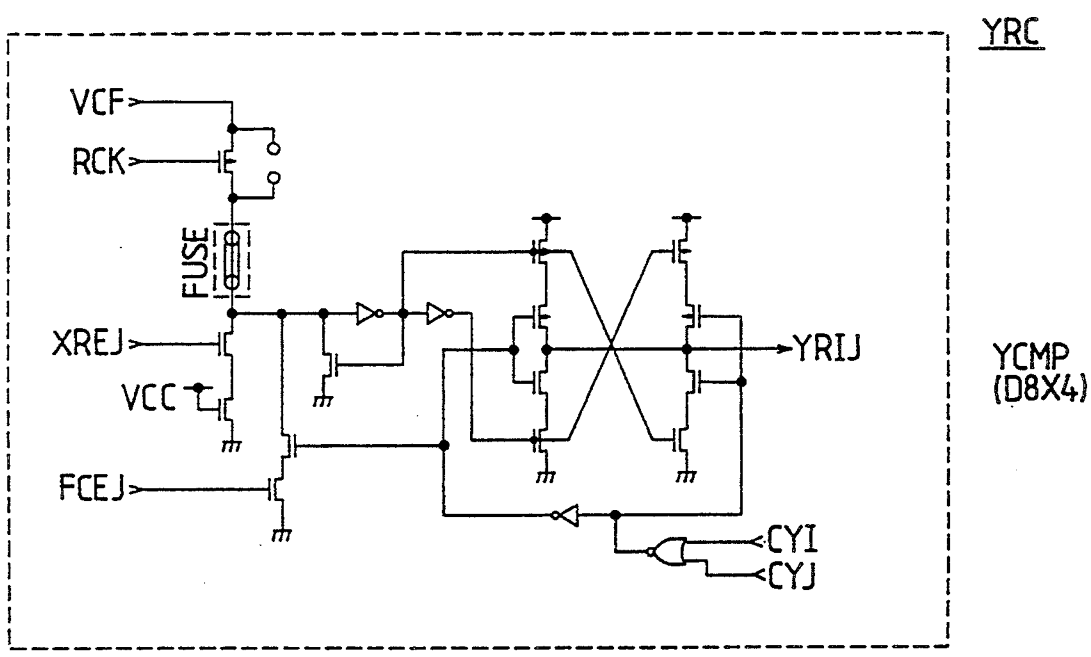

Of these, the redundant enable circuit YRE includes fuse means FUSE which is selectively cut when the corresponding redundant complementary data line groups are switched to the defective complementary data line groups detected to be troubled, namely, when the corresponding Y-system redundant circuit is validated, as exemplified in FIG. 59. When those fuse means FUSE are cut, the output signals YREJ of the individual redundant enable circuit YRE, i.e., the internal signals YRE0 to YRE3 are set to the high level so that the corresponding eight-address comparators YCMP are substantially brought into the operative states.

As shown in FIG. 59, on the other hand, the address comparator YCMP includes fuse means FUSE which is selectively cut when the corresponding bit of the defective address assigned to the corresponding Y-system redundant circuit takes the logic "1". Further inclusive is a coincidence detection circuit and a comparator for comparing and collating the corresponding bit of the assigned defective address and the corresponding bit of the address to be fed when in the memory access, i.e., the internal address signals CY1 to CY8 (i.e., the logical sum signals with the internal address signals CY6Z to CY8Z to be selectively validated when in the dynamic RAM is in the ZIP package shape, in the case of the address comparators YCMP6 to YCMP8). Each address comparator YCMP is selectively brought into the operative state when the aforementioned corresponding internal signals YRE0 to YRE3 are at the high level. In these operative states, the individual address comparators have their output signals YRIJ set selectively to the low level on condition that the corresponding addresses are incoincident.

Figure 60:
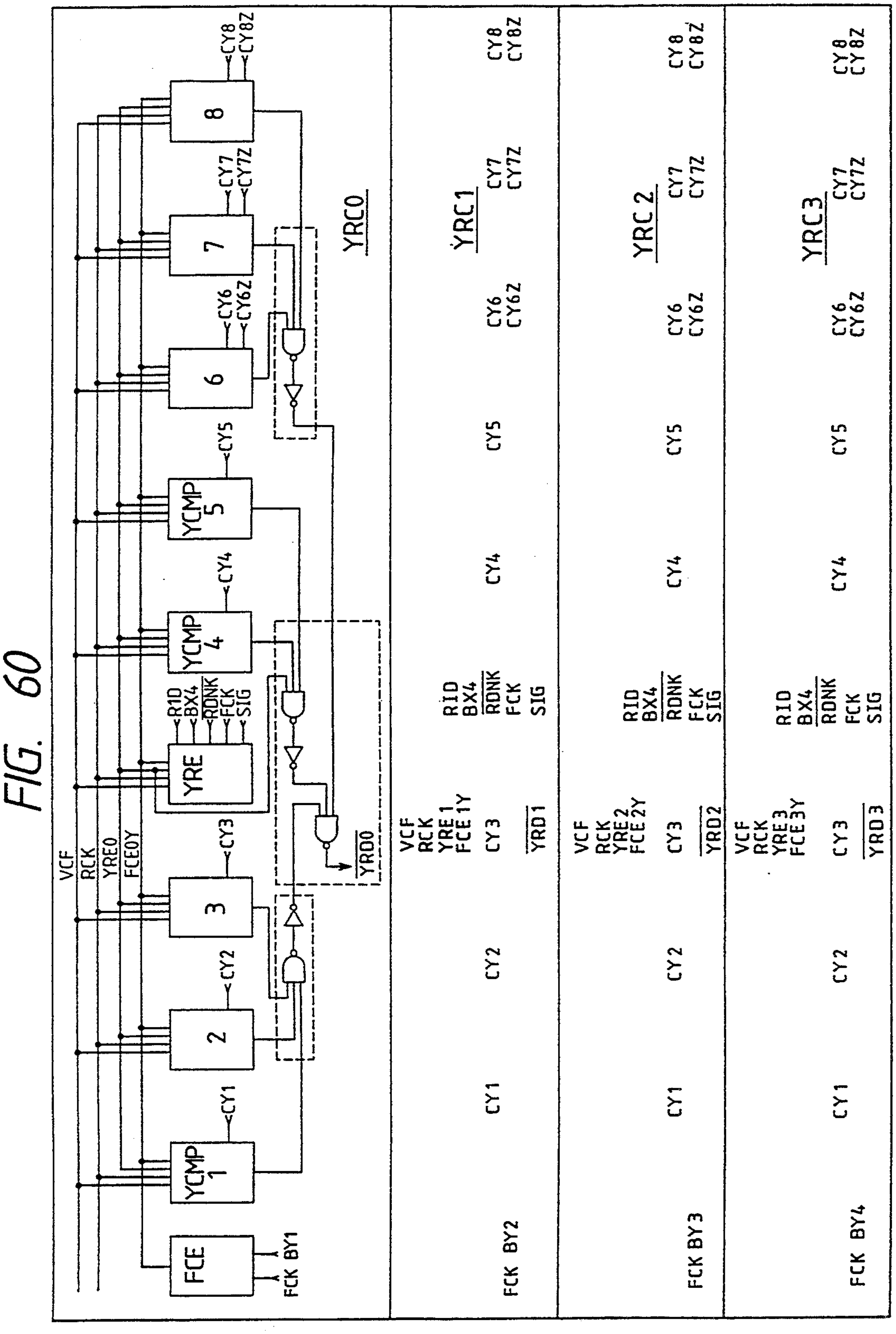

The output signals YRIJ of the eight address comparators YCMP constituting the individual Y-system redundant circuits YRC are negatively logically summed, as exemplified in FIG. 60, to form the aforementioned inverted internal signals $\overline{\text{YRD0}}$ to $\overline{\text{YRD3}}$. As a result, these inverted internal signals $\overline{\text{YRD0}}$ to $\overline{\text{YRD3}}$ are selectively set to the low level when the defective addresses assigned to the corresponding Y-system redundant circuit and the addresses to be fed when in the memory access are incoincident.

The Y-system redundant circuits YRC0 to YRC3 are given both the fuse checking function and the redundancy checking function like the aforementioned X-system redundant circuits XRC0 to XRC3. When the dynamic RAM is in the fuse check mode, the selection signals for designating the Y-system redundant circuits YRC0 to YRC3 selectively are fed as the Y-address signals Y2 to Y5 to the latch FCE, as shown in FIG. 74. Moreover, the fuse selection signals for designating the fuses of the individual Y-system redundant circuits, i.e., the redundant enable circuit or the address comparator are fed as the X-address signal X4 or the Y-address signals Y1 to Y8 to the redundant enable circuit YRE or the eight address comparator YCMP, as shown in FIG. 59.

1.2.16. Address Transition Detection Circuit

The address transition detection circuit. ATD includes: ten unit circuits ATD provided for the Y-address signals Y0 to Y9; and the common I/O line precharge control circuit IOP shared among those unit circuits; and the Y-system activation circuit YACT.

Of these, the common I/O line precharge control circuit IOP and the Y-system activation circuit YACT are arranged generally at the central portion of the semiconductor substrate surface, as shown in FIG. 17. On the other hand, the unit circuits ATD are dispersedly arranged in the vicinity of the corresponding address input pads, and their closely arranged output terminals are logically coupled to constitute unit circuit groups ATD0 to ATD4. Specifically, the unit circuit group ATD0 includes three unit circuits ATD corresponding to the pads A1 to A3 arranged at the lefthand lower side portion of the semiconductor substrate surface, as shown in FIG. 19, and the unit circuit group ATD1 includes seven unit circuits ATD corresponding to the pads A4 to A7 and A6Z to A8Z arranged at the righthand lower side portion, as shown in FIG. 20. Likewise, the unit circuit group ATD2 includes two unit circuits ATD corresponding to the pads A0 and A10 (or A9) arranged at the lefthand middle side portion of the semiconductor substrate surface, as shown in FIG. 17, and the unit circuit-group ATD3 includes two unit circuits ATD corresponding to the pads A8 and A9 (or e,ovs/OE/ ) arranged at the righthand middle side portion, as shown in FIG. 18. Moreover, the unit circuit group ATD4 includes one unit circuit ATD corresponding to the pad A9Z (or $\overline{\text{OEZ}}$) arranged at the righthand upper side portion of the semiconductor substrate surface, as shown in FIG. 15.

Figure 61:
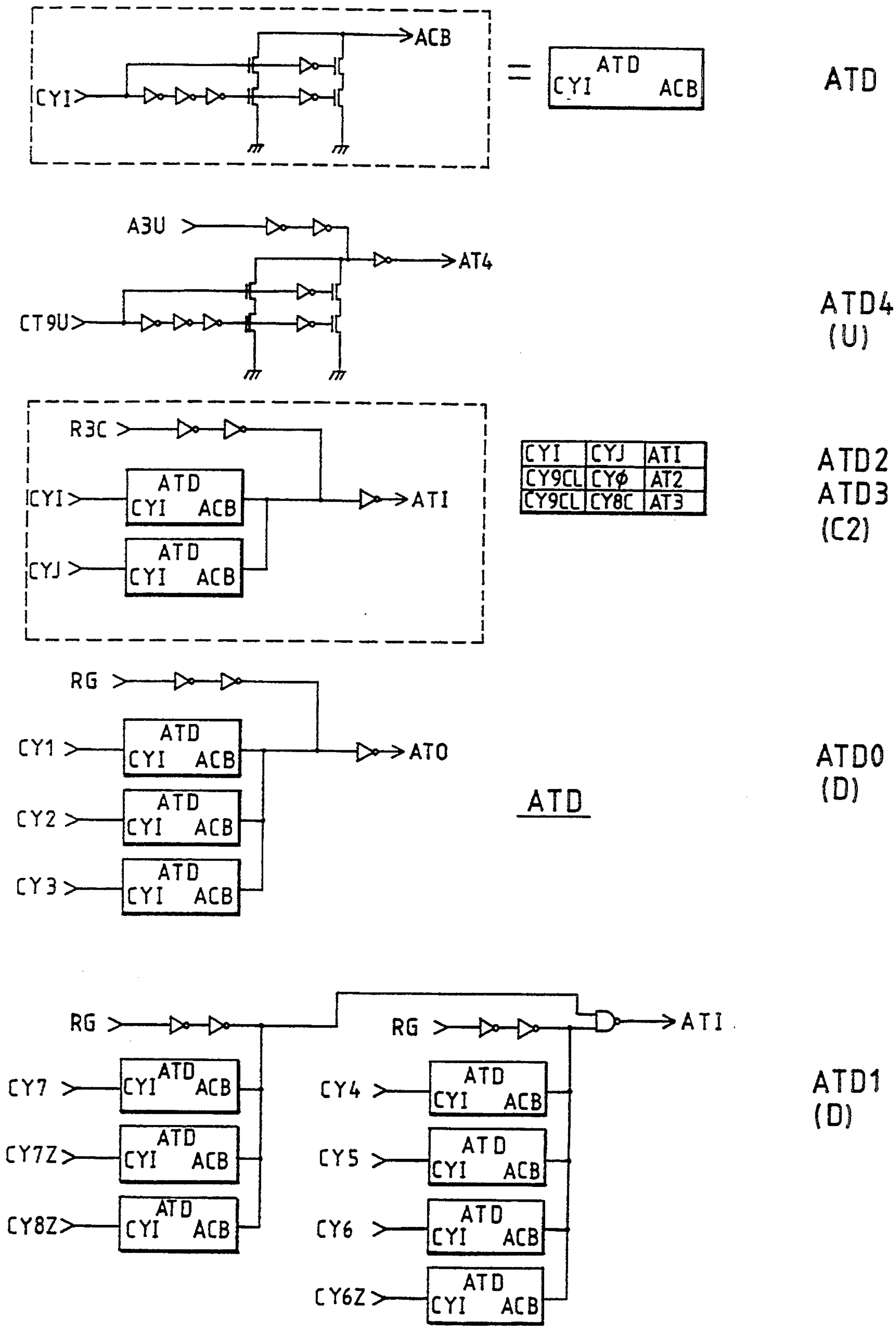

As shown in FIG. 61, those unit circuits include two sets of series N-channel MOSFETs which are connected in parallel between the output terminal ACB and the ground potential of the circuit for receiving the corresponding internal address signal $\overline{\text{CYI}}$ and its inverted delay signal or inverted internal address signal CYI and its inverted delay signal, respectively. These MOSFETs are temporarily and simultaneously brought into the ON states, when the corresponding internal address signal CYI is changed from the low to high levels or vice versa, to short the corresponding aforementioned output terminal ACB and the ground potential of the circuit for a while. As a result, the output signals AT0 to AT4 of the unit circuit groups ATD0 to ATD4 are fixed at the high level when the dynamic RAM is brought into the unselected state so that the timing signal RG or R3 is set to the low level. When the dynamic RAM is brought into the selected state so that the aforementioned timing signal RG or R3 is set to the high level, on the other hand, those output signals are all once set to the low level and are then temporarily set to the high level on condition that the output terminal ACB of any of the corresponding one or more unit circuits ATD is coupled to the ground potential of the circuit, namely, that any of the corresponding internal address signals is transited from the low to high levels or vice versa.

The output signals AT0 to AT4 of the unit circuit groups ATD0 to ATD4 are gathered to the common I/O line precharge control circuit IOP (see FIG. 62) which is arranged generally at the central portion of the semiconductor substrate surface. As a result, the inverted internal signal IOP0B for precharging the common I/O line is selectively set to the low level, as has been described hereinbefore, when any of the aforementioned output signals AT0 to AT4 is at the high level.

1.2.17. Common I/O Line Selection Circuit

Figure 68A:
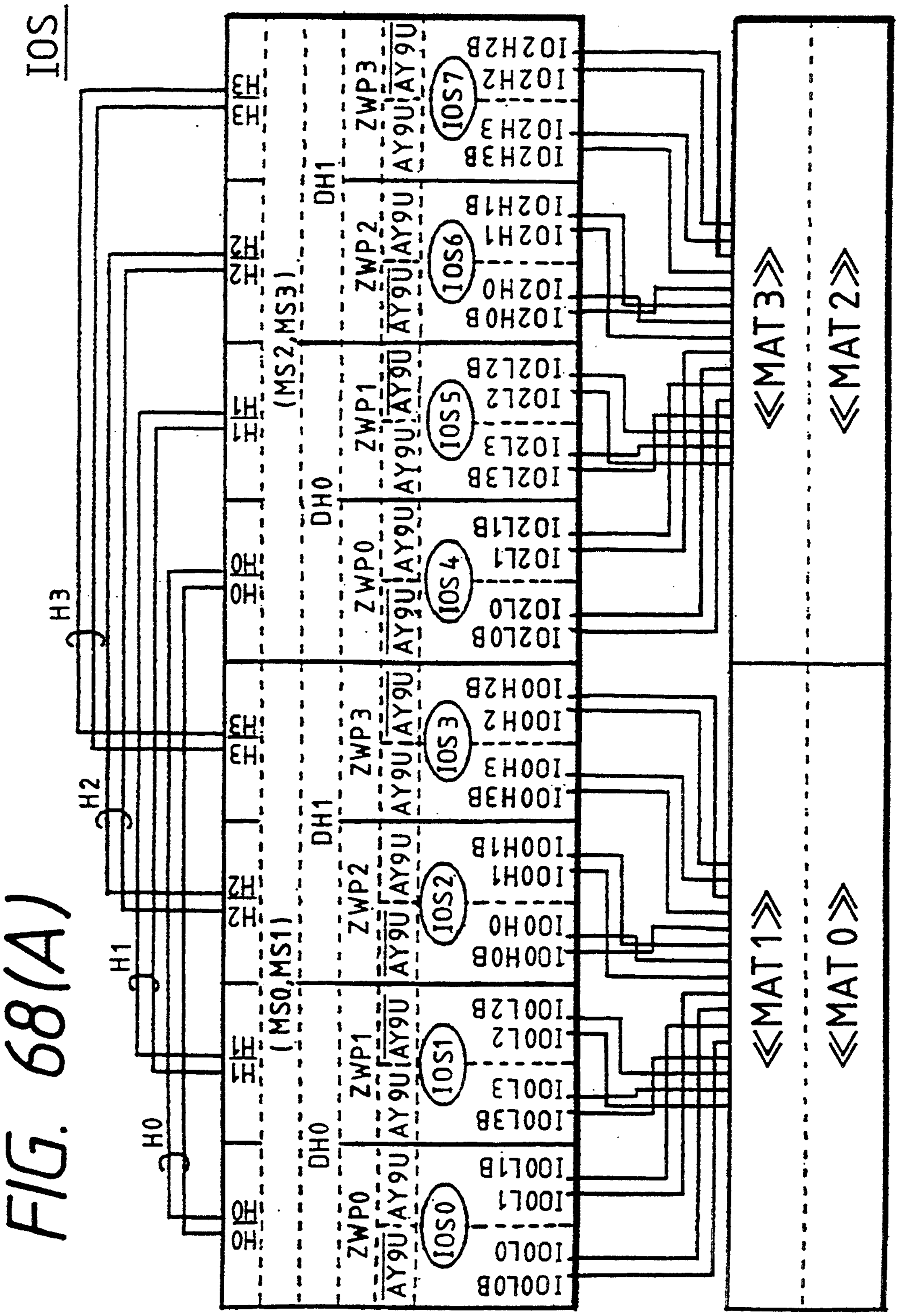
Figure 68B:
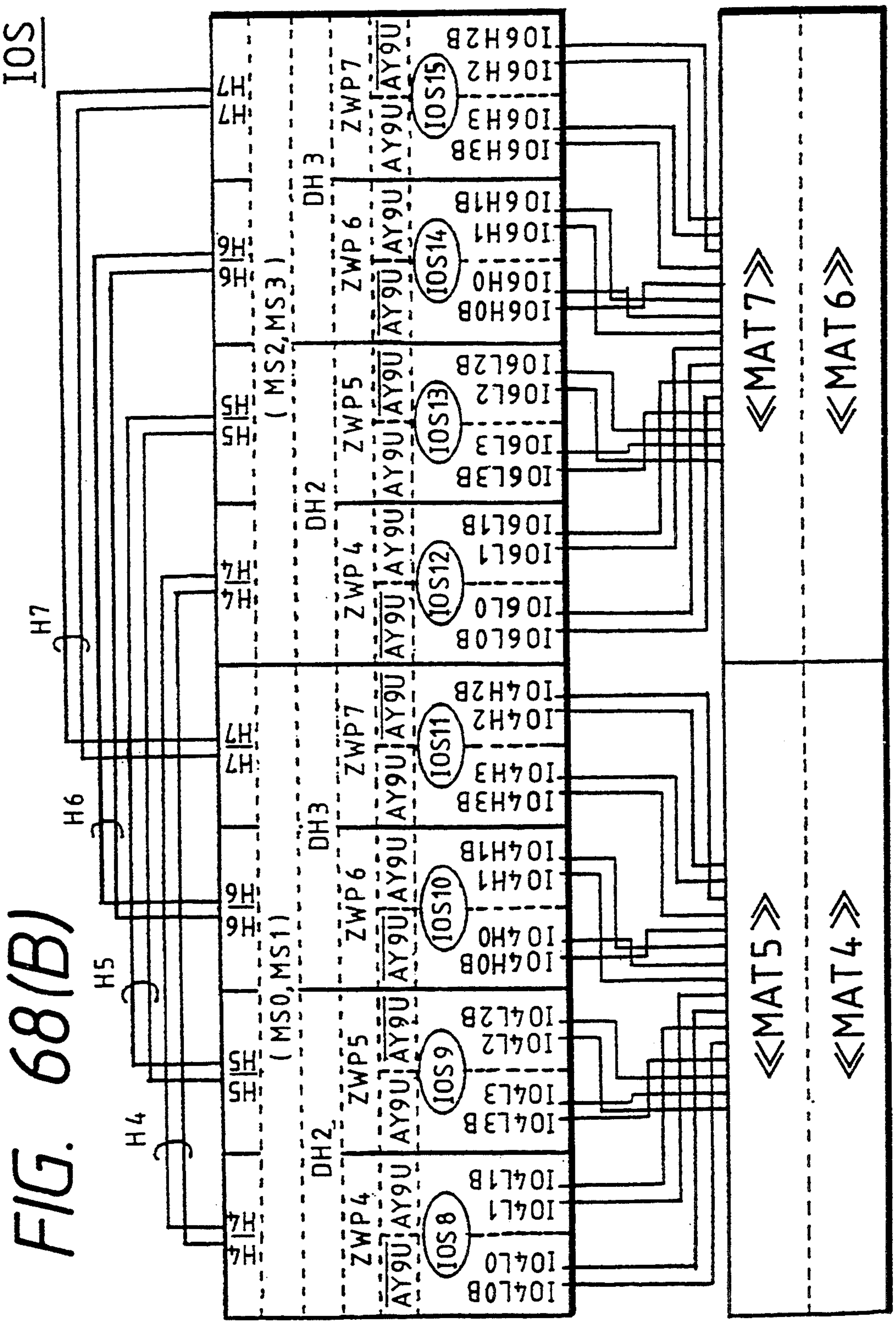

The total of thirty two sets of IO0L0 to IO0L3 and IO0H0 to IO0H3 to IO6L0 to IO6L3 and IO6H0 to IO6H3, with which every two from the total of four memory arrays of the two memory mats to be simultaneously brought into the selected states, i.e., totally eight sets of complementary data lines, are selectively connected, are coupled to every two sets of corresponding common I/O selection circuits IOS0 to IOS15, as shown in FIG. 68, and are selectively connected with the corresponding eight main amplifiers MA0 to MA7 through those common I/O line selection circuits, as shown in FIG. 83.

Figure 67A:
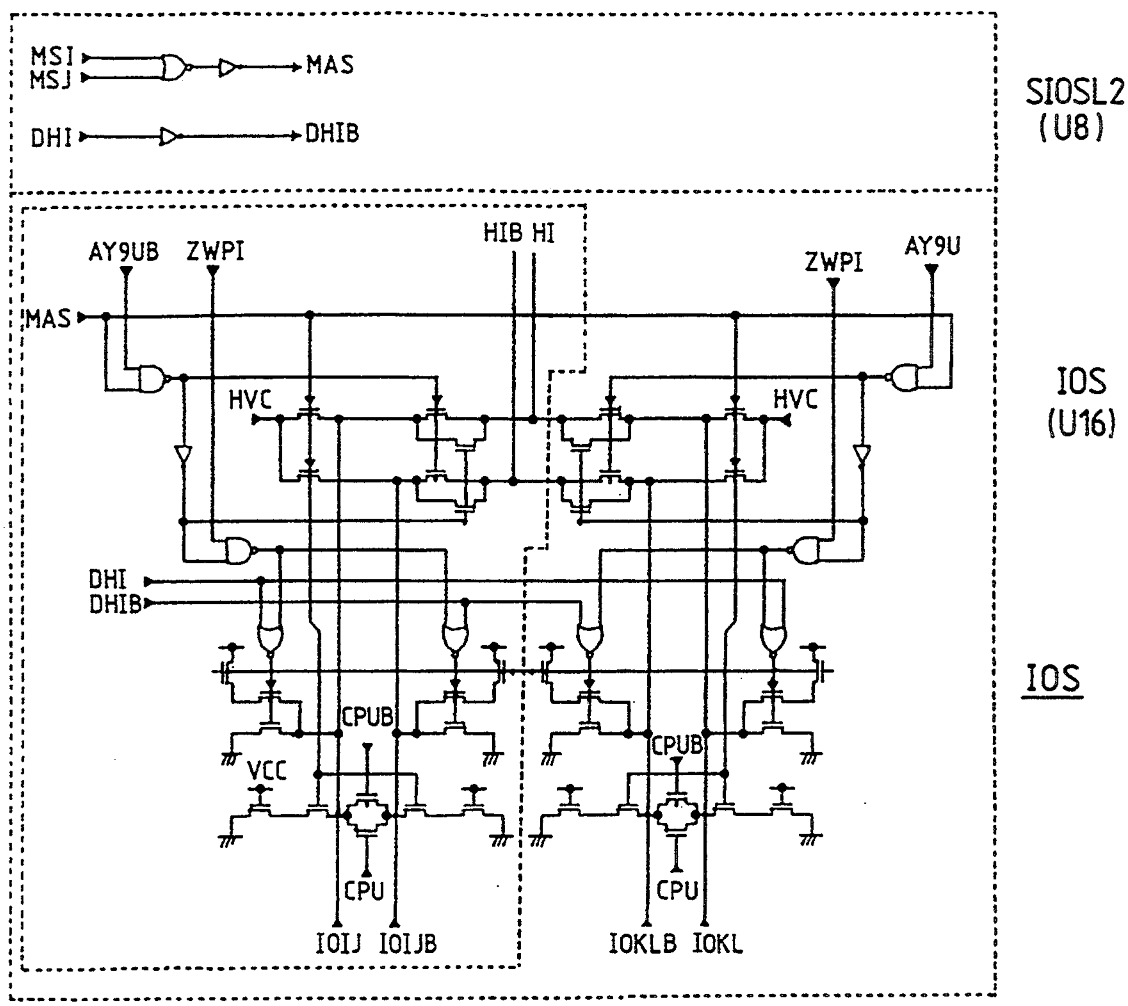

In accordance with the mat selection signals MSI and MSJ, i.e., MS0 to MS3 and the complementary internal address signal AY9U, as exemplified in FIG. 67, each common I/O line selection circuit selects one of the corresponding two sets of common I/O lines and connects them with the corresponding main amplifiers MA0 to MA7. Specifically, the common I/O line selection circuit selects the common I/O lines at the lefthand side, as shown, and connects it with complementary signal lines HI, i.e., H0 to H7, when the corresponding mat selection signals MS0 to MS3 are at the high level and when the inverted internal address signal AY9UB is at the high level. When the corresponding mat selection signal MS0 to MS3 are at the high level and when the uninverted internal address signal AY9U is at the high level, on the other hand, the common I/O line selection circuit selects the common I/O line at the righthand side, as shown, and connects it with the corresponding aforementioned complementary signal lines H0 to H7.

When fed with internal signals ZWP1, i.e., ZWP0 to ZWP7 from the corresponding main amplifiers MA0 to MA7, on the other hand, the common I/O line selection circuit forms write signals in accordance with the complementary internal input data DHI, i.e., DH0 to DH3 and transmits them to any of the corresponding two sets of common I/O lines. At this time, the high level of those write signals is dropped from the power supply voltage VCC of the circuit by the threshold voltage of the N-channel MOSFETs so that its low level is substantially equalized to the ground potential of the circuit.

The common I/O line selection circuit is additionally given a function to equalize the corresponding two Sets of common I/O lines when the corresponding aforementioned mat selection signals MS0 to MS3 are at the low level or when the a precharging complementary internal signal CPU is at the logic "1".

1.2.18. Main Amplifier

The dynamic RAM of this embodiment is equipped with the eight main amplifiers MA0 to MA7, as has been described hereinbefore, and a main amplifier drive circuit MAD for transmitting a variety of drive signals to those main amplifiers.

Figure 69A:
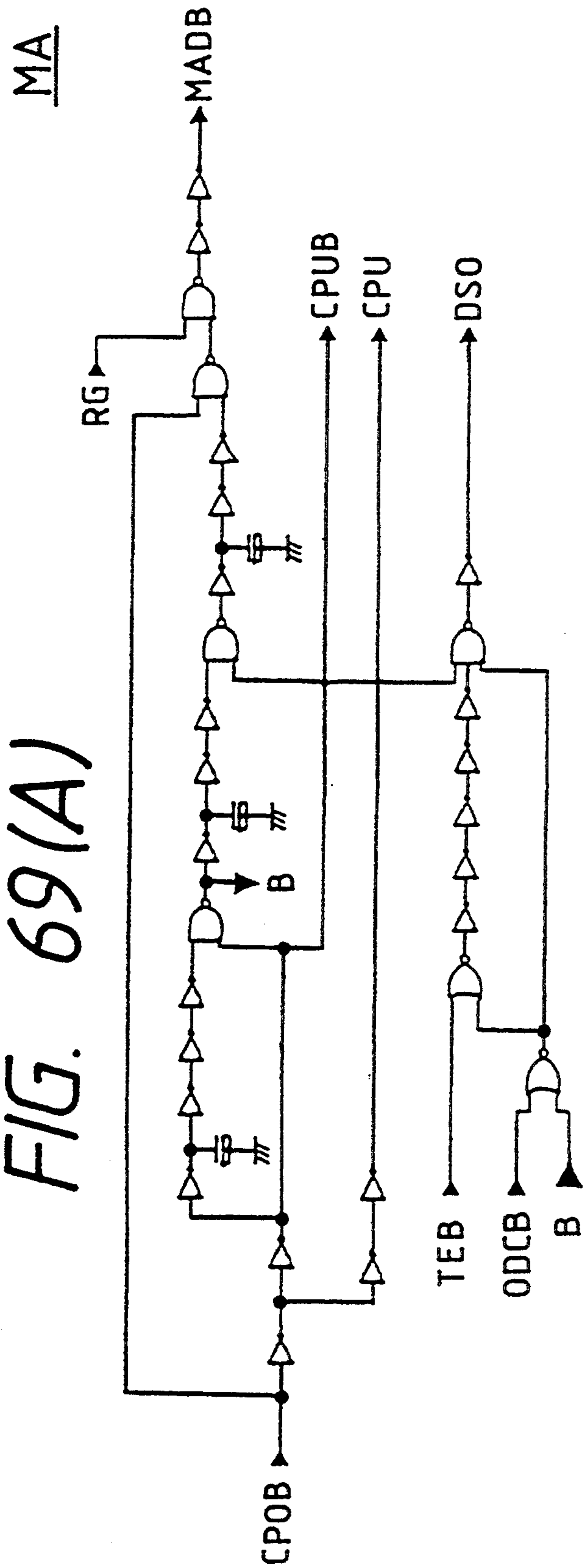
Figure 69B:
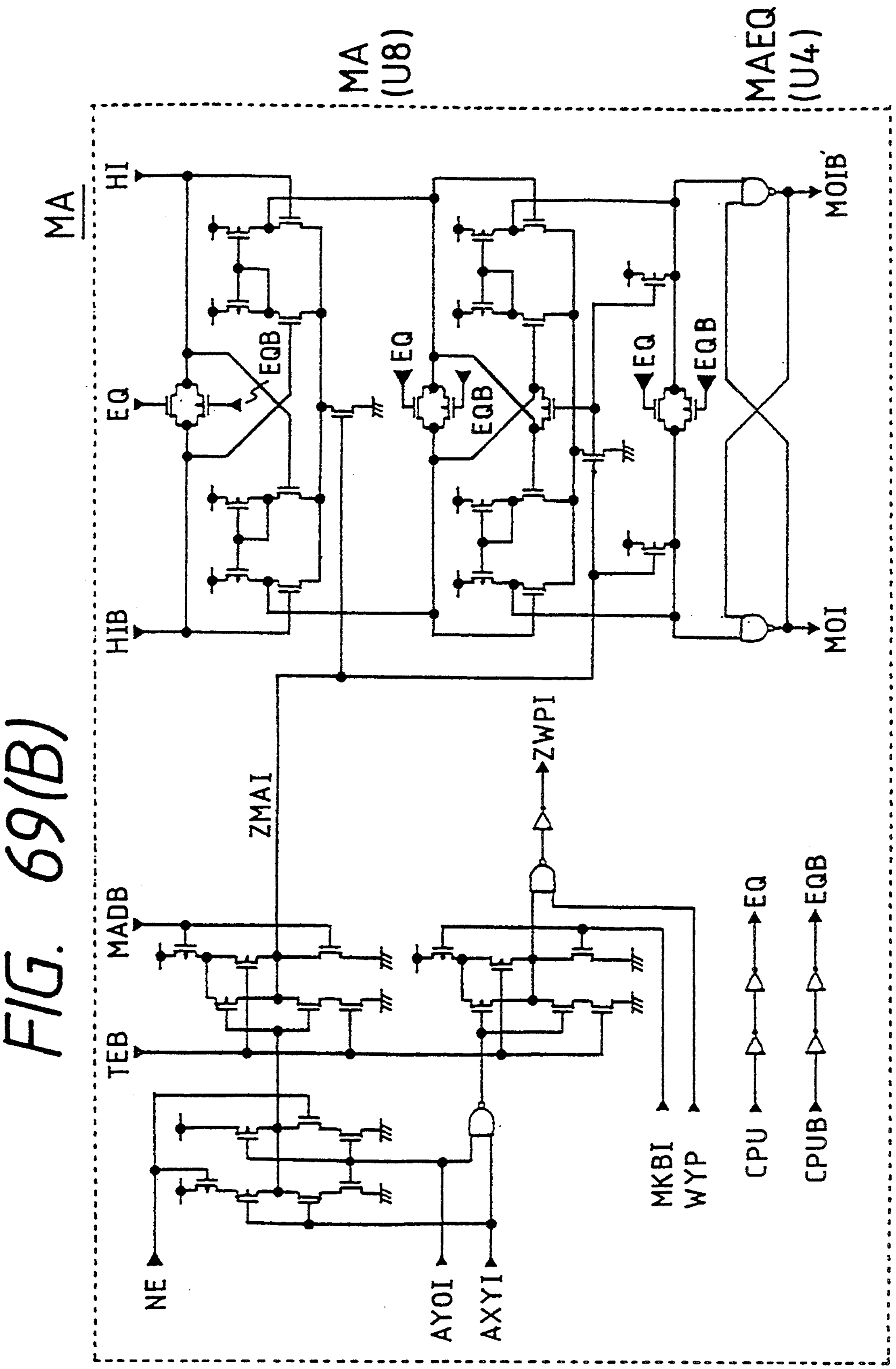

As exemplified in FIG. 69, the main amplifiers MA0 to MA7 are basically constructed of two pairs of static amplifiers which are provided for the aforementioned complementary signal lines H0 to H7 and connected in series. Those main amplifiers are selectively brought into the operative states in accordance with the selection signals AXYI, i.e., AXY0 to AXY3 to be fed from the later-described nibble counter NBC and the complementary internal address signal AY0 of the least significant bit, when they are fed with an inverted drive signal MADB at the low level from the aforementioned main amplifier drive circuit MAD. Here, the inverted drive signal MADB is temporarily triggered to the low level by the change of the precharging inverted internal signal CP0B to the low level, as shown in FIG. 69, when the timing signal RG is at the high level. Moreover, the selection signals AXY0 to AXY3 are all fixed at the high level, when the dynamic RAM has the x 4 bit structure, and are selectively set to the high level in accordance with the output signal of the nibble counter NBC when the dynamic RAN has the x 1 bit structure.

If, at this time, the dynamic RAM is in the nibble mode, the output signals of the nibble counter NBC are at first selectively set to the high level in accordance with the X-address signal X10 and the Y-address signal Y10 at the most significant bit, as will be described hereinafter, and the high level is sequentially shifted in response to the nibble operation. If in the fast page mode or static column mode, however, the nibble counter NBC does not perform the shifting operation but functions substantially as a decoder. Specifically, four of the main amplifiers MA0 to MA7 are selectively and simultaneously brought into the operative states in accordance with the complementary internal address signal AY0 of the least significant bit, when the dynamic RAM has the x 4 bit structure. At this time, each main amplifier selectively forms four of the aforementioned writing internal signals ZWP0 to ZWP7 in a corresponding combination in accordance with the corresponding internal mask data MKBI, i.e., MKB0 to MKB3.

When the dynamic RAM has the x 1 bit structure and the nibble mode, on the other hand, four of the main amplifiers MA0 to MA7 are likewise selectively and simultaneously brought into the operative states. The output signals of those main amplifiers are selectively outputted, as will be described hereinafter, in accordance with the corresponding aforementioned selection signals AXY0 to AXY3. In this-nibble mode, the writing internal signals ZWP0 to ZWP7 are selectively formed in accordance with the aforementioned selection signals AXY0 to AXY3. In case the dynamic RAM has the x 1 bit structure and the fast page mode or static column mode, the main amplifiers MA0 to MA7 are selectively brought into the operative states to form the corresponding writing internal signals ZWP0 to ZWP7 selectively in accordance with the aforementioned complementary internal address signal AY0 and the selection signals AXY0 to AXY3.

The main amplifiers MA0 to MA7 are additionally given a function to equalize their complementary input nodes and complementary output nodes and the complementary coupled nodes of the aforementioned two pairs of static amplifiers in accordance with the complementary internal signal EQ, i.e,. the precharging complementary internal signal CPU.

Figure 70:
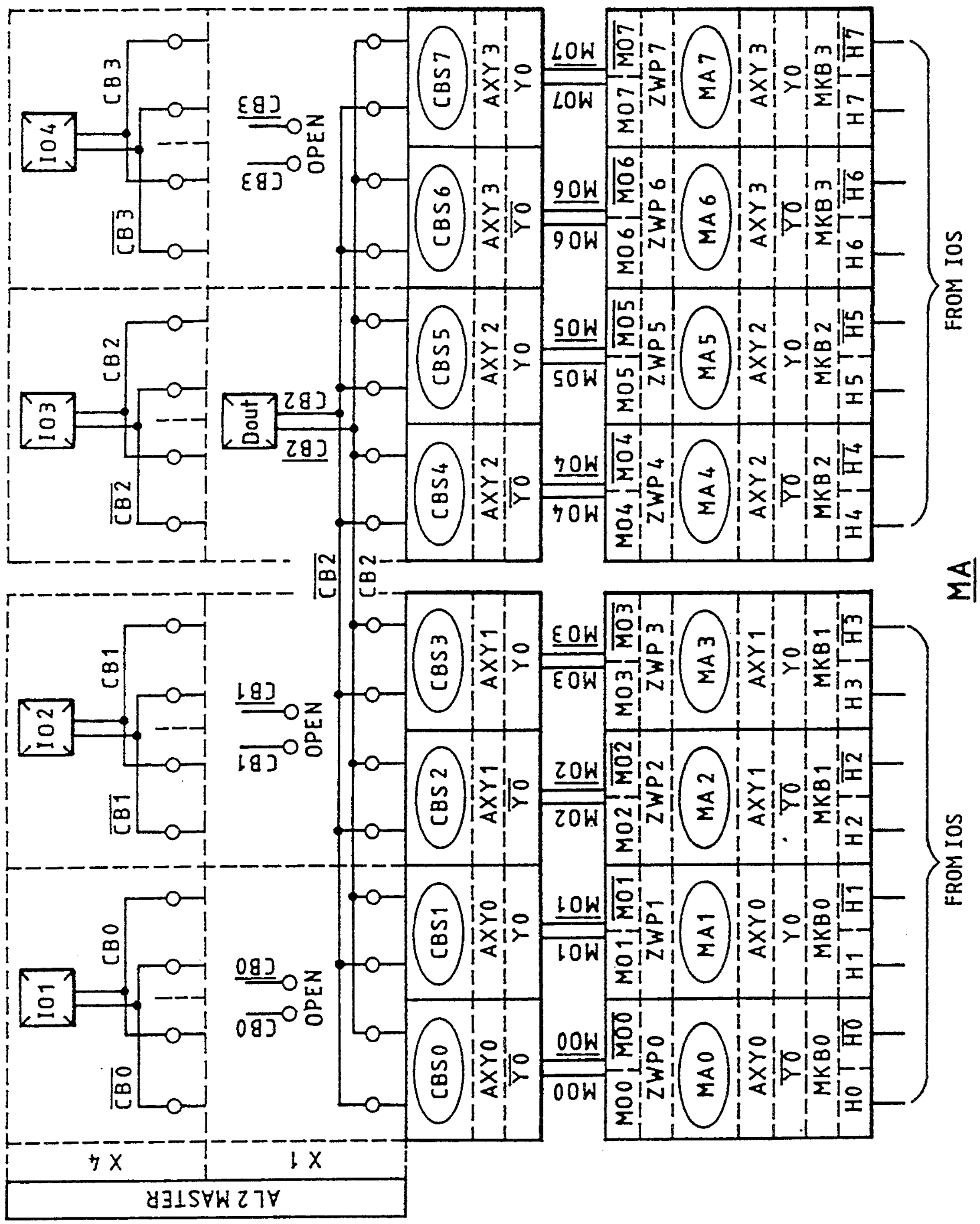

The complementary output terminals MOI, i.e., MO0 to MO7 of the main amplifiers MA0 to MA7 are selectively connected, as shown in FIG. 70, through corresponding coupling circuits CBS0 to CBS7 with the complementary input terminals CBI, i.e., CB0 to CB3 of the data output buffers DOB0 to DOB3. At this time, the output signals of the individual main amplifiers are selectively transmitted in synchronism with a data strobing inverted internal signal DSB and in accordance with the aforementioned selection signals AXY0 to AXY3 and the complementary internal address signal AY0 of the least significant bit. Incidentally, the complementary input terminals of the aforementioned data output buffers CB0 to CB3 are logically coupled with the corresponding output terminals of the test logic circuit SX4T and SX1T of a test mode control circuit TST.

1.2.19. Nibble Counter

Figure 63:
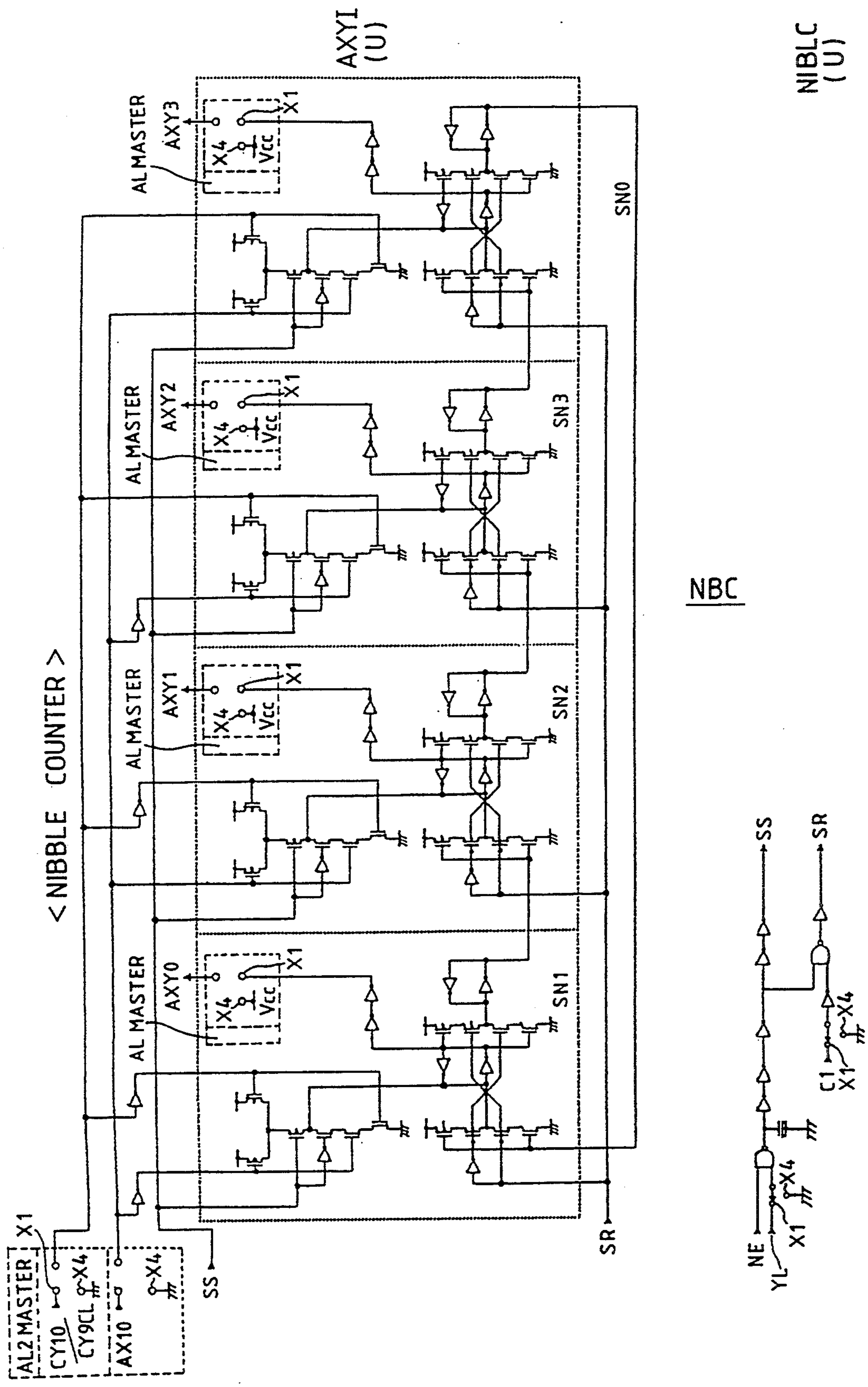

The nibble counter NBC includes unit circuits of 4 bits which are coupled in series to constitute a ring-shaped shift register, as shown in FIG. 63. These unit circuits individually include master and slave latches coupled in series to perform the initial setting operation in accordance with an internal signal SS and the shifting operation in accordance with an internal signal SR. Specifically, the slave latch of each unit circuit is initially set, when the aforementioned internal signal SS is at the low level, such that its output signal is selectively set to the high level in accordance with the X-address signal X10 of the most significant bit, i.e., the internal address signal AX10 and the Y-address signal Y10 of the most significant bit, i.e., the internal address signal CY10. This high level is transmitted as it is as the output signal of each unit circuit when the dynamic RAM is in the fast page mode or static column mode. In the case of the nibble mode, on the other hand, the aforementioned internal signal YL is set to the high level, and the internal signal SS is set to the high level. Then, the initial setting is fixed, and the inside of the nibble counter NBC is shifted in the ring shape in accordance with the internal signal SR.

Thus, the nibble counter NBC is formed into the shift register shape so that the selecting operations can be speeded up to raise the data rate of the dynamic RAM in the nibble mode.

The output signals of the individual unit circuits of the nibble counter NBC are fed as the aforementioned selection signals AXY0 to AXY3 to the main amplifiers MA0 to MA7 and the coupling circuits CBS0 to CBS7. These output signals are fixed at the power supply voltage VCC of the circuit, i.e., at the high level, as has been described hereinbefore, when the dynamic RAM has the x 4 bit structure.

1.2.20. Data Input Buffer

The dynamic RAM of this embodiment is equipped with four data input buffers DIB0 to DIB3 which are selectively used in accordance with the bit structure thereof (as shown in FIG. 3). In other words, all the data input buffers DIB0 to DIB3 are used when the dynamic RAM has the x 4 bit structure. At this time, the input terminals of the individual data input buffers are coupled to the corresponding data input/output terminals I/O1 to I/O4, respectively. When the dynamic RAM has the x 1 bit structure, on the other hand, only one data input buffer DIB1 is used whereas the remaining three data input buffers are left unused. At this time, the data input buffer DIB1 has its input terminal connected with the data input terminal Din.

Figure 71A:
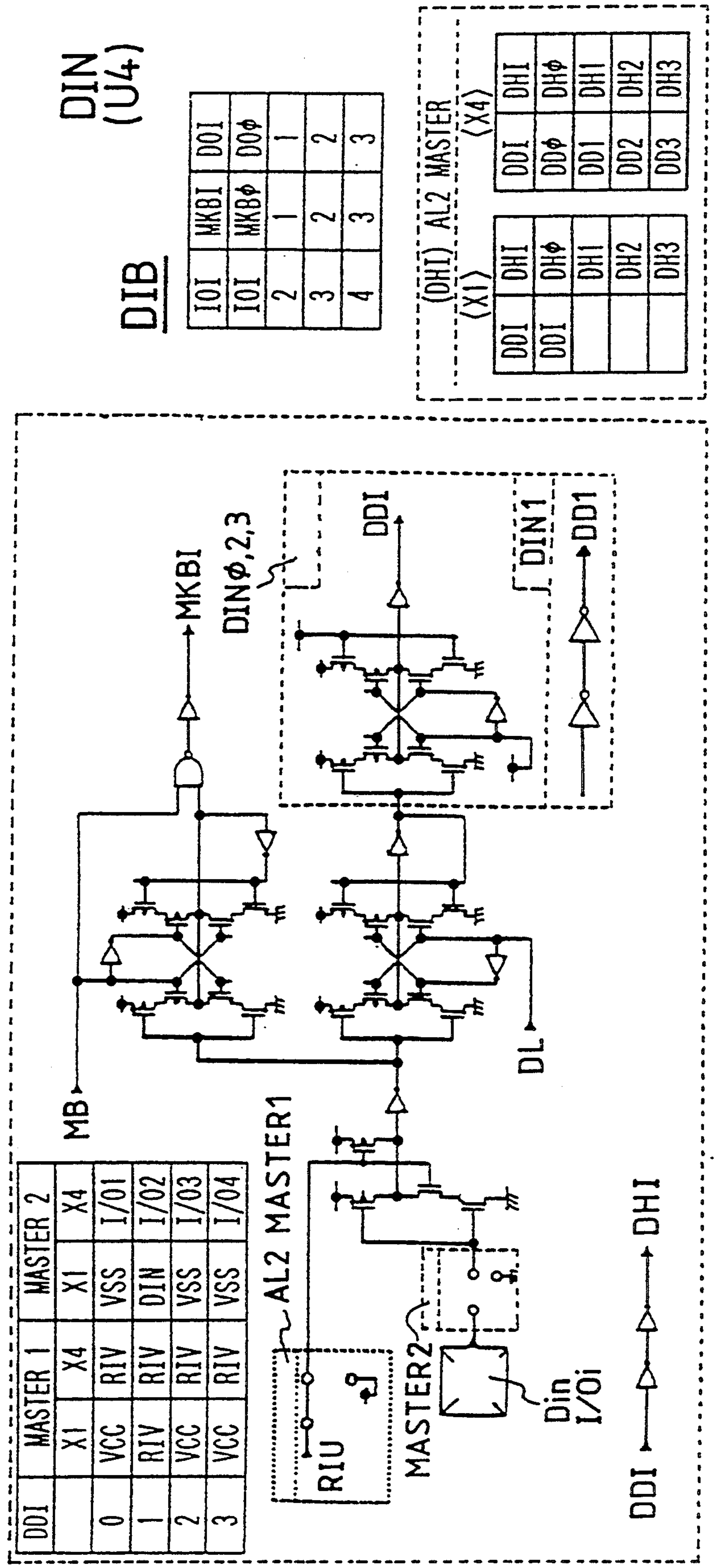
Figure 71B:
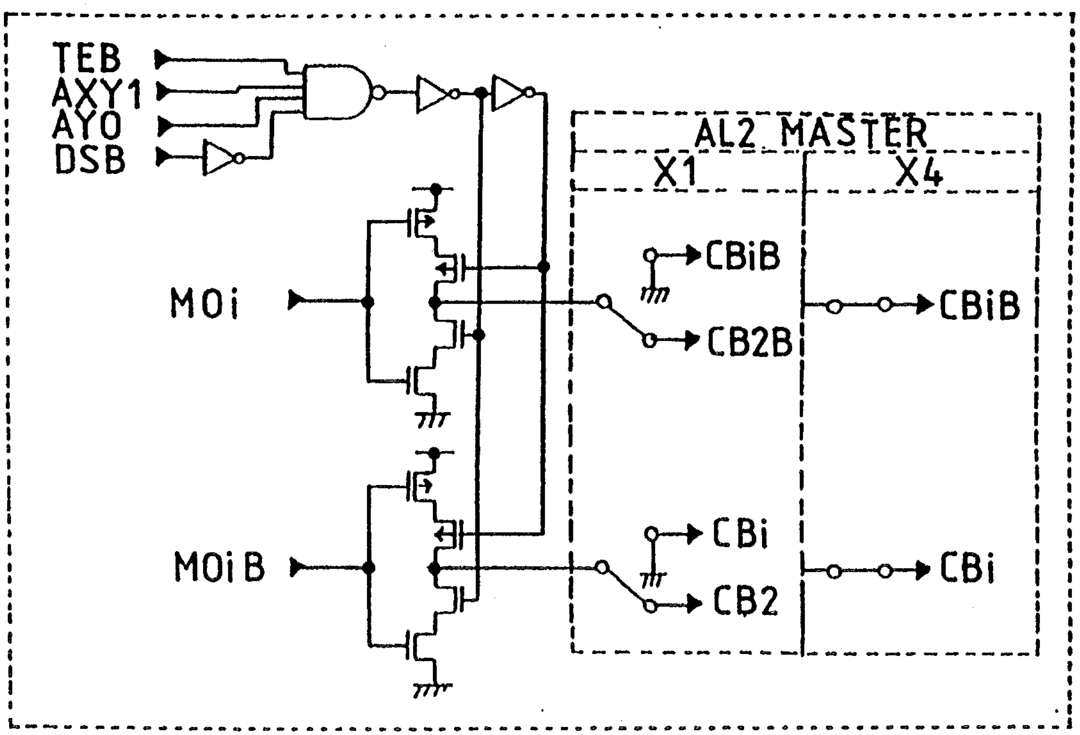
Figure 71C:
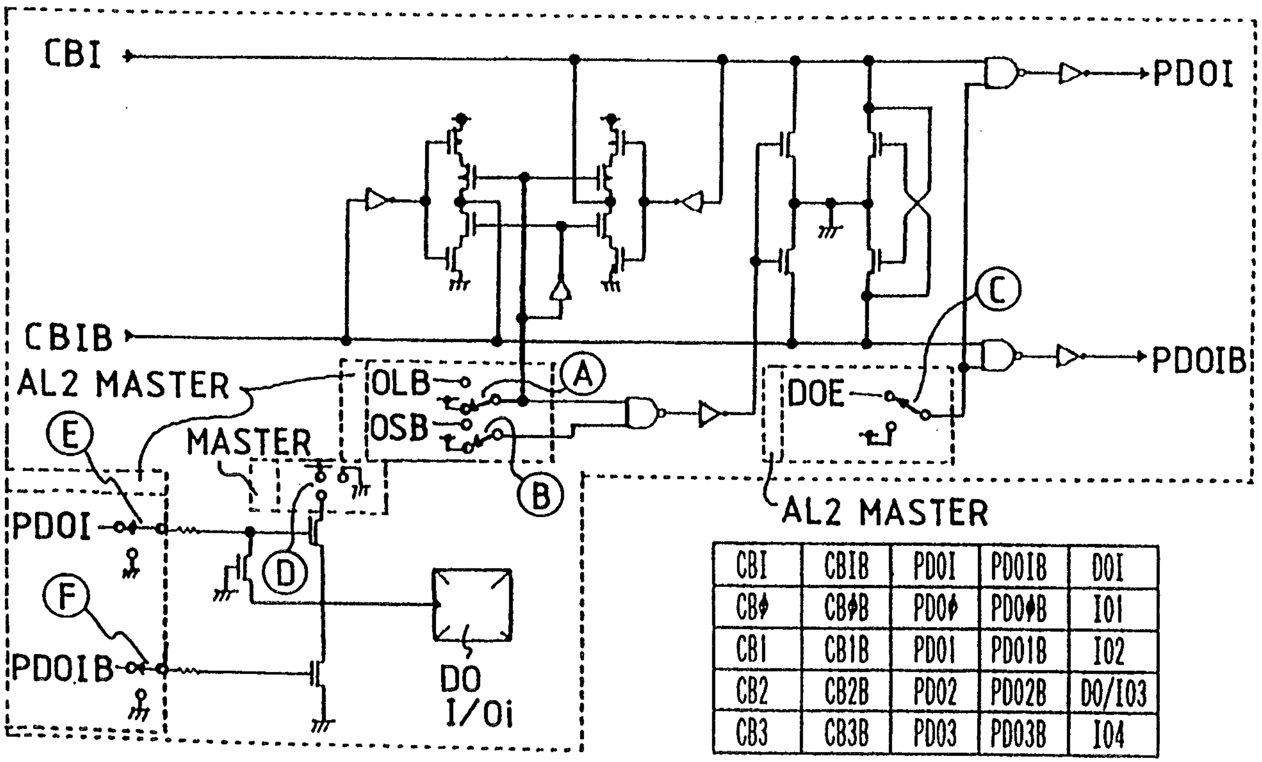

Each of the data input buffers DIB0 to DIB3 includes, as shown in FIG. 71: one data latch for latching corresponding input data; and one mask data latch for latching the corresponding mask data. Of these latches, the data latch fetches and latches the corresponding input data in accordance with a data latching internal signal DL. The output signals of those data latches are fed as the aforementioned complementary internal input data $\overline{DHI}$, i.e., $\overline{DH0}$ to $\overline{DH3}$ to the corresponding common I/O line selection circuits IOS0 to IOS15. On the other hand, the mask data latch of each data input buffer fetches and latches the corresponding mask data in accordance with a mask data latching internal signal WB when the dynamic RAM is brought into the selected state in the write cycle of the mask drive mode. The output signals of these mask data latches are fed as the aforementioned internal mask data MKB0 to MKB3 to the corresponding main amplifiers MA0 to MA7.

1.2.21. Data Output Buffer

The dynamic RAM of this embodiment is equipped with four data output buffers DOB0 to DOB3 to be selectively used in accordance with the bit structure thereof as shown in FIG. 3. Specifically, all the data output buffers DOB0 to DOB3 are used when the dynamic RAM has the x 4 bit structure. At this time, the output terminals of the individual data output buffers are connected with the corresponding data input/output terminals I/O1 to I/O4, respectively. When the dynamic RAM has the x 1 bit structure, on the other hand, only one data output buffer DOB2 is used, whereas the remaining three data output buffers are left unused. At this time, the output terminal of the data output buffer DOB2 is coupled to the data input terminal Dout.

Referring to FIG. 71, the data output buffers DOB0 to DOB3 include output latches in which two clocked inverter circuits to be selectively brought into the transmitting states in accordance with an output data latching inverted internal voltage OLB are crossly connected with each other. The complementary input/output nodes of the output latches are connected with the other input terminals of a pair of 2-input NAND gate circuit which have their gates controlled in accordance with a data outputting internal signal DOE. The output signals of those NAND gate circuits are inverted by the corresponding paired inverter circuits and then transmitted to either the corresponding paired output MOSFETs or the gates of the paired output MOSFETs of the data output buffer DOB2.

In this embodiment, the data output buffers DOB0 to DOB3 are additionally equipped with equalizing circuits which are connected between the uninverted and inverted input/output nodes of the aforementioned output latches. These equalizing circuits short the uninverted and inverted input/output nodes of the output latches to the ground potential of the circuit when both the aforementioned inverted internal signal OLB and the aforementioned data strobing inverted internal signal $\overline{DS}$ are at the high level. As a result, the inverting operations of the output latches are speeded up to raise the data rate of the dynamic RAM in the nibble mode, static column mode or fast page mode.

1.2.22. Input Protection Circuit

The dynamic RAM of this embodiment is equipped with a plurality of input protection circuits provided for the inputting bonding pads, although not especially limitative thereto.

Figure 98:
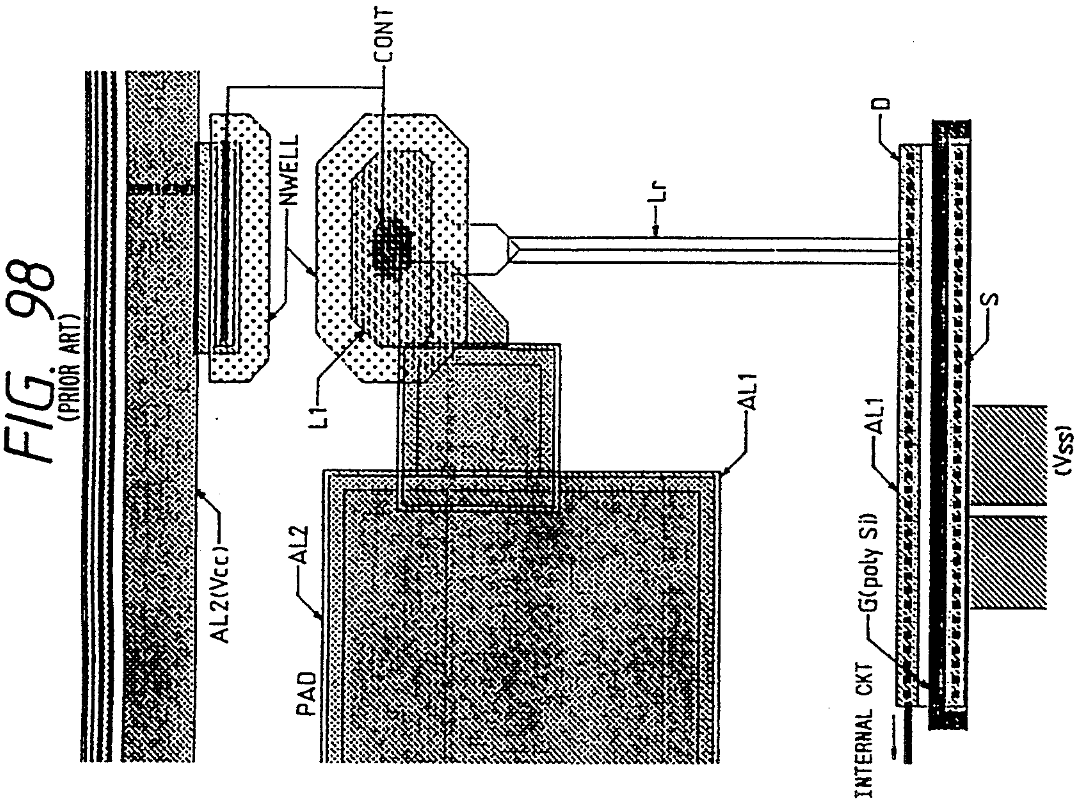
FIG. 98 is an arrangement diagram showing one example of the input protection circuit of the dynamic RAM from a previously developed arrangement.

FIGS. 92 to 97 present arrangement diagrams of first to sixth embodiments of the input protection circuit to be used in the dynamic RAM. On the other hand, FIGS. 89 and 90 present circuit diagrams showing circuits equivalent to the input protection circuits of FIGS. 92 to 96 and FIG. 97. Moreover, FIG. 98 shows one example of the arrangement diagram of the input protection circuit used in the dynamic RAM according to the prior art, and FIG. 91 is a circuit diagram showing a circuit equivalent to the input protection circuit of the prior art. With reference to these Figures, the structures, operations and features of the individual embodiments of the input protection circuit will be summarized in the following.

Figure 92:
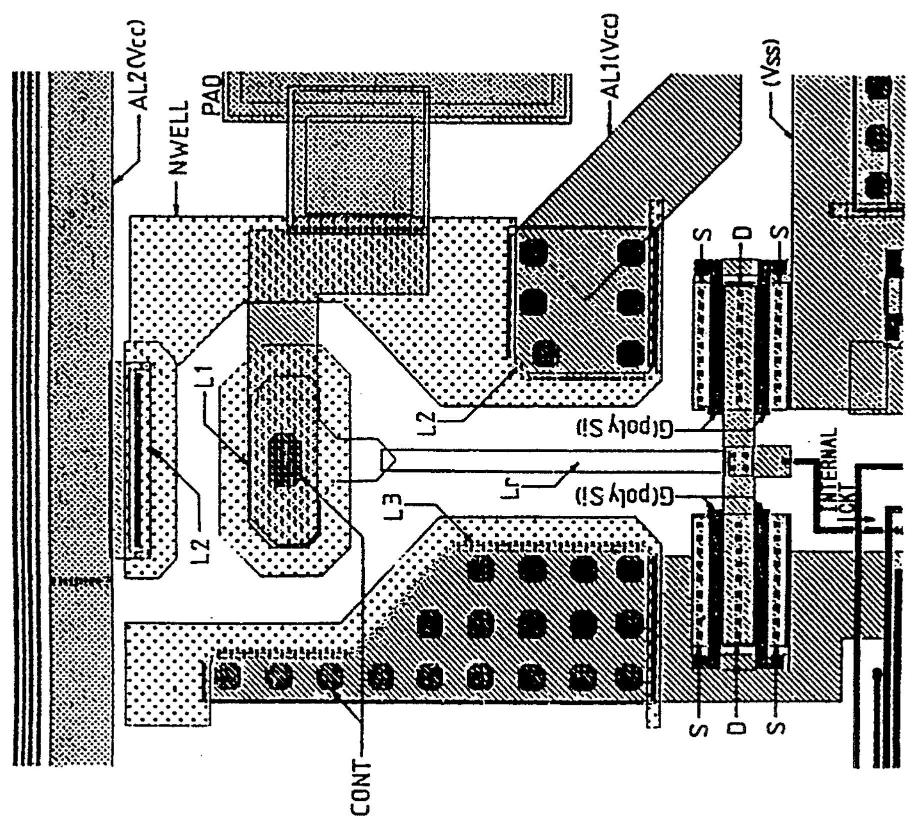

In FIG. 92, the input protection circuit includes an N−-diffusion layer (which will be referred merely to as the "diffusion layer"), i.e., an input diffusion layer L1 (i.e., the first diffusion layer) formed for each inputting pad PAD. This input diffusion layer L1 is coupled to the corresponding pad PAD through a corresponding metallic wiring layer, i.e, an aluminum wiring layer AL1 and a contact (CONT). The input diffusion layer L1 is coupled to the drain region d of the clamp MOSFET QC1 of the same Figure through the diffusion layer Lr forming the protection resistor R1 of FIG. 89 and the aluminum wiring layer AL1 and further to the internal terminal of the corresponding internal circuit. Between the aforementioned protection resistor R1 and the semiconductor substrate SUB, there is equivalently formed a parasitic diode D1 of FIG. 89. Another parasitic diode D2 is formed between the clamp MOSFET QC1 and the semiconductor substrate SUB.

In this embodiment, the aluminum wiring layer AL1 coupling the aforementioned diffusion layer Lr and the drain region D of the clamp MOSFET is formed substantially all over the drain region D of the clamp MOSFET and is coupled through a number of contacts to the drain region D. Likewise, the source region S of the clamp MOSFET QC1 is also coupled to the ground potential VSS of the circuit through the aluminum wiring layer AL1 formed substantially all over the surface and the numerous contacts. As a result, the connection resistances of the connection nodes of the individual regions can be reduced to form the stable clamp MOSFET.

The input protection circuit further includes: diffusion layers L2 and L2' (i.e., the second diffusion layers) formed in the vicinity of the aforementioned input diffusion layer L1 and coupled to the power supply voltage VCC of the circuit through the corresponding aluminum wiring layers AL1 and the contacts; and a diffusion layer L3 (i.e., the third diffusion layer) formed in the vicinity of the aforementioned input diffusion layer L1 and coupled through the corresponding aluminum wiring layer AL1 and the numerous contacts to the ground potential VSS of the circuit. Well regions (NWELL) are formed to enclose the aforementioned input diffusion layer L1 around and below the input diffusion layer L1 and at the front edge portions of the diffusion layers L2, L2' and L3. Of these, the diffusion layers L2 and L2' constitute a lateral bipolar transistor BT1 of FIG. 89 together with the input diffusion layer L1. Likewise, the aforementioned diffusion layer L3 constitutes a lateral bipolar transistor BT2 of FIG. 89 together with the input diffusion layer L1. These transistors are turned on, as a result that the aforementioned parasitic diode D1 is broken down to raise the potential of the semiconductor substrate SUB when spike noises are inputted through the corresponding pads PAD, to absorb the aforementioned spike noises abruptly into the node for supplying the power source voltage or ground potential of the circuit.

As a result, the input protection circuits of this embodiment are afforded the better surge absorbing effects of the power supply voltage VCC and ground potential VSS of the circuit than those of the input protection circuits of the prior art. Since, moreover, the well regions are formed to enclose the input diffusion layer L1, the input diffusion layer L1 can be prevented from being broken when in the broken-down operation, to suppress the surge absorptions of the semiconductor substrate SUB and accordingly the fluctuations of the substrate potential.

Figure 93:
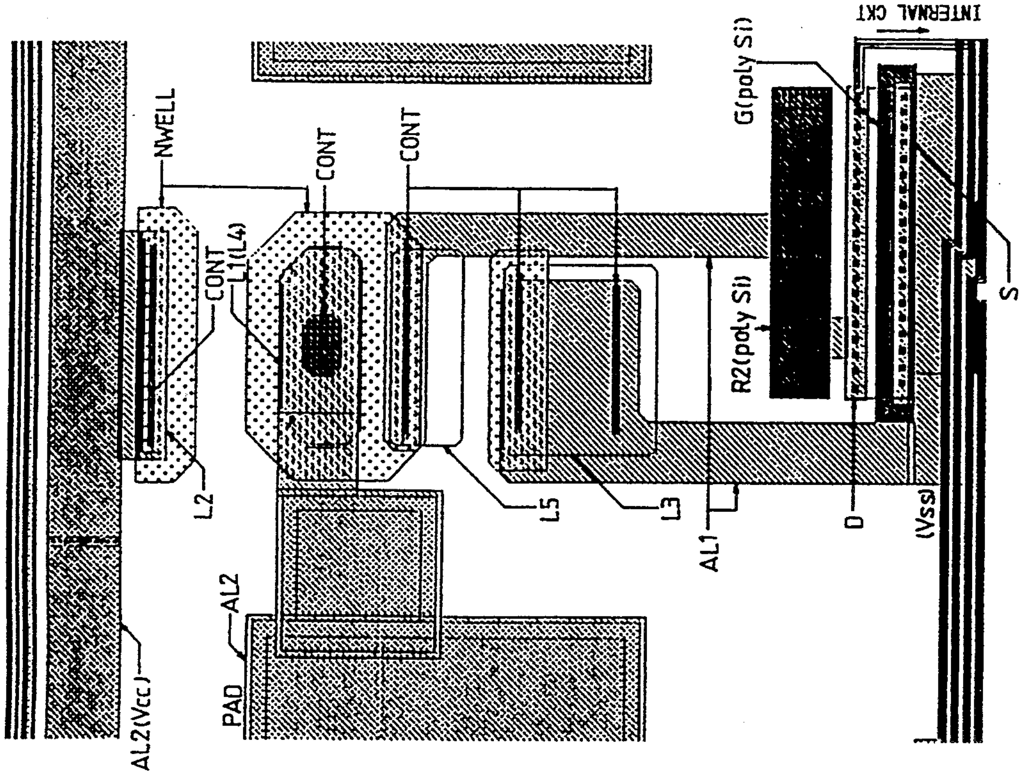
FIGS. 92 to 97 are arrangement diagrams showing several embodiments of the input protection circuit of the dynamic RAM according to the present invention.

As shown in FIG. 93, the Input protection circuit further includes a diffusion layer L5 (i.e., the fifth diffusion layer) which is formed to face the aforementioned input diffusion layer L1 (which is shared as the first and fourth diffusion layers) across a predetermined well region, in addition to the diffusion layers L2 and L3 which constitute the aforementioned lateral bipolar transistors BT1 and BT2 together with the input diffusion layer L1. The well region to be formed between the input diffusion layer L1 and the diffusion layer L5 acts as a well resistor to constitute a portion of the protection resistor R1 of FIG. 89, i.e., the first protection resistor.

The diffusion layer L5 is coupled through the corresponding; aluminum wiring; layer AL1 to a polysilicon resistor R2 (i.e., a second protection resistor) and further to the drain region D of the clamp MOSFET QC1. The aforementioned polysilicon resistor R2 constitutes the protection resistor R1 of FIG. 89 together with the aforementioned well resistor (i.e., the first protection resistor).

In this embodiment, the lateral bipolar transistors BT1 and BT2 are constructed between the input diffusion layer L1 and the diffusion layers L2 and L3, namely, between the pad PAD and the power supply voltage VCC and the ground potential VSS of the circuit, so that the effects obtainable are similar to those of the foregoing first embodiment. Moreover, the protection resistor R1 is constituted of the well resistance so that the area necessary for the layout can be reduced. The well region to be formed between the input diffusion layer L1 and the diffusion layer L5 is not formed at the trailing edge portion of the diffusion layer L5 so that the 3unction density gradient between the semiconductor substrate SUB and the diffusion layer L5 becomes so steep as to reduce the breakdown voltage of the parasitic diode D1.

Figure 94:
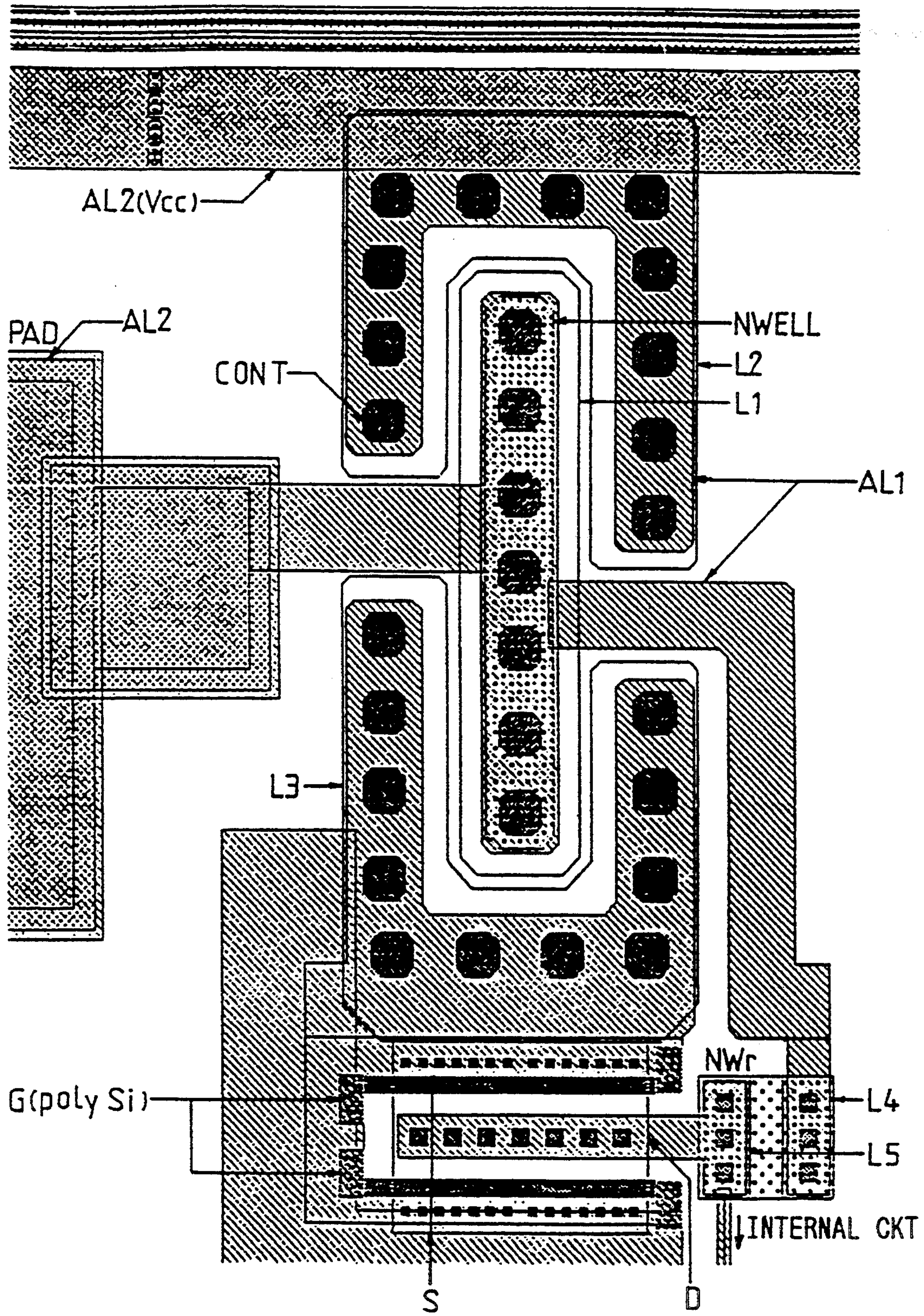

In FIG. 94, the input diffusion layer L1 is made relatively thin, and the aluminum wiring layer AL1 and contacts for coupling the input diffusion layer L1 and the corresponding pad PAD are formed at the inner side except the peripheral portion of the input diffusion layer L1, These contacts are underlaid by the well regions to envelop the lower ends thereof. This raises the breakdown voltage of the lower portions of the contacts.

The input diffusion layer L1 is further coupled through the corresponding aluminum wiring layer AL1 to a diffusion layer L4 (i.e., a fourth diffusion layer) which constitutes a well resistor NWr together with the diffusion layer L5 (i.e., the fifth diffusion layer). This diffusion layer 5 is coupled to the drain region D of the Clamp MOSFET QC1 and further to the input terminal of the corresponding internal circuit. In this embodiment, the protection resistor R1 is constructed of only the aforementioned well resistor NWr. As a result, the area necessary for the layout of the protection resistance is further reduced.

On the other hand, the diffusion layer L2 constituting the lateral bipolar transistor BT1 together with the aforementioned input diffusion layer L1 is formed to enclose the upper half of the input diffusion layer L1, whereas the diffusion layer L3 constituting the lateral bipolar transistor BT2 together with the input diffusion layer L1 is formed to enclose the lower half. Moreover, the aluminum wiring layer AL1 and the contacts for coupling those diffusion layers L2 and L3 and the power source voltage VCC and the ground potential VSS of the circuit are formed at the inner sides of the leading edge portions of the individual diffusion layers. This drops the breakdown voltage of the aforementioned parasitic diode D1 and the ON resistances of the lateral bipolar transistors BT1 and BT2.

Figure 96:
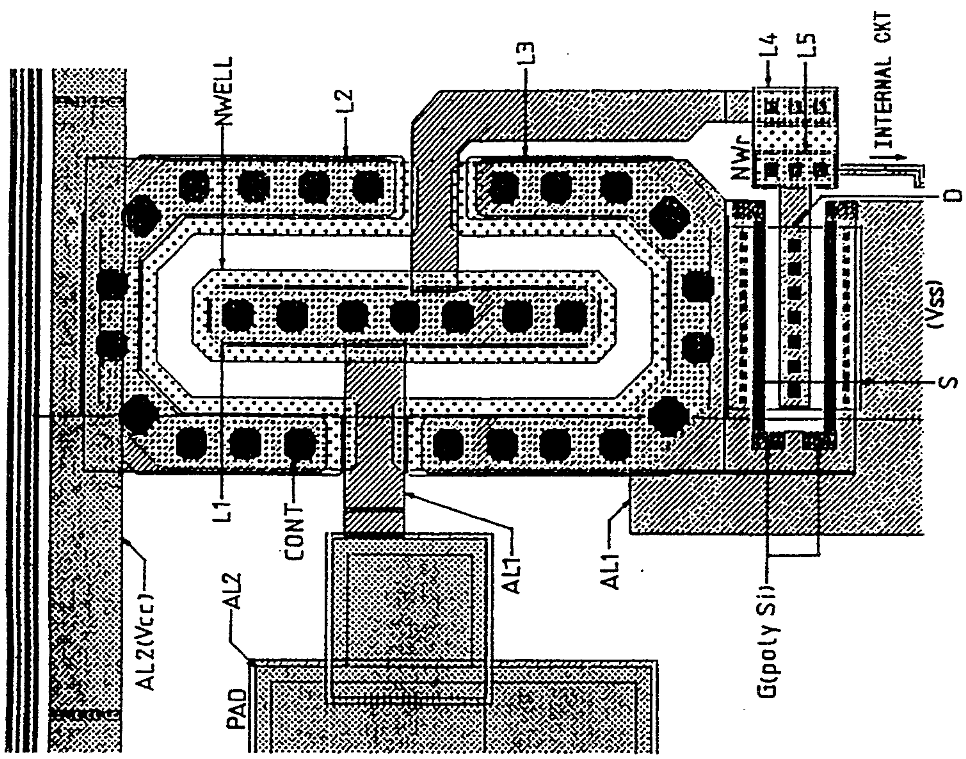
Figure 95:
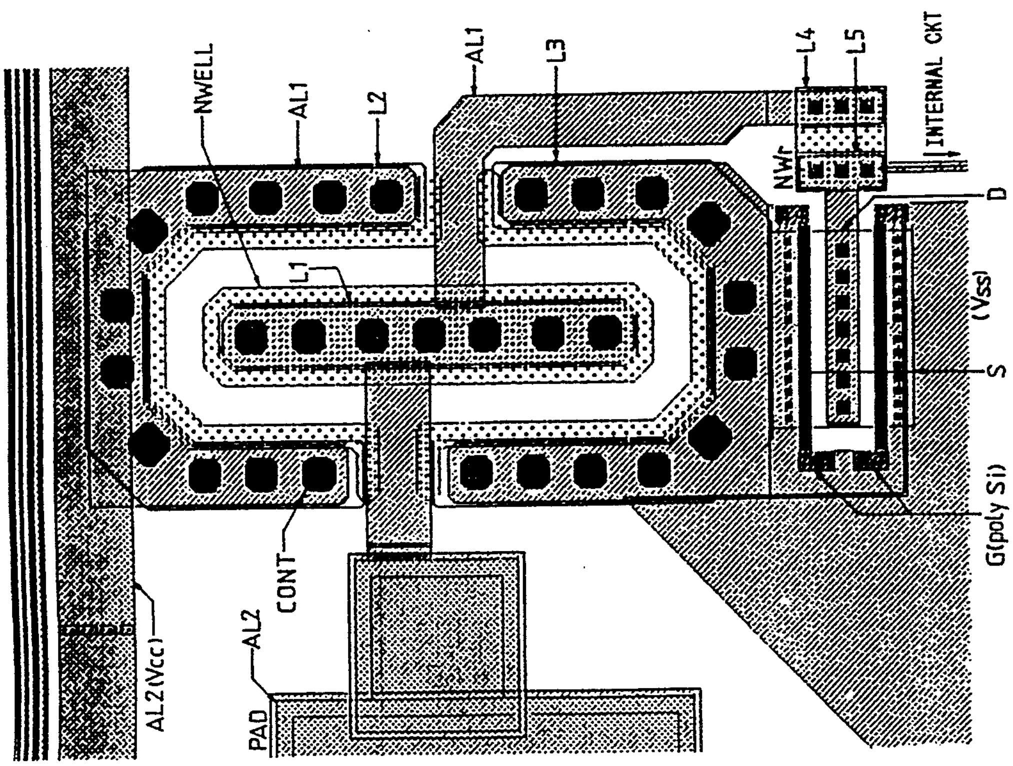

In the embodiment of FIG. 95, the well regions are added to the leading edge portions of the input diffusion layer L1 and the diffusion layers L2 and L3 of FIG. 94. In the embodiment of FIG. 96, moreover, the well regions are further added to below the diffusion layers L2 and L3 of FIG. 94. As a result, the diffusion layers L1 to L3 can be prevented from being broken due to the overcurrent when in the breakdown.

Figure 97:
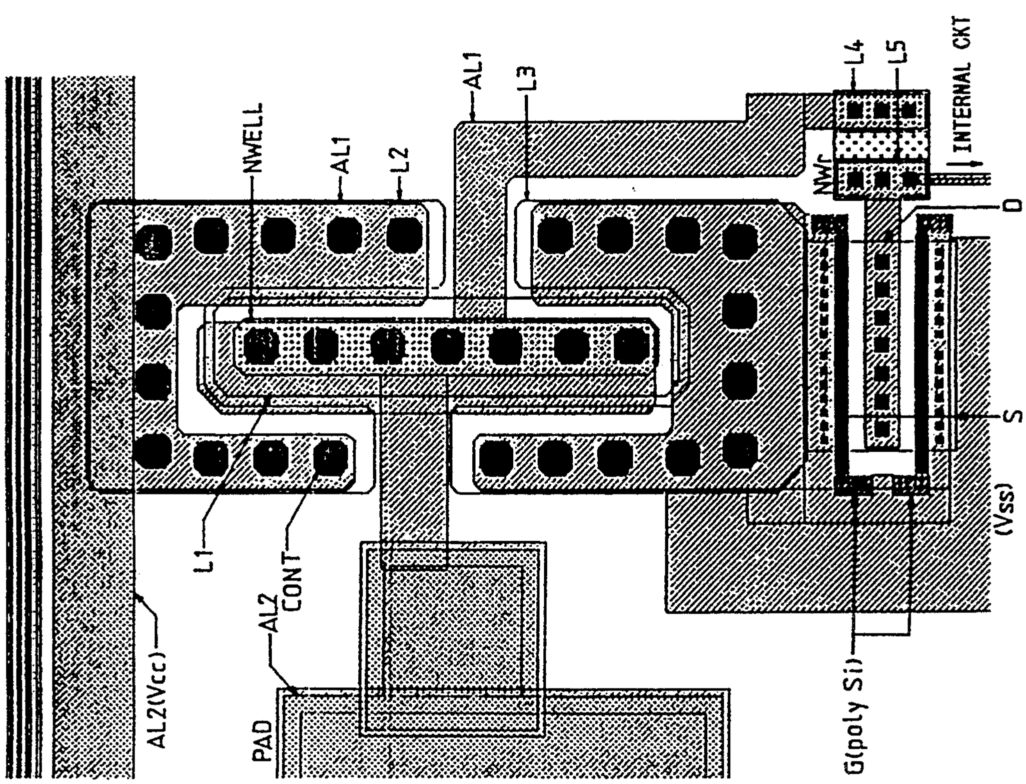

In FIG. 97, the aluminum wiring layer AL1 for coupling the aforementioned input diffusion layer L1 of FIG. 94 and the corresponding pad PAD is formed over portions of the leading edges of the diffusion layers L2 and L3. As a result, between the input diffusion layer Li and the diffusion layers L2 and L3, namely, between the corresponding pad PAD and the power supply voltage VCC and ground potential VSS of the circuit, there are equivalently formed the two aluminum parasitic MOSFETs using the aluminum wiring layer AL1 as their gate regions, i.e, the clamp MOSFETs QC4 and QC5 of FIG. 90.

On the other hand, the aluminum wiring layer AL1 for coupling the aforementioned diffusion layers L2 and L3 and the power supply voltage VCC or ground potential VSS of the circuit is formed over a portion of the opposed leading edges of the input diffusion layer L1. As a result, between the diffusion layers L2 and L3 and the input diffusion layer 1, namely, between the power supply voltage VCC and ground potential VSS of the circuit and the corresponding pad PAD, there are equivalently formed the two aluminum parasitic MOSFETs using the aluminum wiring layer AL1 as their gate regions, i.e., the clamp MOSFETs QC2 and QC3 of FIG. 90.

From these, the spike noises to be fed to the corresponding pad PAD are absorbed through the clamp MOSFETs having a relatively high threshold voltage to retain the characteristics of the input protection circuits against the power supply voltage VCC or the ground potential VSS.

1.2.23. Timing Generator

The dynamic RAM of this embodiment is equipped with timing generators TG for forming a variety of timing signals for controlling the operations of the aforementioned individual circuits. As shown in FIG. 2, timing generators TG include: A $\overline{RAS}$-system control circuit RTG provided for the row address strobe signal $\overline{RAS}$; a $\overline{CAS}$-system control circuit CTG provided for the column address strobe signal $\overline{CAS}$; and a $\overline{WE}$-system control circuit WTG provided for the write enable signal $\overline{WE}$, although not especially limitative thereto. The timing generators TG further include a data output control circuit OTG for controlling the output operations of the dynamic RAM, and a mode control circuit MOD for controlling the operation modes of the former. With reference to FIGS. 42 and 43, FIG. 55, FIGS. 64, 65 and 66, and FIGS. 75 and 76, the structures, operations and features of the individual portions of the timing generators TG will be described in the following. In the course of those descriptions, reference should be made to the timing charts of FIGS. 80 and 81.

(1) $\overline{RAS}$-System Control Circuit

Figure 42A:
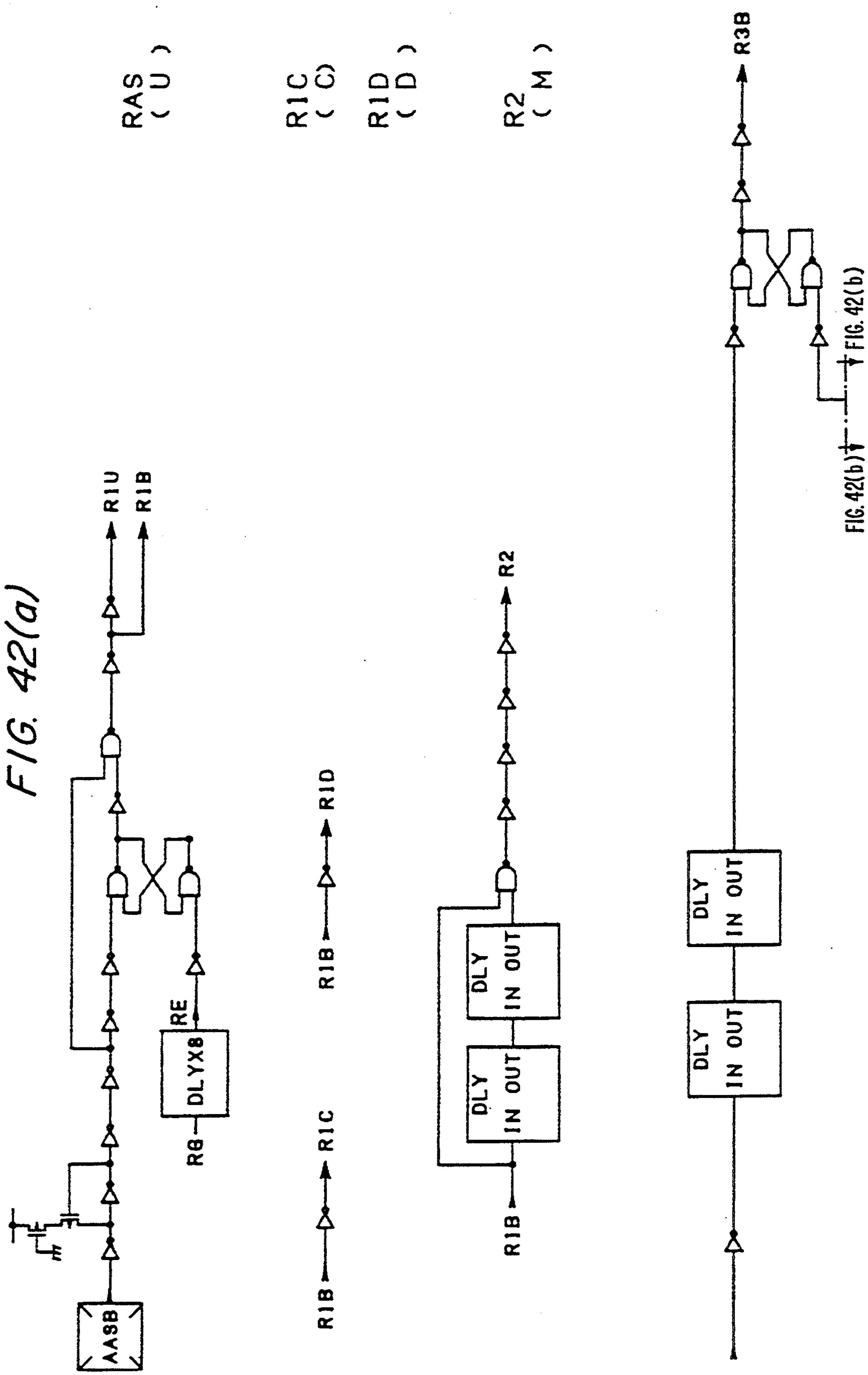
Figure 42B:
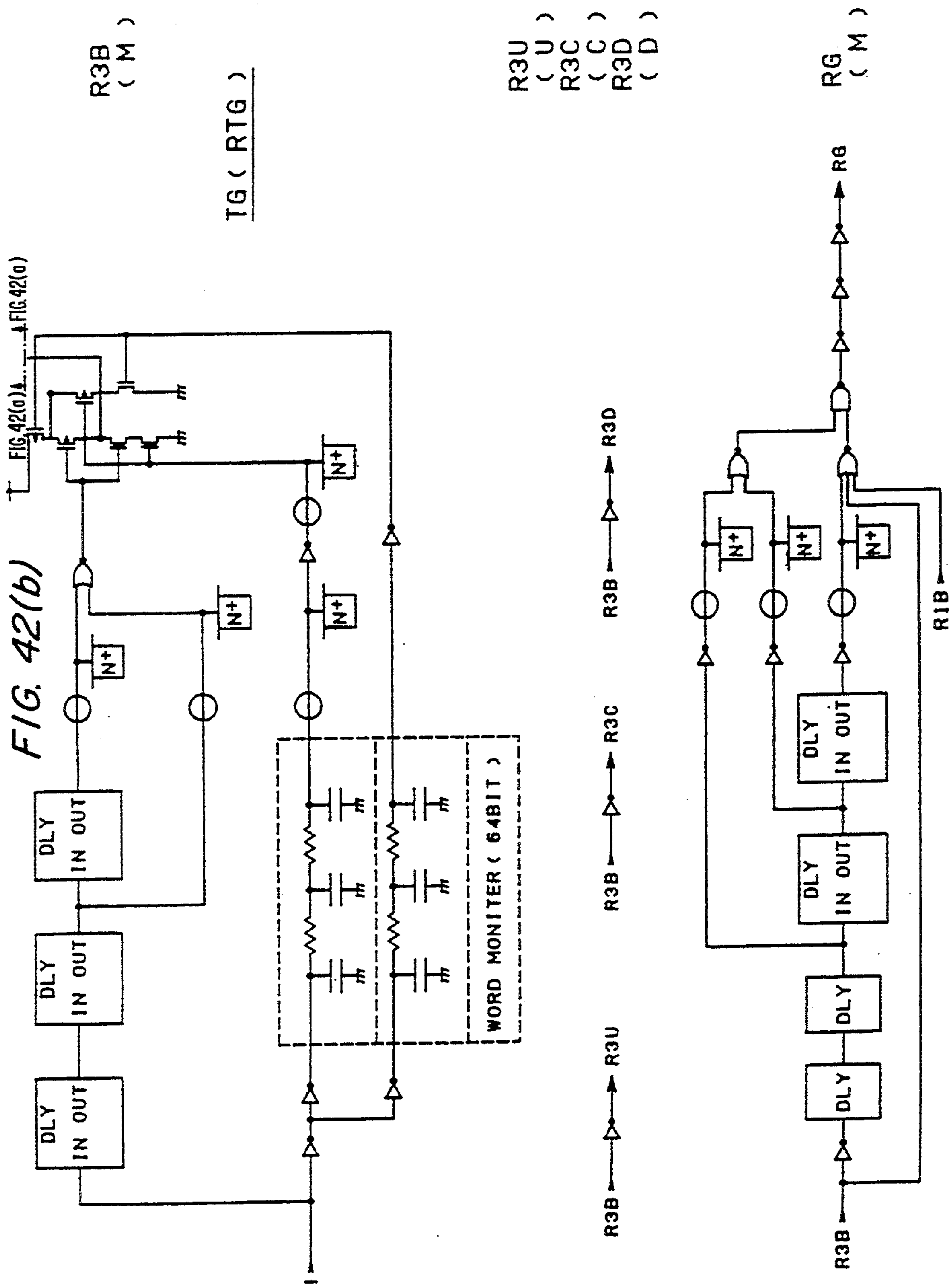
Figure 43A:
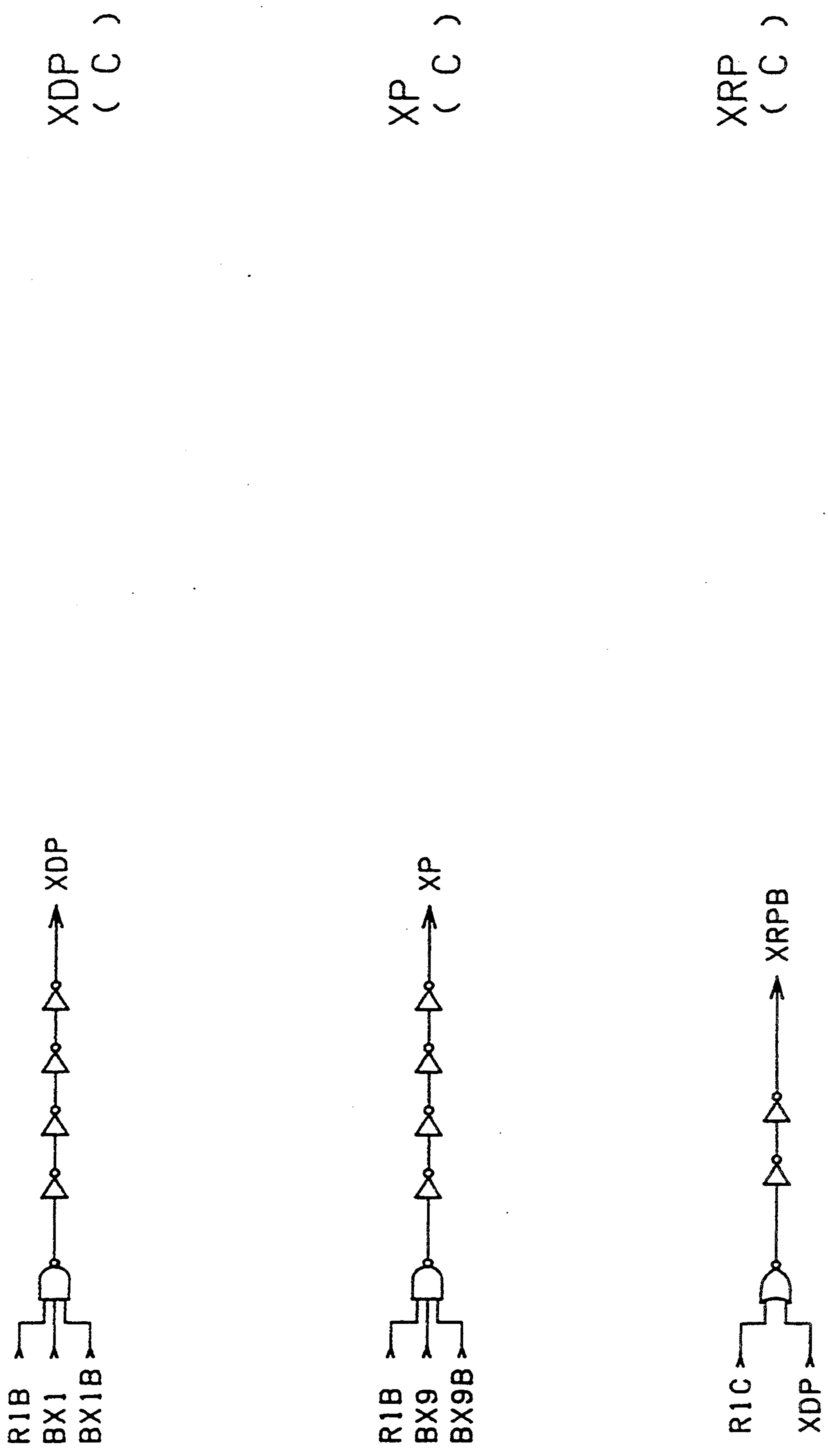
Figure 43B:
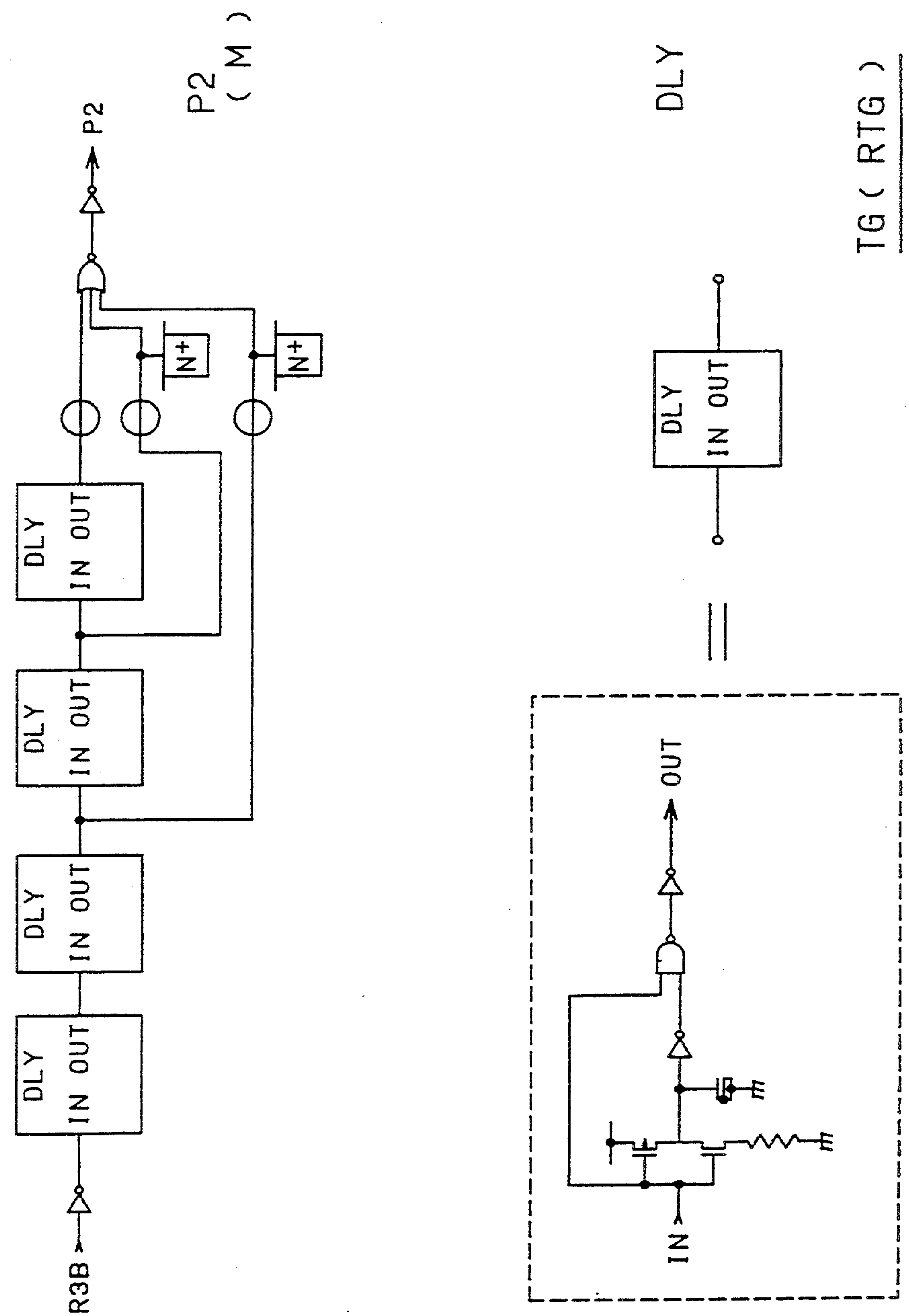

On the basis of the row address strobe signal $\overline{RAS}$ fed as the control signal from the outside, as shown in FIGS. 42 and 43, the $\overline{RAS}$-system control circuit RTG of the timing generator TG forms the timing signals R1, R2, R3, RG, P2, XDP and XP.

Of these, the timing signal R1 is formed in accordance with the row address strobe signal $\overline{RAS}$ so that the timing signals R2 and XDP are accordingly formed.

In the dynamic RAM, the X-address signals X0 to X10 are latched by the X-address buffer XAB in response to the aforementioned timing signal R1, and the precharge operation of the X-address decoder XAD is stopped in response to the timing signal XDP. As a result, the decoding operation of the X-address decoder XAD is substantially started to select the word lines. The drive signal of the word lines is monitored by the word line monitor circuit, as has been described hereinbefore, so that the output signal, i.e., the internal signal XM, is fed back to the $\overline{RAS}$-system control circuit RTG.

The aforementioned internal signal XM is delayed through delay circuits XDLY3 to XDLY5 in the series connection and transmitted through two sets of word line monitor circuits until they are combined under a predetermined logical condition to form the inverted timing signal R3B. In this embodiment, the word line monitor circuit to be fed with the aforementioned internal signal XM is made to have different transmission characteristics by raising or dropping the logic threshold level of the inverter circuit to be disposed downstream of the monitoring word line. The several transmission routes of the internal signal XM contained in those word line monitor circuits are selectively trimmed with a laser at the cut points, as indicated at symbol ○ in the same Figure, so that they are set at a suitable delay time. Moreover, the downstream nodes at the cut points are coupled to the semiconductor substrate SUB through the $N^{--}$-well region. As a result, the nodes cut from the corresponding cut points with the laser are discharged to the low level through the corresponding well-regions.

Here, the word lines constituting the memory array of this dynamic RAM are of the so-called "divided word line type" composed of: a plurality of divided word lines cut in the extending directions and made of polysilicon, polycide or polysilicide; and main word lines formed of a metallic wiring layer such as an aluminum wiring layer and coupling the corresponding plural divided word lines at the central portions. As a result, the transmission rate of the drive signals on the individual word lines is determined by the divided word lines having a relatively large distribution resistance value so that the drive states of the word lines can be equivalently confirmed by monitoring the drive signals to be transmitted over those divided word lines. In the word line monitor circuit of this embodiment, therefore, monitoring word lines having one half length of that of the aforementioned divided word lines are formed so that the end of the drive operations of the word lines is decided by measuring the time period for which the aforementioned internal signal XM is transmitted in those monitoring word lines. In this embodiment, the aforementioned two monitoring word lines are arranged across the dummy word lines and at the same pitch as that of the actual word lines constituting the memory array, as shown in FIG. 87, and similar dummy word lines are also arranged outside. As a result, the monitoring word lines are given the transmission characteristics similar to those of the actual word lines constituting the memory array so that the monitor accuracy of the word line monitor circuit is improved.

(2) $\overline{CAS}$-System Control Circuit

Figure 55:
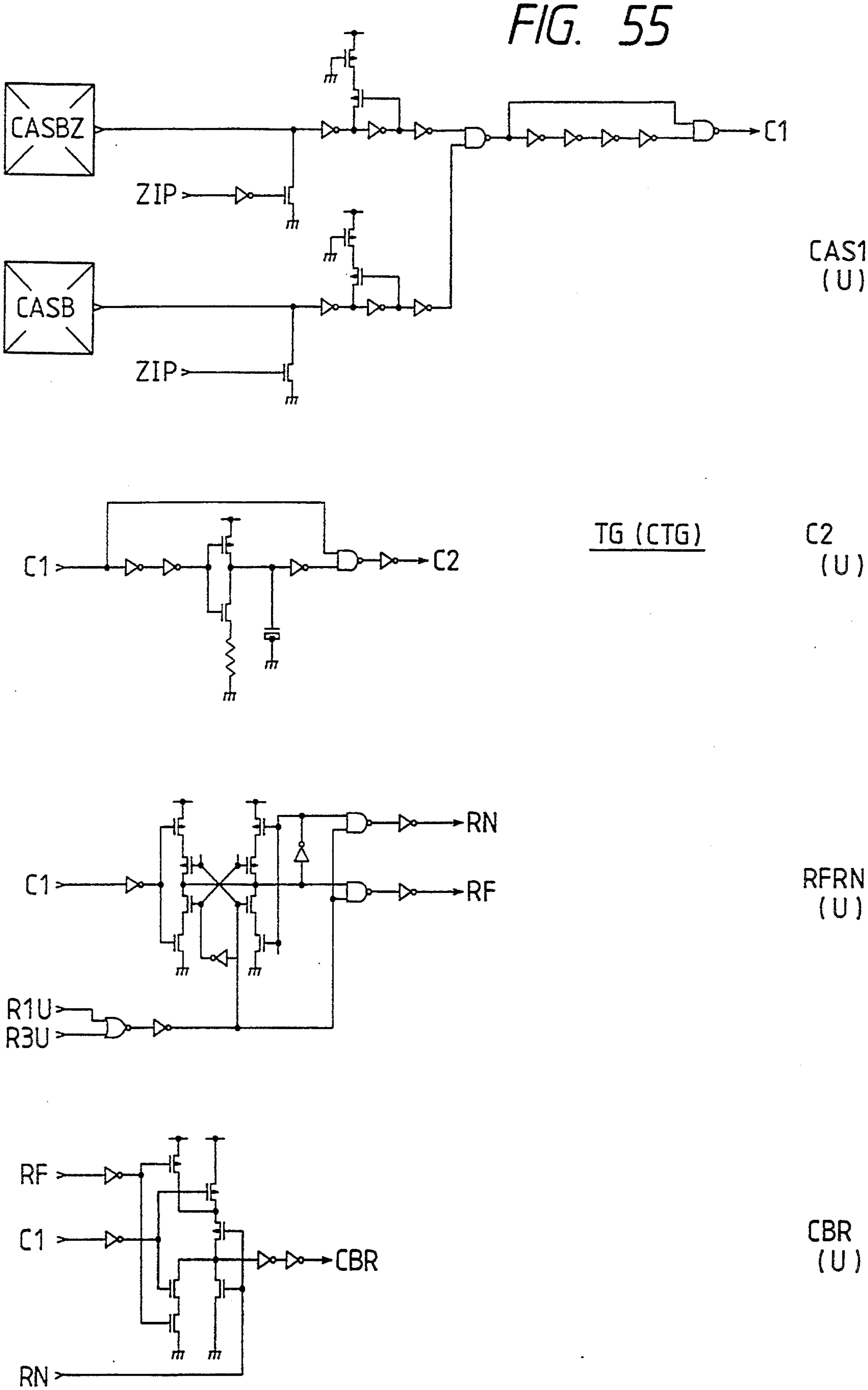

On the basis of the column address strobe signal $\overline{CAS}$ fed as the control signal from the outside, as shown in FIG. 55, the $\overline{CAS}$-system control circuit CTG of the timing generator TG forms the timing signals C1 and C2. On the basis of the aforementioned timing signal C1 and the timing signals R1 and R2 formed by the $\overline{RAS}$-system control circuit RTG, moreover, the $\overline{CAS}$-system control circuit CTG forms internal signals RN, RF and CBR.

Of these, the timing signal C1 is formed in accordance with the column address strobe signal $\overline{CAS}$, and the timing signal C2 is formed in accordance with the former timing signal C1.

On the other hand, the internal signal RN is selectively set to the high level on condition that the timing signal C1 is at the low level when the timing signal R1 is at the high level, namely, that the column address strobe signal $\overline{CAS}$ is not set to the low level prior to the row address strobe signal $\overline{RAS}$. Moreover, the internal signals RF and CBR are selectively set to the high level on condition that the timing signal C1 is at the high level when the timing signal R1 is at the high level, namely, that the column address strobe signal $\overline{CAS}$ is set to the low level prior to the row address strobe signal $\overline{RAS}$. Although internal signal lines for transmitting these internal signals are not shown in FIG. 2 (to prevent undue drawing complexity), these internal signals are fed to the mode control circuit MOD of the timing generator TG so that they are used to set the operation cycle of the dynamic RAM.

(3) $\overline{WE}$-System Control Circuit

Figure 64:
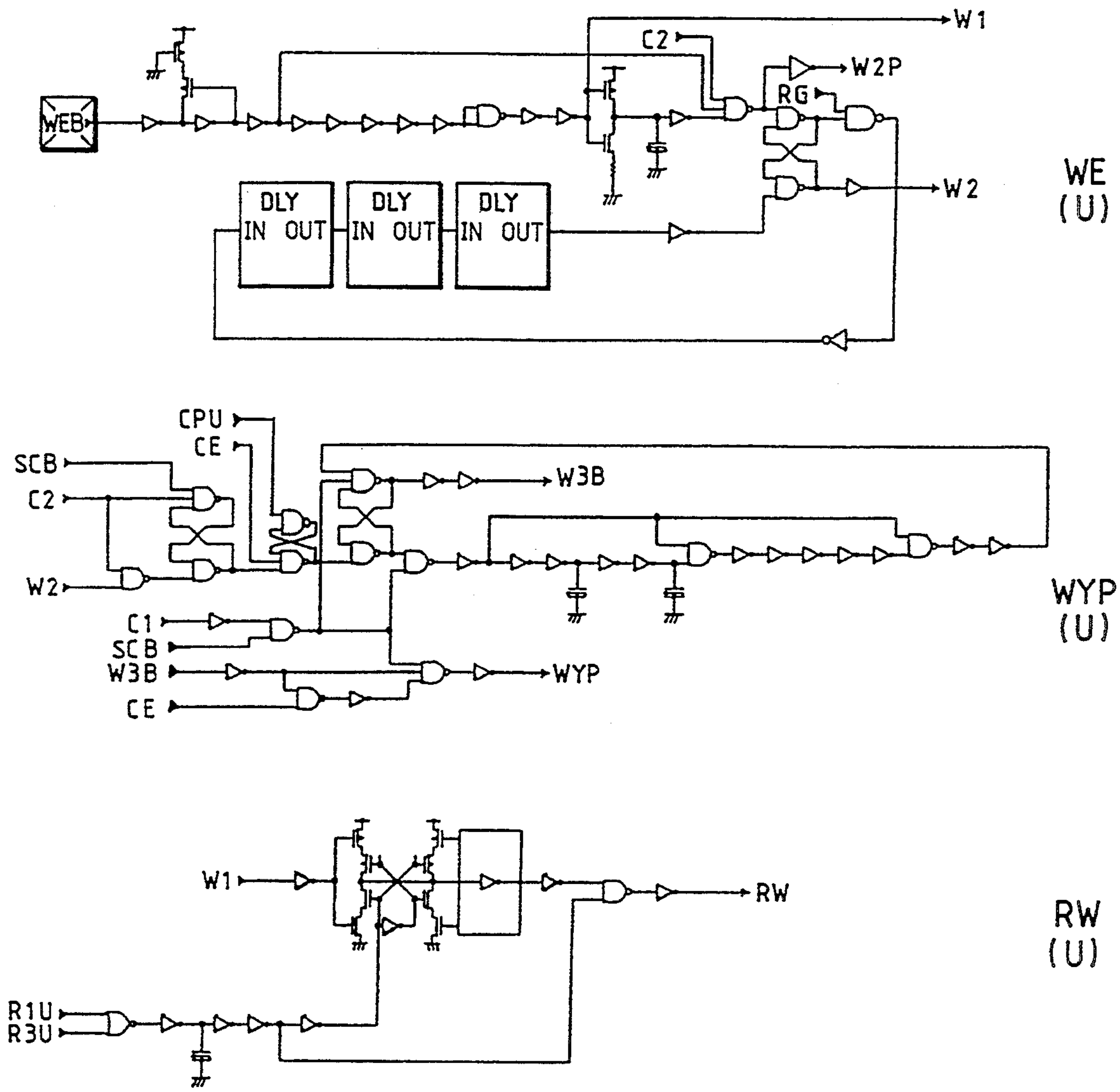
Figure 65:
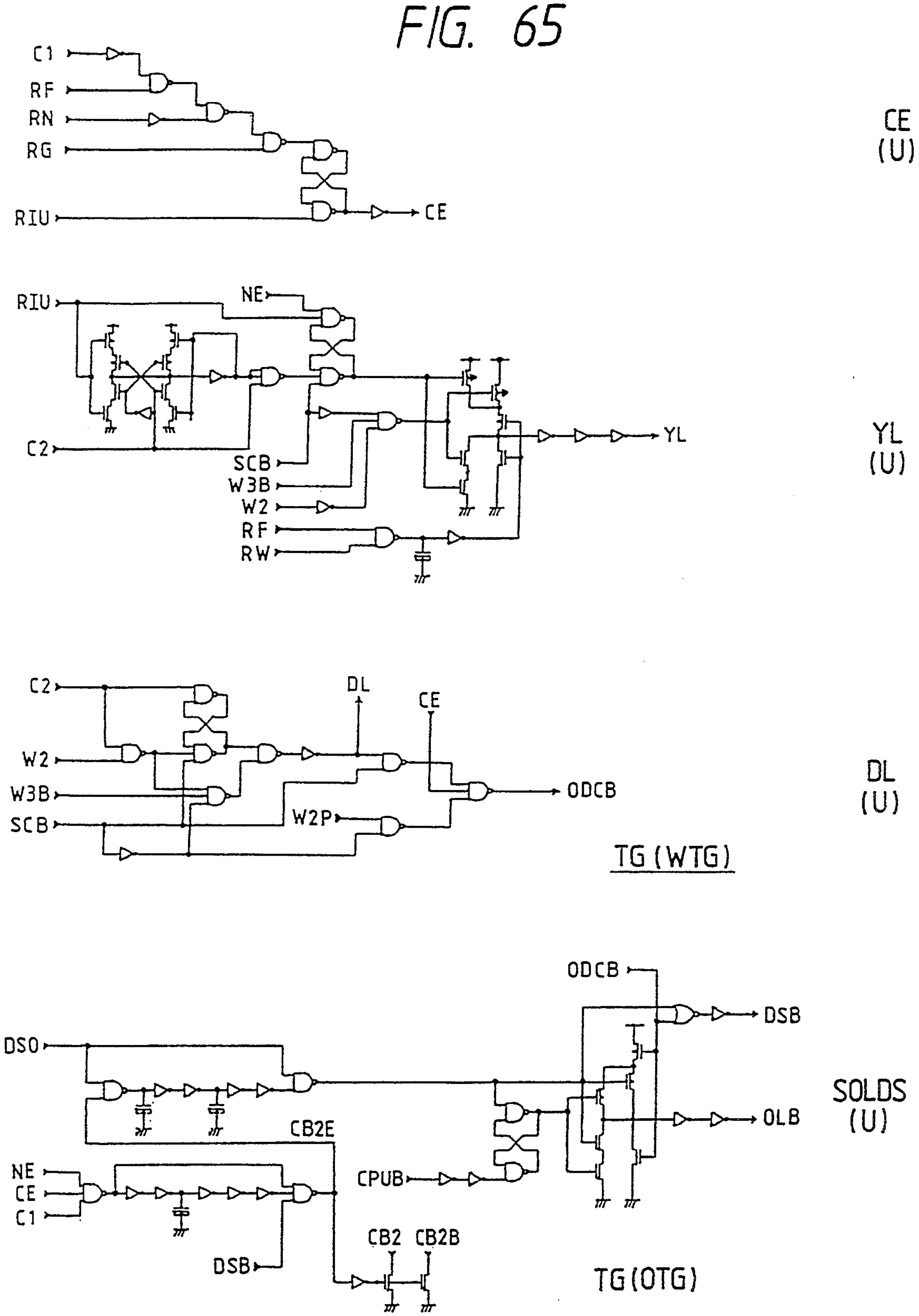

On the basis of the write enable signal $\overline{WE}$ fed from the outside, as shown in FIGS. 64 and 65, the WE-system control circuit WTG of the timing generator TG forms the timing signals W1 to W3 and WYP. The $\overline{WE}$-system control circuit WTG further forms not only the internal signal RW but also the timing signals CE, YL, DL and ODCB.

Of these, the timing signals W1 and W2 are sequentially formed in accordance with the write enable signal $\overline{WE}$, and the timing signal WYP is formed on the basis of the aforementioned timing signal W2 and the timing signal C2 fed from the aforementioned $\overline{CAS}$-system control circuit CTG. The timing signal WYP is used as a write pulse for controlling the writing operations of the dynamic RAM.

Next, the internal signal RW is formed on the basis of the aforementioned timing signal W1 and the timing signals R1 and R3 fed from the aforementioned $\overline{RAS}$-system control circuit RTG. The signal RW is selectively set to the high level on condition that the timing signal W1 is at the high level when the timing; signal R1 is at the high level, namely, that the write enable signal $\overline{WE}$ is set to the low level prior to the row address strobe signal $\overline{RAS}$. The internal signal RW is fed to the mode control circuit MOD so that it is used to set the operation cycle of the dynamic RAM.

The timing signal CE is set to the high level in accordance with the timing signal RG fed from the $\overline{RAS}$-system control circuit RTG and to the low level in accordance with the timing signal R1. This timing signal CE is used as the $\overline{CAS}$-system enable signal. On the other hand, the timing signal YL is formed in accordance with the aforementioned timing signal C2 or W3. The timing signal YL is fed to the Y-address buffer YAB so that it is used for latching the Y-address signals Y0 to Y10.

The timing signal DL is formed in accordance with the aforementioned timing signals C2 and W2 or W3 and is used for fetching the write data for the data input buffers DIB0 to DIB3. Moreover, the timing signal ODCB is formed in accordance with the aforementioned timing signal DL and timing signal CE and is used for the output controlling operation.

(4) Data Output Control Circuit

Figure 66:
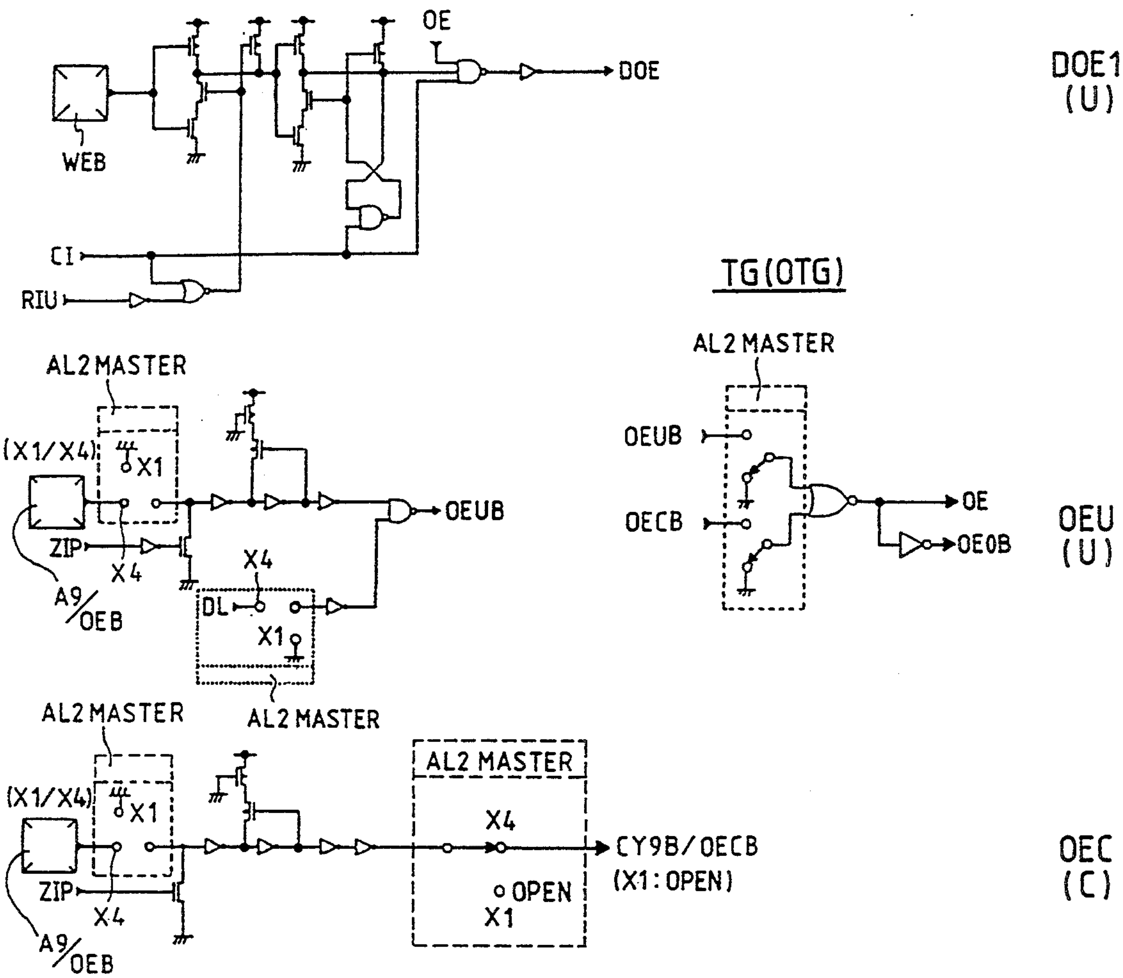

On the basis of either the internal signals DS0 and CPUB fed from the aforementioned main amplifiers MA0 to MA7 or the timing signal C1 (or the output enable signal $\overline{OE}$ in the case of the x 4 bit structure) fed from the aforementioned $\overline{CAS}$-system control circuit CTG, as shown in FIGS. 65 and 66, the data output control circuit OTG of the timing generator TG forms the inverted timing signals DSB and OLB and the timing signal DOE.

Of these, the inverted timing signal DSB is formed into the one-shot pulse formed at the rising edge of the internal signal DS0 and is used as the strobe signal of the internal output data for the data output buffers DOB0 to DOB3. Moreover, the inverted timing signal OLB is formed in accordance with the aforementioned inverted timing signal DSB and the internal signal CPUB and is used for controlling the operations of the output latches of the data output buffers DOB0 to DOB3. When both the inverted timing signals DSB and OLB are at the high level, the uninverted and inverted input/output nodes of the output latches are equalized in the data output buffers DOB0 to DOB3.

On the other hand, the timing signal DOE is set to the high level in accordance with the timing signal C1 when the write enable signal $\overline{WE}$ is at the high level, namely, when the dynamic RAM is in the read cycle. This timing signal DOE is used for controlling the output operations of the data output buffers DOB0 to DOB3.

(5) Mode Control Circuit

Figure 75:
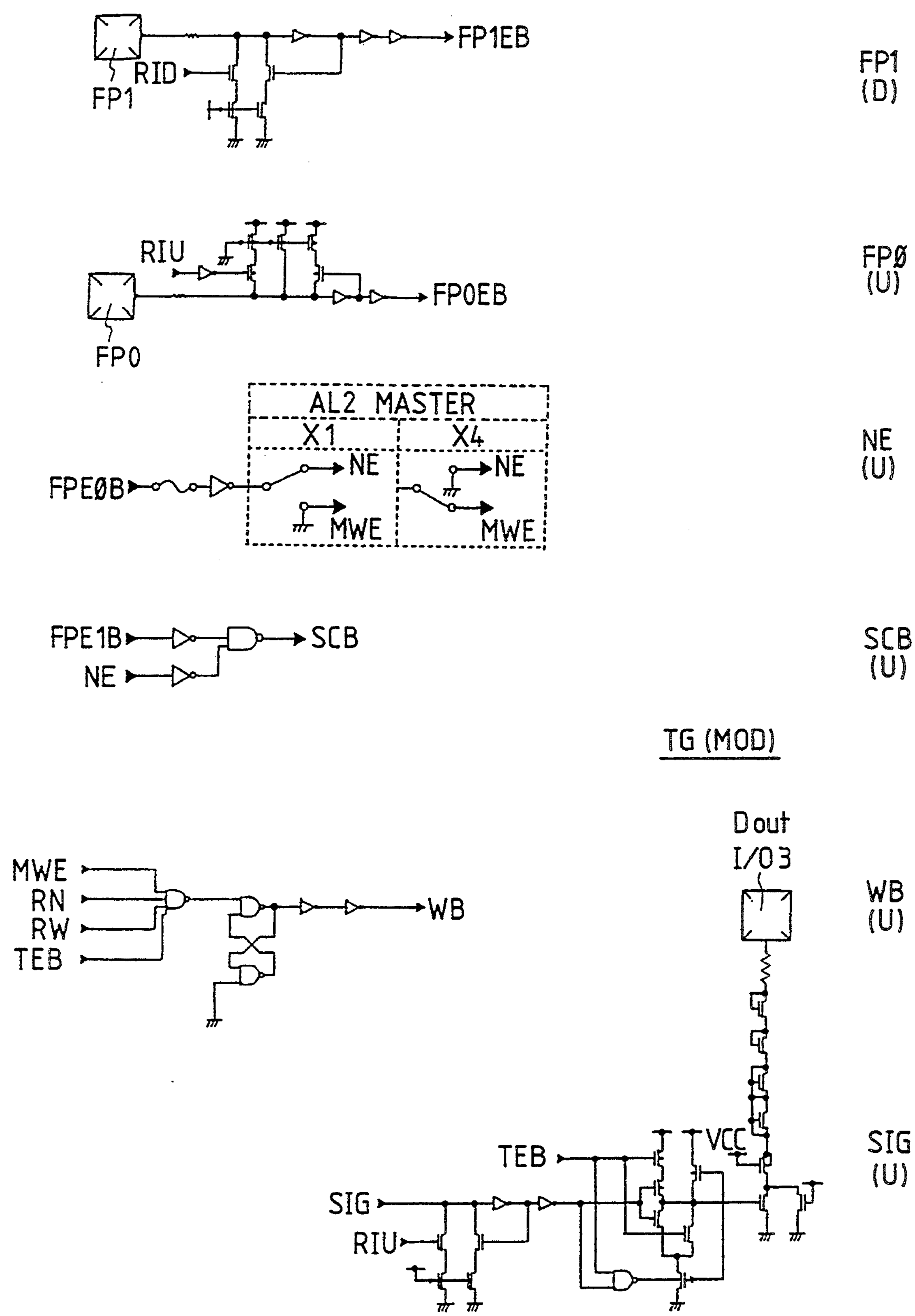

The mode control circuit MOD of the timing generator TG sets the operation mode of the dynamic RAM, as shown in FIGS. 75 and 76, when the bonding pads FP0 and FP1 are selectively bonded to the ground potential VSS or power supply voltage VCC of the circuit. Moreover, the mode control circuit MOD forms the internal signal on the basis of the aforementioned internal signals RN and RW and sets the corresponding test mode when fed with a predetermined test signal or voltage through the testing pads FCK, RCK, ICT and VCF. The mode control circuit MOD is further given a function to switch the package shape-of the dynamic RAM when the pad ZIP is selectively bonded to the power supply voltage VCC of the circuit.

In FIG. 75, the mode control circuit MOD raises both the inverted internal signals FP0EB and FP1EB to the high level when both the pads FP0 and FP1 are opened. As a result, the dynamic RAM is brought into the fast page mode, as tabulated in the foregoing Table 6. Next, the inverted internal signal FP0EB is set to the low level when only the pad FP0 is bonded to the ground potential of the circuit. If the dynamic RAM has the x 1 bit structure, the internal signal NE takes the high level so that the dynamic RAM is brought into the nibble mode. With the x 4 bit structure, on the contrary, the internal signal MWE is set to the high level so that the dynamic RAM is brought into the masked write mode. If, on the contrary, only the pad FP1 is bonded to the power supply voltage VCC of the circuit, the inverted internal signal FP0EB is set to the low level. As a result, the inverted internal signal SCB is set to the low level, on condition that the aforementioned internal signal NE is at the low level, so that the dynamic RAM is brought into the static column mode.

As shown in FIG. 75, the internal signal WB is selectively set to the high level on condition that the aforementioned internal signals MWE and RW and the inverted internal signal TEB are set to the high level and that the internal signal RN is set to the high level, namely, on condition that the row address strobe signal $\overline{RAS}$ is set to the low level subsequent to the write enable signal $\overline{WE}$ and prior to the column address strobe signal $\overline{CAS}$ when the dynamic RAM is in the masked write mode but not in the test mode. This internal signal WB is fed to the data input buffers DIB0 to DIB so that it is used for fetching the mask data in the masked write mode.

The mode control circuit MOD sets the internal signal FCK to the high level l to make the fuse checking test possible when the pad FCK is fed with the power supply voltage VCC of the circuit. At this time, the pad VCF is fed with a predetermined fuse check power supply voltage, as has been described hereinbefore. On the other hand, the mode control circuit MOD sets the internal signal RCK to the high level to make the redundant checking test possible when the pad RCK is fed with the power supply voltage VCC of the circuit. Moreover, the mode control circuit MOD set the internal signal ICT to the low level, when the pad ICT is fed with the power supply voltage VCC of the circuit, to stop the operations of the reference potential generator VL and the substrate back bias voltage generator VBBG selectively. As a result, the standby current of the dynamic RAM can be stopped to confirm the leak current or the like due to the circuit malfunction.

Moreover, the mode control circuit MOD raises the internal signal ZIP to the high level when the pad ZIP is bonded to the power supply voltage VCC of the circuit. In the X-address buffer XAB and Y-address buffer YAB of the dynamic RAM and the CAS-system control circuit CTG of the timing generator TG, the input buffer provided for the ZIP package shape is brought into the operative state to validate the corresponding pad selectively when the aforementioned internal signal ZIP is at the high level. As a result, the package shape of the dynamic RAM is switched to effect the efficient development of the different device kinds.

The mode control circuit MOD includes the voltage generator HVC, the reference potential voltage generator VL and the signature output circuit SIG. Of these, the voltage generator HVC forms the constant voltage HVC of one half as high as the power supply voltage VCC of the circuit. The constant voltage HVC is fed to the precharge circuit of the sense amplifier and as the plate voltage VPL to the memory cells constituting the memory array. The plate voltage VPL is selectively switched between the power supply voltage VCC and the ground potential VSS of the circuit, as has been described hereinbefore, when the dynamic RAM is in the vendor test mode and in the VPL stress mode.

1.2.24. Test Mode Control Circuit

The dynamic RAM has a variety of test modes, as has been described hereinbefore, and is equipped with the test mode control circuit TST for executing those test modes selectively.

As shown in FIG. 72, the test mode control circuit TST is equipped with: a high-voltage detection circuit SVC for discriminating that the data output terminal Dout (i.e., the data input/output terminal I/O3 in the case of the x 4 bit structure) is fed with a predetermined high voltage SVC exceeding the power supply voltage VCC of the circuit; and a set cycle decision circuit FSR and a reset cycle decision circuit FR for deciding the set cycle and reset cycle of each test mode on the basis of the output signal of the high-voltage detection circuit SVC, i.e., the internal signal SVC, the aforementioned internal signals RF and RW and the timing signals R1, RG and C1.

Of these, the high-voltage detection circuit SVC raises its output signal, i.e, the internal signal SVC selectively when the aforementioned data output terminal Dout (or the data input/output terminal I/O3) is fed with the high voltage such as +10 V.

Next, the set cycle decision circuit FSR sets its output signal, i.e., the internal signal FSR selectively to the high level in accordance with the aforementioned internal signal SVC or the inverted internal signal TEB selectively to the low level on condition that the timing signal R1 is at the low level and that both the internal signals RF and RW are at the high level, namely, on condition that the dynamic RAM is in the WCBR cycle.. Specifically, the set cycle decision circuit FSR decides the vendor test mode of the dynamic RAM to raise the internal voltage FSR to the high level when the WCBR cycle is discriminated and when the internal signal SVC is at the high level. When, on the other hand, the WCBR cycle is discriminated and when the internal signal SVC is at the low level, the set cycle decision circuit FSR decides the open test mode of the dynamic RAM and sets the internal signal TEB to the low level. These internal signals FXR and TEB are reset when the output signal of the reset cycle decision circuit FR, i.e, the inverted internal signal FRB is set to the low level.

On the other hand, the reset cycle decision circuit FR sets its output signal, i.e., the inverted internal signal FRB selectively to the low level either on condition that the internal signal RF is at the high level whereas the internal signal RW is at the low level when the timing signal RG is at the high level, namely, that the dynamic RAM is in the CBR refresh cycle and that the timing signal RG is at the high level, or on condition that the timing signal C1 is at the low level whereas the timing signal R1 is at the breaking edge when the timing signal R1 is at the rising edge, namely, that the dynamic RAM is in the RAS only-refresh cycle and that the timing signal R1 is at the low level. When the inverted internal signal FRB is at the low level, as has been described hereinbefore, the vendor test most and the open test mode of the dynamic RAM are released, as has been described hereinbefore.

When the aforementioned internal signal FSR is at the high level, the test mode control circuit TST fetches the test mode setting signal for designating the specific content of the vendor test mode, as shown in FIG. 74. In the vendor test mode, more specifically, the test mode setting signals are fed as the address signals A0 to A10 (or the output enable signal $\overline{OE}$), i.e., the internal address signals AY0 to AY10 (or $\overline{OE}$0B) or BY0 to BY10 so that the test content of the dynamic RAM is set in accordance with the aforementioned Table 8. As a result, the internal signal BTE for designating the 8-bit simultaneous reading test is set to the high level, if the inverted internal address signal AY0UB is at the low level, and the internal signal TRI for designating the ternary test is raised to the high level if the inverted internal address signal AY9UB is at the low level. By the combination of those internal signals BTE and TRI, the 8-bit simultaneous reading test of the binary or ternary outputs of the dynamic RAM is selectively designated. If the internal address signal BY1 is at the low level, on the other hand, the internal signal VPLL for designating the VPL stress mode 1 is set to the low level. If the internal address signal BY2 is at the high level, the internal signal VPLH for designating the VPL stress mode 2 is set to the low level. If, moreover, the internal address signal AY10 (or OE0B) is at the high level, the internal signal VBS for designating the VBB stop mode is set to the high level.

The test mode control circuit TST is further equipped with four test data collation circuits SX4T and one test data collation circuit SX1T for collating the read data to be output ted through the main amplifiers MA0 to MA7 in the aforementioned 8-bit simultaneous read test to transmit the collated results to the corresponding data output buffers DOB0 to DOB3. The outputs of those test data collation circuits are logically coupled together with the output terminals of the aforementioned coupling circuits CBS0 to CBS7 to the-complementary input terminals of the corresponding data output buffers DOB0 to DOB3.

Figure 73:
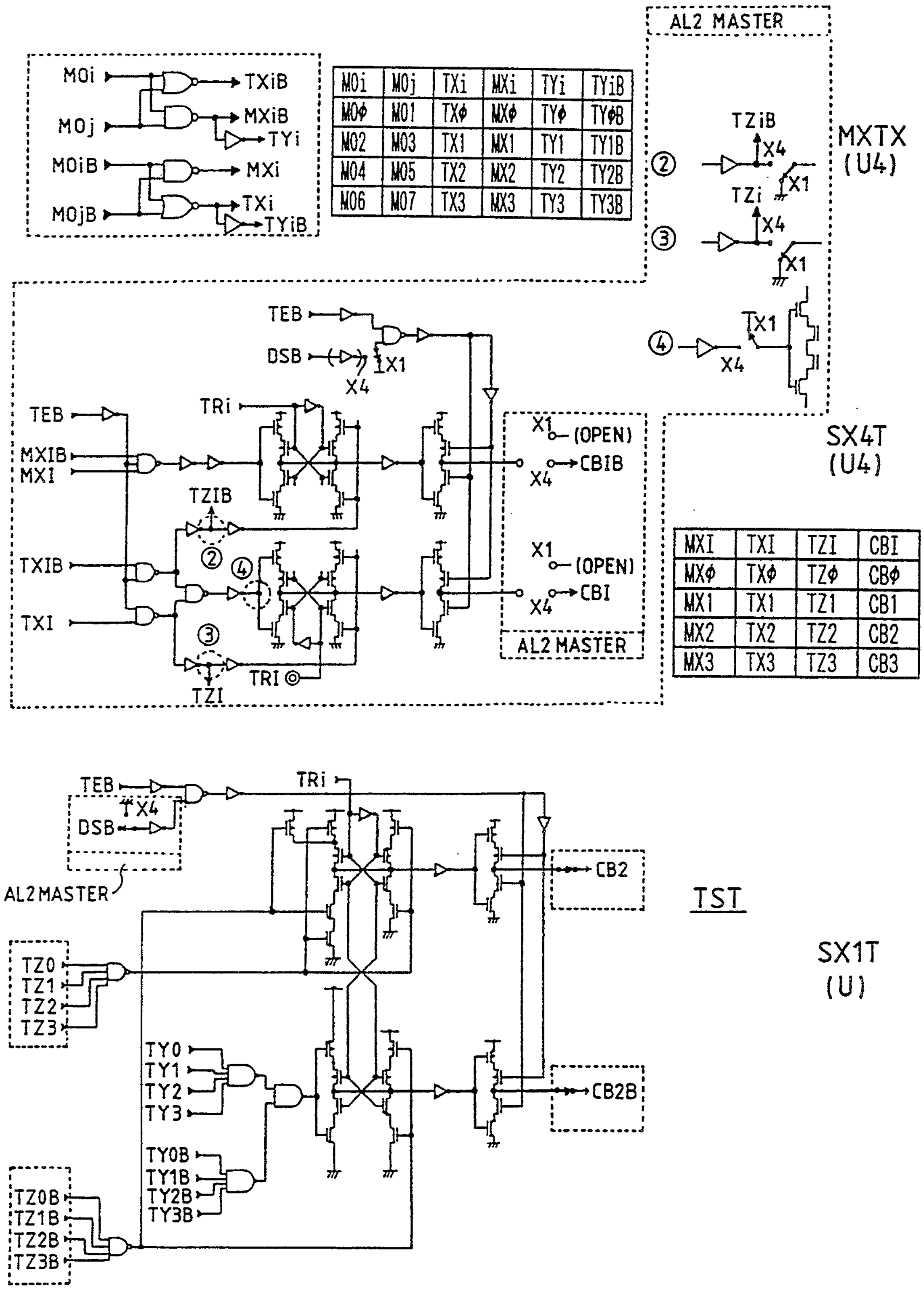

The test data collation circuit SX4T is selectively brought into the operative state, when the dynamic RAM has the x 4 bit structure, to form the complementary output signals CB0 to CB3 selectively, as shown in FIG. 73, in response to the complementary output signals MO0 and MO1 to MO6 and MO7 of the corresponding two main amplifiers MA0 and MA1 to MA6 and MA7. In case the dynamic RAM has the x 4 bit structure and is in the open test mode or the binary test mode of the vendor test, the test data collation circuit SX4T sets its complementary output signal to the logic "1", if the corresponding 2-bit read data are coincident, and to the logic "0" if incoincident. In case the dynamic RAM has the x 4 bit structure and is in the ternary test mode of the vendor test, the test data collation circuit SX4T sets its complementary output signal to the logic "1" or "0" in accordance with the read data, if the corresponding 2-bit read data are coincident, and brings the same output signal into the high-impedance state if incoincident.

When the dynamic RAM has the x 1 bit structure, on the other hand, the test data collation circuit SX1T is selectively brought into the operative state, as shown in FIG. 73, to form the complementary output signal CB2 in response to the complementary output signals MO0 to MO7 of the eight main amplifiers MA0 to MA7. In case the dynamic RAM has the x 1 bit structure and in the open test mode or the binary test mode of the vendor test, the test data collation circuit SX1T sets its complementary output signal CB2 to the logic "1", if all the 8-bit read data are coincident, and the same to the logic "0" if incoincident. In case the dynamic RAM has the x 4 bit structure and in the ternary test mode of the vendor test, the test data collation circuit SX1T sets its complementary output signal CB2 to the logic "1" or "0" in accordance with the read data, if all the 8-bit read data are coincident, and brings the same output signal CB2 into the high-impedance state if incoincident.

1.2.25. Substrate Back Bias Voltage Generator

The dynamic RAM has a built-in substrate back bias voltage generator VBBG for forming a substrate back bias voltage VBB at a predetermined negative voltage on the basis of the power supply voltage VCC of the circuit.

Figure 77:
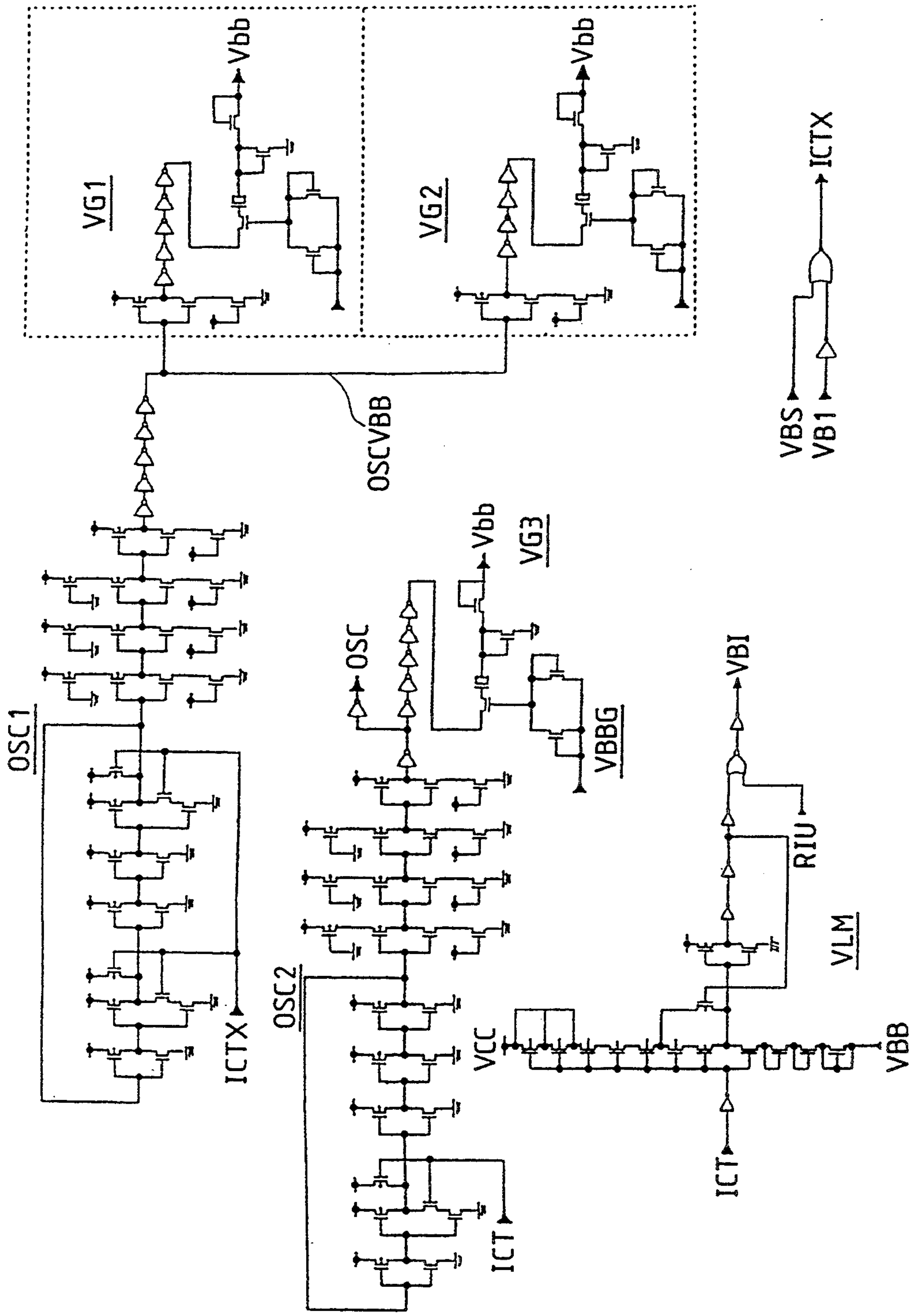

This substrate back bias voltage generator VBBG is equipped, as shown in FIG. 77, with: one level detection circuit LVM; two oscillation circuits OSC1 and OSC2; and three voltage generators VG1 (i.e., the first voltage generator), VG2 (i.e., the second voltage generator) and VG3 (i.e., the third voltage generator), although not especially limitative thereto.

The level detector VLM is selectively brought into the operative state when it is fed with the internal signal ICT at the high level from the aforementioned test mode control circuit TST. In this operative state, the level detection circuit VLM discriminates that the absolute value of the substrate back bias voltage VBB is equal to or lower than a predetermined value, to set its output signal, i.e., the internal VBI selectively to the high level. This internal signal VBI is forcibly set to the high level independently of the substrate back bias voltage VBB when the dynamic RAM is brought into the selected state and when the aforementioned timing signal R1 is at the high level.

The oscillation circuit OSC1 includes five CMOS logic gate circuits which are coupled in a ring shape to constitute one ring oscillator. This ring oscillator is selectively brought into the operative state to form a pulse signal having a predetermined frequency on condition that the aforementioned internal signal VB1 is at the high level whereas the aforementioned internal signal VBS is at the low level. The aforementioned pulse signal is fed at one hand through nine steps of series inverter circuits and then six steps of inverter circuits to the voltage generator VG1 and at the other through five steps of inverter circuits to the voltage generator VG2. As a result, the pulse signal to be fed to the voltage generators VG1 and VG2 is made to have a phase difference of 180 degrees.

The voltage generators VG1 and VG2 contain predetermined boost capacities to form the substrate back bias voltage VBB in accordance with the corresponding aforementioned pulse signals. Here, these pulse signals suppress the fluctuations of the substrate back bias voltage VBB because of their phase difference of 180 degrees to stabilize the operations of the dynamic RAM better.

On the other hand, the oscillation circuit OSC2 is made to have a circuit structure similar to that of the aforementioned oscillation circuit OSC1 and is steadily brought into the operative state on condition that the aforementioned internal signal ICT is at the high level. In this operative state, the oscillation circuit OSC2 forms the pulse signal having a predetermined frequency and feeds it to the voltage generator VG3.

This voltage generator VG3 is made to have a circuit structure similar to those of the aforementioned voltage generators VG1 and VG2 to form the aforementioned substrate back bias voltage VBB on the basis of the pulse signal fed from the oscillation circuit OSC2. In this embodiment, the voltage generator VG3 is designed to have a smaller current feeding ability than those of the aforementioned voltage generators VG1 and VG2.

Figure 100:
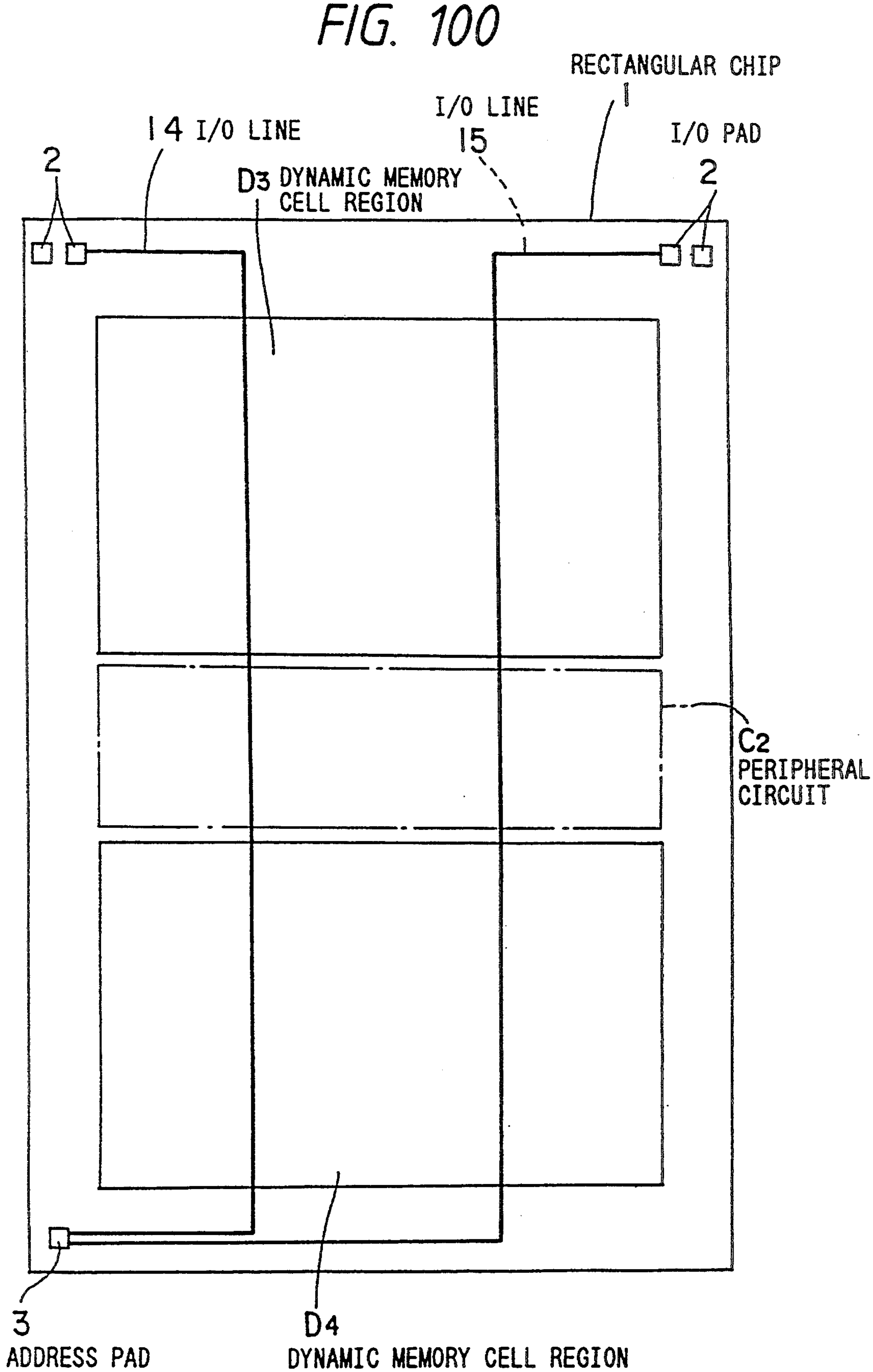
FIG. 100 is a schematic diagram showing one embodiment of the semiconductor device according to the present invention.

FIG. 100 shows another embodiment of the present invention. Before this embodiment is described, first reference will be made to FIG. 105 so as to explain a semiconductor device having the dynamic RAN, which has been conceived by us prior to the present invention.

There is conceived a semiconductor device in which a rectangular chip has its two longitudinal ends arranged with dynamic memory cell regions and its central portion arranged with a peripheral circuit. This semiconductor device is exemplified in FIG. 105.

Figure 105:
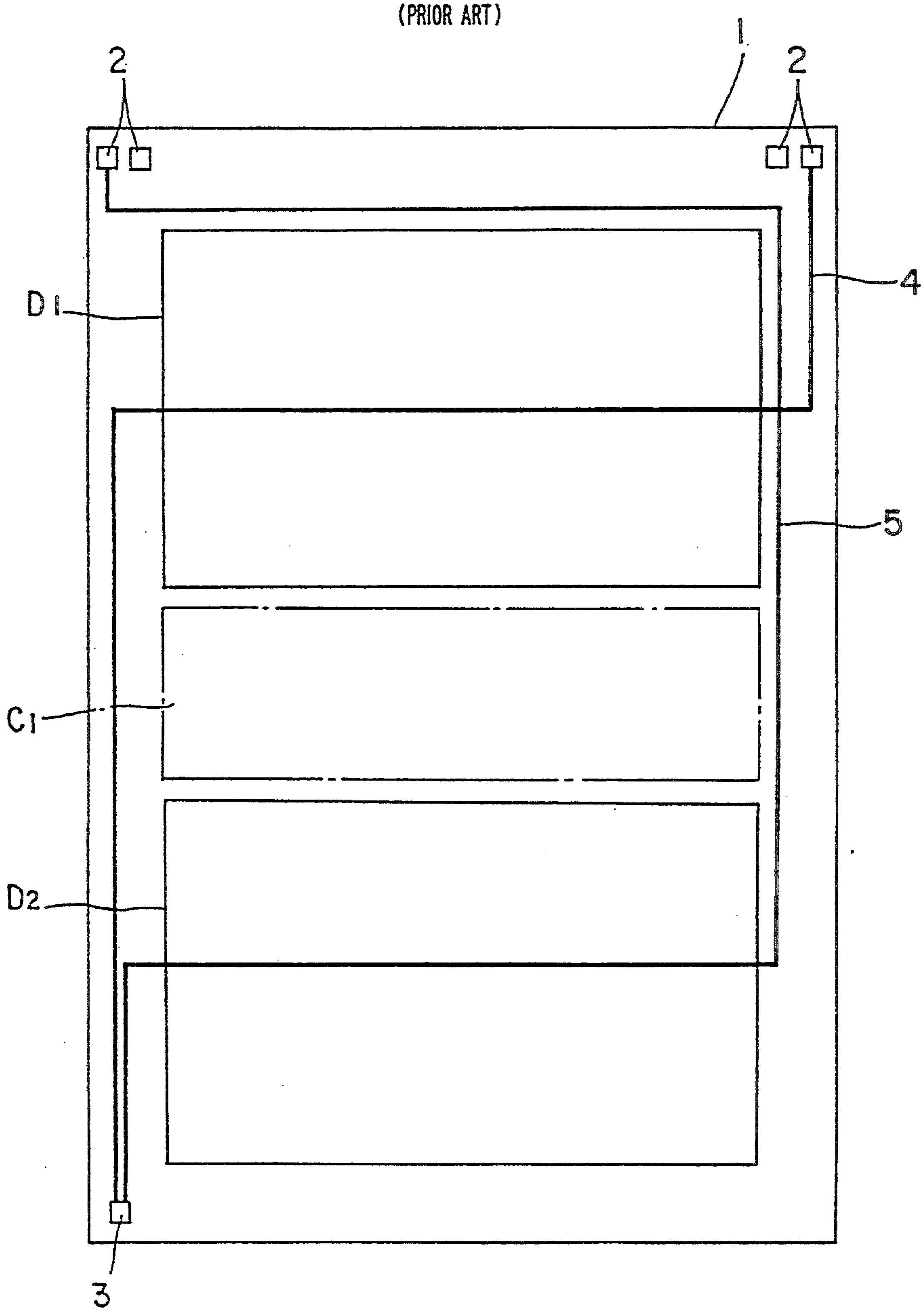
FIG. 105 is a schematic diagram showing the semiconductor device which was conceived by the inventors prior to the present invention.

In FIG. 105, reference numeral 1 designates a rectangular chip which has its two longitudinal ends formed with dynamic memory cells D1 and D2 and its central portion formed with a peripheral circuit C1, as indicated by single-dotted lines. The memory cells in the aforementioned dynamic memory cell regions D1 and D2 are arranged in an array form, and the (not-shown) word lines arranged therein are arranged in parallel with the shorter sides (i.e., rightward or leftward of FIG. 105) of the chip 1 (whereas the data lines are in parallel with the longer sides of the chip 1). Reference numeral 2 designates the I/O pads which are formed at the two corners of one longitudinal (or vertical of FIG. 105) end of the chip 1. Numeral 3 designates an input address pad which is formed at the corner of the other end. The address pad 3 and the aforementioned I/O pads 2 are individually connected by I/O lines 4 and 5. These I/O lines 4 and 5 are lines for transmit ting the data which are read out from the memory cells in the memory cell regions D1 and D2, respectively, and are arranged in parallel with the word lines which are formed in said memory cell regions D1 and D2.

Thus, in the semiconductor device shown in FIG. 105, the memory cells in the dynamic memory cell regions D1 and D2 are arranged transversely such that the word lines arranged therein are in parallel with the shorter sides of the chip 1.

However, we have found that the semiconductor device of FIG. 105 have the following problems.

In case the memory cells are transversely arranged, as described above, the I/O lines 4 and 5 extending in the memory regions D1 and D2 have to be arranged in parallel with the word lines. Since, moreover, the I/O pads 2 and the address pad 3 have already been formed at the two longitudinal ends portions of the chip 1, as shown in FIG. 105, the lengths of the I/O lines 4 and 5 taken in the shorter side direction of the chip 1 are required to be as large as that between the two shorter end portions of the chip 1, and at least one (e.g., the I/O line 5 in FIG. 105) of the I/O lines 4 and 5 has to be uselessly led about in the shorter side direction of the chip 1, thus raising a problem that the address accessing speed is dropped.

Therefore, the following arrangement is taken in the present embodiment.

The rectangular chip is formed thereover with dynamic memory cell regions at its two longitudinal ends and with a peripheral circuit at its central portion. The I/O pads and address pad, which are formed at the two longitudinal ends of the chip, are connected. The I/O lines are arranged in parallel with the word lines which are formed in the dynamic memory cell regions. The semiconductor device thus constructed has its dynamic memory cell regions formed such that the word lines are in parallel with the longer sides of the chip. Thus, the dynamic memory cell regions are formed to have the word lines in parallel with the longer sides of the chip. As a result, the I/O lines arranged in parallel with the word lines in the dynamic memory cell regions are also directed in parallel with the longer sides of the chip in said regions. Since the I/O lines in the memory cell regions divided and arranged at the two ends are connected straight, their length taken in the direction of the shorter sides of the chip can be suppressed within that between the two ends of the memory cell regions in the direction of the shorter sides of the chip at the longest although their length taken in the direction of the longer sides is kept unchanged from that of FIG. 105. As a result, the lengths of the I/O lines can be shorter than those of FIG. 105 to speed up the address access.

The present embodiment will be described in the following with reference to FIG. 100.

FIG. 100 shows the embodiment of the semiconductor for embodiment according to the present invention, as will be summarized in the following.

In FIG. 100, reference numeral 1 designates a rectangular chip which has its two longitudinal ends formed with dynamic memory cells D3 and D4 and its central portion formed with a peripheral circuit C2, as indicated by single-dotted lines. The memory cells in the aforementioned dynamic memory cell regions D3 and D4 are arranged in an array form, and the word lines (although not shown so as to avoid complexity) arranged therein are arranged in parallel with the longer sides (i.e., upward or downward of FIG. 100) of the chip 1 (whereas the data lines are in parallel with the shorter sides of the chip 1). Reference numeral 2 designates the I/O pads which are formed at the two corners of one longitudinal end of the chip 1. Numeral 3 designates an input address pad which is formed at the corner of the other end. The address pad 3 and the aforementioned I/O pads 2 are individually connected by I/O lines 14 and 15. These I/O lines 14 and 15 are lines for transmitting the data which are read out from the memory cells in the memory cell regions D3 and D4, respectively, and are arranged in parallel with the word lines which are formed in said memory cell regions D3 and D4.

Thus, in the present embodiment, the memory cells in the dynamic memory cell regions D3 and D4 are arranged longitudinally unlike the transverse arrangement of FIG. 105 such that their inside word lines are in parallel with the longer sides of the chip 1. As a result, the I/O lines arranged in the dynamic memory cell regions D3 and D4 in parallel with the word lines are accordingly arranged in parallel with the longer sides of the chip 1 in said regions D3 and D4. Since, moreover, the I/O lines in the memory cell regions D3 and D4 divided and arranged at the two ends are (or can be) connected so straight to have the minimum length, the I/O lines 14 and 15 have their lengths unchanged (not increased) in the longer side direction of the chip 1 from that of the I/O lines 4 and 5 of FIG. 105 but suppressed in the shorter side direction of the chip 1 within that between the two ends of the memory cell regions D3 and D4 at the longest. Since the length of the I/O line 14 in the shorter side direction of the chip 1 is far shorter than those of the I/O lines of FIG. 105, the total of the lengths of the I/O lines 14 and 15 is drastically reduced from that of the I/O lines 4 and 5 of FIG. 105 so that the speed-up of the address access is realized.

Figure 101:
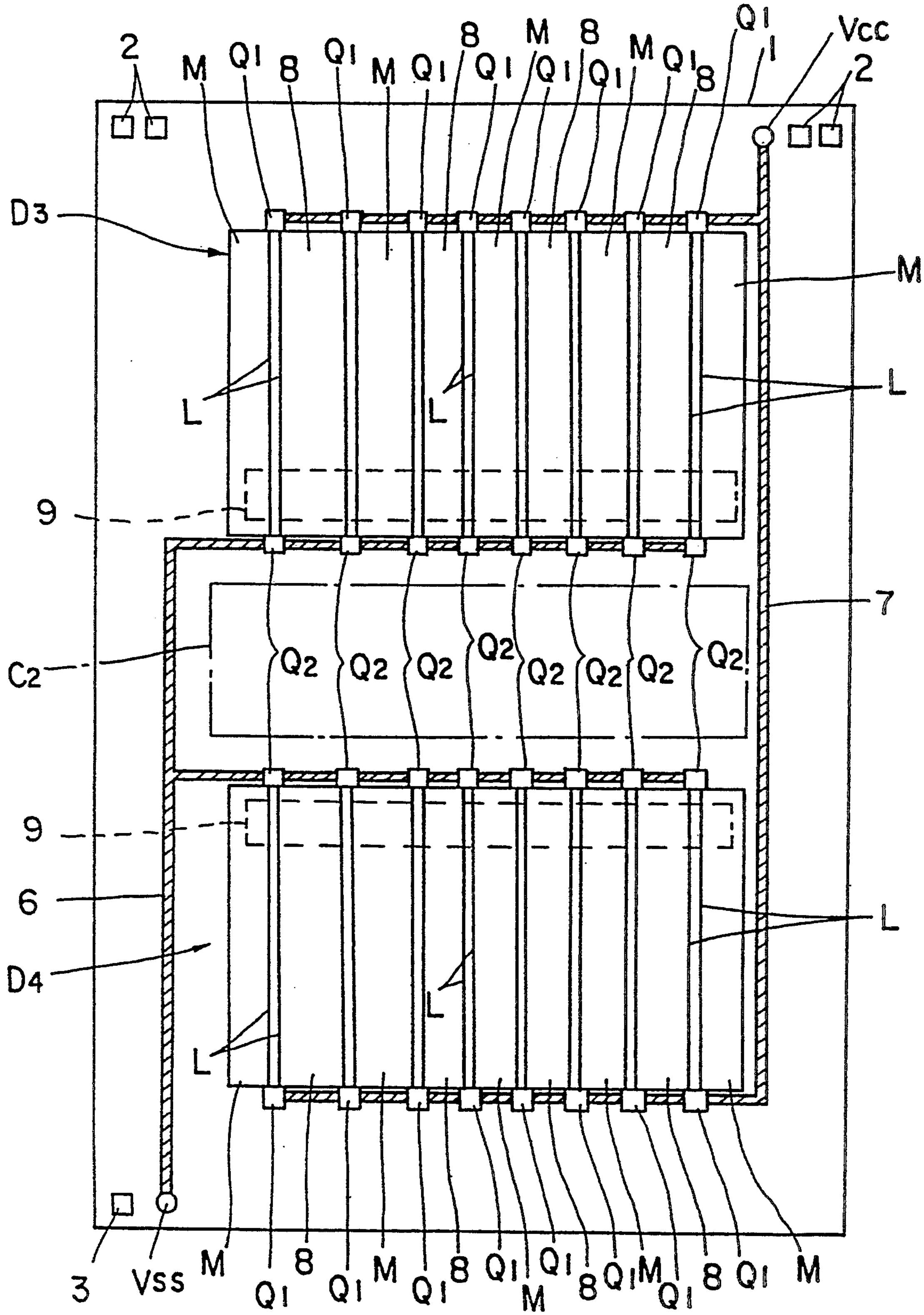
FIG. 101 is a detailed diagram showing the embodiment of FIG. 100.

FIG. 101 is a detailed diagram showing the embodiment of FIG. 100.

As shown, the dynamic memory cell regions D3 and D4 thus arranged longitudinally are individually divided into a number of memory cells M arranged in an array shape, Y-decoders 8 and X-decoders 9. The memory cells M and Y-decoders 8 are divided by two common source lines L and L which are arranged in parallel with the word lines (although not shown). These common source lines L and L are connected with the sense amplifiers (or the flip-flops of the CMOS) in the dynamic memory cell regions D3 and D4. The common source lines L and L have their two ends connected with common source driving MISFETs Q1 and Q2 which are arranged at the end portions in parallel with the shorter sides of the dynamic memory cell regions D3 and D4. Those common source driving MISFETs Q1 and MISFETs Q2 are individually connected in series with one another. These wiring lines connecting the common source-driving MISFETs Q1 and MISFETs Q2 are connected with charge and discharge wiring lines 7 and 6, respectively, which are formed along the end portions taken in the shorter side direction of the chip 1. The charge wiring line 7 is connected with the power supply voltage VCC whereas the discharge wiring line 6 is connected with the ground potential VSS. Moreover, the drive of the aforementioned sense amplifiers is accomplished by controlling the ON and OFF of the common source driving MISFETs Q1 and Q2.

Here in FIG. 101, the I/O lines are not shown so as to avoid the complexity, but it should be understood that the I/O lines 14 and 15 similar to those shown in FIG. 100 are arranged in FIG. 101, too.

Thus, the semiconductor device of FIG. 100 is constructed, as detailed in FIG. 101.

Figure 102:
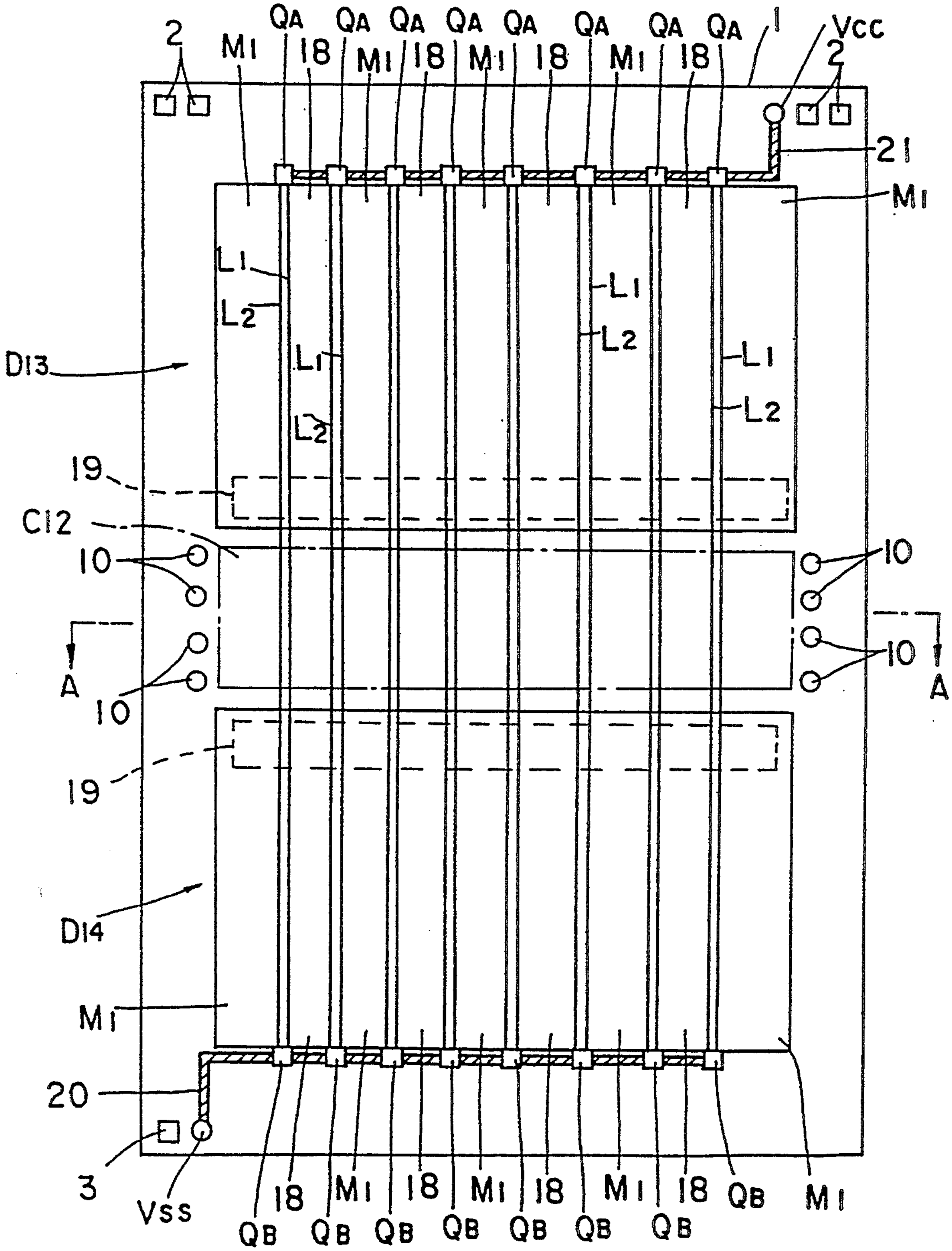
FIG. 102 is a detailed diagram showing a modification of FIG. 101.

FIG. 102 shows a modification of FIG. 101.

This modification is different from the semiconductor device shown in FIG. 101 in that the common source driving MISFETs for driving the sense amplifiers in the dynamic memory cell regions D13 and D14 divided and arranged at the two longitudinal ends of the rectangular chip 1 are arranged at the end portions of the dynamic memory cell regions D13 and D14 taken in the longer sides of the chip 1, as shown, so that those common source driving MISFETs QA and QB at the two ends may be connected straight by the common source lines L1 and L2. Here, the common source driving MISFETs QA and MISFETs QB are connected in series with one another, as shown, and the wiring lines 21 and 20 connecting those common source driving MISFETs QA and QB are directly connected with the power supply voltage VCC and the ground potential VSS, respectively, which are arranged in the vicinity thereof.

Incidentally, reference characters M1, 18 and 19 designate memory cells, Y-decoders and X-decoders, which are individually formed in the dynamic memory cell regions D13 and D14. Moreover, the I/O lines are also not shown in FIG. 102 like FIG. 101 so as to avoid the complexity, but it is quite natural that the I/O lines 14 and 15 similar to those of FIG. 100 are arranged in FIG. 102, too.

In the semiconductor device thus constructed, as shown in FIG. 102, the common source driving MISFETs QA and QB are arranged at the individual end portions of the dynamic memory cell regions D13 and D14 at the longer side of the chip 1 so that they are connected straight by the common source lines L1 and L2. This makes it possible to eliminate the common source driving MISFETs Q2 which are arranged at the inner end portions of the dynamic memory cell regions D13 and D14 in parallel with the shorter sides of the chip 1, as shown in FIG. 102. As a result, the area of the dynamic memory cell regions D13 and D14 taken in the longer side direction of the chip 1 can be made larger than that of FIG. 101 while simplifying the drive circuit. In addition, this structure can make the charge and discharge wiring lines 7 and 6 of FIG. 101 unnecessary so that the area of the dynamic memory cell regions D13 and D14 taken in the shorter side direction of the chip 1 can be made larger than that of FIG. 101 while reducing the noises to be caused in the wiring lines.

Here, the common source lines L1 and L2 to be connected with the sense amplifiers are intersected, although not shown so, around the peripheral circuit C1 arranged at the center, thus taking the so-called "twist sense system".

Figure 103:
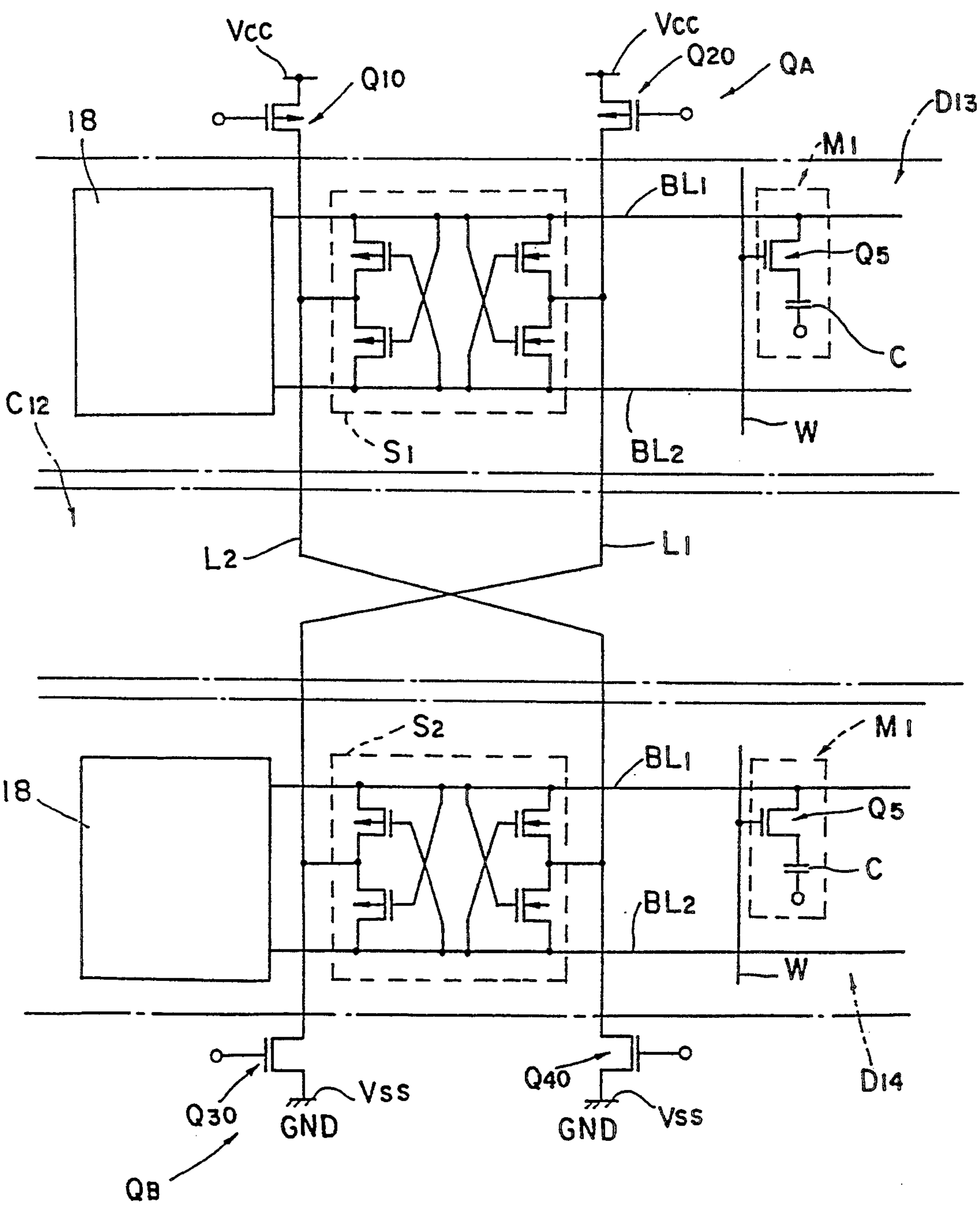
FIG. 103 is a circuit diagram showing an essential portion of FIG. 102.

The essential portion of the semiconductor device of FIG. 102 adopting the twist sense system is shown in the form of a circuit diagram in FIG. 103.

As shown in FIG. 103, each of the common source driving MISFETs QA and QB of FIG. 102 is actually composed of two common source driving MISFETs Q10 and Q20, and Q30 nd Q40. The common source line L2 connecting the common source driving MISFETs Q10 and Q40 and the common source line L1 connecting the common source driving MISFETs Q20 and Q30 are intersected, as shown, around the peripheral circuit C12. The sense amplifier S1 is connected with the common source lines L1 and L2 at the dynamic memory cell region D13, and the sense amplifier S2 is connected with the common source lines L1 and L2 at the dynamic memory cell region D14. Although only one sense amplifier is shown in each region D13 or D14 so as to avoid the complexity from FIG. 103, it is a practical fact that a number of sense amplifiers are connected with the common source lines L1 and L2 through said common source lines L1 and L2. Those sense amplifiers S1 and S2 are also connected with a pair of data lines BL1 and BL2 arranged in the array, and each data line BL1 or BL2 is connected with the memory cell M1, which is composed of the switch MISFET Q5 and the capacitor C, and the aforementioned Y-decoder 18. The aforementioned common source driving MISFETs Q10 and Q20 are connected with the power supply voltage VCC, and the common source driving MISFETs Q30 and Q40 are connected with the ground potential VSS.

As a result, when the common source driving MISFETs Q10 and Q30 are turned on, the sense amplifier S1 in the dynamic memory cell region D13 is brought into the operative state whereas the sense amplifier S2 in the dynamic memory cell region D14 is turned off. When the common source driving MISFETs Q20 and Q40 are turned off, the sense amplifier S2 in the dynamic memory cell region D14 is brought into the operative state whereas the sense amplifier S1 in the dynamic memory cell region D13 is turned off.

Thus, since the semiconductor device shown in FIG. 103 adopts the twist sense system, the sense amplifiers always operate only at one side (not two sides) of the dynamic memory cell region so that the amount of charge to be extracted by the sense amplifiers is reduced to speed up the operations.

In the semiconductor device shown in FIG. 102, moreover, the common source lines L1 and L2 extend over the peripheral circuit C2 so that this peripheral circuit C12 need not be divided by the common source lines L1 and L2, thus raising an advantage that the region of the peripheral circuit C12 can be effectively utilized all over.

Figure 104:
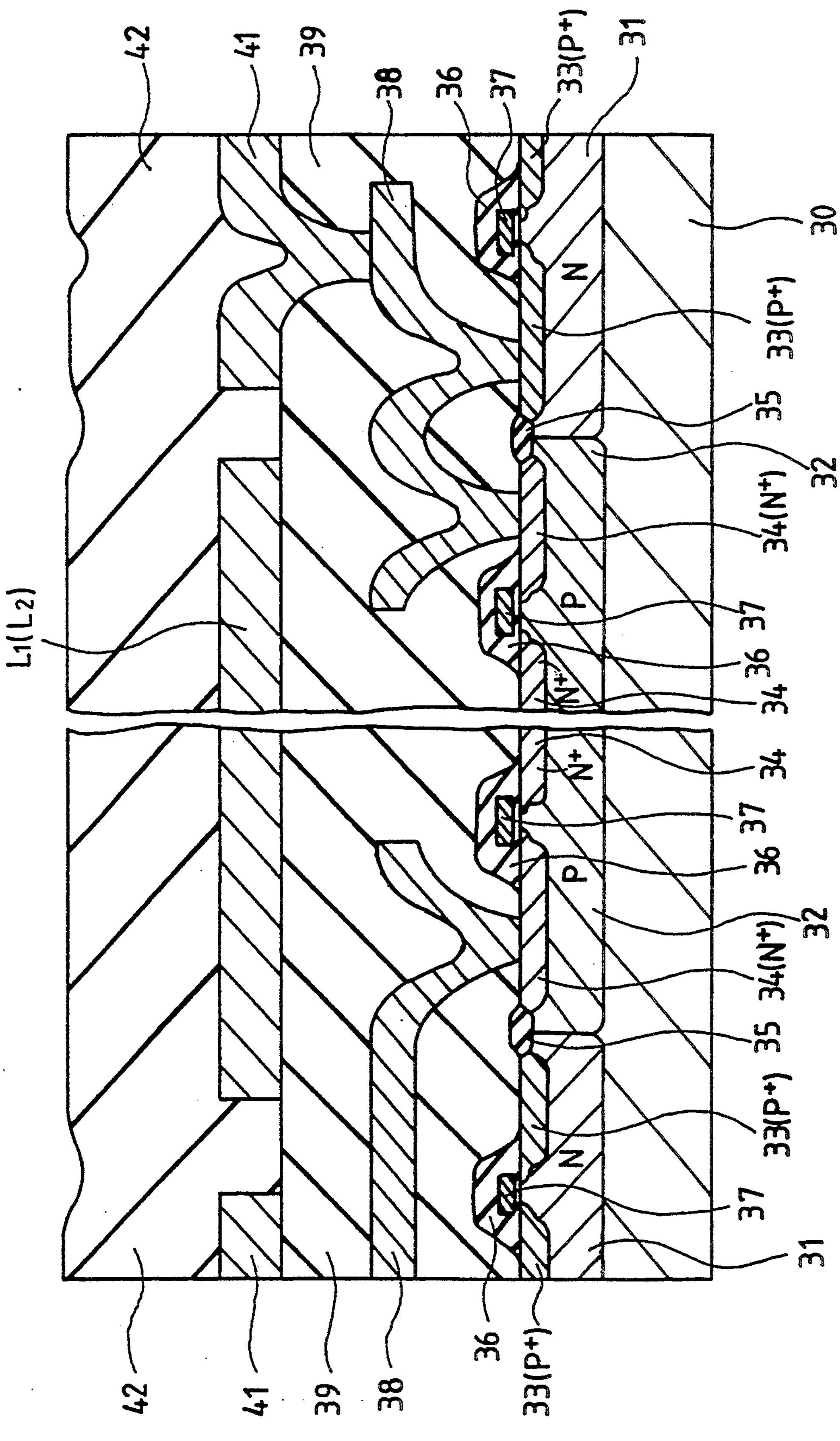
FIG. 104 is a section taken along line A—A of FIG. 102.

As shown in FIG. 104, more specifically, the semiconductor device takes a multi-layered wiring structure (having two layers in the present modification), in which a first wiring layer 38 is used as a specific one for contacting with diffusion layers 33 and 34 formed over a substrate 30 as the peripheral circuit C12 whereas a second wiring layer made of aluminum is partially used as the common source lines L1 and L2. As a result, these common source lines L1 and L2 do not divide the peripheral circuit C12 but can make effective use of the whole region of the peripheral circuit C12. Here: reference numerals designate N-well ad P-well formed in the substrate, respectively; numeral 35 a field insulating film for element separation; numeral 37 a gate electrode; numeral 38 an insulating film formed around the gate electrode 37; numeral 39 an inter-layer insulating film formed on the upper and lower faces of the first wiring layer 38; numeral 41 a wiring layer for the peripheral circuit C12 formed in the same (or second) layer as the common source lines L1 and L2; and numeral 42 a passivation film formed on the upper faces of the second layer.

Despite of this structure, however, the present modification can naturally be applied to the semiconductor device having a single-layer structure. In this application, no circuit element can be formed below the common source lines L1 and L2, but the peripheral circuit C12 is divided by the common source lines L1 and L2 so that the degree of usage of the region of the peripheral circuit C12 is dropped.

The following advantage can be attained in the semiconductor device shown in FIG. 102.

Since the bonding pads 10 for the peripheral circuit C12 are arranged in the vicinity of the two end portions of the peripheral circuit C12 in the shorter side direction of the chip 1, the connection between the inner leads (although not shown) arranged in the vicinity of the longer center of the chip 1 and said bonding pads 10 is improved better, and the distance between the inner leads and the bonding pads 10 is remarkably shortened to speed up the operations.

The following effects can be attained by applying the present invention to the semiconductor memory device such as the dynamic RAM, as has been described in the foregoing embodiments.

(1) In the dynamic RAM having a plurality of package specifications, there is prepared a common semiconductor substrate comprising: a plurality of bonding pads arranged in the optimum positions corresponding to the individual package shapes; a plurality of buffers provided for those bonding pads; and a controlling bonding pad for validating said plural buffers, i.e., said plural bonding pads, selectively by executing a corresponding predetermined bonding in a selective manner. Since a plurality of package specifications can be realized on the basis of one common semiconductor substrate, there can be attained an effect that different kinds of the dynamic RAM having the plural package specifications can be efficiently developed.

(2) In the aforementioned item (1), the plural buffers are arranged in the vicinity of the corresponding bonding pads and have their output terminals connected logically. As a result, there can be attained an effect that the transmission delay time of input or output signals can be shortened to speed up the operations of the dynamic RAM accordingly.

(3) The output terminals of the individual unit circuits of the X-address buffers and the output terminals of the corresponding unit circuits of the refresh counters are logically connected. As a result, there can be attained an effect that the transmission delay time of the X-address signals can be shortened to speed up the operations of the dynamic RAM.

(4) The address transition detection circuit is constructed of a plurality of unit circuits provided for one or more address input pads dispersedly arranged over the semiconductor substrate surface, and a common circuit made receptive of the output signals of the unit circuits. The plural unit circuits are arranged in the vicinity of the corresponding address input pads, and the common circuit is arranged generally at the central portion of the semiconductor substrate surface. As a result, there can be attained an effect that the transmission delay time of the address signals can be shortened to speed up the operations of the address transition detection circuit, (5) The memory array of the dynamic RAM is constructed of the divided word line system, in which it is divided into at least two halves by the center line extending in parallel with the shorter sides of the semiconductor substrate surface. Moreover, a portion of the peripheral circuit including the word line drive circuit is arranged along the aforementioned central line, and the memory arrays are arranged such that they intersect a portion of the aforementioned peripheral circuit and such that the word lines are symmetrically extended toward the individual shorter sides-of the semiconductor substrate surface. As a result, there can be attained an effect that the transmission delay time of the selection signals of the X-system selection circuit can be shortened to speed up the operations of the access time of dynamic RAM.

(6) In the aforementioned i tern (5), the unit circuits such as the word line drive circuit constituting the X-system selection circuit, the X-predecoder and the X-system redundant circuit are arranged symmetrically with respect to the center line in parallel with the shorter sides of the semiconductor substrate surface. As a result, there can be attained an effect that the layout of the peripheral circuit such as the dynamic RAM and the layout design can be efficiently accomplished.

(7) The memory arrays are divided into at least four and arranged by two center lines in parallel with the shorter and longer sides of the semiconductor substrate surface. Moreover, a portion of the peripheral circuit is arranged along the center line in parallel with the shorter sides of the semiconductor substrate surface, and another portion of the peripheral circuit is arranged in parallel with the individual shorter sides of the semiconductor substrate surface outside of the memory arrays. Moreover, the power supply trunk lines for feeding the power supply voltage or ground potential of the circuit to those peripheral circuits and memory arrays are composed of: the first power supply lines arranged alone the center line in parallel with the longer sides of the semiconductor substrate surface; and a plurality of power supply lines arranged along one or another portion of the peripheral circuit and commonly connected through the first power supply line in the form of the Japanese letter " 工 ". As a result, there can be attained an effect that the synthetic impedance of the power supply trunk lines can be reduced while suppressing the power supply noises, to stabilize the operations of dynamic RAM.

(8) In the aforementioned item (7), the bonding pads for transmitting the power supply voltage or ground potential of the circuit to the power supply trunk lines are arranged in the vicinity of one or the other ends of the first power supply line. Moreover, one portion or the whole portion of the first power supply lines is constructed of a plurality of metallic wiring layers. As a result, there can be attained an effect that the synthetic impedance of:the power supply trunk lines can be further reduced to stabilize the operations of the dynamic RAM better.

(9) In the aforementioned items (7) and (8), the signal lines coupling one or another portion of the peripheral circuits are arranged alone the aforementioned first power supply lines, and the input and output nodes relating to those signal lines are arranged in the vicinity of the first power supply lines. As a result, there can be attained an effect that the transmission delay time of the signals to be transmitted through the aforementioned signal lines can be shortened to speed up the operations of the dynamic RAM.

(10) The unit circuits of the address buffers provided for the individual bits of the address signals are arranged in the vicinity of the corresponding bonding pads. As a result, there can be attained an effect that the transmission delay time of the corresponding address signals can be shortened to speed up the operations of the dynamic RAM.

(11) In the aforementioned item (19), the X-address signals and the Y-address signals are fed in a time sharing manner, and the individual unit circuits of the Y-address buffers are arranged closer to the corresponding bonding pads than the corresponding unit circuits of the X-address buffers. As a result, there can be attained an effect that the transmission delay time of the Y-address signals determining the rate of the cycle time of the continuous operations in the static column mode can be shortened to speed up the operations of the dynamic RAM more.

(12) The circuit elements composing the peripheral circuit are formed in the element regions which are formed in the semiconductor for substrate surface at a predetermined interval and in the form of a band,and the signal lines coupling those circuit elements are formed in the wiring regions formed between the element regions. As a result, there can be attained an effect that the layout of the peripheral circuits constructed basically of the random logic circuits can be made efficient.

(13) In the aforementioned item (12), there are arranged in the wiring region two metallic wiring layers, of which the upper metallic wiring layer is arranged in parallel with the element region and used as a main signal line for coupling the individual circuit elements whereas the lower metallic wiring layer is used as a leading signal line for coupling the aforementioned circuit element and the corresponding main signal line. As a result, there can be attained an effect that the resistance of the main signal line to be arranged over a relatively long range can be suppressed to shorten the signal transmission delay time thereby to speed up the operations of the dynamic RAM.

(14) In the dynamic RAM capable of providing a plurality of kinds by changing a portion of the photo mask of the common semiconductor substrate, a predetermined signal line is used as one having a different application. As a result, there can be attained an effect that the number of the signals lines to be arranged over a relatively long range of the relatively narrow wiring region of the aforementioned common semiconductor substrate surface can be reduced to make the layout of the dynamic RAM efficient.

(15) The precharge control signal lines, which are arranged over a relatively long range of the semiconductor substrate surface to have their one and other ends coupled to the output terminals of the two drive circuits, are cut at predetermined positions corresponding to the time difference for which the corresponding control signals are transmitted through the aforementioned two drive circuits from one to other terminals. As a result, there can be attained an effect to prevent the through current which might otherwise be generated due to the discrepancy of the transmission time.

(16) The set cycle of the vendor test mode is judged on condition that the column address strobe signal and the write enable signal are set to the low level prior to the row address strobe signal and that the other predetermined external terminal is fed with a predetermined high voltage exceeding the power supply voltage of the circuit at the breaking edge of the aforementioned row address strobe signal. The specific content of the aforementioned vendor test is selectively designated by the combination of the predetermined address signals fed at the breaking edge of the row address strobe signal. As a result, there can be attained an effect that a variety of testing operations of the dynamic RAM can be selectively accomplished after the packaging and by such a combination of the start control signals as cannot occur in the ordinary memory access.

(17) In the vendor test mode, the operations of the voltage generator for forming an internal voltage, for example, are substantially stopped, so that the value of the internal voltage may be selectively and stepwise set in accordance with the test signal fed through a predetermined external terminal. As a result, there can be attained an effect that the memory cell test or the leak current test can be efficiently executed in the plate stress state or the standby current stop state.

(18) In the dynamic RAM including: a common I/O line connected selectively with a designated data line; a static main amplifier connected selectively with said common I/O line; and a common I/O line selection circuit connected selectively with said common I/O line and said main amplifier, the complementary signal line from said common I/O line to the output node of said main amplifier is equalized upstream, downstream or at a predetermined middle node of the switch means to be selectively connected or disconnected. As a result, there can be attained an effect that the level change at each-node can be raised to speed up the wiring of reading operations of the dynamic RAM.

(19) In the aforementioned item (18), the memory arrays are arranged in the so-called "longitudinal arrangement", and the aforementioned common I/O line is arranged over the two memory arrays arranged symmetrically and is coupled to the corresponding common I/O selection circuit at the outside of one of the memory arrays. At this time, the common I/O lines are individually equalized at the aforementioned coupling node and at the middle node between the corresponding two memory arrays. As a result, there can be attained an effect that the equalizations of the common I/O line can be speeded up to further speed up the operations of the dynamic RAM.

(20) In the aforementioned items (18) and (19), the write pulse for controlling the continuous writing operations in the static column mode is formed on the basis of the timing signal for controlling the aforementioned equalizations so that it can be effectively formed. As a result, there can be attained an effect that the continuous writing operations of the dynamic RAM in the static column mode can be speeded

(21) The substrate back bias voltage generator is equipped with a first voltage generator for forming a substrate back bias voltage on the basis of a predetermined pulse signal, and a second voltage generator for forming said substrate back bias voltage on the basis of the inverted signal of said pulse signal. As a result, there can be attained an effect that the level fluctuations of the aforementioned substrate back bias voltage synchronized with the aforementioned pulse signal can be suppressed to stabilize the operations of the dynamic RAM.

(22) The X-system redundant circuit is equipped with an address coincidence detection circuit or an address incoincidence detection circuit for deciding a coincidence or incoincidence between the defective addresses assigned to the corresponding redundant word lines and the addresses designated from the outside, and their output signals are selectively validated when the corresponding conditions hold. As a result, there can be attained an effect that the transmission delay time of the redundant circuit for the critical path can be shortened to speed up the operations of the dynamic RAM.

(23) The word line selection timing signal generator, the redundant word line selection timing signal generator and the redundant X-address decoder constituting the X-system selection circuit are constructed of selective extraction type circuits which have their precharged output nodes extracted selectively under the corresponding conditions. The X-address decoder is constructed of a selective charged type circuit which has its output node charged selectively under a predetermined condition. As a result, there can be attained an effect that the current consumption of the X-system selection circuit can be reduced while its operations are being speeded up.

(24) The output signals of the X-predecoder are selectively validated when the dynamic RAM is brought into the selected state, to change the reset timings of the X-address signals in accordance with the applications. Thus, the sequence control can be accomplished in accordance with the internal address signal or the output signal of the X-predecoder. As a result, there can be attained an effect that the circuit structure of the peripheral circuit can be simplified to speed up the operations of the dynamic RAM.

(25) The timing generator is equipped with: monitoring word lines made to have a structure substantially similar to that of the word lines constituting the memory arrays and equivalent electric characteristics; and a word line monitor circuit for discriminating that the word line selection signal to be fed selectively to the word lines has arrived at the remote end of said monitoring word lines. As a result, there can be attained an effect that the end of the selections of the word lines can be accurately decided to stabilize the operations of the timing generator and accordingly the dynamic RAM.

(26) In the aforementioned item (25), there are provided two monitoring word lines, of which one word line has its other end connected with the input terminal of the logic gate circuit having a relatively high logical threshold level whereas the other monitoring word line has its other end connected with the input terminal of the logic gate circuit having a relatively low logical threshold level. Moreover, the output signals of the logical gate circuits are selectively validated by the laser trimming, for example. As a result, there can be attained an effect that the decisions of the word line monitor circuit can be made accurate to stabilize the operations of the dynamic RAM better.

(27) The data output buffer is constructed of: a latch for receiving and latching the complementary output signal outputted from an upstream circuit; a pair of NAND gate circuits for transmitting the complementary output signal of said latch selectively; a pair of inverter circuits for inverting and transmitting the complementary output signals of said paired NAND gate circuits; and a pair of N-channel output MISFETs connected in series between the power supply voltage and the ground potential of the circuit and having their gates made receptive of the complementary output signals of said paired inverter circuits and their commonly connected sources and drains connected with the data output terminals or the data input/output terminals. As a result, there can be attained an effect that the circuit structure of the data output buffer can be optimized to speed up the outputting operations of the dynamic RAM.

(28) In the aforementioned item (27), the uninverted and inverted input/output nodes of the aforementioned latch are temporarily equalized immediately before the new complementary output signal is transmitted from the upstream circuit, to hold the output temporarily in a high-impedance state. As a result, there can be attained an effect that the operations of the data output buffer can be speeded up to further speed up the single-reading operations of the dynamic RAM and the continuous reading operations in the static column mode.

(29) The individually paired P-channel MOSFETs and N-channel MOSFETs constituting the sense amplifier have their source, gate and drain regions and contacts laid out symmetrically with respect to a straight line perpendicular to the extension of the corresponding complementary data lines and in parallel with said straight line. As a result, there can be attained an effect that the changes of the parasitic capacities to be caused in the uninverted and inverted signals of the individual complementary data lines due to the mask displacement offset one another, for example, thereby to stabilize the reading operations of the dynamic RAM.

(30) The input protection circuit is formed with: an input diffusion layer coupled through a metallic wiring layer to the corresponding bonding pads; and second and third diffusion layers formed to face said input diffusion layer and coupled through the metallic wiring layers to the power supply voltage or the ground potential of the circuit. As a result, there can be attained an effect that there can be formed between the aforementioned pads and the power supply voltage and the ground potential of the circuit lateral bipolar transistors for absorbing the spike noises at a high speed thereby to improve the input protection characteristics of the dynamic RAM.

(31) In the aforementioned item (30), predetermined well regions are formed all over the aforementioned input diffusion layer and second and third diffusion layers or around or below the opposed leading end portions of the same. As a result, there can be attained an effect that the input diffusion layer can be prevented from being broken when in the breakdown to suppress the surge absorption of the semiconductor substrate and accordingly the fluctuations of the substrate potential.

(32) As the protection resistor to be connected between the input or output terminal of the internal circuit and the corresponding bonding pad, there is used a well resistor which is constructed by forming a pair of diffusion layers across a well region and in a facing manner.

As a result, there can be attained an effect that the area necessary for the layout of the protection resistor can be reduced together with the chip area of the dynamic RAM.

(33) The clamp MOSFET disposed in the input protection circuit has its drain connected with the input or output terminal of the internal circuit or the protection resistor through the metallic wiring layer formed substantially thereover. As a result, there can be attained an effect that the current distribution in the drain region of the clamp MOSFET can be made uniform to stabilize the clamping characteristics.

(34) There are further formed a second diffusion layer formed to enclose a portion of the input diffusion layer and coupled to the power supply voltage of the circuit through the metallic wiring layer and a third diffusion layer formed to enclose another portion of the aforementioned input diffusion layer and coupled to the ground potential of the circuit through the metallic wiring layer. As a result, there can be attained an effect that the ON resistance of the lateral bipolar transistor formed equivalently between the input pad and the power supply voltage or ground potential of the circuit can be reduced to improve the protection characteristics of the input protection circuit.

(35) In the aforementioned item (34), a predetermined well region is formed below the plural contacts for coupling the input diffusion layer and the metallic wiring layer, i.e., the corresponding pads. As a result, there can be attained an effect that the breakdown voltage between the input diffusion layer below the aforementioned contacts and the semiconductor substrate can be raised.

(36) In the aforementioned items (34) and (35), the metallic wiring layer for coupling the input diffusion layer and the corresponding pads are formed over a portion of the aforementioned second and third diffusion layers, and the metallic wiring layers for coupling the second and third diffusion layers and the power supply voltage or ground potential of the circuit are formed over a portion of the aforementioned input diffusion layer. As a result, there can be attained an effect that a hi-directional clamp MOSFET having a relatively high threshold voltage can be equivalently formed between each pad and the power supply voltage and ground potential of the circuit to improve the characteristics against the power supply voltage and against the ground potential of the input protection circuit.

(37) The gate layer made of polysilicon and acting as the gate electrode of the MOSFET and the metallic wiring layer for transmitting an input signal to that gate layer are coupled through at least two contacts. As a result, there can be attained an effect that the transmission delay time of the input signal in the gate layer can be shortened to speed up the operations of the peripheral circuit including the corresponding MOSFETs and accordingly the operations of the dynamic RAM.

(38) Since the dynamic memory cell regions D3 and D4 (or D13 and D14) are formed so that the word lines W are in parallel with the longer sides of the rectangular chip 1, the I/O lines to be arranged in parallel with the word lines W in the dynamic memory cell regions D3 and D4 (or D13 and D14) are also in parallel with the longer sides of the chip 1. Since the I/O lines in the memory cell regions D3 and D4 (or D13 and D14) divided and arranged at the two ends are connected straight, the lengths of the I/O lines 14 and 15 are unchanged in the longer side direction of the chip 1 from those of FIG. 105 but can be suppressed within that between the two ends of the memory cell regions D3 and D4 (or D13 and D14) in the shorter side direction of the chip 1 at the longest. As a result, there can be attained an effect that the length of the I/O lines can be made shorter than that of FIG. 105 to speed up the address access.

Although our invention has been specifically described in connection with the embodiments thereof, it should not be limited thereto but can naturally be modified in various manners without departing from the gist thereof. For example, the dynamic RAM may have package specifications other than those of DIP, SOJ and ZIP or may be equipped with a plurality of controlling bonding pads for switching the package specifications. This specific method to be conceived for switching the package specifications can include a variety of embodiments. The bit number and bit applications of the X-address signals and Y-address signals should not be limited by the embodiments like the arrangements and combinations of the bonding pads corresponding to those address signals. Moreover, the memory mats may be divided into more memory mats, and each memory array mat adopt the shared sense amplifier system, for example. Still moreover, each memory array may be equipped with an arbitrary number of redundant word lines or redundant complementary word lines, and the defective address for each redundant circuit mat not be the fuse means. The specific content of the testing operations to be conceived in the vendor test mode may be exemplified in various manners and may have a special reset cycle. The several embodiments of the protection circuit may be made by another combination, and the shapes of the individual diffusion layers and metallic wiring layers present mere examples. The metallic wiring layers to be prepared for the semiconductor substrate does not have to be made of aluminum or its alloy but may have three or more layers. Moreover, the specific circuit structures shown in the individual circuit diagrams, the specific layouts shown in the individual arrangement diagrams, and the combination and logical levels of the start control signals, address signals and the timing signals may adopt a variety of modes of embodiments.

In the semiconductor device shown in FIG. 100, the I/O pads 2 are formed in the two corners of one longitudinal end of the chip 1, and the input address pad 3 is formed at the corner of the other end. However, the I/O pads 2 and the address pad 3 should not be limited to those positions, but the present invention can be applied to a semiconductor device in which the I/O pads 2 and the address pad 3 are arranged at the two longitudinal ends of the chip 1. In the description thus far made, our invention has been applied to the dynamic RAM which provides the field of application backing the present invention. However, the present invention should not be limited thereto,but the invention directed to the switching of the package specifications by the bonding option, the protection circuit or the output buffer can be applied to a variety of semiconductor integrated circuit devices. Other inventions can also be applied to a variety of semiconductor memory devices such as the static RAM or the digital integrated circuit including such semiconductor memory device. Thus, the present invention can be applied widely to either a semiconductor integrated circuit device, which has a plurality of package specifications and input/output bonding pads or output buffers, or a semiconductor memory device having a plurality of memory mats and an internal voltage generator.

The effects to be obtained from the representatives of the invention disclosed herein will be summarized in the following. In the dynamic RAM having the plural package specifications, there is prepared and shared by the plural package specifications the common semiconductor substrate which includes: the plural bonding pads arranged in the optimum positions for the individual package shapes; the plural buffers provided for those bonding pads; and the controlling bonding pad for validating the plural buffers, i.e., the plural bonding pads selectively by executing the corresponding predetermined bonding treatments selectively. Moreover, the memory arrays of the dynamic RAM are divided into at least four and arranged by the two center lines in parallel with the shorter and longer sides of the semiconductor substrate surface, so that the peripheral circuit including the X-system selection circuit is arranged along the center line in parallel with the shorter sides of the semiconductor substrate surface whereas another portion of the peripheral circuit is arranged in parallel with the shorter sides of the semiconductor substrate surface outside of the memory arrays. At this time, the power supply trunk lines are constructed of: the first power supply lines arranged alone the center line in parallel with the longer sides of the semiconductor substrate surface; and the plural power supply lines arranged along the peripheral circuits and coupled commonly by the first power supply lines. As a result, the kinds of the semiconductor memory device of the dynamic RAM having the plural package specifications can be efficiently developed, and the signal transmission delay time can be shortened while suppressing the power supply noises and reducing the area necessary for the layout. Thus, the operations of the dynamic RAM can be speeded up and stabilized. This makes it possible to enhance the performances and reliability of the dynamic RAM and to promote the cost reduction.

In the semiconductor device, moreover, in which the dynamic memory cell regions are formed at the two longitudinal ends over the rectangular chip whereas the peripheral circuit is formed at the central portion, in which the I/O pads formed at the longitudinal ends of the chip are connected with the address pads, and in which the I/O lines are arranged in parallel with the word lines formed in the dynamic memory cell regions, these dynamic memory cell regions are formed in parallel with the longer sides of the chip so that the I/O lines arranged in parallel with the word lines in the dynamic memory cell regions are also arranged in parallel with the longer sides of the chip in said regions. By connecting straight the I/O lines in the memory regions divided to the two ends, therefore, the length of the I/O lines can be suppressed within that between the two end portions of the memory cell regions in the shorter side direction of the chip, without being unchanged in the longer side direction of the chip. As a result, the I/O lines can be made shorter to speed up the address access accordingly.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor memory device comprising:

an address buffer circuit having a first pair of output terminals controlled to be in a high impedance state during a predetermined refresh cycle;

a refresh counter having a second pair of output terminals controlled to be in a high impedance state during a normal access cycle;

a pair of common nodes connected to said first and second pair of output terminals; and drive means, common to said address buffer circuit and said refresh counter, for providing said pair of common nodes with a pair of complementary signals on the basis of a pair of output signals at the first pair of output terminals of said address buffer circuit or a pair of output signals at the second pair of output terminals of said refresh counter, wherein said address buffer circuit includes a first pair of open-drain type MOS transistors having drains coupled to said first pair of output terminals, and wherein said refresh counter includes a second pair of open-drain type MOS transistors having drains coupled to said first pair of output terminals.

2. A semiconductor memory device according to claim 1, wherein said drive means include first and second latch circuits coupled to said pair of common nodes, respectively.

3. A semiconductor memory device according to claim 2, wherein said drive means include a first MOS transistor having a gate coupled to one of said common nodes and a source-drain path coupled between a power supply voltage and the other of said common nodes, and a second MOS transistor having a gate coupled to said other of said common nodes and a source-drain path coupled between said power supply voltage and said one of said common nodes.

4. A semiconductor memory device according to claim 3, wherein said drive means include a pair of pull-up MOS transistors coupled between said power supply voltage and said pair of common nodes.

5. A semiconductor memory device according to claim 1, wherein said address buffer circuit includes a first switch MOS transistor coupled to said first pair of open-drain type MOS transistors in series for controlling said first pair of output terminals to be in a high impedance state.

6. A semiconductor memory device according to claim 1, wherein said refresh counter includes a first pair of switch MOS transistors coupled to said first pair of open-drain type MOS transistors in series for controlling said second pair of output terminals to be in a high impedance state.

7. A semiconductor memory device comprising:

an address buffer circuit having a first output terminal controlled to be in a high impedance state during a predetermined refresh cycle;

a refresh counter having a second output terminal controlled to be in a high impedance state during a normal access cycle;

a common node connected to said first and second output terminals; and drive means, common to said address buffer circuit and said refresh counter, for providing said common node with a signal on the basis of an output signal at said first output terminal of said address buffer circuit or an output signal at said second output terminal of said refresh counter, wherein said address buffer circuit includes a first open-drain type MOS transistor having a drain coupled to said first output terminal, and wherein said refresh counter includes a second open-drain type MOS transistor having a drain coupled to said first output terminal.

* * * * *